(12) United States Patent
Hwang et al.

(10) Patent No.: US 11,205,758 B2
(45) Date of Patent: *Dec. 21, 2021

(54) ORGANOMETALLIC COMPOUND, ORGANIC LIGHT-EMITTING DEVICE INCLUDING THE ORGANOMETALLIC COMPOUND, AND DIAGNOSTIC COMPOSITION INCLUDING THE ORGANOMETALLIC COMPOUND

(71) Applicant: Samsung Electronics Co., Ltd., Suwon-si (KR)

(72) Inventors: Kyuyoung Hwang, Anyang-si (KR); Seungyeon Kwak, Suwon-si (KR); Sunyoung Lee, Seoul (KR); Jungin Lee, Seoul (KR); Aram Jeon, Suwon-si (KR); Yuri Cho, Suwon-si (KR); Seokhwan Hong, Seoul (KR); Ohyun Kwon, Seoul (KR); Byoungki Choi, Hwaseong-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 491 days.

This patent is subject to a terminal disclaimer.

(21) Appl. No.: 16/146,244

(22) Filed: Sep. 28, 2018

(65) Prior Publication Data
US 2019/0103568 A1 Apr. 4, 2019

(30) Foreign Application Priority Data

Sep. 29, 2017 (KR) .................. 10-2017-0127764
Sep. 21, 2018 (KR) .................. 10-2018-0113886

(51) Int. Cl.
| H01L 51/00 | (2006.01) |
| C07F 15/00 | (2006.01) |
| C09K 11/06 | (2006.01) |
| H01L 51/50 | (2006.01) |

(52) U.S. Cl.
CPC ...... *H01L 51/0087* (2013.01); *C07F 15/0086* (2013.01); *C09K 11/06* (2013.01); *C09K 2211/1044* (2013.01); *C09K 2211/185* (2013.01); *H01L 51/5016* (2013.01); *H01L 51/5056* (2013.01); *H01L 51/5072* (2013.01); *H01L 51/5088* (2013.01); *H01L 51/5092* (2013.01); *H01L 51/5096* (2013.01)

(58) Field of Classification Search
CPC ............ H01L 51/5096; H01L 51/5092; H01L 51/5088; H01L 51/5072; H01L 51/5056; H01L 51/5016; H01L 51/0087; C09K 2211/185; C09K 2211/1044; C09K 11/06; C07F 15/0086
USPC ........................................................ 428/690
See application file for complete search history.

(56) References Cited

U.S. PATENT DOCUMENTS

| 8,257,838 B2 | 9/2012 | Igarashi et al. |
| 9,224,963 B2 | 12/2015 | Li et al. |
| 10,158,091 B2 * | 12/2018 | Li ................. C07F 15/0086 |
| 10,937,974 B2 * | 3/2021 | Jeon ................. H01L 51/0087 |
| 2017/0040555 A1 | 2/2017 | Li et al. |
| 2018/0090707 A1 | 3/2018 | Jeon et al. |
| 2018/0248137 A1 | 8/2018 | Jeon et al. |
| 2021/0226136 A1 * | 7/2021 | Lee ................. H01L 51/0089 |
| 2021/0253618 A1 * | 8/2021 | Kwon ............... H01L 51/0085 |
| 2021/0257560 A1 * | 8/2021 | Hong ............... H01L 51/0072 |
| 2021/0261589 A1 * | 8/2021 | Li .................... C09B 47/00 |
| 2021/0273166 A1 * | 9/2021 | Lee ................. H01L 51/0084 |
| 2021/0273182 A1 * | 9/2021 | Li .................... H05B 33/14 |
| 2021/0288268 A1 * | 9/2021 | Yi .................... H01L 51/0085 |

FOREIGN PATENT DOCUMENTS

| EP | 2574613 A1 | 4/2013 |
| EP | 3392257 A1 | 10/2018 |

OTHER PUBLICATIONS

CAS reg. No. 2305062-37-5, Apr. 22, 2019. (Year: 2019).*
Extensive European Search Report issued by the European Patent Office dated Jan. 31, 2019 in the examination of the European Patent Application No. 18197329.8-1109.
Guijie Li et al. "Stable and efficient sky-blue organic light emitting diodes employing a tetradentate platinum complex", Appl. Phys. Lett. 2017, 110, 113301.
Tyler B. Fleetham et al. "Tetradentate Pt(II) Complexes with 6-Membered Chelate Rings: A New Route for Stable and Efficient Blue Organic Light Emitting Diodes", Chem. Mater. 2016, 28, 3276-3282.

* cited by examiner

*Primary Examiner* — Douglas J McGinty
(74) *Attorney, Agent, or Firm* — Cantor Colburn LLP

(57) ABSTRACT

An organometallic compound represented by Formula 1:2

Formula 1

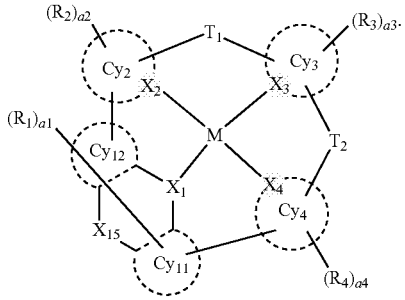

wherein, in Formula 1, groups and variables are the same as described in the specification.

20 Claims, 1 Drawing Sheet

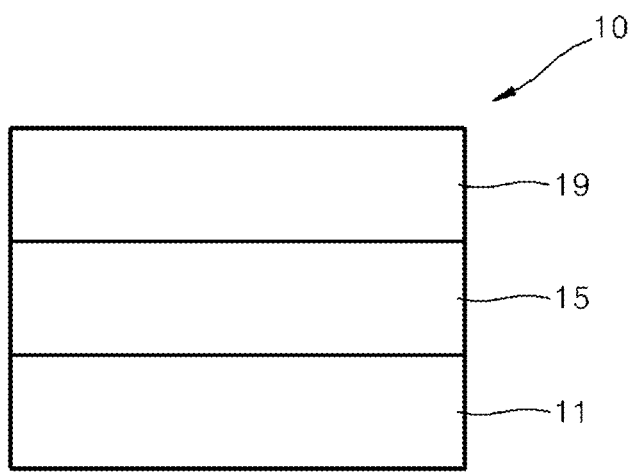

ORGANOMETALLIC COMPOUND, ORGANIC LIGHT-EMITTING DEVICE INCLUDING THE ORGANOMETALLIC COMPOUND, AND DIAGNOSTIC COMPOSITION INCLUDING THE ORGANOMETALLIC COMPOUND

CROSS-REFERENCE TO RELATED APPLICATION

This application claims priority to Korean Patent Applications No. 10-2017-0127764, filed on Sep. 29, 2017, and 10-2018-0113886, filed on Sep. 21, 2018, in the Korean Intellectual Property Office, and all the benefits accruing therefrom under 35 U.S.C. § 119, the contents of which are incorporated herein in their entirety by reference.

BACKGROUND

1. Field

One or more embodiments relate to an organometallic compound, an organic light-emitting device including the organometallic compound, and a diagnostic composition including the organometallic compound.

2. Description of the Related Art

Organic light-emitting devices (OLEDs) are self-emission devices, which have superior characteristics in terms of a viewing angle, a response time, a brightness, a driving voltage, and a response speed, and which produce full-color images.

In an example, an organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

Meanwhile, luminescent compounds may be used to monitor, sense, or detect a variety of biological materials including cells and proteins. An example of the luminescent compounds includes a phosphorescent luminescent compound.

Various types of organic light emitting devices are known. However, there still remains a need in OLEDs having low driving voltage, high efficiency, high brightness, and long lifespan.

SUMMARY

Aspects of the present disclosure provide an organometallic compound, an organic light-emitting device including the organometallic compound, and a diagnostic composition including the organometallic compound.

Additional aspects will be set forth in part in the description which follows and, in part, will be apparent from the description, or may be learned by practice of the presented embodiments.

An aspect of the present disclosure provides an organometallic compound represented by Formula 1:

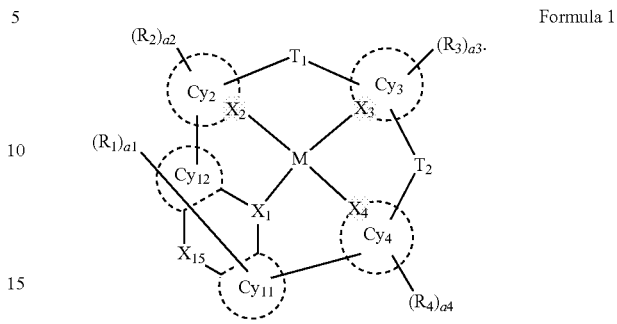

Formula 1

In Formula 1,

M may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au), $X_1$ may be N, $X_2$ to $X_4$ may each independently be N or C, a bond between $X_1$ and M may be a covalent bond, two bonds selected from a bond between $X_2$ and M, a bond between $X_3$ and M, and a bond between $X_4$ and M may each be a coordinate bond and the remaining bond may be a covalent bond, ring $CY_{11}$ and ring $CY_{12}$ may each independently be a $C_5$-$C_{15}$ carbocyclic group or a $C_1$-$C_{15}$ heterocyclic group, ring $CY_2$ to ring $CY_4$ may each independently be a $C_5$-$C_{30}$ carbocyclic group or a $C_1$-$C_{30}$ heterocyclic group, $T_1$ and $T_2$ may each independently be selected from a single bond, a double bond, *—N($R_5$)—*', *—B($R_5$)—*', *—P($R_5$)—*', *—C($R_5$)($R_6$)—*', *—Si($R_5$)($R_6$)—*', *—Ge($R_5$)($R_6$)—*', *—S—*', *—Se—*', *—O—*', *—C(=O)—*', *—S(=O)—*', *—S(=O)$_2$—*', *—C($R_5$)=*', *=C($R_5$)—*', *—C($R_5$)=C($R_6$)—*', *—C($R_{5a}$)($R_{5b}$)—C($R_{6a}$)($R_{6b}$)—*', *—C(=S)—*', and *—C≡C—*', and * and *' each indicate a binding site to a neighboring atom, $X_{15}$ may be a single bond, O, S, Se, N($R_{15}$), C($R_{15}$)($R_{16}$), or Si($R_{15}$)($R_{16}$), $R_5$ and $R_6$, and $R_{15}$ and $R_{16}$ may optionally be linked via a single bond, a double bond, or a first linking group to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group may be each unsubstituted or substituted with at least one $R_{1a}$, $R_1$ to $R_6$, $R_{5a}$, $R_{5b}$, $R_{6a}$, $R_{6b}$, $R_{15}$, and $R_{16}$ may each independently be selected from hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$), a1 to a4 may each independently be an integer from 0 to 20, two or more groups selected from a plurality of neighboring groups $R_1$ are optionally linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group may be each unsubstituted or substituted with at least one $R_{1a}$, two or more groups selected from a plurality of neighboring groups $R_2$ are optionally linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group may be each unsubstituted or substituted with at least one $R_{1a}$, two or more groups selected from a plurality of neighboring groups $R_3$ are optionally linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group may be each unsubstituted or substituted with at least one $R_{1a}$, two or more groups selected from a plurality of neighboring groups $R_4$ are optionally linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group may be each unsubstituted or substituted with at least one $R_{1a}$, two or more groups selected from $R_1$ to $R_6$, $R_{5a}$, $R_{5b}$, $R_{6a}$, $R_{6b}$, $R_{15}$, and $R_{16}$ are optionally linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group may be each unsubstituted or substituted with at least one $R_{1a}$, $R_{1a}$ may be defined the same as above $R_1$, at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), and —P(=O)($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), and —P(=O)($Q_{28}$)($Q_{29}$); and —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one selected from deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

Another aspect of the present disclosure provides an organic light-emitting device including:

a first electrode;

a second electrode; and an organic layer disposed between the first electrode and the second electrode, wherein the organic layer includes an emission layer, and wherein the organic layer includes at least one organometallic compound.

The organometallic compound may act as a dopant in the organic layer.

Another aspect of the present disclosure provides a diagnostic composition including at least one of the organometallic compound represented by Formula 1.

BRIEF DESCRIPTION OF THE DRAWING

These and/or other aspects will become apparent and more readily appreciated from the following description of the embodiments, taken in conjunction with FIGURE which is a schematic view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the FIGURES, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the FIGURES, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

An aspect of the present disclosure provides an organometallic compound represented by Formula 1:

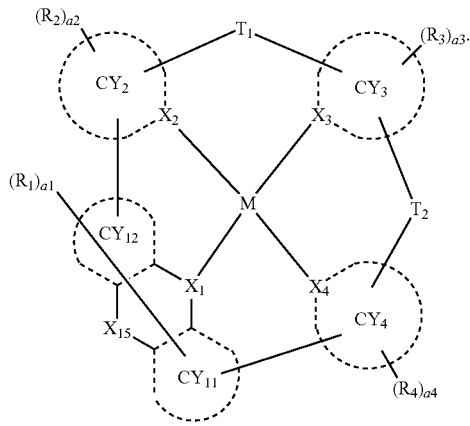

Formula 1

In Formula 1, M may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au).

For example, M may be Pd, Pt, or Au, but embodiments of the present disclosure are not limited thereto.

In Formula 1, $X_1$ may be N, and $X_2$ to $X_4$ may each independently be N or C.

In an embodiment, in Formula 1, a bond between $X_1$ and M may be a covalent bond, and two bonds selected from a bond between $X_2$ and M, a bond between $X_3$ and M, and a bond between $X_4$ and M may each be a coordinate bond and the remaining bond may be a covalent bond. In this regard, the organometallic compound represented by Formula 1 may be electrically neutral.

For example, in Formula 1,
i) $X_2$ and $X_3$ may each be N, and $X_4$ may be C,
ii) $X_2$ and $X_4$ may each be N, and $X_3$ may be C,
iii) a bond between $X_2$ and M and a bond between $X_3$ and M may each be a coordinate bond, and a bond between $X_4$ and M may be a covalent bond, or
iv) a bond between $X_2$ and M and a bond between $X_4$ and M may each be a coordinate bond, and a bond between $X_3$ and M may be a covalent bond, but embodiments of the present disclosure are not limited thereto.

In Formula 1, ring $CY_{11}$ and ring $CY_{12}$ may each independently be a $C_5$-$C_{15}$carbocyclic group or a $C_1$-$C_{15}$ heterocyclic group, ring $CY_2$ to ring $CY_4$ may each independently be a $C_5$-$C_{30}$ carbocyclic group or a $C_1$-$C_{30}$ heterocyclic group.

In an embodiment, ring $CY_{11}$, ring $CY_{12}$, and ring $CY_2$ to ring $CY_4$ may each independently be selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzooxadiazole group, a benzothiadiazole group, a 5,6,7,8-tetrahydroisoquinoline group, a 5,6,7,8-tetrahydroquinoline group, an indazole group, a benzofluorene group, a benzocarbazole group, a naphthobenzofuran group, a naphthobenzothiophene group, and a naphtobenzosilole group, but embodiments of the present disclosure are not limited thereto.

In one or more embodiments, ring $CY_{11}$, ring $CY_{12}$, and ring $CY_2$ to ring $CY_4$ may each independently be selected from i) a first ring, ii) a second ring, iii) a condensed ring in which at least two first rings are condensed, iv) a condensed ring in which at least two second rings are condensed, and v) a condensed ring in which at least one first ring and at least one second ring are condensed, the first ring may be selected from a cyclopentadiene group, a furan group, a thiophene group, a pyrrole group, a silole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, and a triazasilole group, and the second ring may be selected from an adamantane group, a norbornane group, a norbornene group, a cyclohexane group, a cyclohexene group, a benzene group, a pyridine group, a pyrimidine group, a pyrazine group, a pyridazine group, and a triazine group.

In Formula 1, $T_1$ and $T_2$ may each independently be selected from a single bond, a double bond, *—N($R_5$)—*', *—B($R_5$)—*', *—P($R_5$)—*', *—C($R_5$)($R_6$)—*', *—Si($R_5$)($R_6$)—*', *—Ge($R_5$)($R_6$)—*', *—S—*', *—Se—*', *—O—*', *—C(=O)—*', *—S(=O)—*', *—S(=O)$_2$—*', *—C($R_5$)=*' *=C($R_5$)—*', *—C($R_5$)=C($R_6$)—*', *—C($R_{5a}$)($R_{5b}$)—C($R_{6a}$)($R_{6b}$)—*', *—C(=S)—*', and *—C≡C—*', wherein * and *' each independently indicate a binding site to a neighboring atom. $R_5$ and $R_6$ may each independently be defined the same as described above, $R_5$ and $R_6$ may optionally be linked each other via a single bond, a double bond, or a first linking group to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group may be each unsubstituted or substituted with at least one $R_{1a}$ and $R_{1a}$ may be defined the same as above $R_1$.

The first linking group may be selected from *—N($R_9$)—*', *—B($R_9$)—*', *—P($R_9$)—*', *—C($R_9$)($R_{10}$)—*', *—Si($R_9$)($R_{10}$)—*', *—Ge($R_9$)($R_{10}$)—*', *—S—*', *—Se—*', *—O—*', *—C(=O)—*', *—S(=O)—*', *—S(=O)$_2$—*', *—C($R_9$)=*', *=C($R_9$)—*', *—C($R_9$)=C($R_{10}$)—*', *—C(=S)—*', and *—C≡C—*', wherein $R_9$ and $R_{10}$ may each independently be defined the same as above $R_5$, and * and *' each independently indicate a binding site to a neighboring atom.

In an embodiment, i) $T_1$ and $T_2$ may each independently be a single bond, or ii) $T_1$ may be a single bond and $T_2$ may be *—N($R_5$)—*', *—B($R_5$)—*', *—P($R_5$)—*', *—C($R_5$)($R_6$)—*', *—Si($R_5$)($R_6$)—*', *—S—*', *—Se—*' or *—O—*'.

In Formula 1, $X_{15}$ may be a single bond, O, S, Se, N($R_{15}$), C($R_{15}$)($R_{16}$), or Si($R_{15}$)($R_{16}$). $R_{15}$ and $R_{16}$ may each independently be the same as described above, and $R_{15}$ and $R_{16}$ may optionally be linked each other via a single bond, a double bond, or the first linking group to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group may be each unsubstituted or substituted with at least one $R_{1a}$ and $R_{1a}$ may be defined the same as above $R_1$.

In an embodiment, $X_{15}$ may be a single bond.

$R_1$ to $R_6$, $R_{5a}$, $R_{5b}$, $R_{6a}$, $R_{6b}$, $R_{15}$, and $R_{16}$ may each independently be selected from hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$). $Q_1$ to $Q_9$ may each independently be the same as described above.

For example, $R_1$ to $R_6$, $R_{5a}$, $R_{5b}$, $R_{6a}$, $R_{6b}$, $R_{15}$, and $R_{16}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, a phenoxy group, and a naphthoxy group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, and —Si($Q_{33}$)($Q_{34}$)($Q_{35}$), each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, and —Si($Q_{33}$)($Q_{34}$)($Q_{35}$); and —N($Q_1$)($Q_2$), —Si($Q_3$)($Q_4$)($Q_5$), —B($Q_6$)($Q_7$), and —P(=O)($Q_8$)($Q_9$), and $Q_1$ to $Q_9$ and $Q_{33}$ to $Q_{35}$ may each independently be selected from:

—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group.

In an embodiment, $R_1$ to $R_6$, $R_{5a}$, $R_{5b}$, $R_{6a}$, $R_{6b}$, $R_{15}$, and $R_{16}$ may each independently be selected from hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, a $C_1$-$C_{10}$ alkoxy group, groups represented by Formulae 9-1 to 9-19, groups represented by Formulae 10-1 to 10-194, —$N(Q_1)(Q_2)$, —$Si(Q_3)(Q_4)(Q_5)$, —$B(Q_6)(Q_7)$, and —$P(=O)(Q_8)(Q_9)$ (wherein $Q_1$ to $Q_9$ may each independently be the same as described above), but embodiments of the present disclosure are not limited thereto:

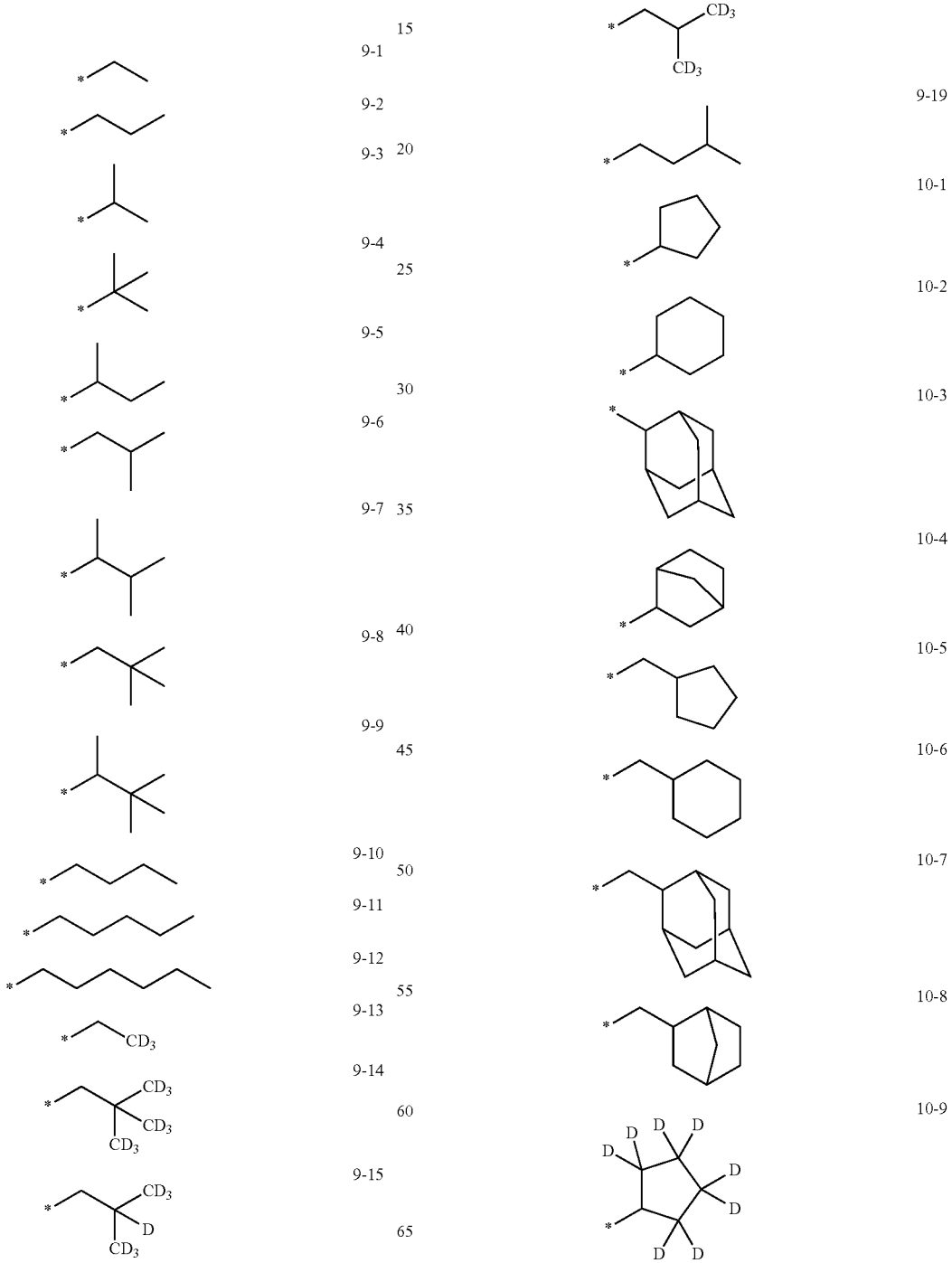

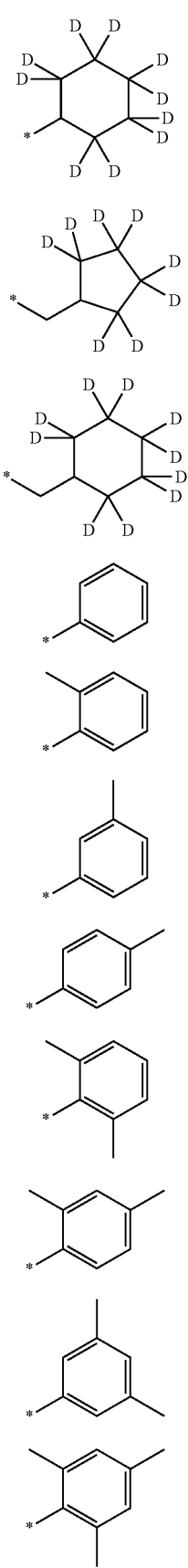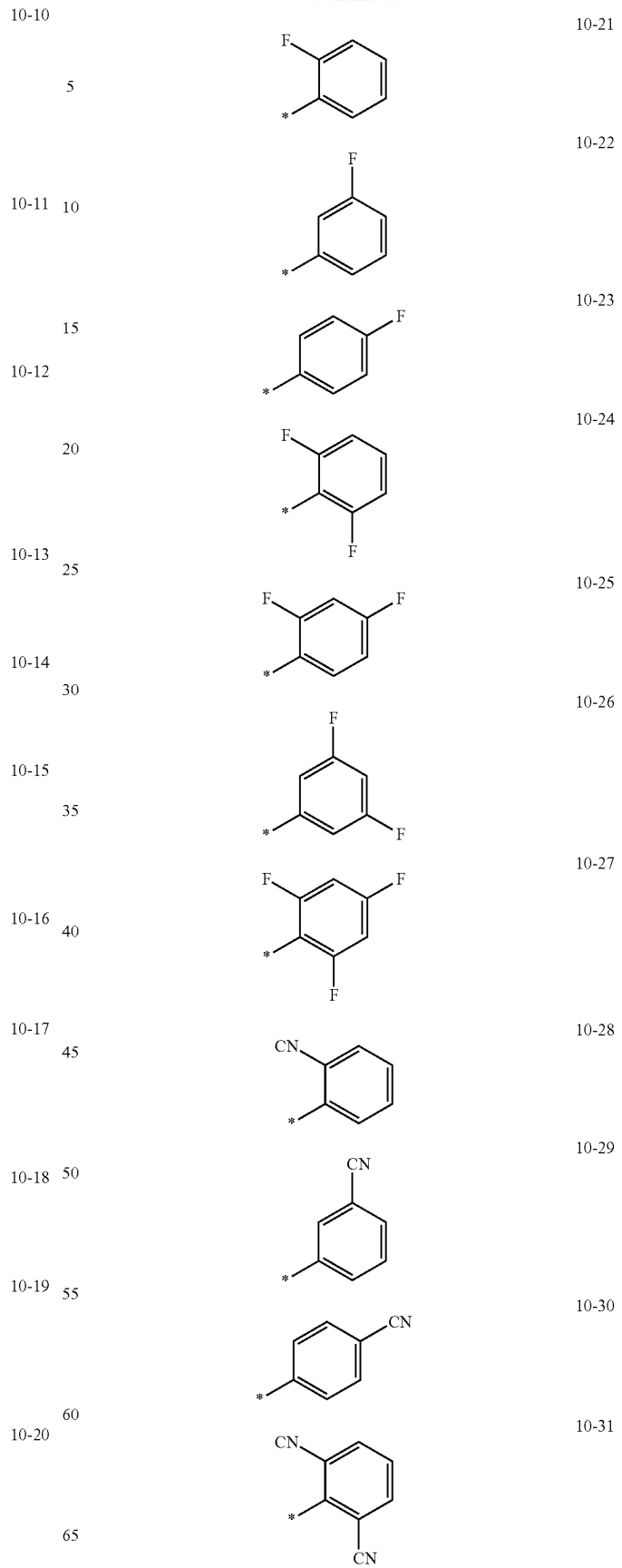

| | |
|---|---|
| 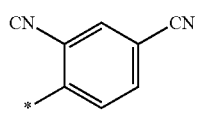 | 10-32 |
| 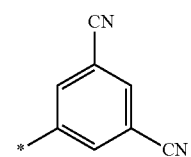 | 10-33 |
| 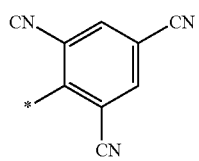 | 10-34 |
| 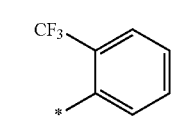 | 10-35 |
| 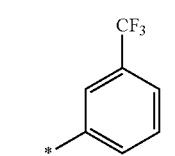 | 10-36 |
| 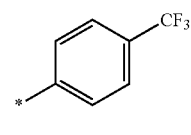 | 10-37 |
| 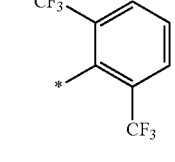 | 10-38 |
| 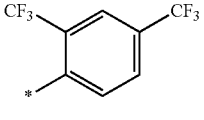 | 10-39 |
| 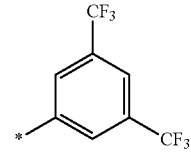 | 10-40 |
| 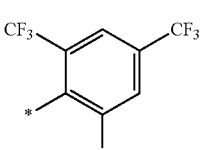 | 10-41 |
| 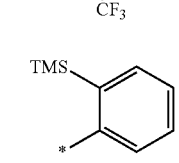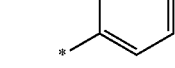 | 10-42 |
| 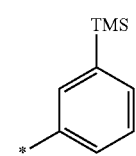 | 10-43 |
| 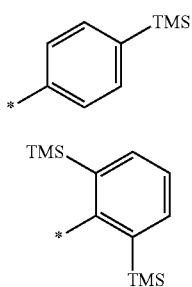 | 10-44 |
| 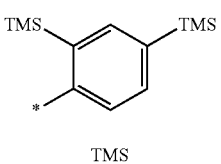 | 10-45 |
| 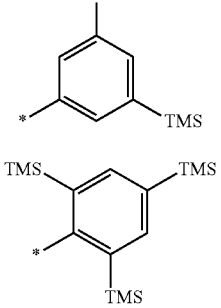 | 10-46 |
| 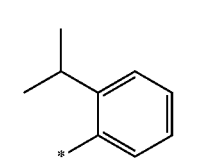 | 10-47 |
| 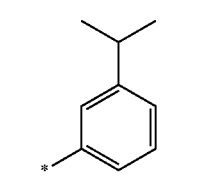 | 10-48 |
| 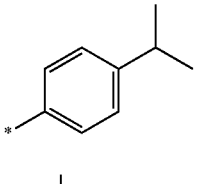 | 10-49 |
| 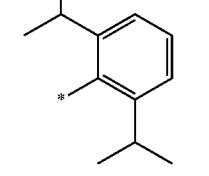 | 10-50 |
10-51
10-52

10-53 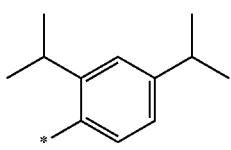
10-54 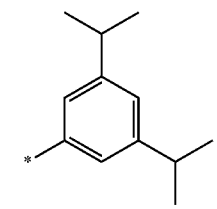
10-55 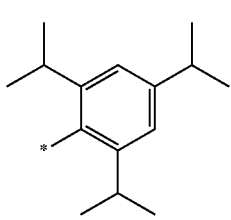
10-56 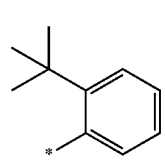
10-57 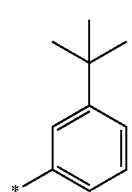
10-58 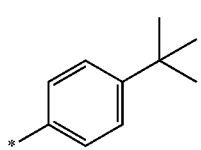
10-59 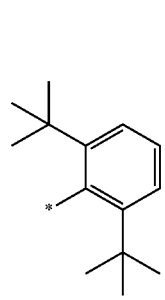
10-60 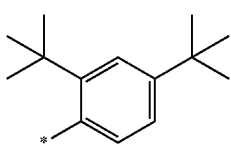
10-61 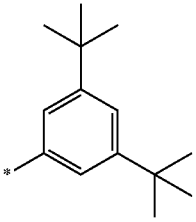
10-62 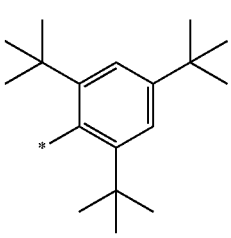
10-63 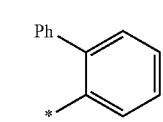
10-64 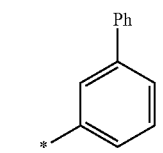
10-65 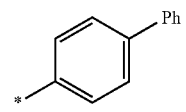
10-66 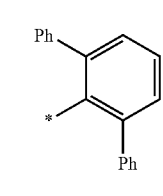
10-67 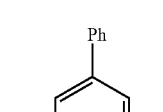
10-68 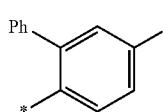
10-69 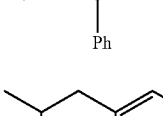
10-70 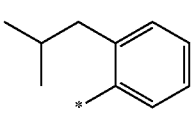

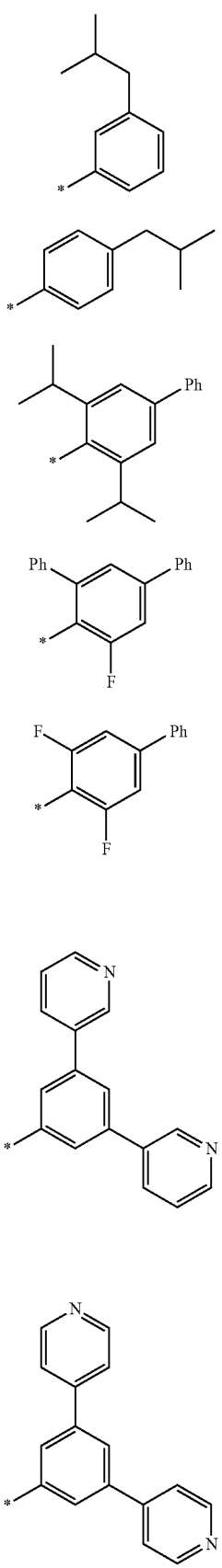
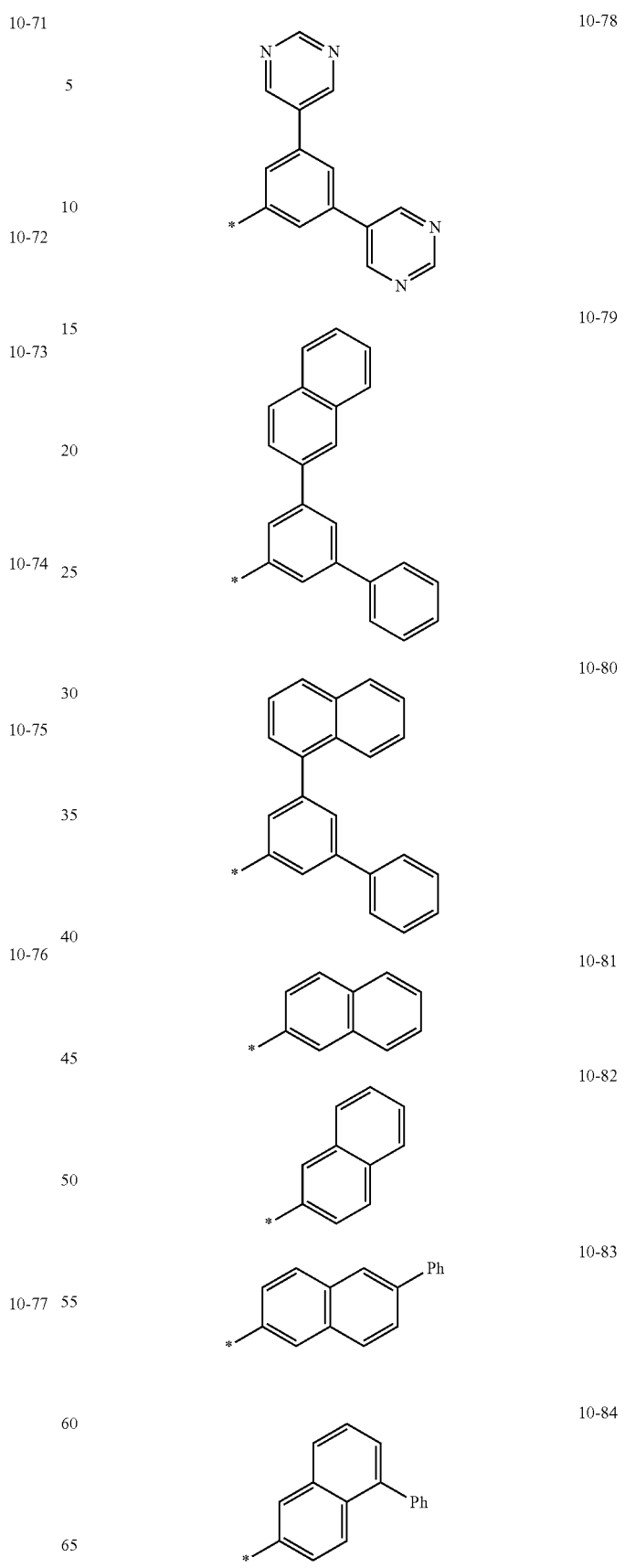

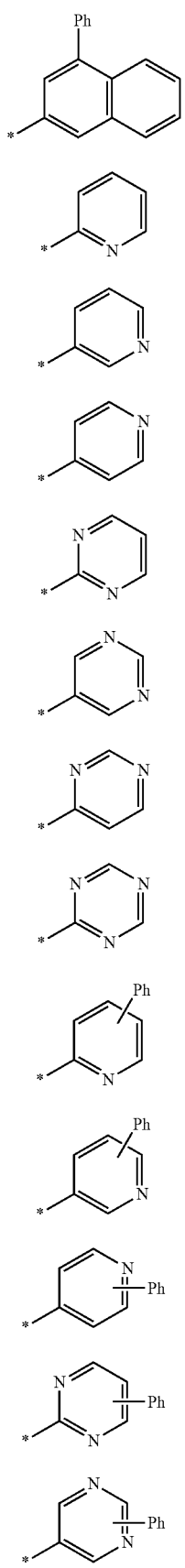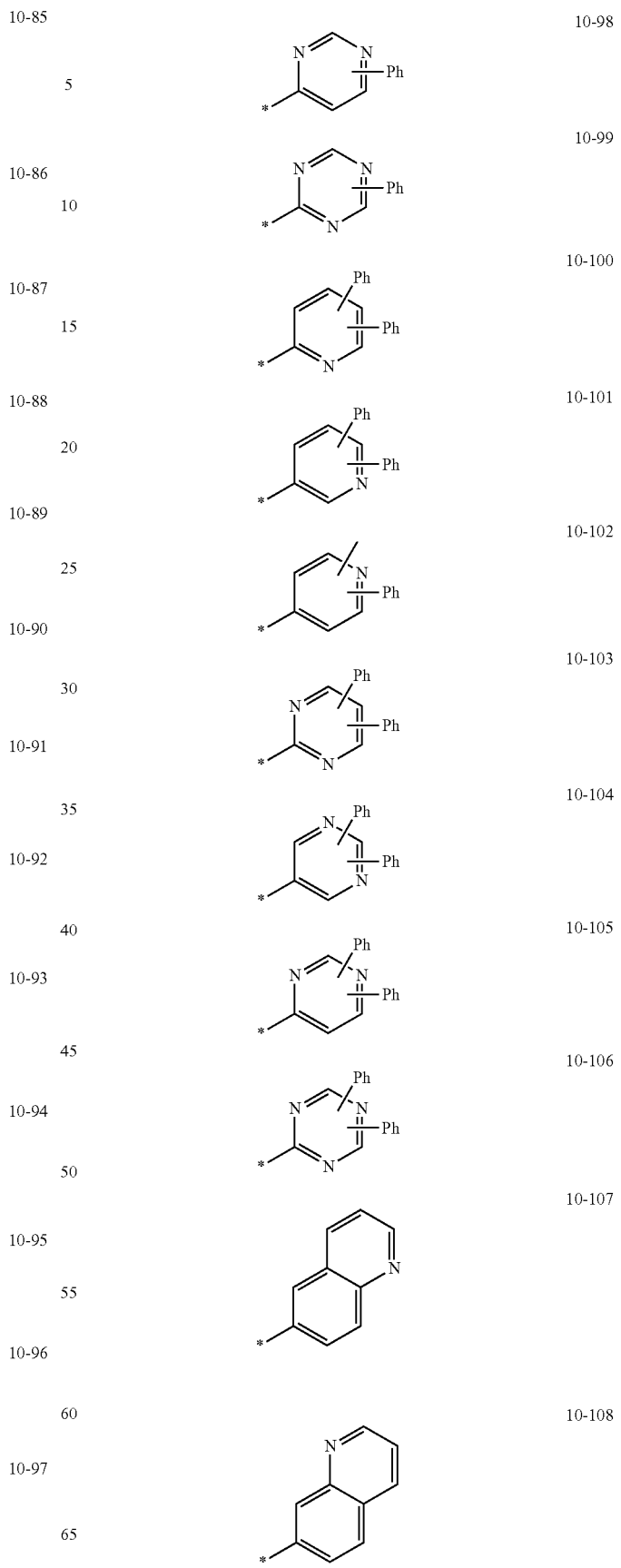

-continued
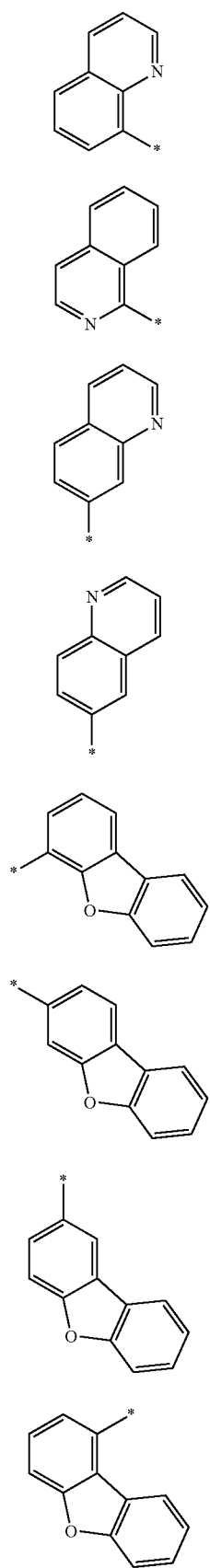
10-109
10-110
10-111
10-112
10-113
10-114
10-115
10-116
-continued
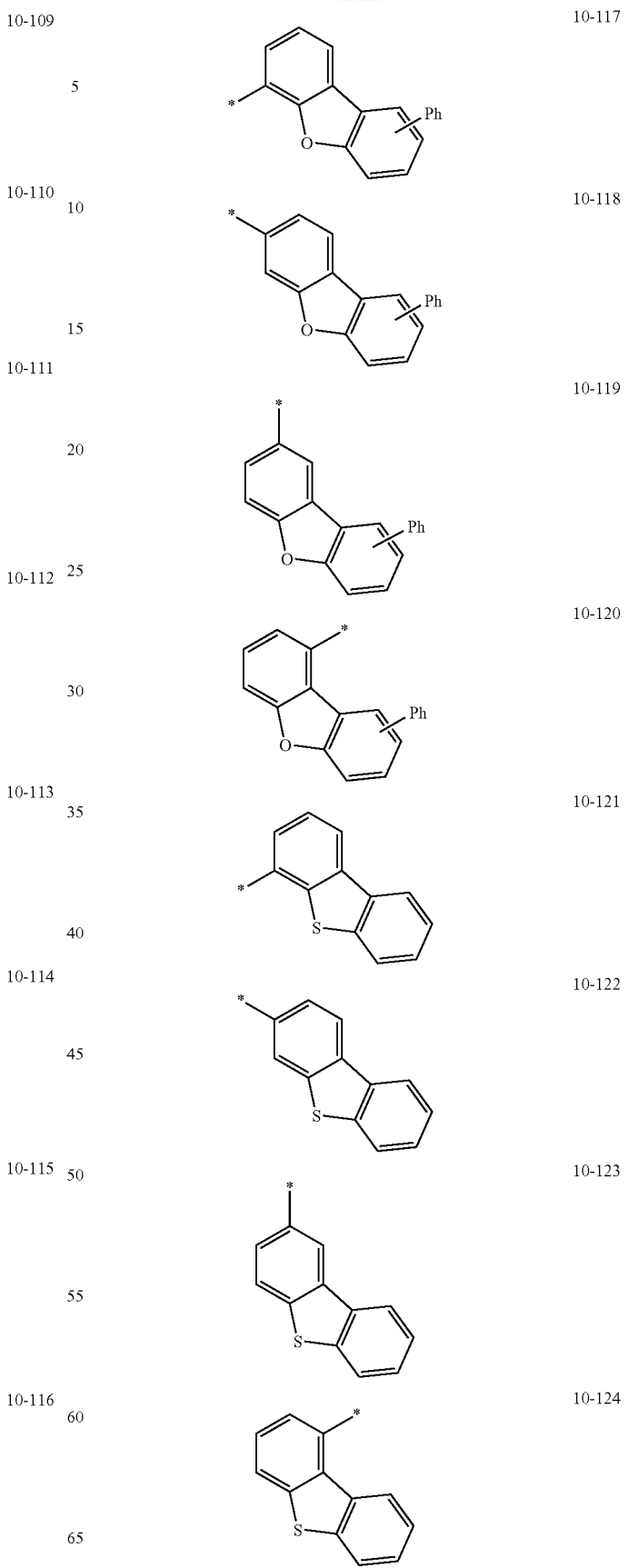
10-117
10-118
10-119
10-120
10-121
10-122
10-123
10-124

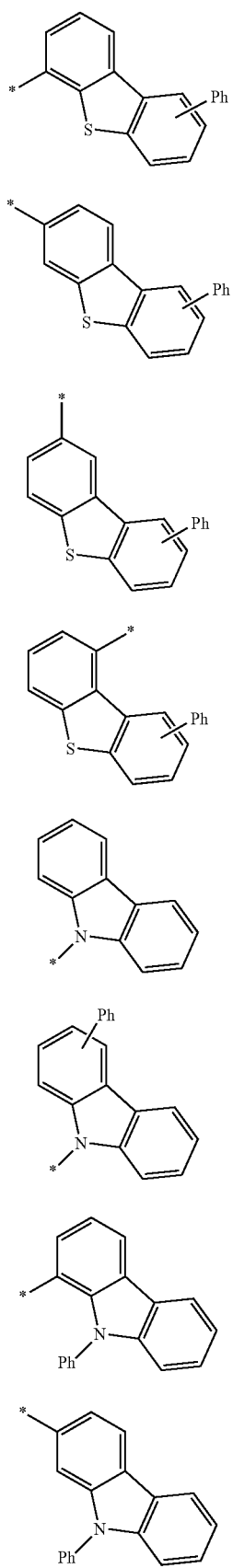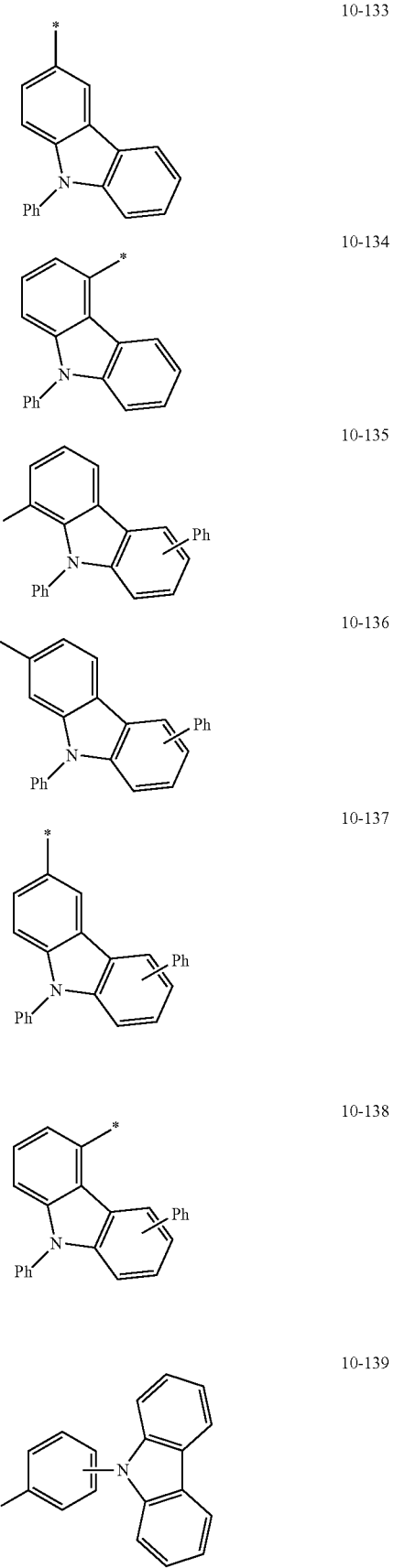

-continued
| | |
|---|---|
| 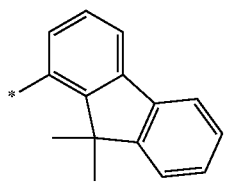 | 10-140 |
| 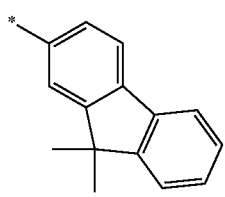 | 10-141 |
| 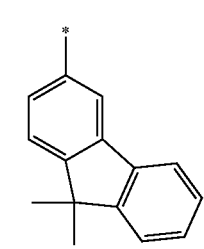 | 10-142 |
| 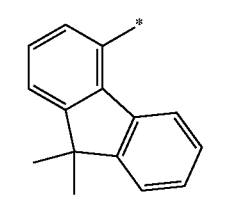 | 10-143 |
| 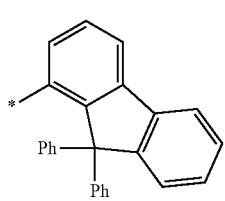 | 10-144 |
| 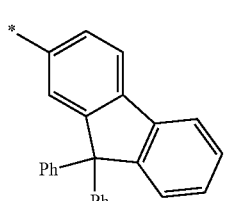 | 10-145 |
| 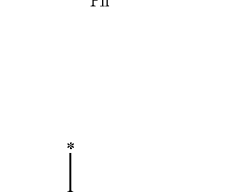 | 10-146 |
-continued
| | |
|---|---|
| 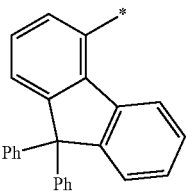 | 10-147 |
| 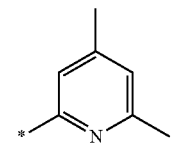 | 10-148 |
| 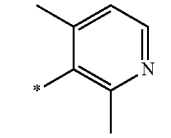 | 10-149 |
| 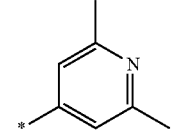 | 10-150 |
| 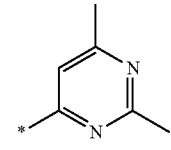 | 10-151 |
| 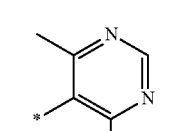 | 10-152 |
| 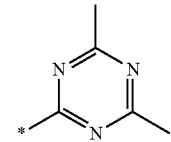 | 10-153 |
| 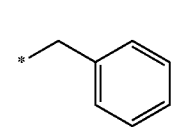 | 10-154 |
| 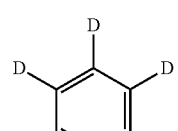 | 10-155 |
| 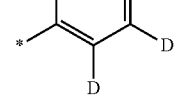 | 10-156 |

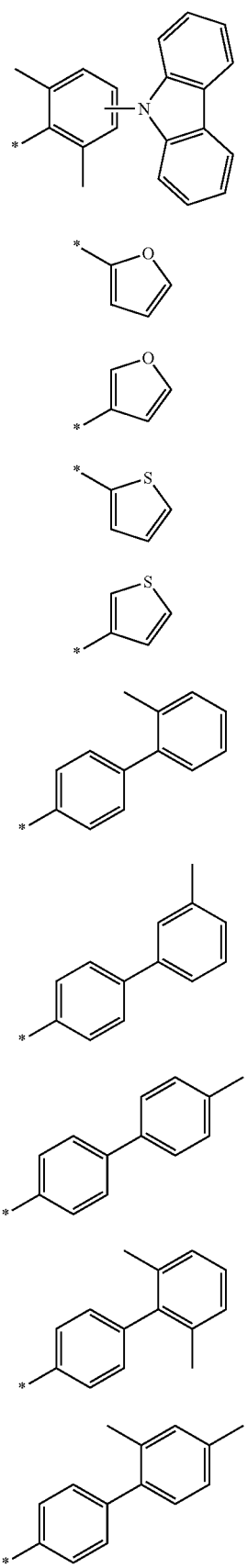
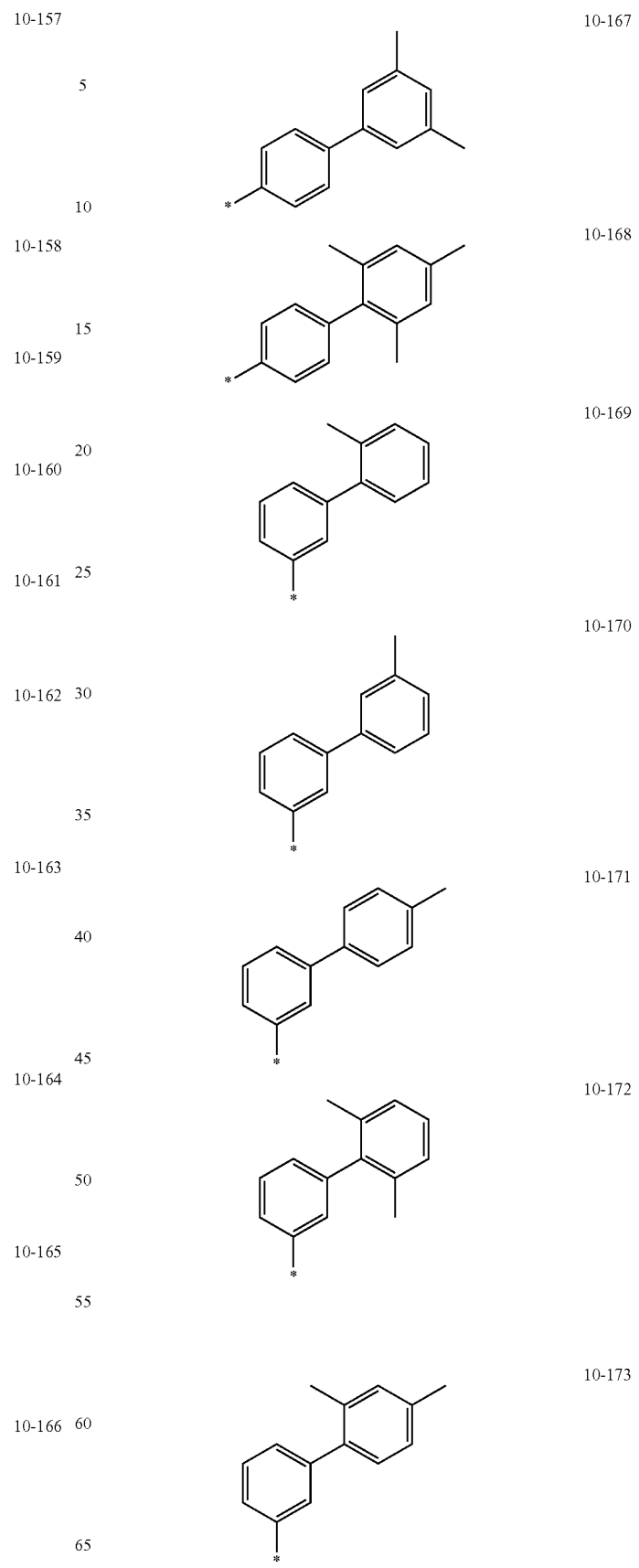

10-174 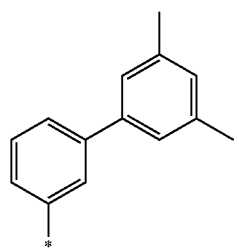
10-175 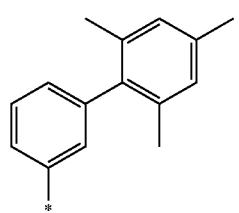
10-176 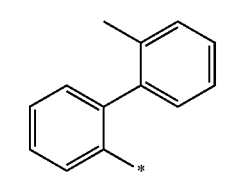
10-177 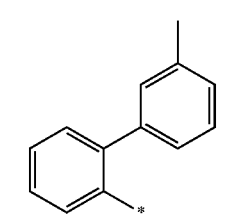
10-178 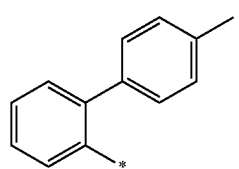
10-179 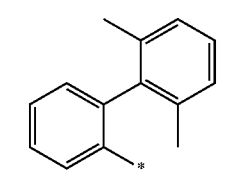
10-180 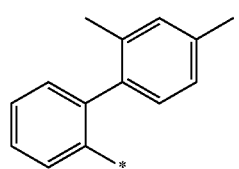
10-181 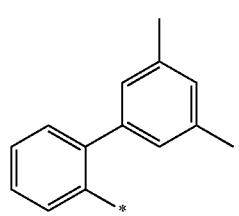
10-182 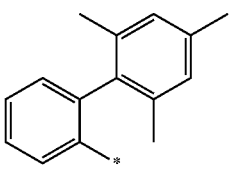
10-183 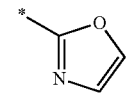
10-184 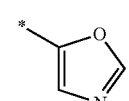
10-185 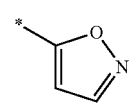
10-186 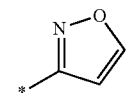
10-187 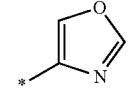
10-188 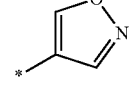
10-189 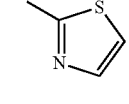
10-190 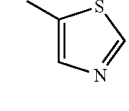
10-191 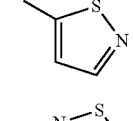
10-192 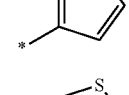
10-193 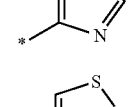
10-194 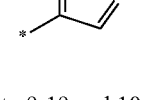
In Formulae 9-1 to 9-19 and 10-1 to 10-194, Ph indicates a phenyl group, TMS indicates a trimethylsilyl group, and * indicates a binding site to a neighboring atom.
In an embodiment, at least one of $R_1$ to $R_4$ in Formula 1 may not be hydrogen.

In Formula 1, a1 to a4 respectively indicate the number of groups $R_1$ to $R_4$, and may each independently be an integer from 0 to 20 (for example, an integer from 0 to 5). When a1 is two or more, two or more groups $R_1$ may be identical to or different from each other, when a2 is two or more, two or more groups $R_2$ may be identical to or different from each other, when a3 is two or more, two or more groups $R_3$ may be identical to or different from each other, and when a4 is two or more, two or more groups $R_4$ may be identical to or different from each other.

In one or more embodiments, in Formula 1, ring $CY_2$ may be a group represented by Formula A2-1' or A2-2', ring $CY_3$ may be a group represented by Formula A3-1', A3-2', or A3-3', ring $CY_4$ may be a group represented by Formula A4-1' or A4-3', and the organometallic compound may satisfy at least one Condition 1 to Condition 3:

Condition 1 ring $CY_2$ is a group represented by Formula A2-2';

Condition 2 ring $CY_3$ is a group represented by Formula A3-2' or A3-3'; and

Condition 3 ring $CY_4$ is a group represented by Formula A4-3'.

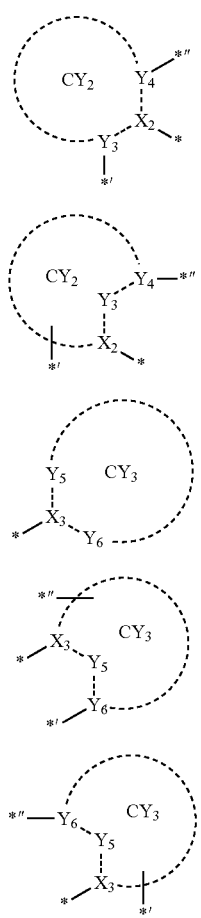

A2-1'

A2-2'

A3-1'

A3-2'

A3-3'

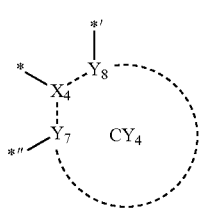

A4-1'

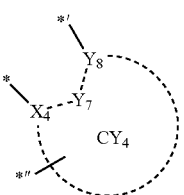

A4-3'

In Formulae A2-1', A2-2', A3-1', A3-2', A3-3', A4-1', and A4-3', $X_2$ to $X_4$ and ring $CY_2$ to ring $CY_4$ may each independently be the same as described herein, $Y_3$ to $Y_8$ may each independently be N, B, P, C, or Si, in Formulae A2-1' and A2-2', i) a bond between $X_2$ and $Y_3$, a bond between $X_2$ and $Y_4$ and a bond between $Y_3$ and $Y_4$ may each independently be a single bond or a double bond; or ii) $Y_3$, $X_2$, and $Y_4$ may form a carbene group, *'' indicates a binding site to ring $CY_{12}$ in Formula 1, * indicates a binding site to M in Formula 1, and *''' indicates a binding site to $T_1$ in Formula 1, and in Formula A3-1', A3-2', and A3-3', i) a bond between $X_3$ and $Y_5$, a bond between $X_3$ and $Y_6$ and a bond between $Y_5$ and $Y_6$ may each independently be a single bond or a double bond; or ii) $Y_5$, $X_3$, and $Y_6$ may form a carbene group, *''' indicates a binding site to $T_1$ in Formula 1, * indicates a binding site to M in Formula 1, and *' indicates a binding site to $T_2$ in Formula 1, in Formula A4-1' and A4-3', i) a bond between $X_4$ and $Y_7$, a bond between $X_4$ and $Y_8$ and a bond between $Y_7$ and $Y_8$ may each independently be a single bond or a double bond; or ii) $Y_7$, $X_4$, and $Y_8$ may form a carbene group, *' indicates a binding site to $T_2$ in Formula 1, * indicates a binding site to M in Formula 1, and *''' indicates a binding site to ring $CY_{11}$ in Formula 1.

In one or more embodiments, in Formula 1, i) ring $CY_2$ may be a group represented by Formula A2-2', and $T_1$ may be a single bond;

ii) ring $CY_3$ may be a group represented by Formula A3-2', and $T_2$ may be a single bond;

iii) ring $CY_3$ may be a group represented by Formula A3-3', and $T_1$ may be a single bond; or iv) ring $CY_4$ may be a group represented by Formula A4-3', and $T_2$ may be a single bond, but embodiments of the present disclosure are not limited thereto.

In one or more embodiments, in Formula 1, ring $CY_2$ may be a group represented by Formula A2-1',
ring $CY_3$ may be a group represented by Formula A3-1',
ring $CY_4$ may be a group represented by Formula A4-3', and $T_2$ may be a single bond, but embodiments of the present disclosure are not limited thereto.

In one or more embodiments, i) ring $CY_2$ may be a group represented by Formula A2-1', $T_1$ may be a single bond, ring $CY_3$ may be a group represented by Formula A3-1', $T_2$ may not be a single bond, and ring $CY_4$ may be a group represented by Formula A4-1'; or ii) ring $CY_2$ may be a group represented by Formula A2-1', $T_1$ may be a single bond, ring $CY_3$ may be a group represented by Formula A3-1', $T_2$ may be a single bond, and ring $CY_4$ may be a group represented by Formula A4-3', but embodiments of the present disclosure are not limited thereto.

In one or more embodiments, the group represented by Formula A2-2' may be a group represented by Formula A2-2, the group represented by Formula A3-2' may be a group represented by Formula A3-2, the group represented by represented by Formula A3-3' may be a group represented by Formula A3-3, and the group represented by Formula A4-3' may be a group represented by Formula A4-3, but embodiments of the present disclosure are not limited thereto:

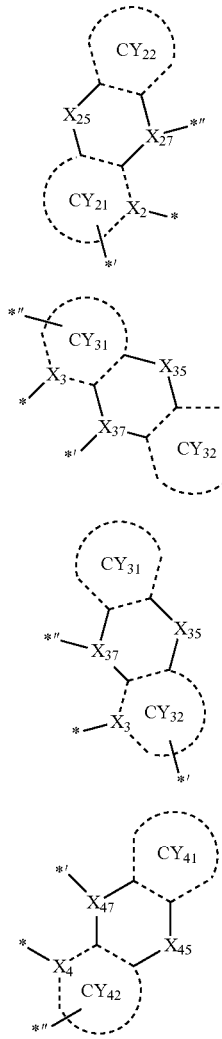

A2-2

A3-2

A3-3

A4-3

In Formula A2-2, ring $CY_{21}$ and ring $CY_{22}$ may each independently be defined as ring $CY_{11}$, $X_{25}$ may be a single bond, O, S, Se, $N(R_{25})$, $C(R_{25})(R_{26})$, or $Si(R_{25})(R_{26})$, $X_{27}$ may be N, B, P, $C(R_{27})$, or $Si(R_{27})$, $X_2$, *', *, and *'' may each independently be defined as $X_2$, *'', *, and *''' in Formula A2-2', and $R_{25}$ to $R_{27}$ may each independently be defined as $R_2$, in Formulae A3-2 and A3-3, ring $CY_{31}$ and ring $CY_{32}$ may each independently be defined as ring $CY_{11}$, $X_{35}$ may be a single bond, O, S, Se, $N(R_{35})$, $C(R_{35})(R_{36})$, or $Si(R_{35})(R_{36})$, $X_{37}$ may be N, B, P, $C(R_{37})$, or $Si(R_{37})$, $X_3$, *'', *, and *''' may each independently be defined as $X_3$, *''', *, and *'' in Formula A3-2', and $R_{35}$ to $R_{37}$ may each independently be defined as $R_3$, and in Formula A4-3, ring $CY_{41}$ and ring $CY_{42}$ may each independently be defined as ring $CY_{11}$, $X_{45}$ may be a single bond, O, S, Se, $N(R_{45})$, $C(R_{45})(R_{46})$, or $Si(R_{45})(R_{46})$, $X_{47}$ may be N, B, P, $C(R_{47})$, or $Si(R_{47})$, $X_4$, *', *, and *'' may each independently be defined as $X_4$, *', *, and *'' in Formula A4-3', and $R_{45}$ to $R_{47}$ may each independently be defined as $R_4$.

For example, a moiety represented by

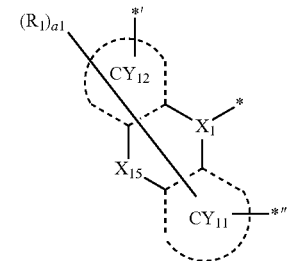

in Formula 1 may be selected from groups represented by Formulae A1-1(1) to A1-1(11):

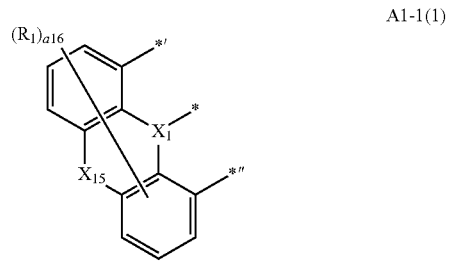

A1-1(1)

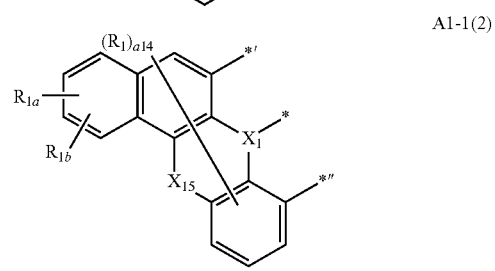

A1-1(2)

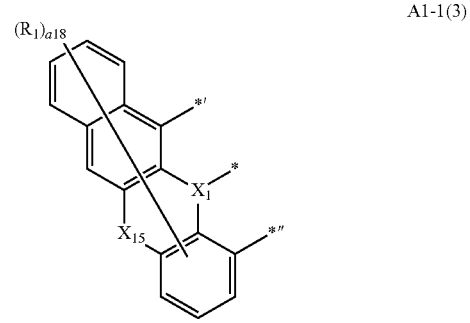

A1-1(3)

A1-1(4) 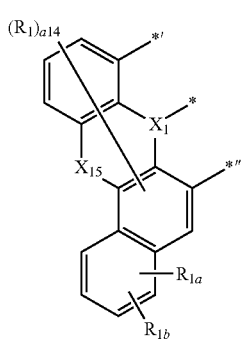

A1-1(5) 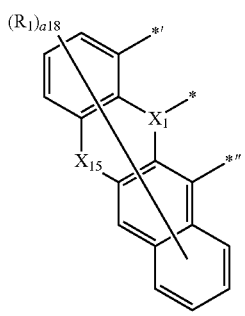

A1-1(6) 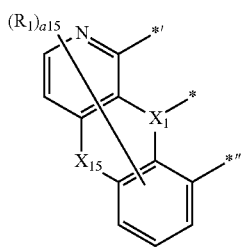

A1-1(7) 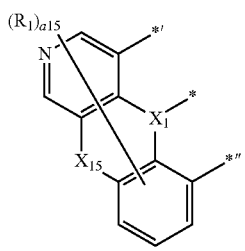

A1-1(8) 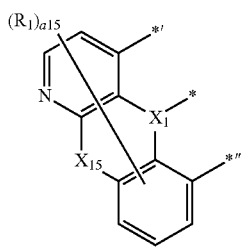

A1-1(9) 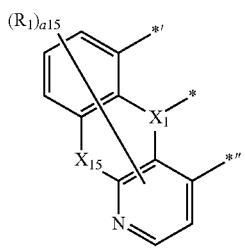

A1-1(10) 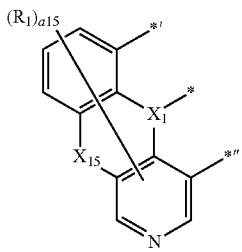

A1-1(11) 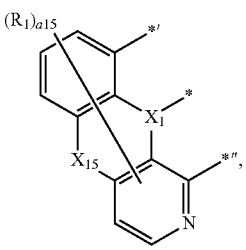

In Formulae A1-1(1) to A1-1(11), $X_1$, $X_{15}$, and $R_1$ may each independently be the same as described herein, $R_{1a}$ and $R_{1b}$ may each independently be defined as $R_1$, a18 may be an integer from 0 to 8, a16 may be an integer from 0 to 6, a15 may be an integer from 0 to 5, a14 may be an integer from 0 to 4,

*″ indicates a binding site to ring $CY_4$ in Formula 1,

* indicates a binding site to M in Formula 1, and

*′ indicates a binding site to ring $CY_2$ in Formula 1.

In an embodiment, a moiety represented by

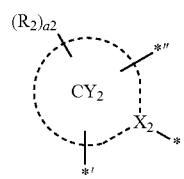

in Formula 1 may be selected from groups represented by Formulae A2-1(1) to A2-1(21) and A2-2(1) to A2-2(58):

A2-1(1) 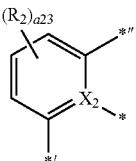

A2-1(2) 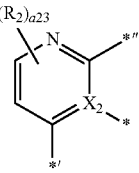

-continued
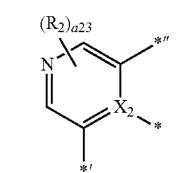
A2-1(3)
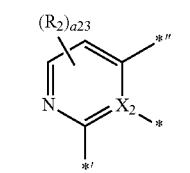
A2-1(4)
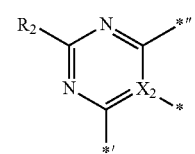
A2-1(5)
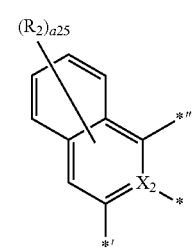
A2-1(6)
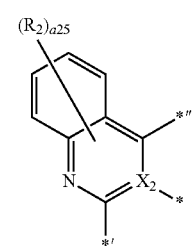
A2-1(7)
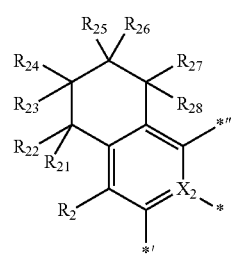
A2-1(8)
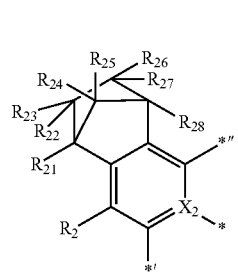
A2-1(9)
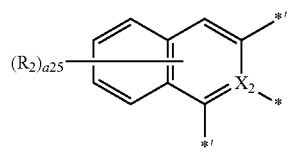
A2-1(10)
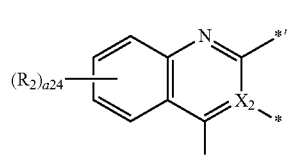
A2-1(11)
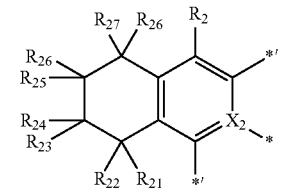
A2-1(12)
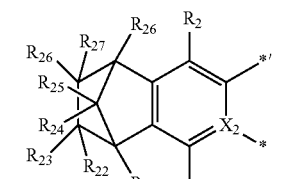
A2-1(13)
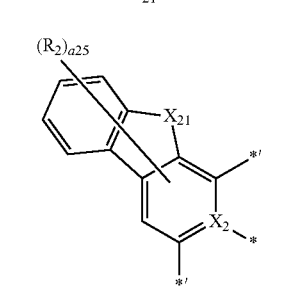
A2-1(14)
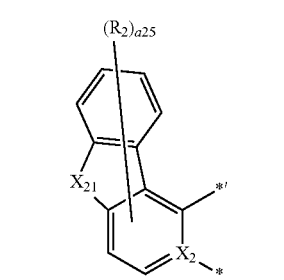
A2-1(15)
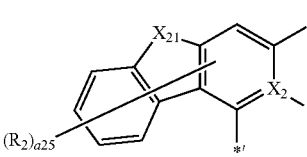
A2-1(16)
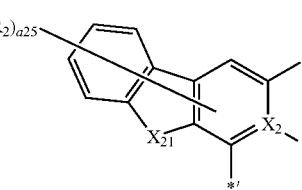
A2-1(17)

-continued
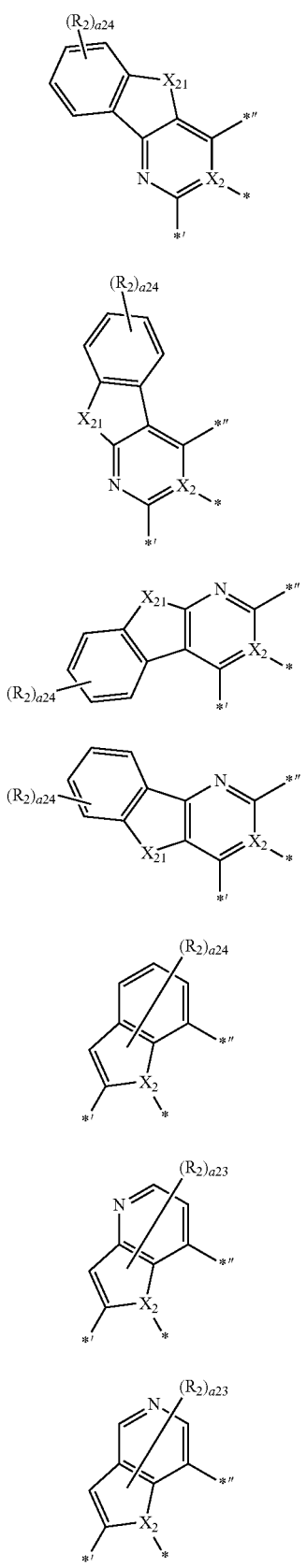
A2-1(18)
A2-1(29)
A2-1(20)
A2-1(21)
A2-2(1)
A2-2(2)
A2-2(3)
-continued
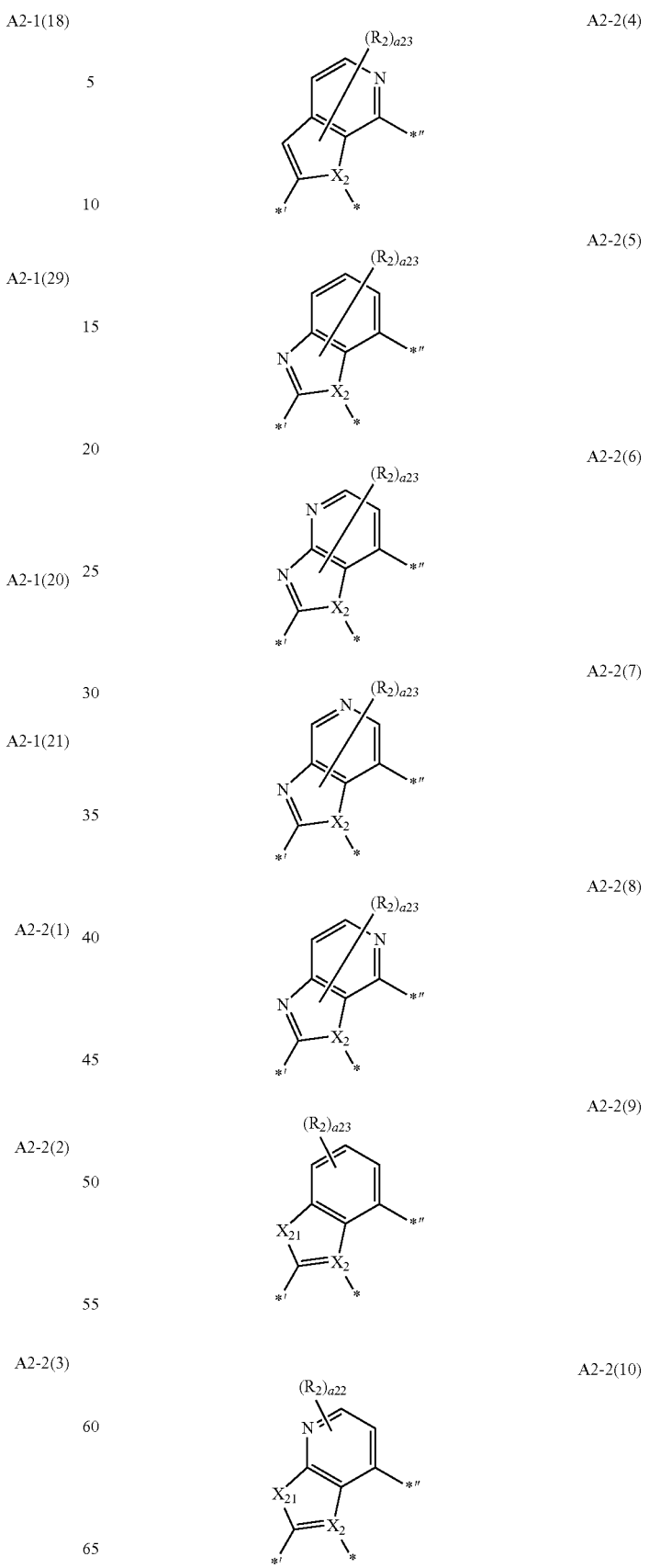
A2-2(4)
A2-2(5)
A2-2(6)
A2-2(7)
A2-2(8)
A2-2(9)
A2-2(10)

-continued
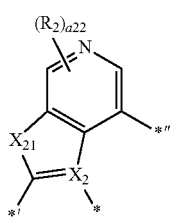
A2-2(11)
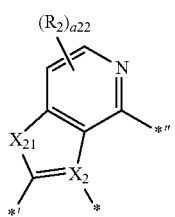
A2-2(12)
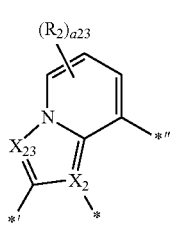
A2-2(13)
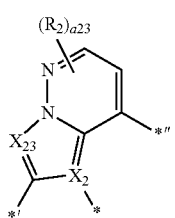
A2-2(14)
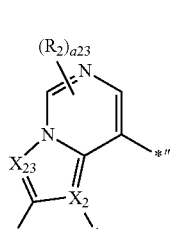
A2-2(15)
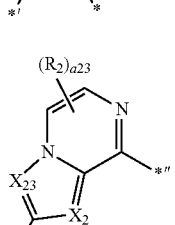
A2-2(16)
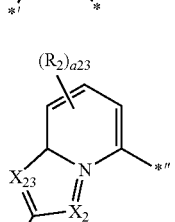
A2-2(17)
-continued
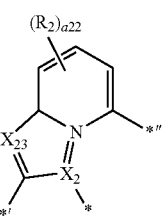
A2-2(18)
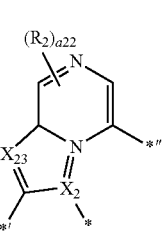
A2-2(19)
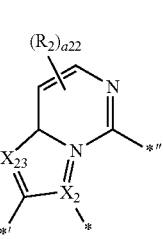
A2-2(20)
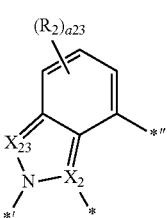
A2-2(21)
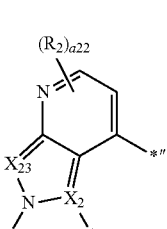
A2-2(22)
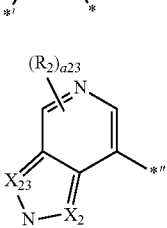
A2-2(23)
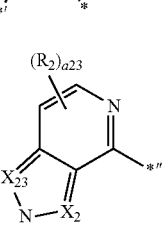
A2-(24)

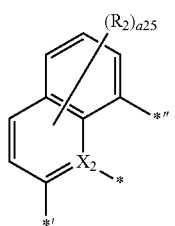 A2-2(25)
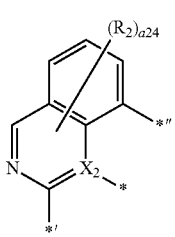 A2-2(26)
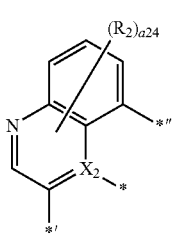 A2-2(27)
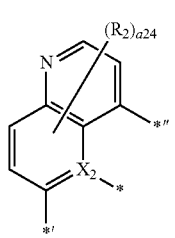 A2-2(28)
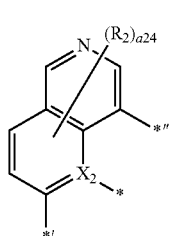 A2-2(29)
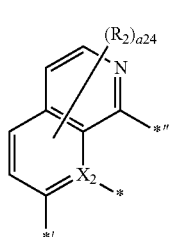 A2-2(30)
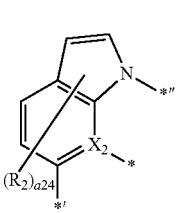 A2-2(31)
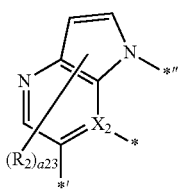 A2-2(32)
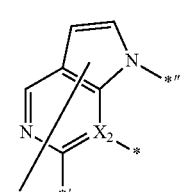 A2-2(33)
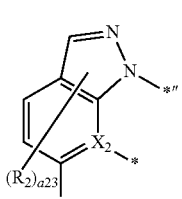 A2-2(34)
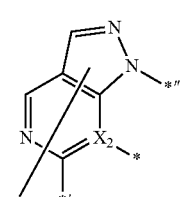 A2-2(35)
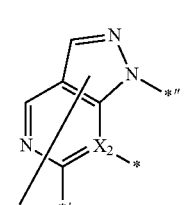 A2-2(36)
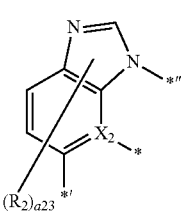 A2-2(37)
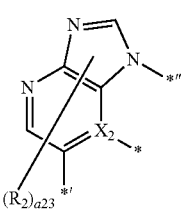 A2-2(38)

-continued
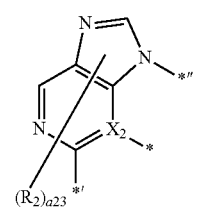
A2-2(39)
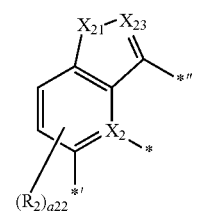
A2-2(40)
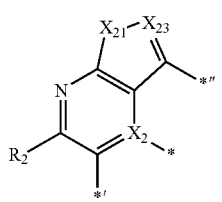
A2-2(41)
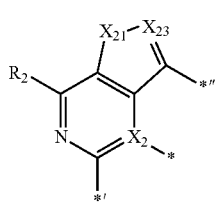
A2-2(42)
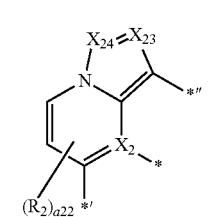
A2-2(43)
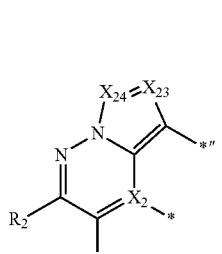
A2-2(44)
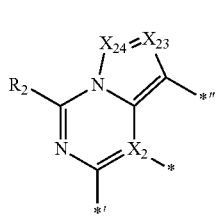
A2-2(45)
-continued
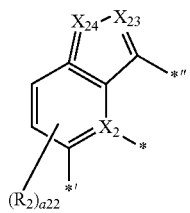
A2-2(46)
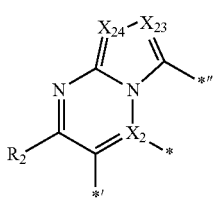
A2-2(47)
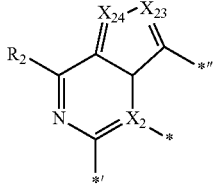
A2-2(48)
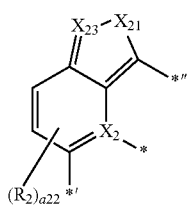
A2-2(49)
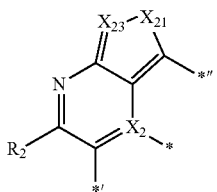
A2-2(50)
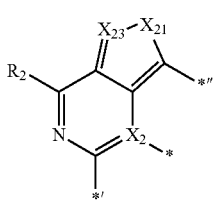
A2-2(51)
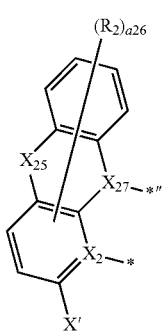
A2-2(52)

A2-2(53)
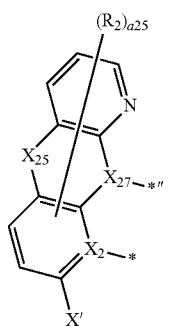

A2-2(54)
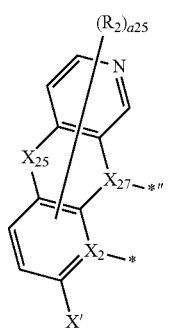

A2-2(55)
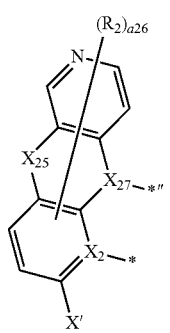

A2-2(56)
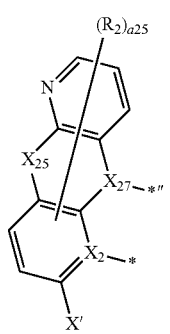

A2-2(57)
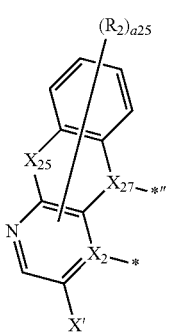

A2-2(58)
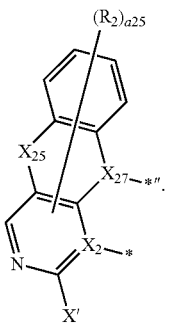

In Formulae A2-1(1) to A2-1(21) and A2-1(1) to A2-2(58), $X_2$ and $R_2$ may each independently be the same as described herein, $X_{21}$ may be O, S, Se, $N(R_{21})$, $C(R_{21})(R_{22})$, or $Si(R_{21})(R_{22})$, $X_{23}$ may be N or $C(R_{23})$, $X_{24}$ may be N or $C(R_{24})$, $X_{25}$ may be a single bond, O, S, Se, $N(R_{25})$, $C(R_{25})(R_{26})$, or $Si(R_{25})(R_{26})$ (for example, a single bond), $X_{27}$ may be N, B, P, $C(R_{27})$, or $Si(R_{27})$, $R_{21}$ to $R_{28}$ may each independently be defined as $R_2$, a26 may be integer from 0 to 6, a25 may be integer from 0 to 5, a24 may be integer from 0 to 4, a23 may be integer from 0 to 3, a22 may be integer from 0 to 2,

*' indicates a binding site to ring $CY_{12}$ in Formula 1,

* indicates a binding site to M in Formula 1, and

*'' indicates a binding site to $T_1$ in Formula 1.

In an embodiment, a moiety represented by

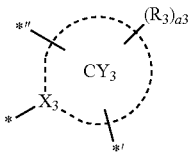

in Formula 1 may be selected from groups represented by Formulae A3-1(1) to A3-1(21), A3-2(1) to A3-2(58), and A3-3(1) to A3-3(58):

A3-1(1)
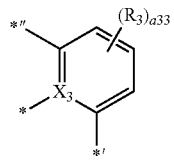

A3-1(2)
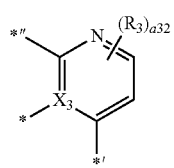

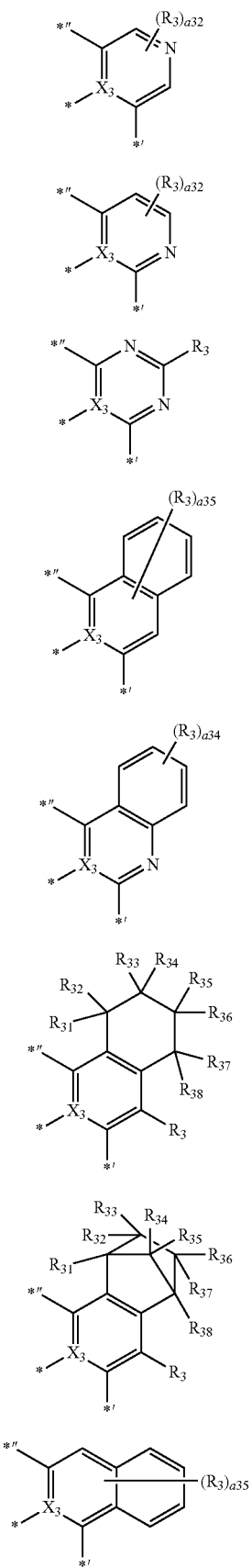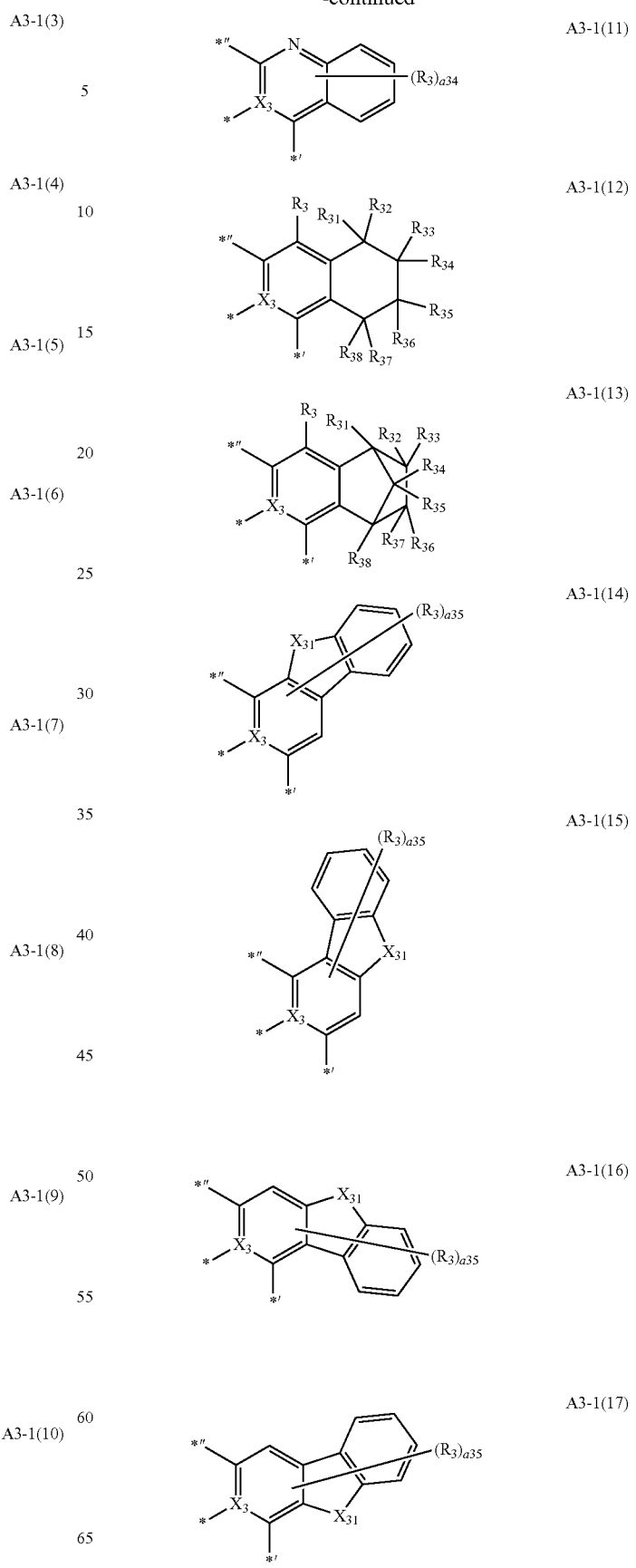

-continued
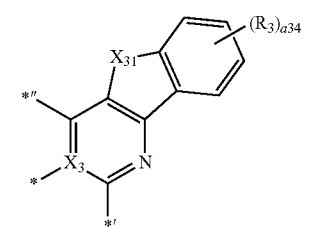 A3-1(18)
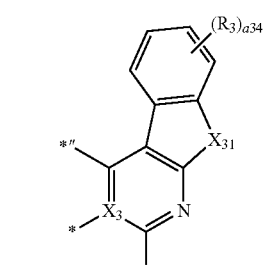 A3-1(19)
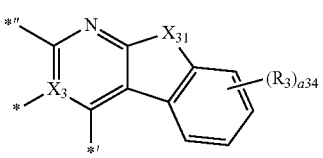 A3-1(20)
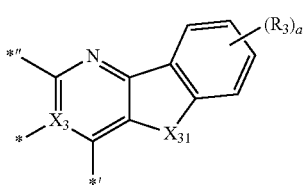 A3-1(21)
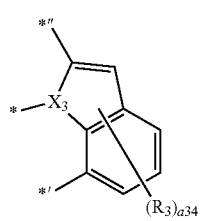 A3-2(1)
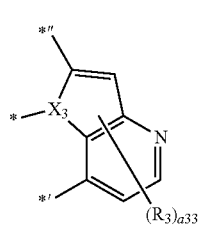 A3-2(2)
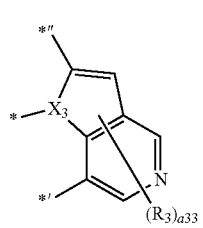 A3-2(3)
-continued
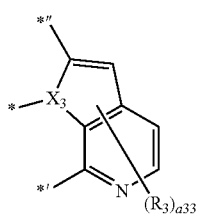 A3-2(4)
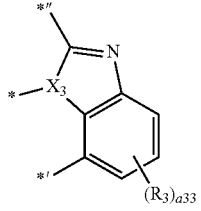 A3-2(5)
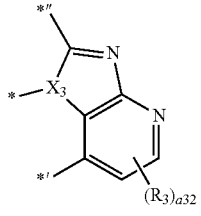 A3-2(6)
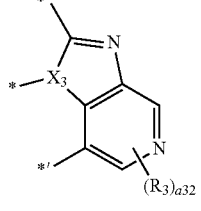 A3-2(7)
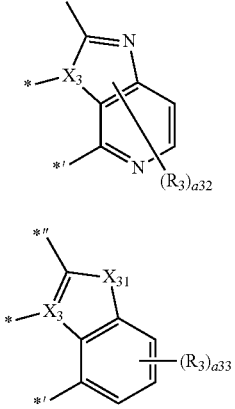 A3-2(8)
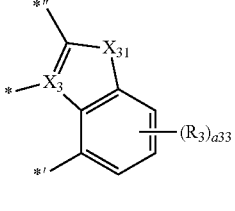 A3-2(9)
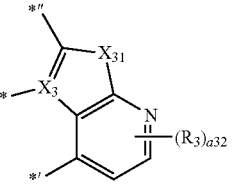 A3-2(10)

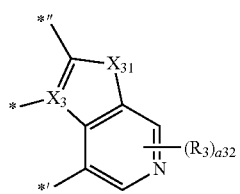
A3-2(11)
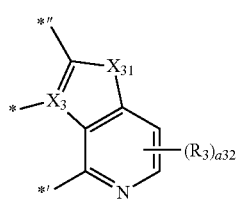
A3-2(12)
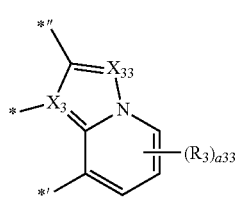
A3-2(13)
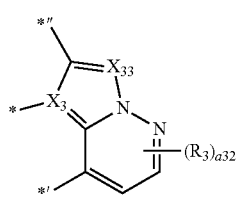
A3-2(14)
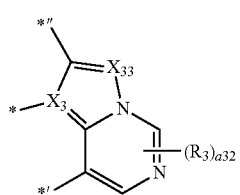
A3-2(15)
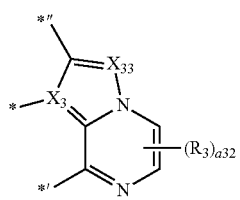
A3-2(16)
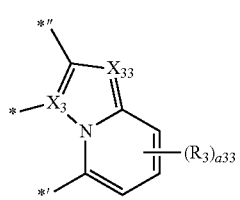
A3-2(17)
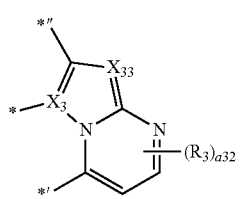
A3-2(18)
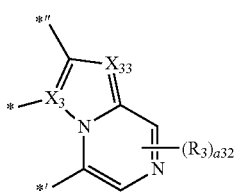
A3-2(19)
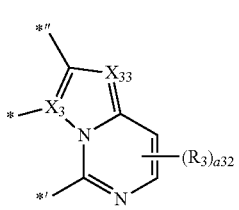
A3-2(20)
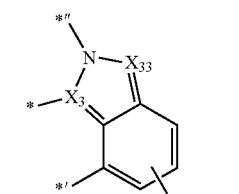
A3-2(21)
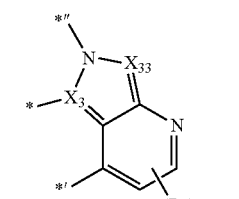
A3-2(22)
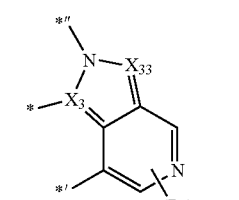
A3-2(23)
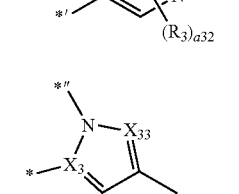
A3-2(24)
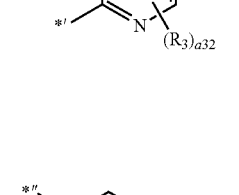
A3-2(24)
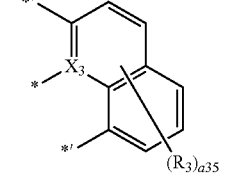
A3-2(25)

-continued
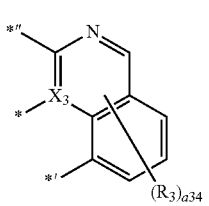 A3-2(26)
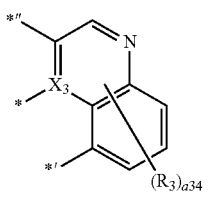 A3-2(27)
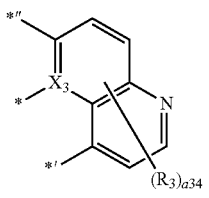 A3-2(28)
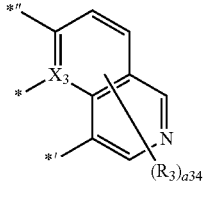 A3-2(29)
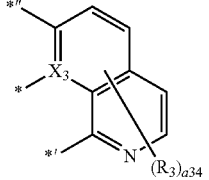 A3-2(30)
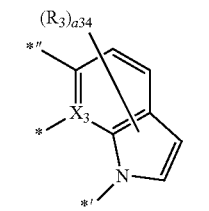 A3-2(31)
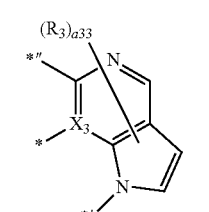 A3-2(32)
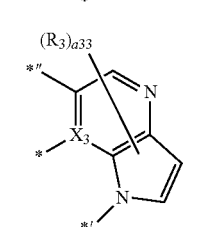 A3-2(33)
-continued
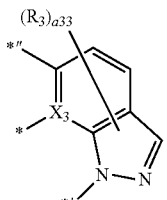 A3-2(34)
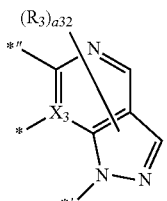 A3-2(35)
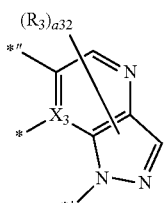 A3-2(36)
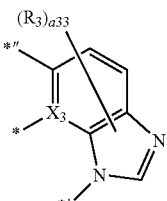 A3-2(37)
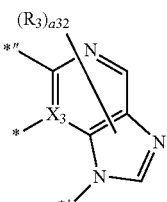 A3-2(38)
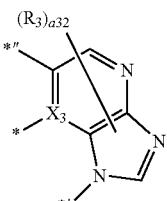 A3-2(39)
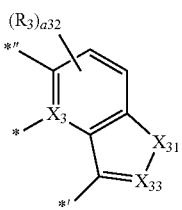 A3-2(40)

-continued

A3-2(41)

A3-2(42)

A3-2(43)

A3-2(44)

A3-2(45)

A3-2(46)

A3-2(47)

-continued

A3-2(48)

A3-2(49)

A3-2(50)

A3-2(51)

A3-2(52)

A3-2(53)

A3-2(54)

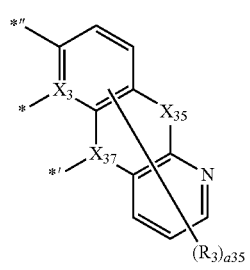 A3-2(55)
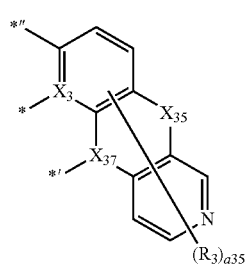 A3-2(56)
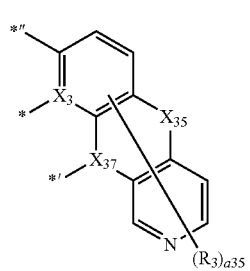 A3-2(57)
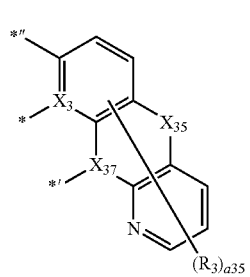 A3-2(58)
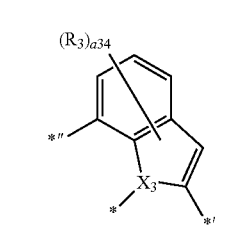 A3-3(1)
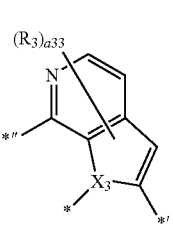 A3-3(2)
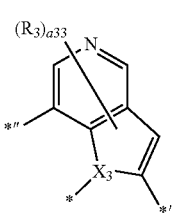 A3-3(3)
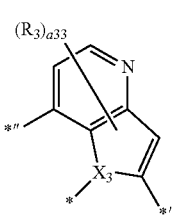 A3-3(4)
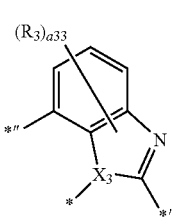 A3-3(5)
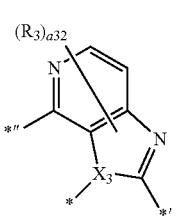 A3-3(6)
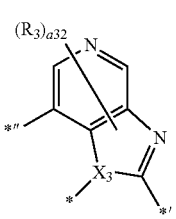 A3-3(7)
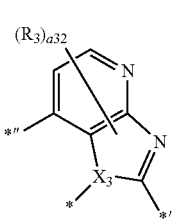 A3-3(8)
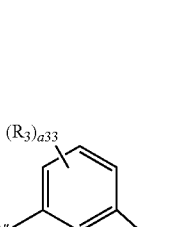 A3-3(9)

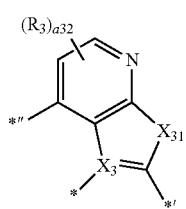 A3-3(10)
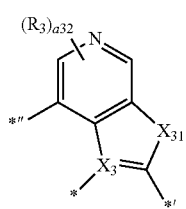 A3-3(11)
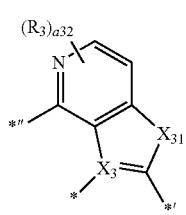 A3-3(12)
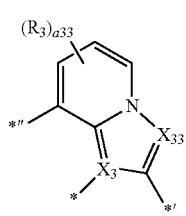 A3-3(13)
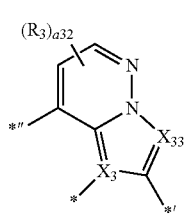 A3-3(14)
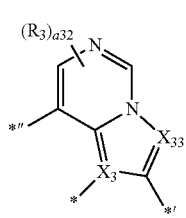 A3-3(15)
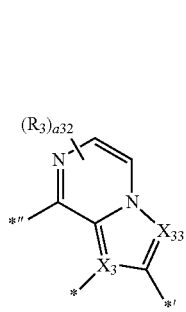 A3-3(16)
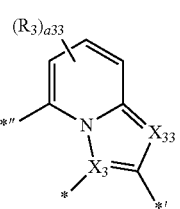 A3-3(17)
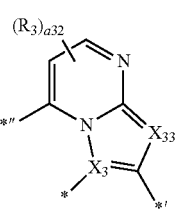 A3-3(18)
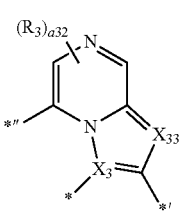 A3-3(19)
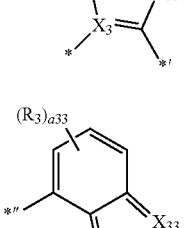 A3-3(20)
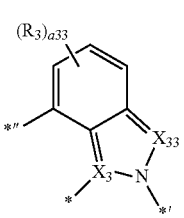 A3-3(21)
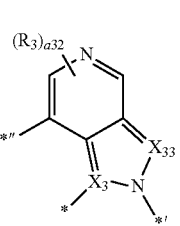 A3-3(22)
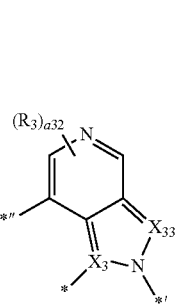 A3-3(23)

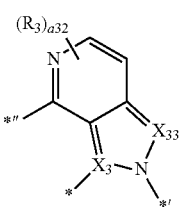 A3-3(24)
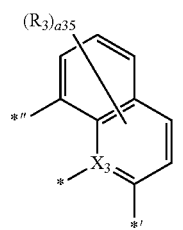 A3-3(25)
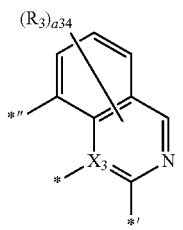 A3-3(26)
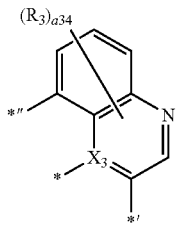 A3-3(27)
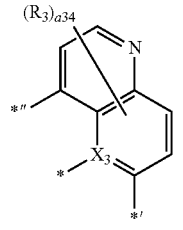 A3-3(28)
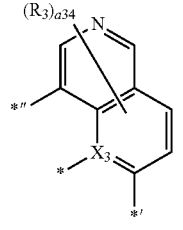 A3-3(29)
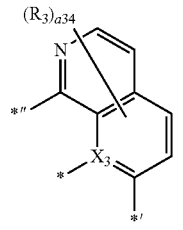 A3-3(30)
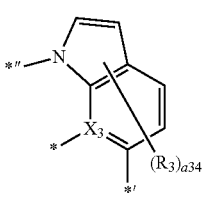 A3-3(31)
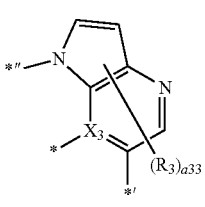 A3-3(32)
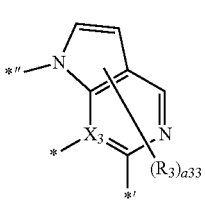 A3-3(33)
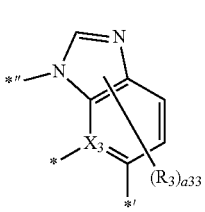 A3-3(34)
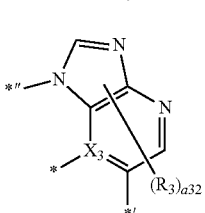 A3-3(35)
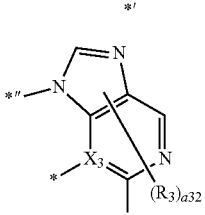 A3-3(36)
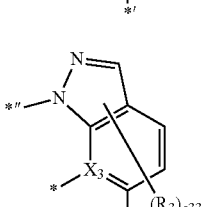 A3-3(37)
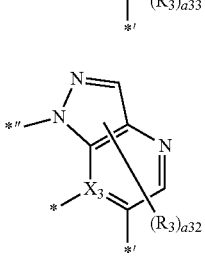 A3-3(38)

-continued
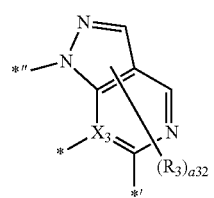 A3-3(39)
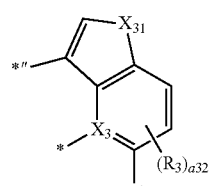 A3-3(40)
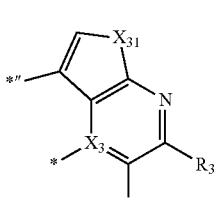 A3-3(41)
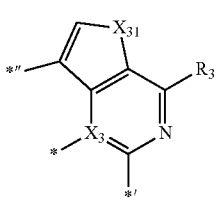 A3-3(42)
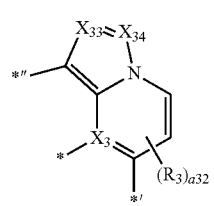 A3-3(43)
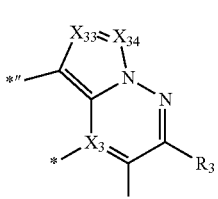 A3-3(44)
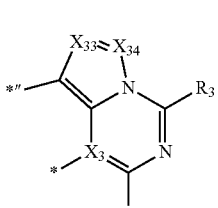 A3-3(45)
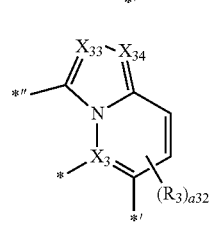 A3-3(46)
-continued
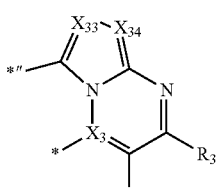 A3-3(47)
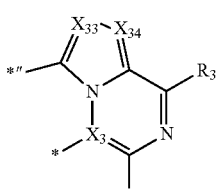 A3-3(48)
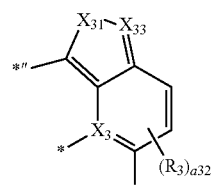 A3-3(49)
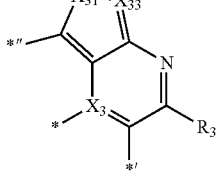 A3-3(50)
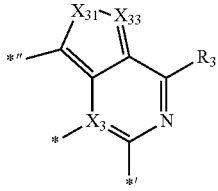 A3-3(51)
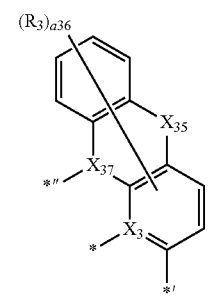 A3-3(52)
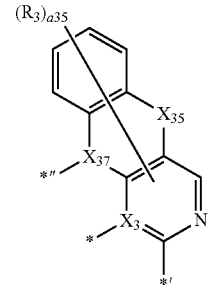 A3-3(53)

-continued

A3-3(54)
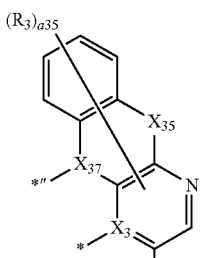

A3-3(55)
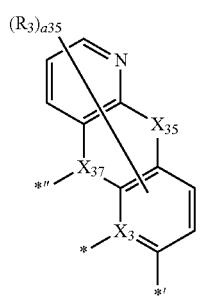

A3-3(56)
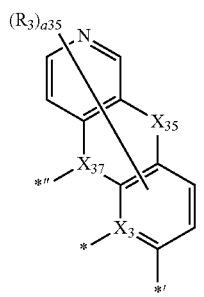

A3-3(57)
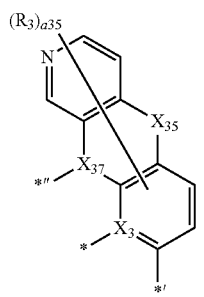

A3-3(58)
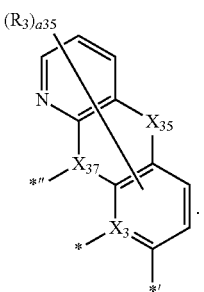

In Formulae A3-1(1) to A3-1(21), A3-2(1) to A3-2(58), and A3-3(1) to A3-3(58), $X_3$ and $R_3$ may each independently be the same as described herein, $X_{31}$ may be O, S, Se, $N(R_{31})$, $C(R_{31})(R_{32})$, or $Si(R_{31})(R_{32})$, $X_{33}$ may be N or $C(R_{33})$, $X_{34}$ may be N or $C(R_{34})$, $X_{35}$ may be a single bond, O, S, Se, $N(R_{35})$, $C(R_{35})(R_{36})$, or $Si(R_{35})(R_{36})$ (for example, a single bond), $X_{37}$ may be N, B, P, $C(R_{37})$, or $Si(R_{37})$, $R_{31}$ to $R_{38}$ may each independently be defined as $R_3$, a36 may be an integer from 0 to 6, a35 may be an integer from 0 to 5, a34 may be an integer from 0 to 4, a33 may be an integer from 0 to 3, a32 may be an integer from 0 to 2,

*" indicates a binding site to $T_1$ in Formula 1,

* indicates a binding site to M in Formula 1, and

*' indicates a binding site to $T_2$ in Formula 1.

In an embodiment, a moiety represented by

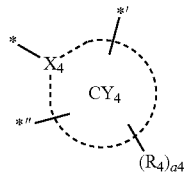

in Formula 1 may be selected from groups represented by Formulae A4-1(1) to A4-1(21) and A4-3(1) to A4-3(61):

A4-1(1)
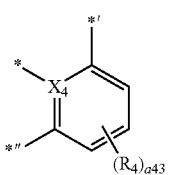

A4-1(2)
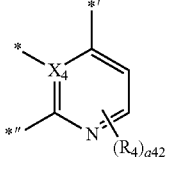

A4-1(3)
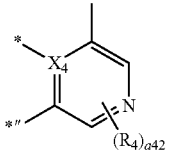

A4-1(4)
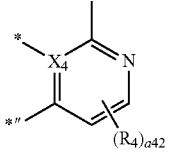

A4-1(5)
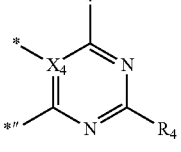

-continued

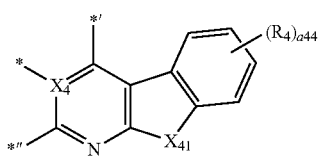
A4-1(20)
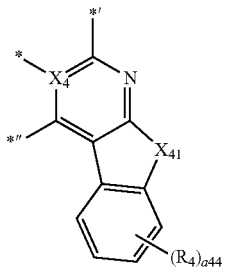
A4-1(21)
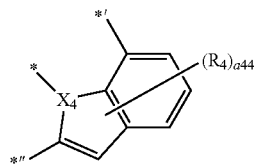
A4-3(1)
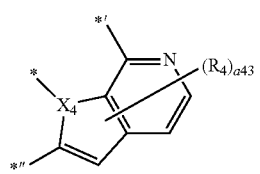
A4-3(2)
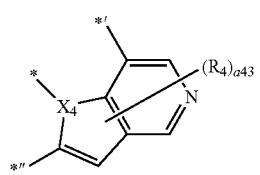
A4-3(3)
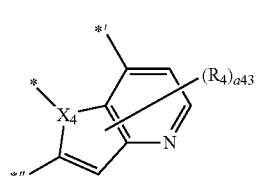
A4-3(4)
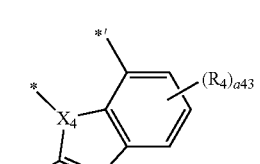
A4-3(5)
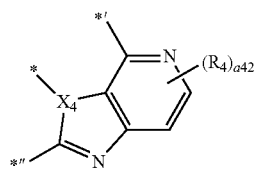
A4-3(6)
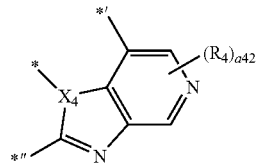
A4-3(7)
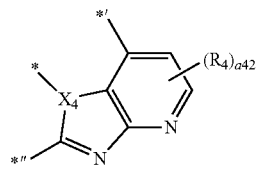
A4-3(8)
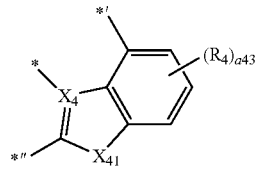
A4-3(9)
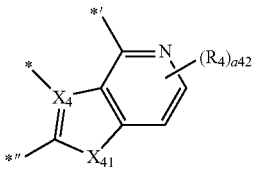
A4-3(10)
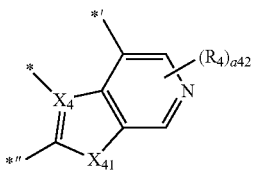
A4-3(11)
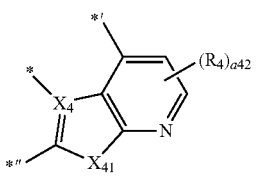
A4-3(12)
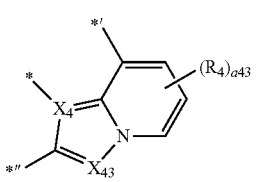
A4-3(13)
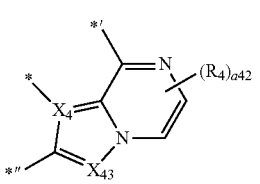
A4-3(14)
A4-3(15)

75
-continued
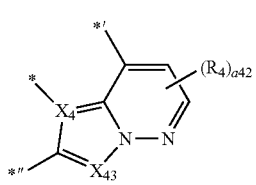 A4-3(16)
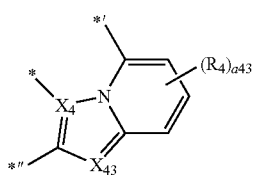 A4-3(17)
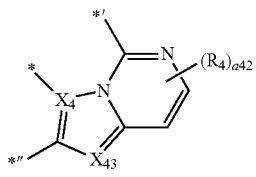 A4-3(18)
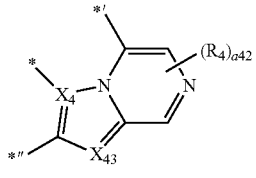 A4-3(19)
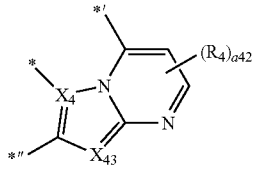 A4-3(20)
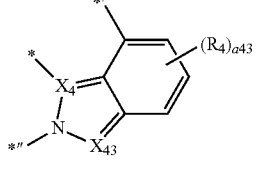 A4-3(21)
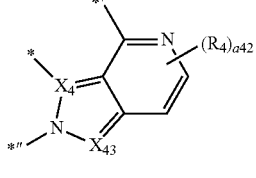 A4-3(22)
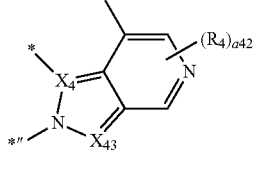 A4-3(23)
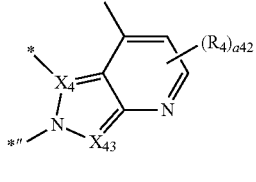 A4-3(24)
76
-continued
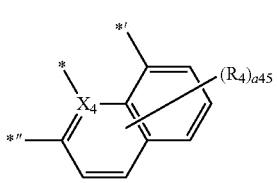 A4-3(25)
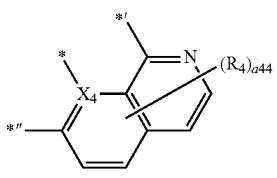 A4-3(26)
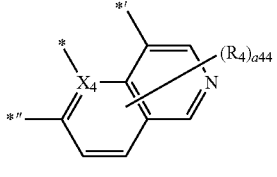 A4-3(27)
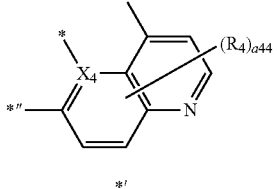 A4-3(28)
A4-3(29)
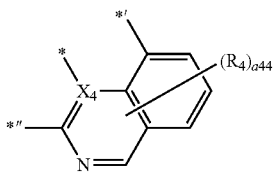 A4-3(30)
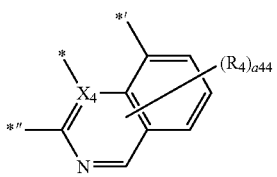 A4-3(30)
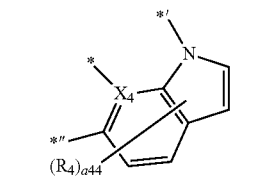 A4-3(31)
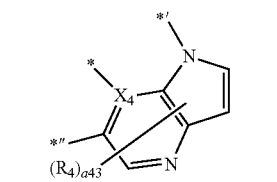 A4-3(32)

-continued
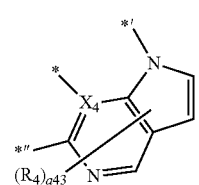
A4-3(33)
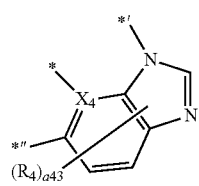
A4-3(34)
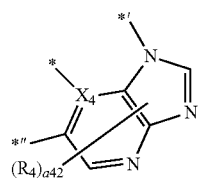
A4-3(35)
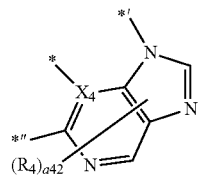
A4-3(36)
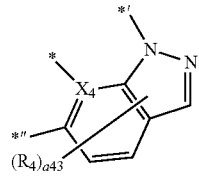
A4-3(37)
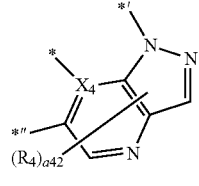
A4-3(38)
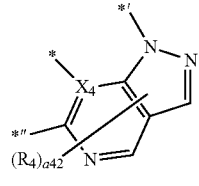
A4-3(39)
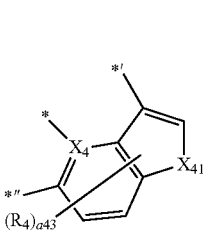
A4-3(40)
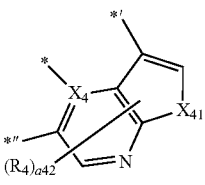
A4-3(41)
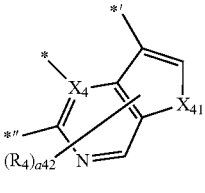
A4-3(42)
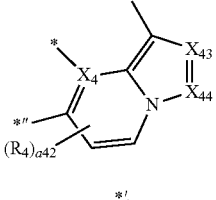
A4-3(43)
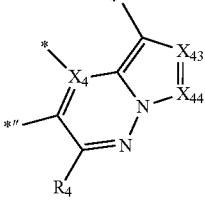
A4-3(44)
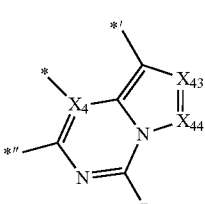
A4-3(45)
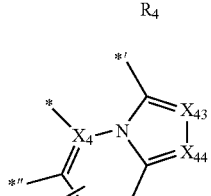
A4-3(46)
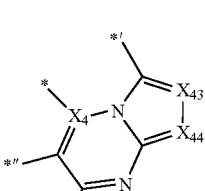
A4-3(47)
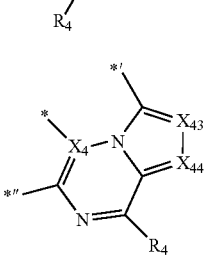
A4-3(48)

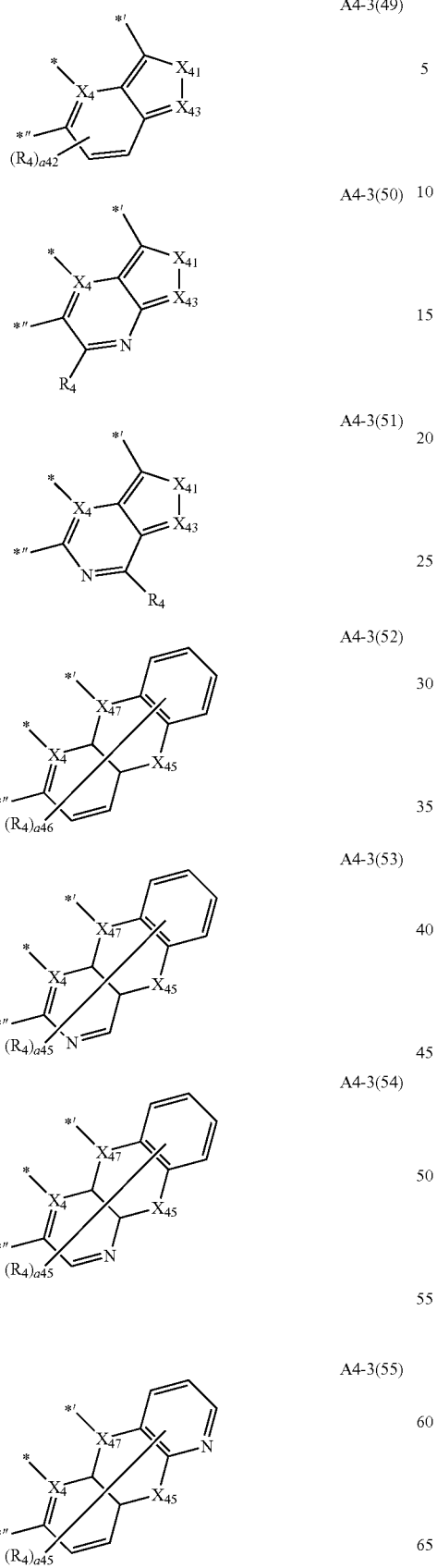
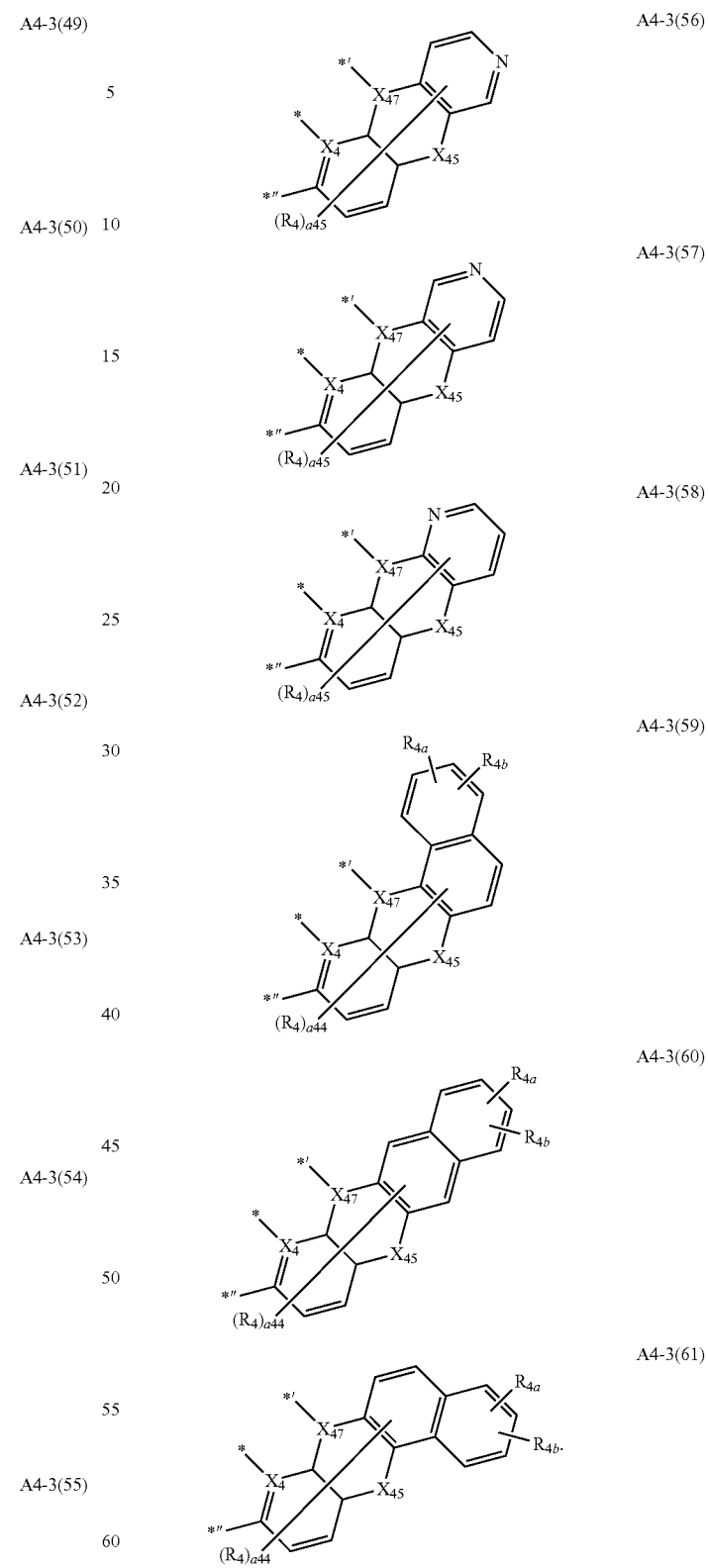
In Formulae A4-1 (1) to A4-1(21) and A4-3(1) to A4-3 (61),
$X_4$ and $R_4$ may each independently be the same as described herein, $X_{41}$ may be O, S, Se, $N(R_{41})$, $C(R_{41})(R_{42})$, or $Si(R_{41})(R_{42})$, $X_{43}$ may be N or $C(R_{43})$, $X_{44}$ may be N or $C(R_{44})$, $X_{45}$ may be a single bond, O, S, Se, $N(R_{45})$, $C(R_{45})(R_{46})$, or $Si(R_{45})(R_{46})$ (for example, a single bond), $X_{47}$ may be N, B, P, $C(R_{47})$, or $Si(R_{47})$, $R_{41}$ to $R_{48}$, $R_{4a}$ and $R_{4b}$ may each independently be defined as $R_4$, a46 may be an integer from 0 to 6, a45 may be an integer from 0 to 5, a44 may be an integer from 0 to 4, a43 may be an integer from 0 to 3, a42 may be an integer from 0 to 2,

*' indicates a binding site to $T_2$ in Formula 1,

* indicates a binding site to M in Formula 1, and

*''' indicates a binding site to ring $CY_{11}$ in Formula 1.

In one or more embodiments, in Formula 1, a moiety represented by

[structure showing $CY_{12}$, $X_1$, $X_{15}$, $CY_{11}$ with $(R_1)_{a1}$]

may be selected from groups represented by Formulae CY1-1 to CY1-4, and/or a moiety represented by

[structure showing $CY_2$, $X_2$ with $(R_2)_{a2}$]

may be selected from groups represented by Formulae CY2-1 to CY2-23, and/or a moiety represented by

[structure showing $CY_3$, $X_3$ with $(R_3)_{a3}$]

may be selected from groups represented by Formulae CY3-1 to CY3-23, and/or a moiety represented by

[structure showing $CY_4$, $X_4$ with $(R_4)_{a4}$]

may be selected from groups represented by Formulae CY4-1 to CY4-26, but embodiments of the present disclosure are not limited thereto:

CY1-1

[structure]

CY1-2

[structure with $R_1$]

CY1-3

[structure with $R_1$]

CY1-4

[structure with $R_{1a}$, $R_{1b}$]

CY2-1

[structure]

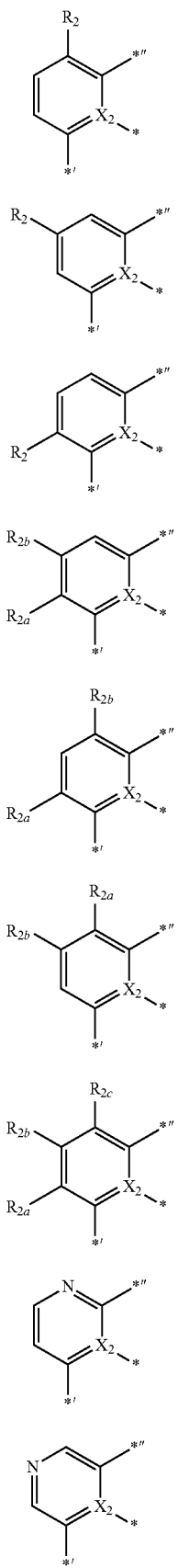
CY2-2
CY2-3
CY2-4
CY2-5
CY2-6
CY2-7
CY2-8
CY2-9
CY2-10
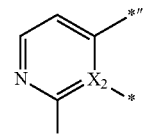
CY2-11
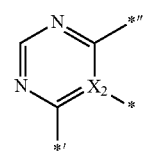
CY2-12
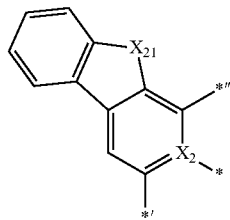
CY2-13
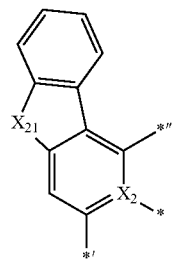
CY2-14
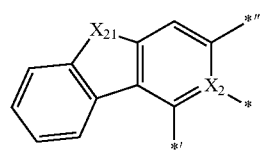
CY2-15
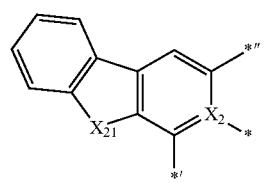
CY2-16
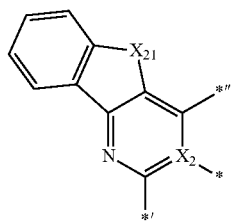
CY2-17
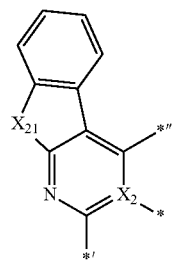
CY2-18

-continued
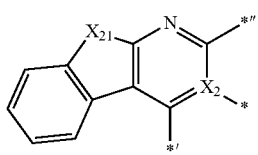
CY2-19
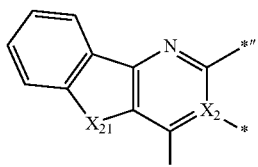
CY2-20
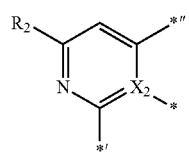
CY2-21
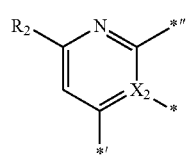
CY2-22
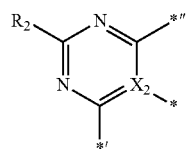
CY2-23
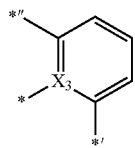
CY3-1
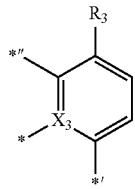
CY3-2
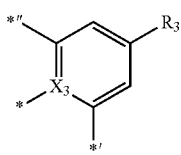
CY3-3
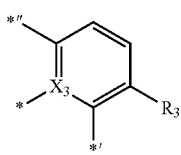
CY3-4
-continued
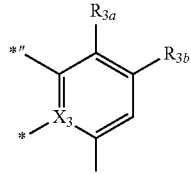
CY3-5
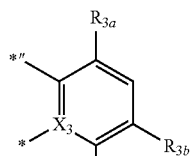
CY3-6
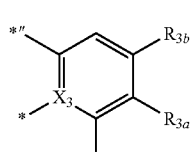
CY3-7
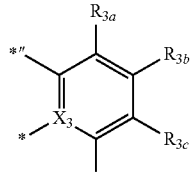
CY3-8
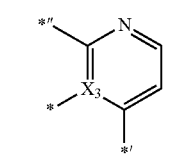
CY3-9
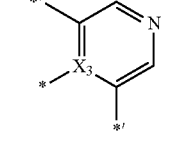
CY3-10
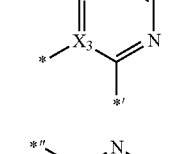
CY3-11
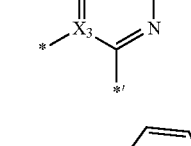
CY3-12
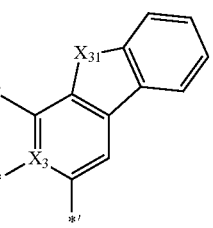
CY3-13

-continued
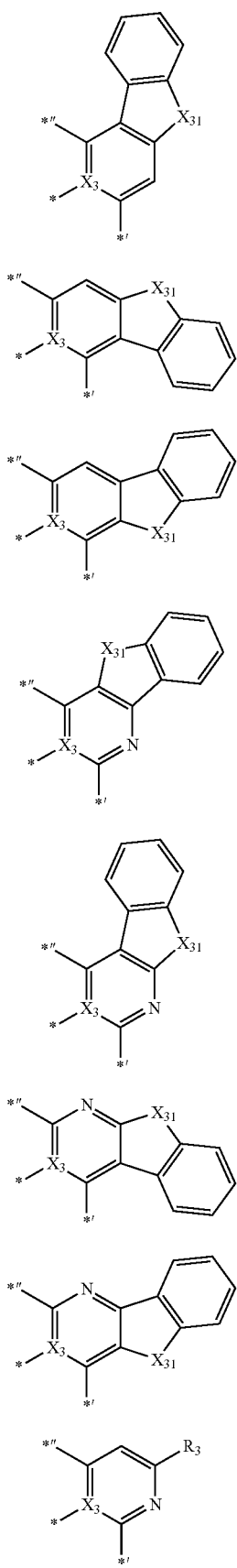
CY3-14
CY3-15
CY3-16
CY3-17
CY3-18
CY3-19
CY3-20
CY3-21
-continued
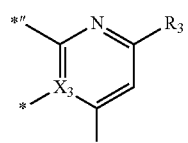 CY3-22
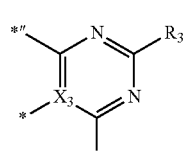 CY3-23
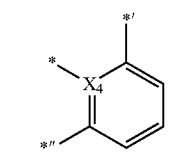 CY4-1
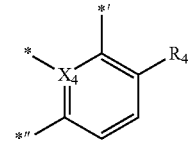 CY4-2
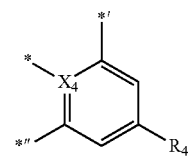 CY4-3
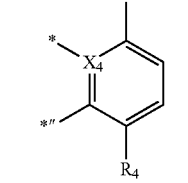 CY4-4
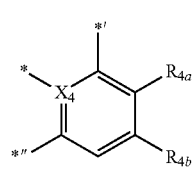 CY4-5
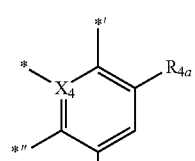 CY4-6
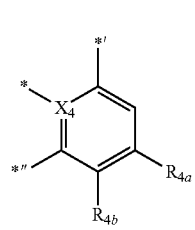 CY4-7

-continued
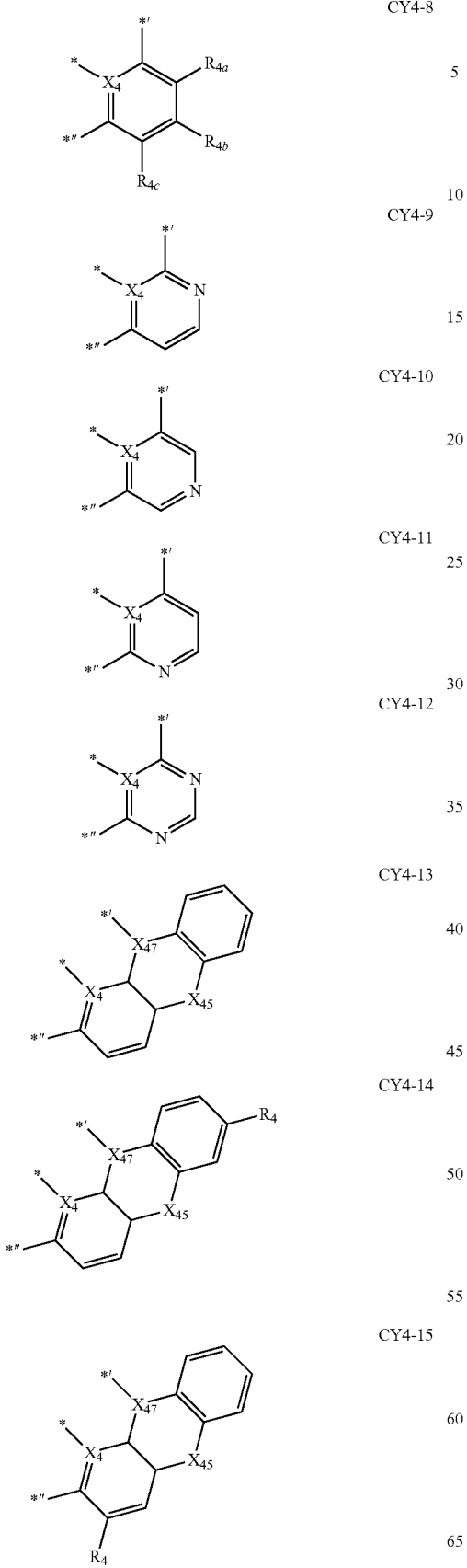
CY4-8
CY4-9
CY4-10
CY4-11
CY4-12
CY4-13
CY4-14
CY4-15
-continued
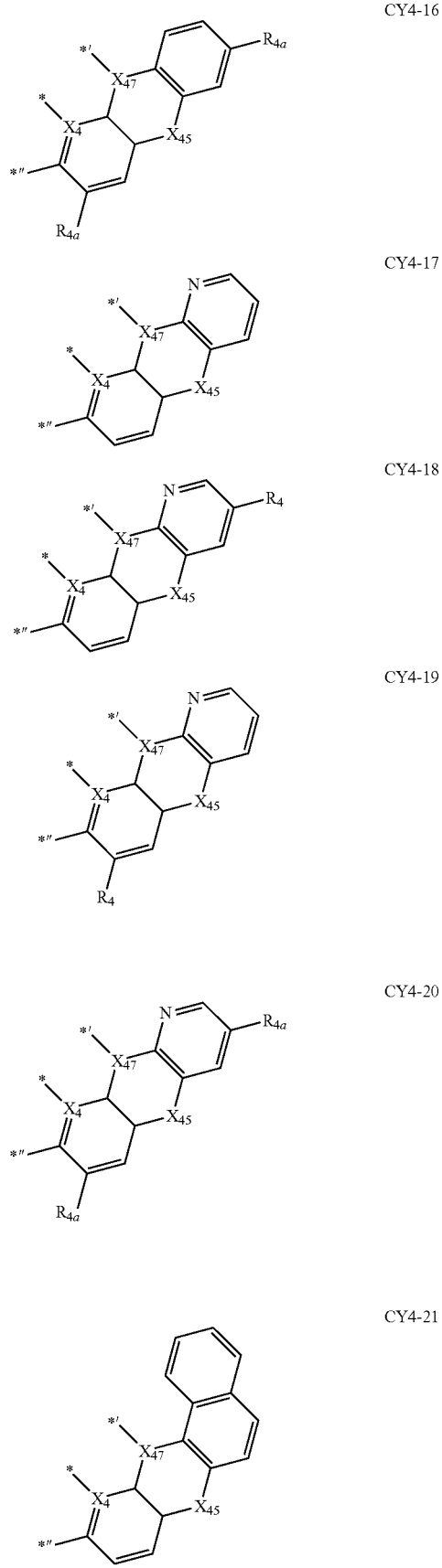
CY4-16
CY4-17
CY4-18
CY4-19
CY4-20
CY4-21

In Formulae CY1-1 to CY1-4, CY2-1 to CY2-23, CY3-1 to CY3-23, and CY4-1 to CY4-26, $X_1$ to $X_4$, $X_{15}$, and $R_1$ to $R_4$ may each independently be the same as described herein, $X_{45}$ may be a single bond, O, S, Se, $N(R_{45})$, $C(R_{45})(R_{46})$, or $Si(R_{45})(R_{46})$, $X_{47}$ may be N, B, P, $C(R_{47})$, or $Si(R_{47})$, $R_{1a}$ and $R_{1b}$ may each independently be defined as $R_1$, $R_{2a}$ to $R_{2c}$ may each independently be defined as $R_2$, $R_{3a}$ to $R_{3c}$ may each independently be defined as $R_3$, $R_{4a}$ to $R_{4c}$, and $R_{45}$ to $R_{47}$ may each independently be defined as $R_4$, in Formulae CY1-1 to CY1-4, *″′ indicates a binding site to ring $CY_4$ in Formula 1, * indicates a binding site to M in Formula 1, and *′ indicates a binding site to ring $CY_2$ in Formula 1, in Formulae CY2-1 to CY2-23, *′ indicates a binding site to ring $CY_{12}$ in Formula 1, * indicates a binding site to M in Formula 1, and *″′ indicates a binding site to $T_1$ in Formula 1, in Formulae CY3-1 to CY3-23, *″′ indicates a binding site to $T_1$ in Formula 1, * indicates a binding site to M in Formula 1, and *′ indicates a binding site to $T_2$ in Formula 1, and in Formulae CY4-1 to CY4-26, *″′ indicates a binding site to $T_2$ in Formula 1, * indicates a binding site to M in Formula 1, and *′ indicates a binding site to ring $CY_{11}$ in Formula 1.

In an embodiment, i) $T_1$ may be a single bond and $R_2$ and $R_3$ may be linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group may be each unsubstituted or substituted with at least one $R_{1a}$;

ii) $T_2$ may be *—$N(R_5)$—*′, *—$B(R_5)$—*′ or *—$P(R_5)$—*′ and $R_4$ and $R_5$ may be linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group may be each unsubstituted or substituted with at least one $R_{1a}$;

iii) $T_2$ may be *—$N(R_5)$—*′, *—$B(R_5)$—*′ or *—$P(R_5)$—*′ and $R_3$ and $R_5$ may be linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group may be each unsubstituted or substituted with at least one $R_{1a}$; or iv) $T_2$ may be *—$N(R_5)$—*′, *—$B(R_5)$—*′ or *—$P(R_5)$—*′, $R_4$ and $R_5$ may be linked to form a $C_5$-$C_{30}$ carbocyclic group or a $C_1$-$C_{30}$ heterocyclic group, $R_3$ and $R_5$ may be linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group may be each unsubstituted or substituted with at least one $R_{1a}$.

In an embodiment, the organometallic compound may be represented by one of Formulae 1-1 to 1-4:

Formula 1-3

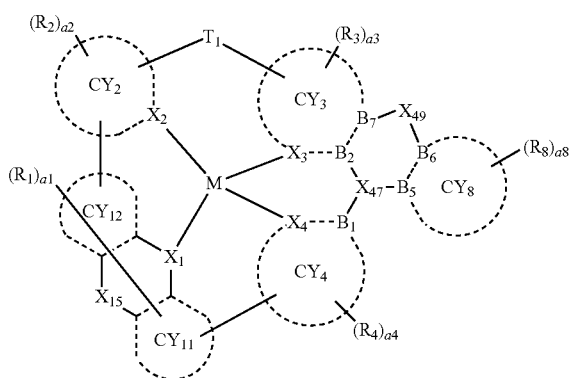

Formula 1-4

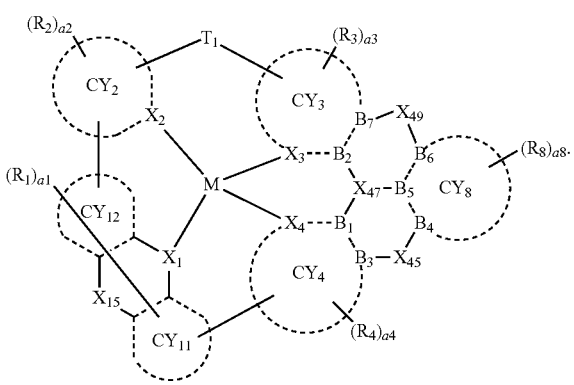

In Formulae 1-1 to 1-4,

M, $X_1$ to $X_4$, ring $CY_{11}$, ring $CY_{12}$, ring $CY_2$ to ring $CY_4$, $T_1$, $T_2$, $X_{15}$, $R_1$ to $R_4$ and a1 to a4 may each independently be the same as described herein, ring $CY_8$ may be defined the same as ring $CY_4$ described herein, $A_1$ to $A_4$ and $B_1$ to $B_7$ may each independently be C or N, $X_{45}$ may be a single bond, O, S, Se, $N(R_{45})$, $C(R_{45})(R_{46})$, or $Si(R_{45})(R_{46})$, $X_{47}$ may be N, B, P, $C(R_{47})$, or $Si(R_{47})$, $X_{49}$ may be a single bond, O, S, Se, $N(R_{48})$, $C(R_{48})(R_{49})$, or $Si(R_{48})(R_{49})$, $T_3$ may be selected from a single bond, a double bond, *—$N(R_7)$—*', *—$B(R_7)$—*', *—$P(R_7)$—*', *—$C(R_7)(R_8)$—*', *—$Si(R_7)(R_8)$—*', *—$Ge(R_7)(R_8)$—*', *—S—*', *—Se—*', *—O—*', *—C(=O)—*', *—S(=O)—*', *—$S(=O)_2$—*', *—$C(R_7)$=*', *=$C(R_8)$—*', *—$C(R_7)$=$C(R_8)$—*', *—C(=S)—*', and *—C≡C—*', and * and *' each indicate a binding site to a neighboring atom, n may be an integer from 1 to 5, wherein, when n is two or more, two or more groups $T_3$ may be identical to or different from each other, $R_{45}$ to $R_{49}$ may each independently be defined as $R_4$, and $R_7$ and $R_8$ may each independently be defined as $R_5$.

In Formula 1, i) two or more groups selected from a plurality of neighboring groups $R_1$ may optionally be linked to form a $C_5$-$C_{30}$ carbocyclic group or a $C_1$-$C_{30}$ heterocyclic group, ii) two or more groups selected from a plurality of neighboring groups $R_2$ may optionally be linked to form a $C_5$-$C_{30}$ carbocyclic group or a $C_1$-$C_{30}$ heterocyclic group, iii) two or more groups selected from a plurality of neighboring groups $R_3$ may optionally be linked to form a $C_5$-$C_{30}$ carbocyclic group or a $C_1$-$C_{30}$ heterocyclic group, iv) two or more groups selected from a plurality of neighboring groups $R_4$ may optionally be linked to form a $C_5$-$C_{30}$ carbocyclic group or a $C_1$-$C_{30}$ heterocyclic group, and v) two or more groups selected from $R_1$ to $R_6$, $R_{5a}$, $R_{5b}$, $R_{6a}$, $R_{6b}$, $R_5$, and $R_{16}$ may optionally be linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group are each unsubstituted or substituted with at least one $R_{1a}$ and $R_{1a}$ is defined the same as above $R_1$.

For example, each of i) two or more groups selected from a plurality of neighboring groups $R_1$, ii) two or more groups selected from a plurality of neighboring groups $R_2$, iii) two or more groups selected from a plurality of neighboring groups $R_3$, iv) two or more groups selected from a plurality of neighboring groups $R_4$, and v) two or more groups selected from $R_1$ to $R_6$, $R_{5a}$, $R_{5b}$, $R_{6a}$, $R_{6b}$, $R_{15}$, and $R_{16}$, may optionally be linked to form a cyclopentadiene group, a cyclohexane group, a cycloheptane group, an adamantane group, a bicycle-heptane group, a bicycle-octane group, a benzene group, a pyridine group, a pyrimidine group, a pyrazine group, a pyridazine group, a naphthalene group, an anthracene group, a tetracene group, a phenanthrene group, a dihydronaphthalene group, a phenalene group, a benzothiophene group, a benzofuran group, an indene group, an indole group, a benzosilole group, an azabenzothiophene group, an azabenzofuran group, an azaindene group, an azaindole group, and an azabenzosilole group, each unsubstituted or substituted with at least one $R_{10a}$ and $R_{1a}$ is defined the same as above $R_1$, but embodiments of the present disclosure are not limited thereto.

In the present disclosure, "an azabenzothiophene, an azabenzofuran, an azaindene, an azaindole, an azabenzosilole, an azadibenzothiophene, an azadibenzofuran, an azafluorene, an azacarbazole, and an azadibenzosilole" as used herein each refer to a hetero ring having the same backbone as "a benzothiophene, a benzofuran, an indene, an indole, benzosilole, a dibenzothiophene, a dibenzofuran, a fluorene, a carbazole, and a dibenzosilole", in which at least one carbon constituting rings thereof is substituted with nitrogen.

In an embodiment, the organometallic compound may be one of Compounds 1 to 160, but embodiments of the present disclosure are not limited thereto:

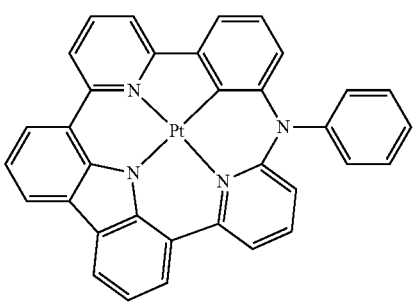

1

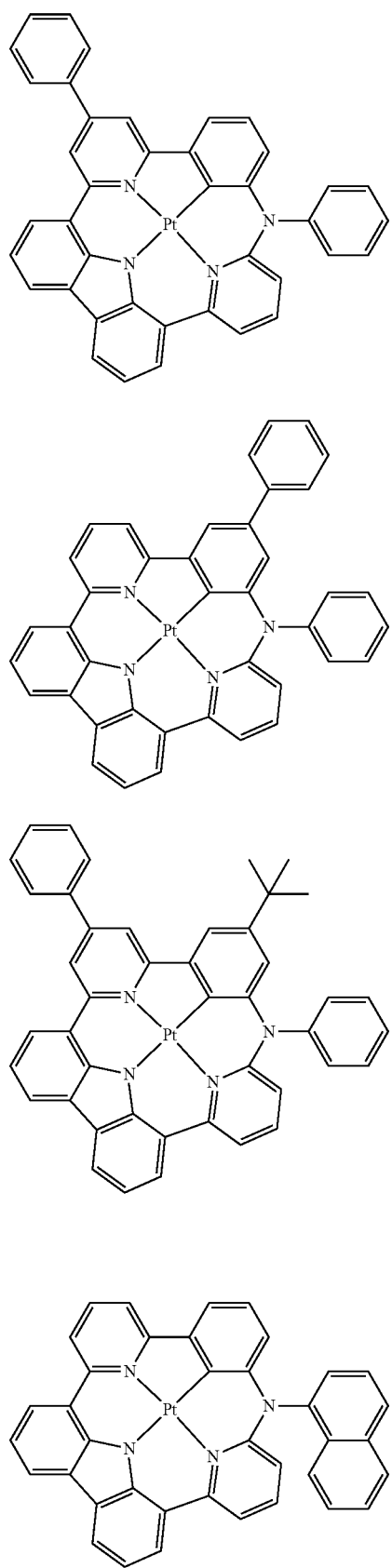
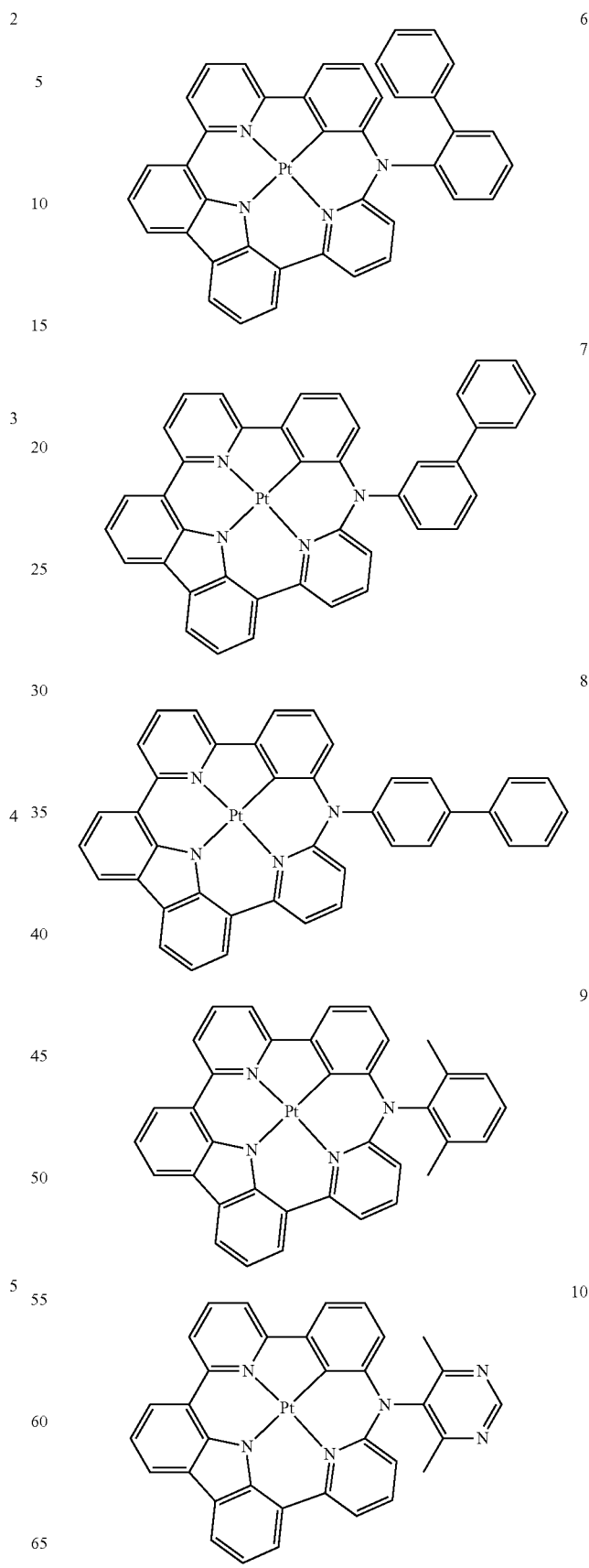

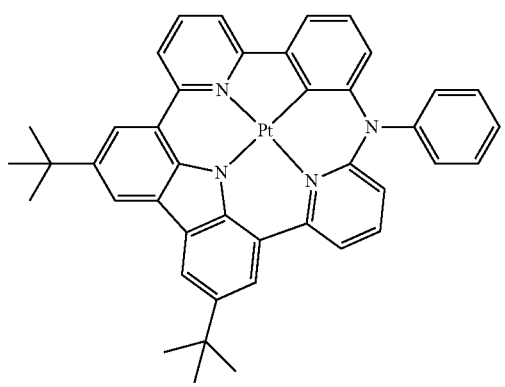
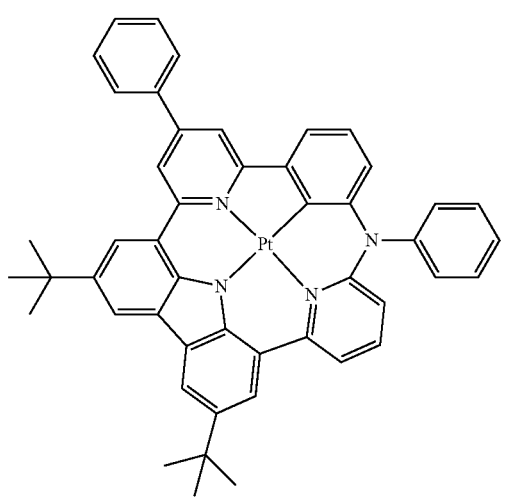
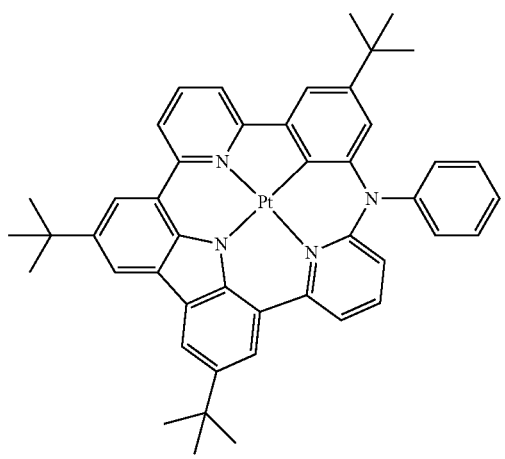
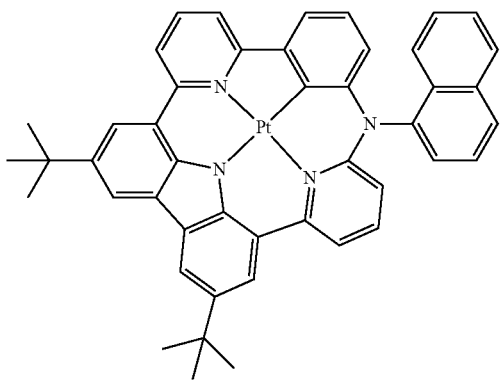
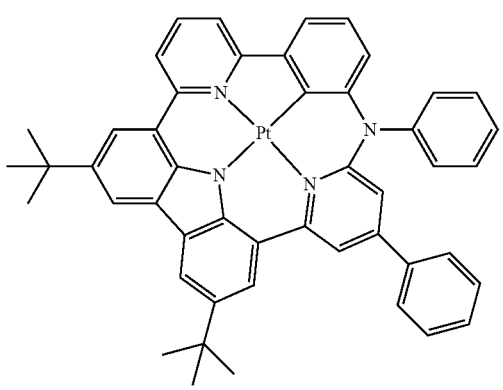
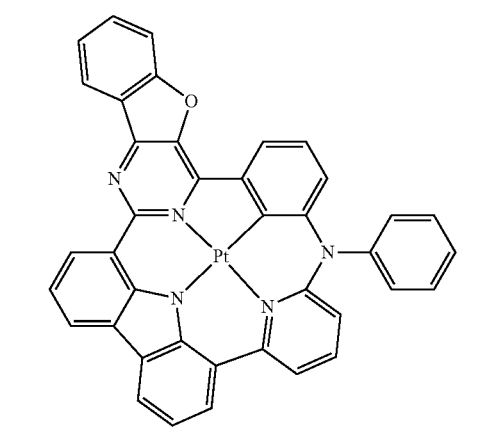
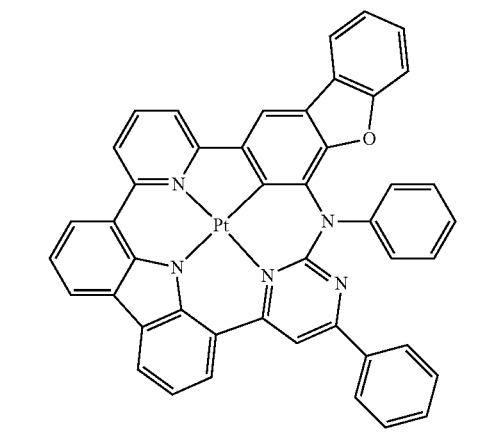

99
-continued
18
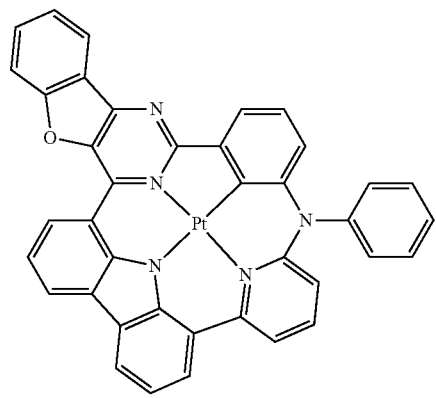
19
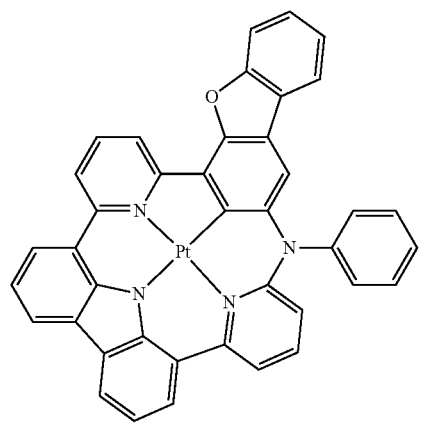
20
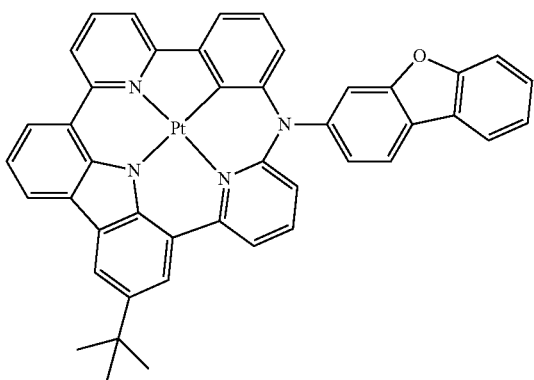
21
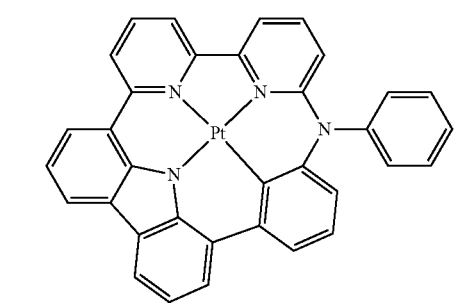
100
-continued
22
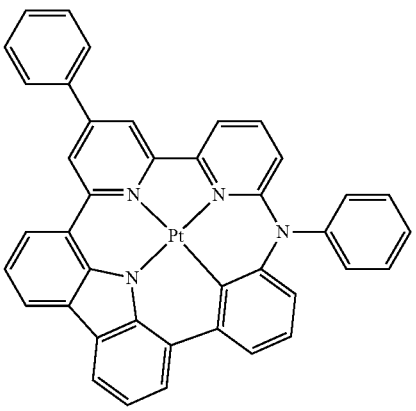
23
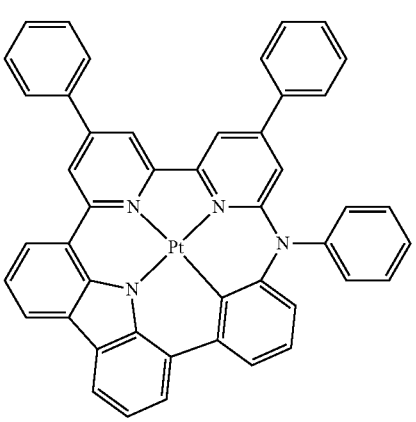
24
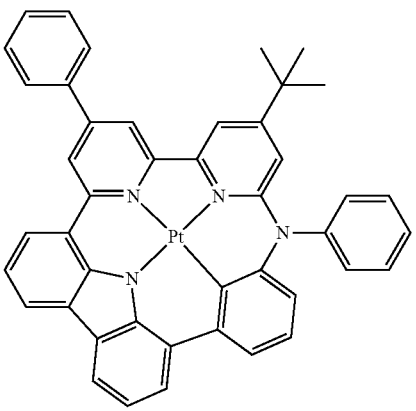
25
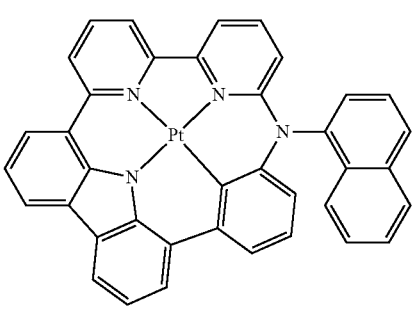

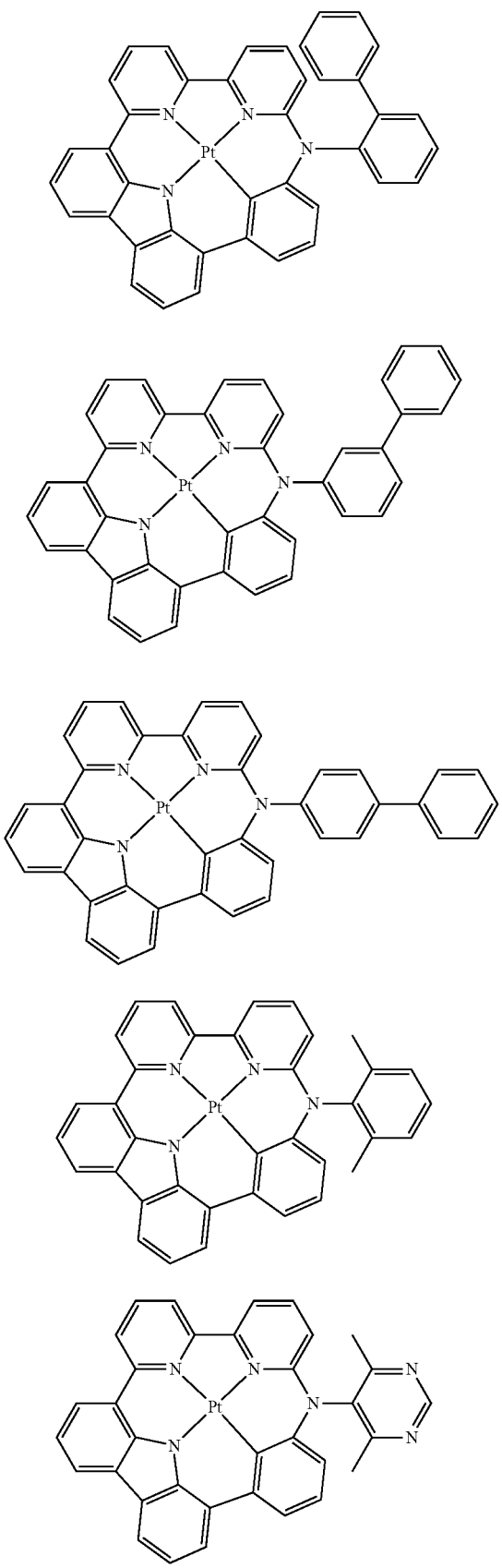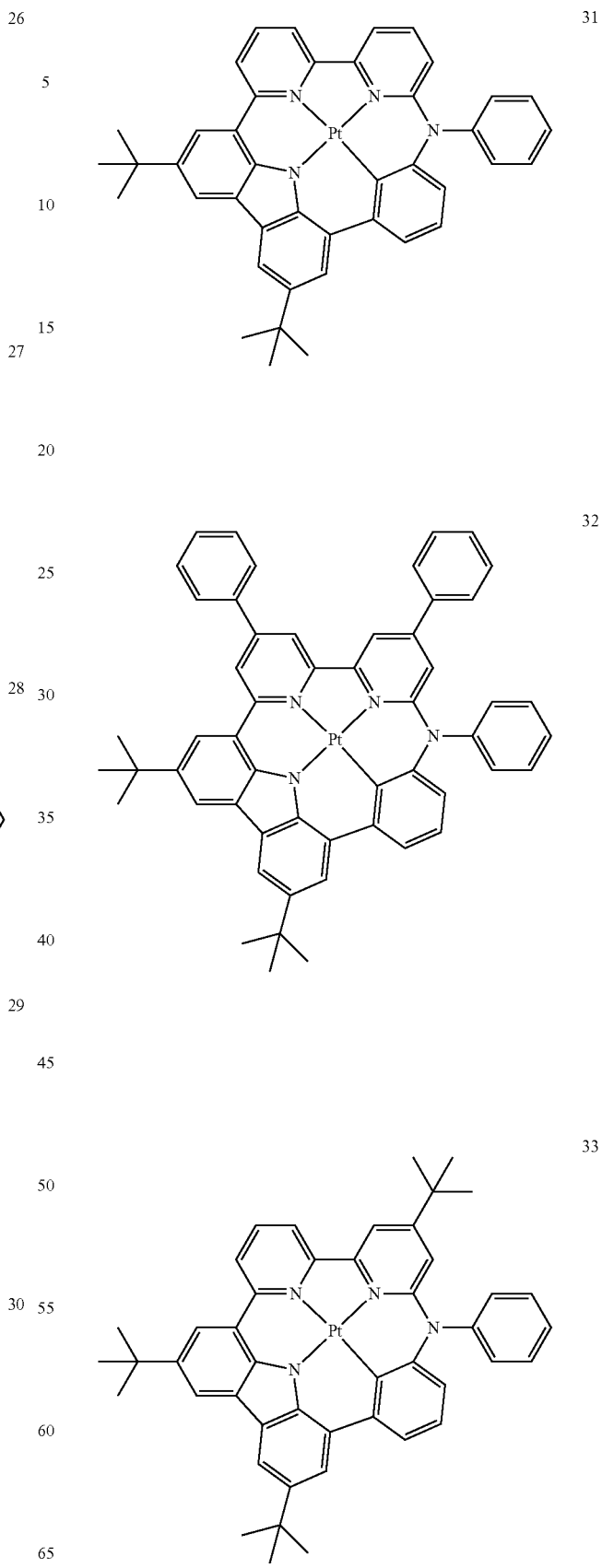

103
-continued
34
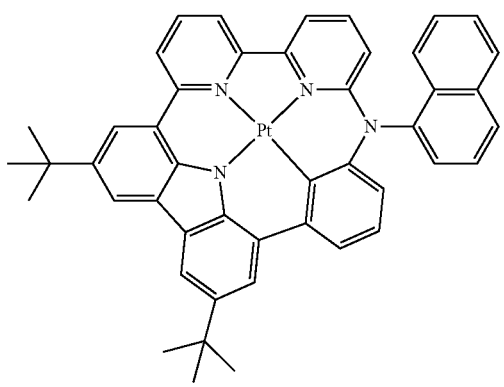
35
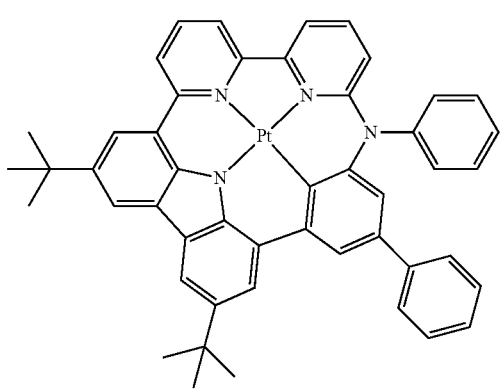
36
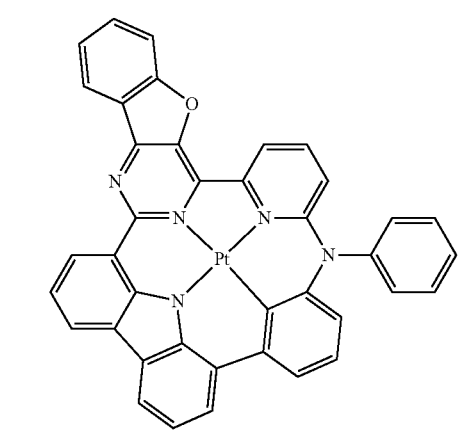
37
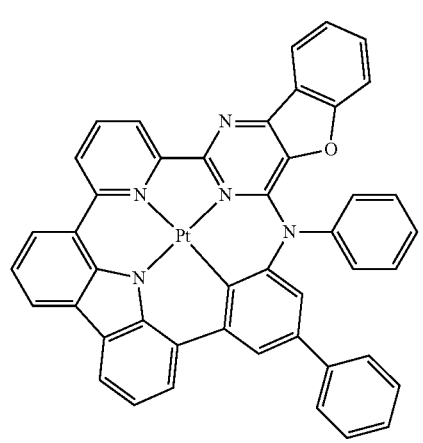
104
-continued
38
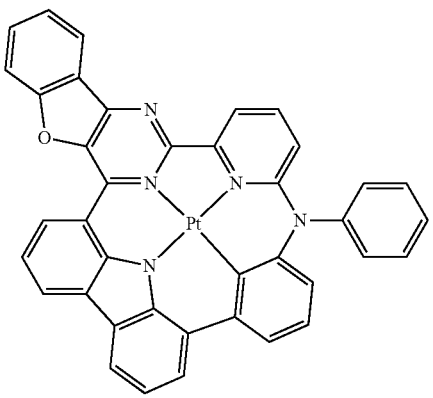
39
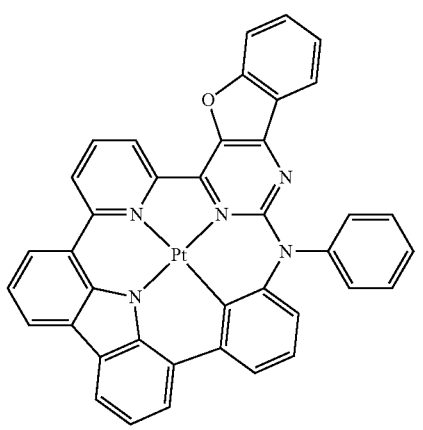
40
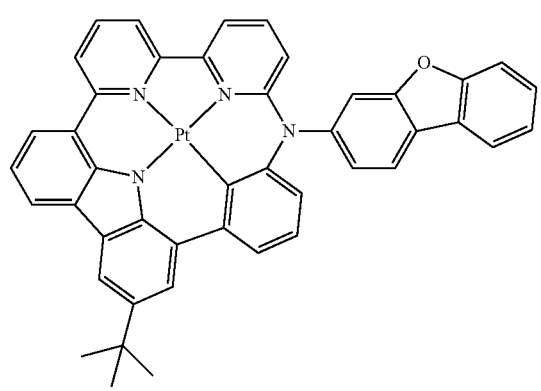
41
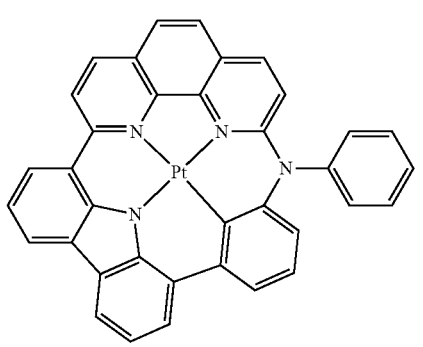

105
-continued
42
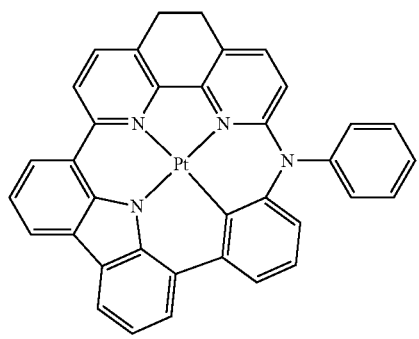
43
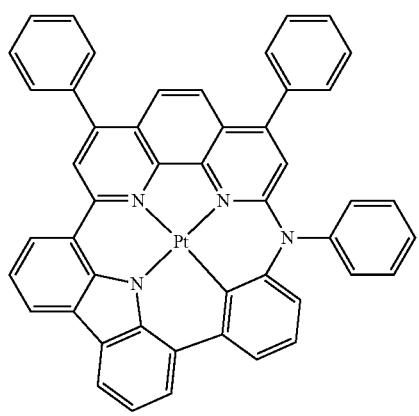
44
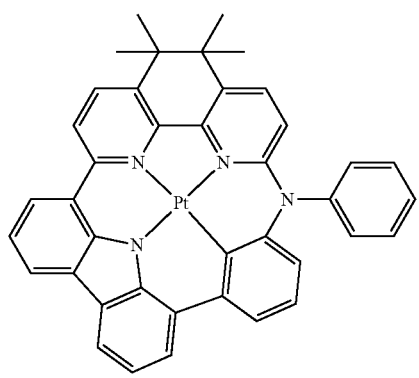
45
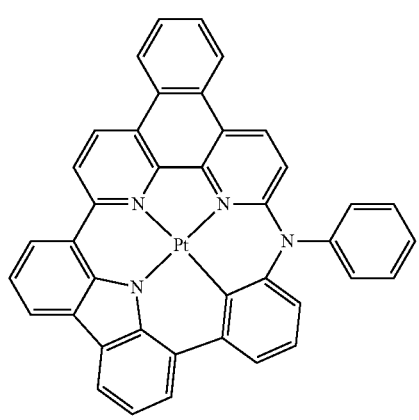
106
-continued
46
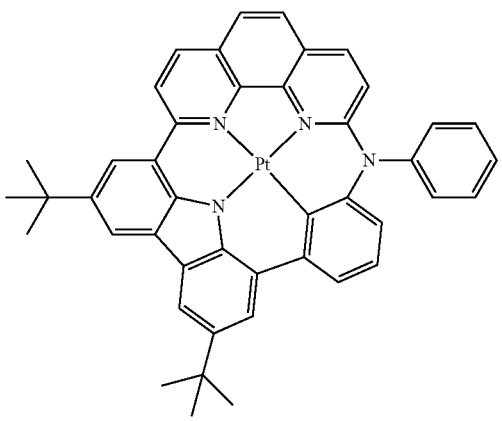
47
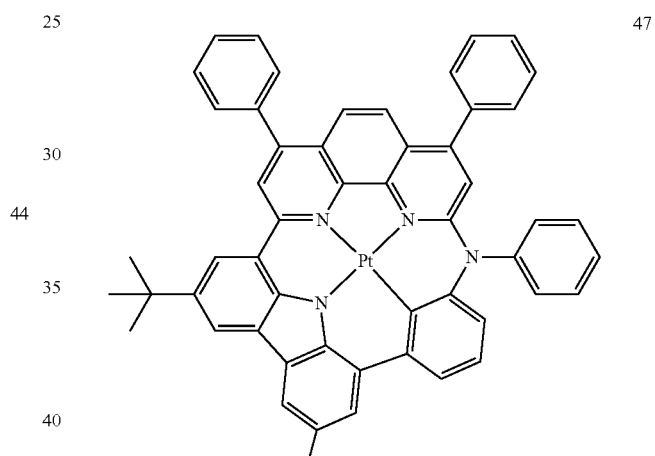
48
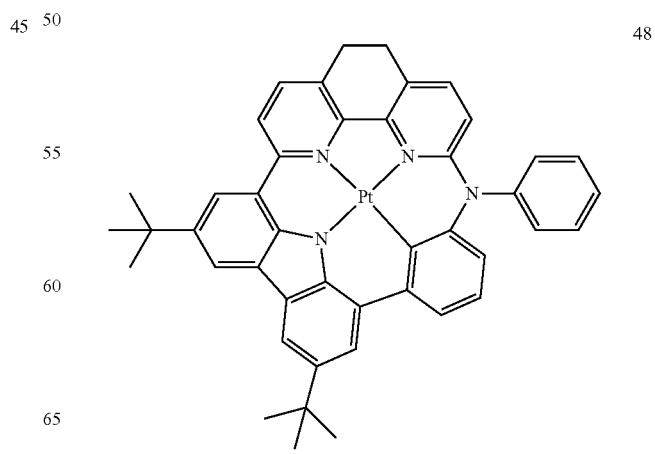

49
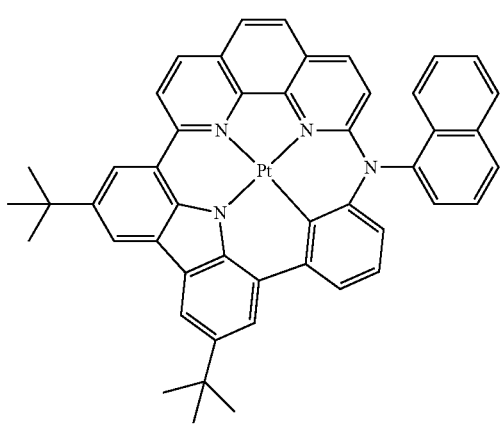
50
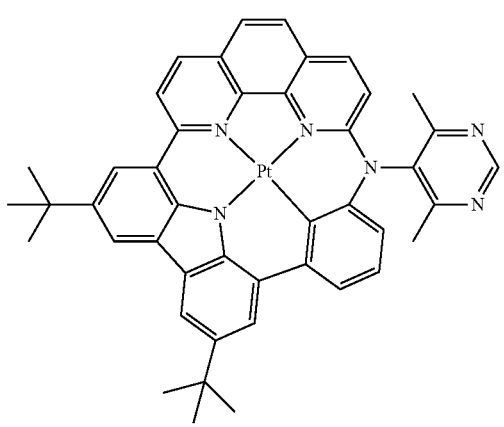
51
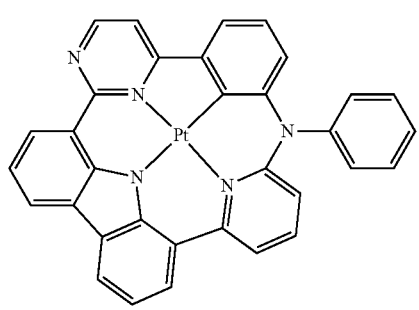
52
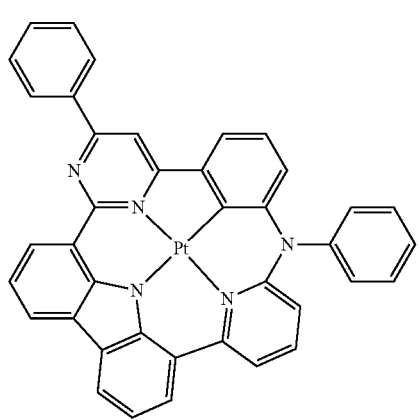
53
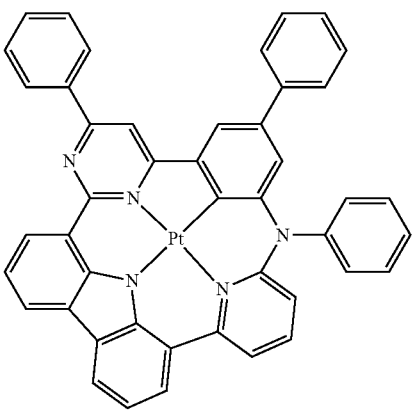
54
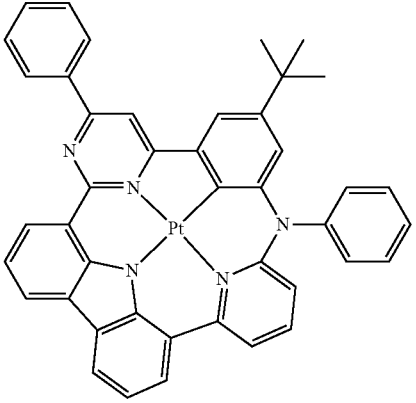
55
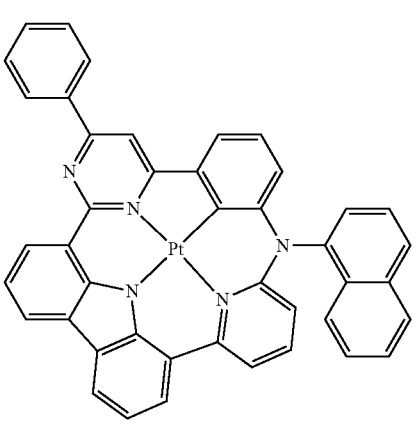
56
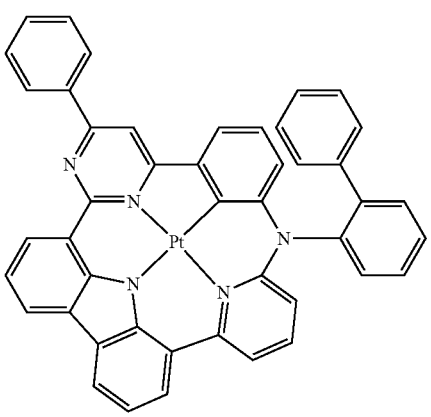

57
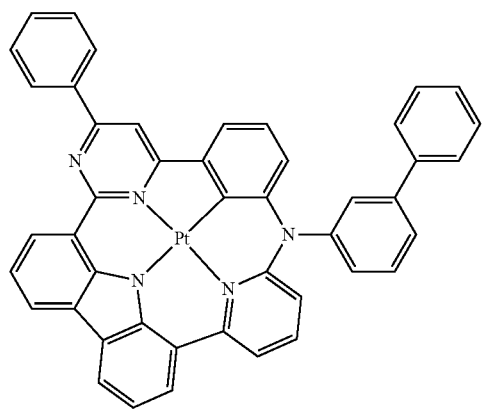
58
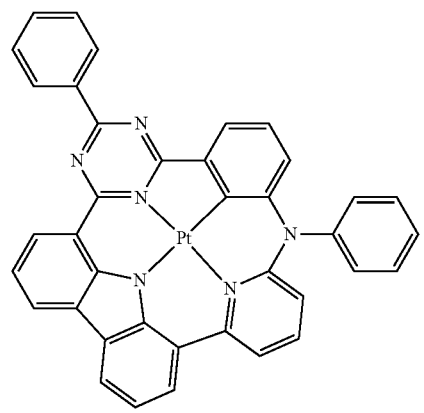
59
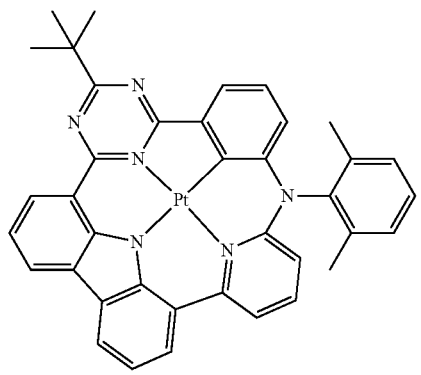
60
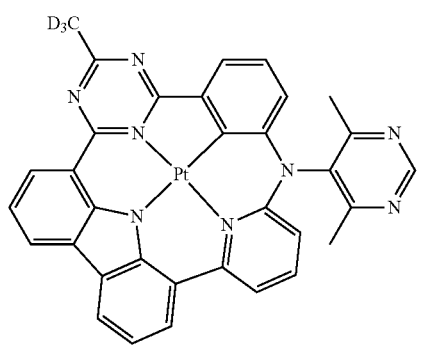
61
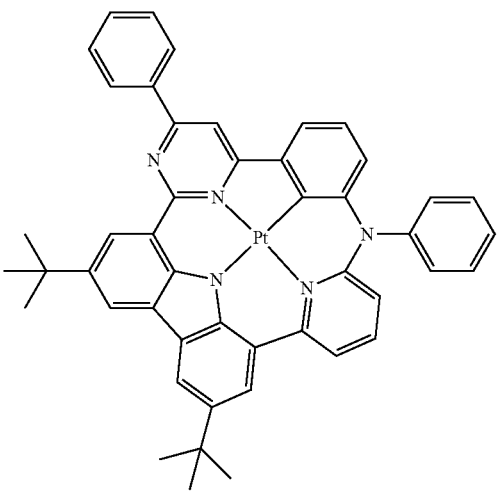
62
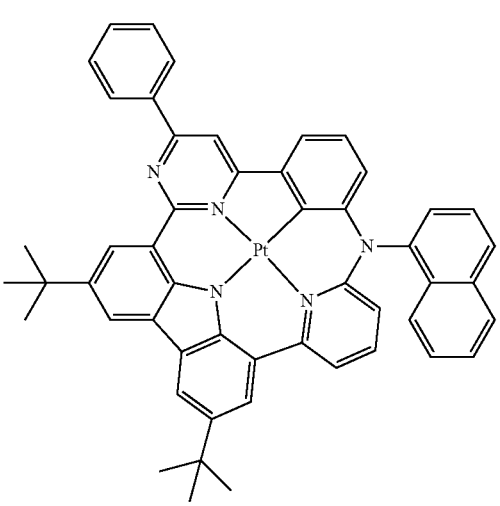
63
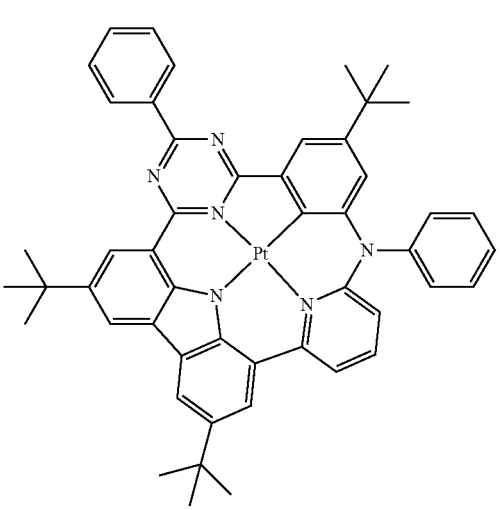

64
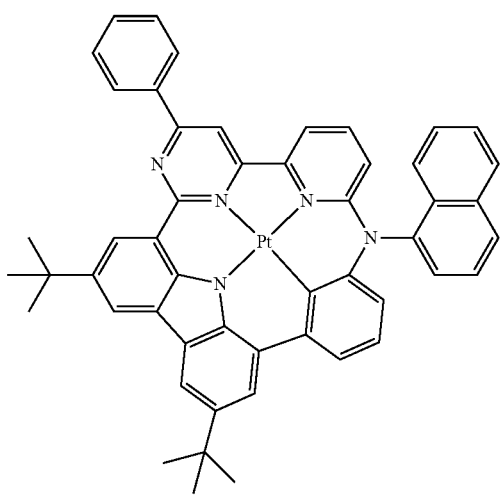
65
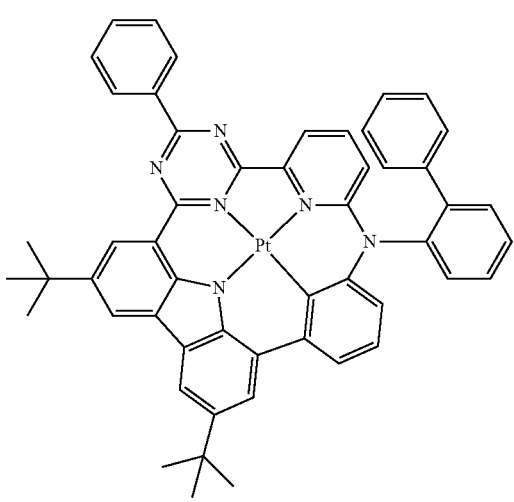
66
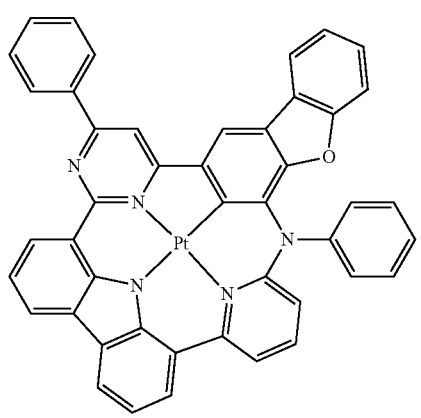
67
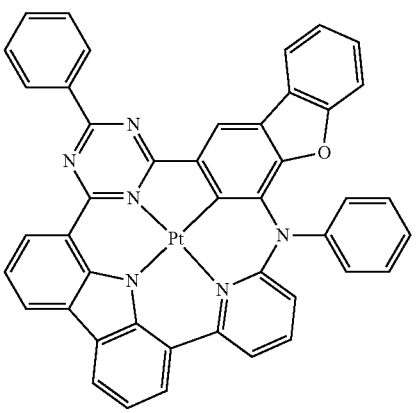
68
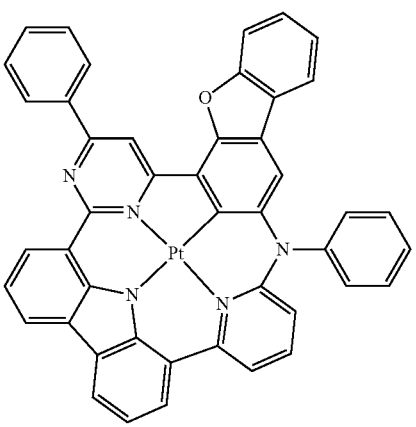
69
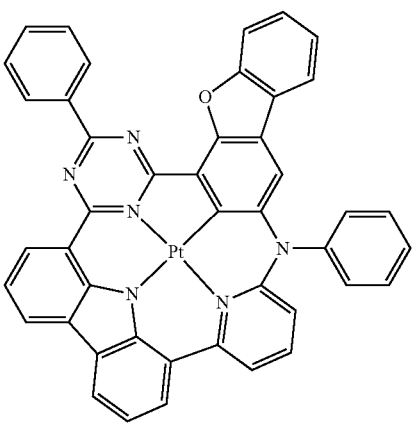

70
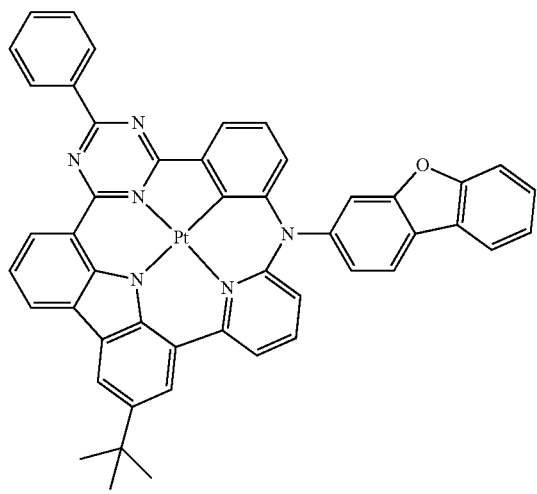
71
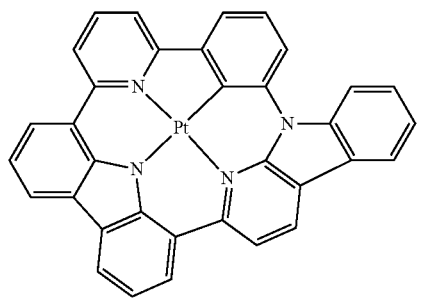
72
73
74
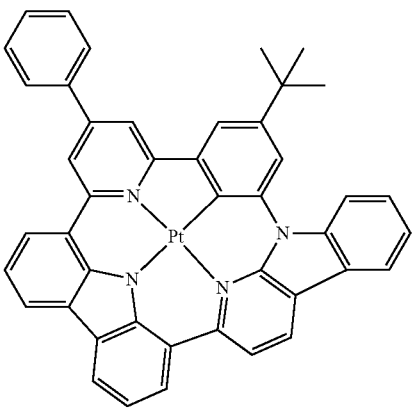
75
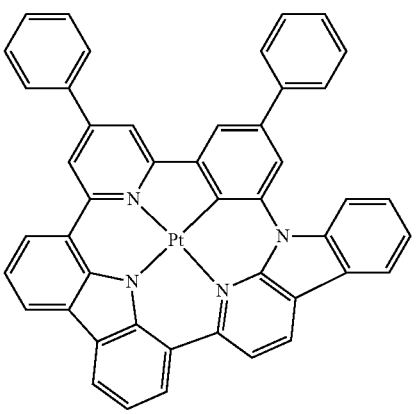
76
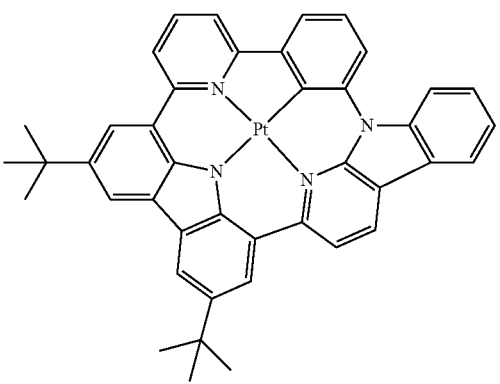

77
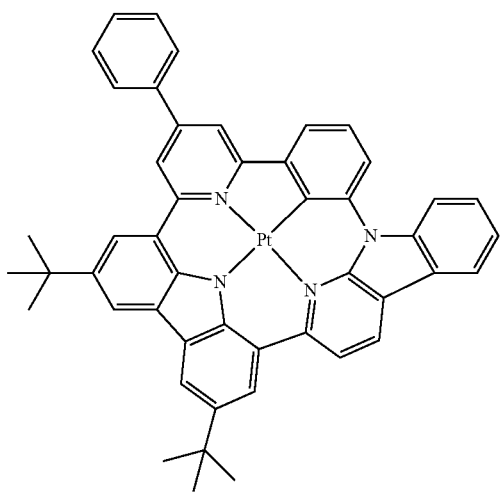
78
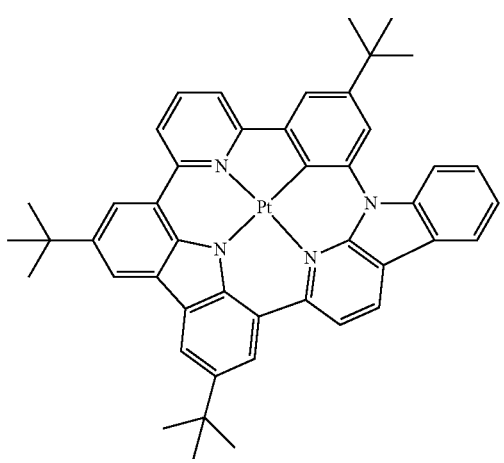
79
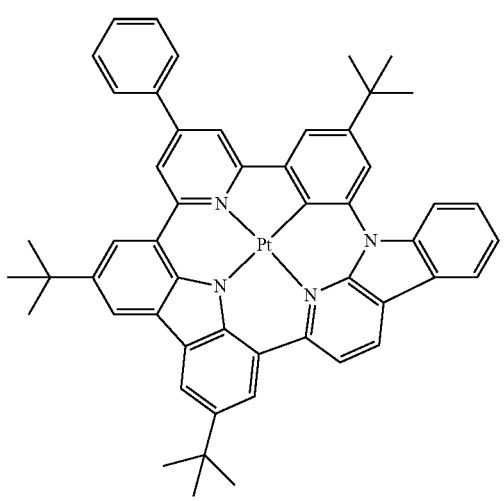
80
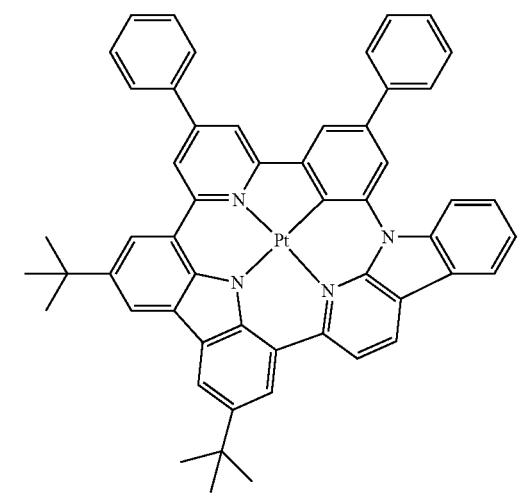
81
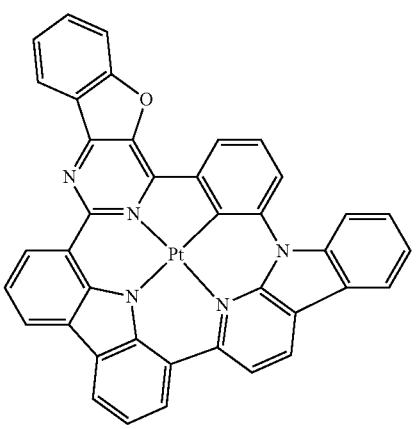
82
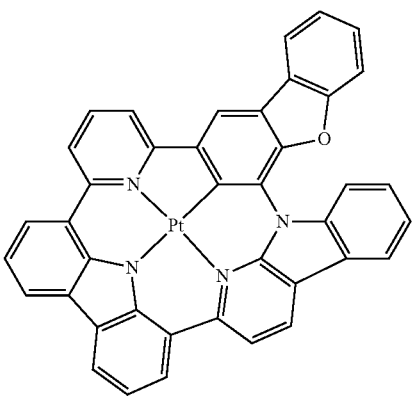

83
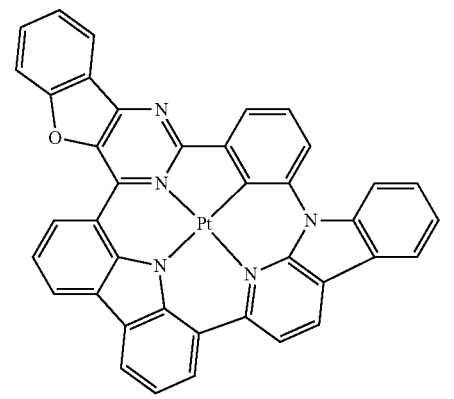
84
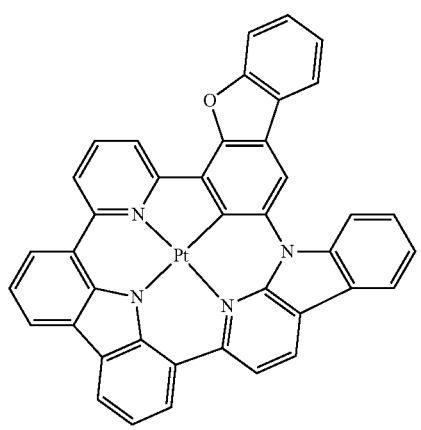
85
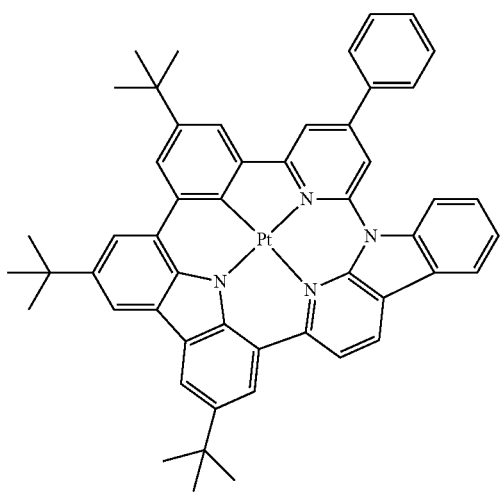
86
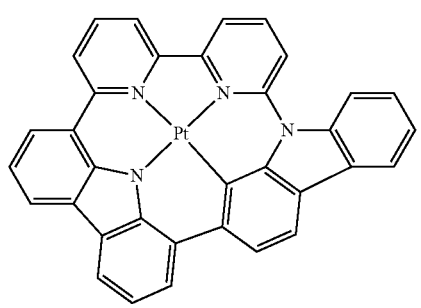
87
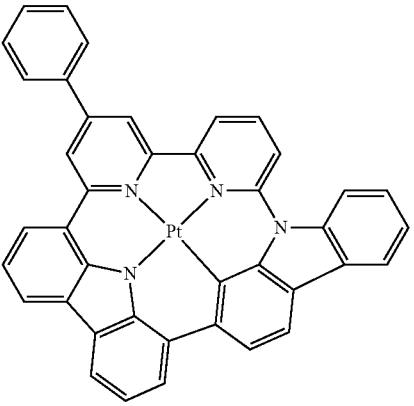
88
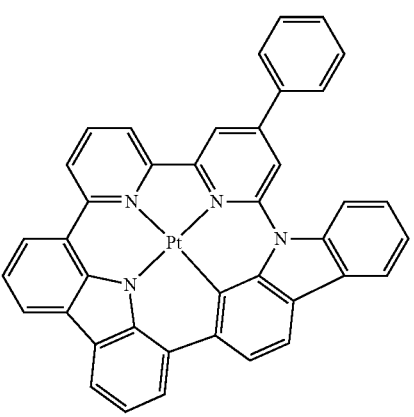
89
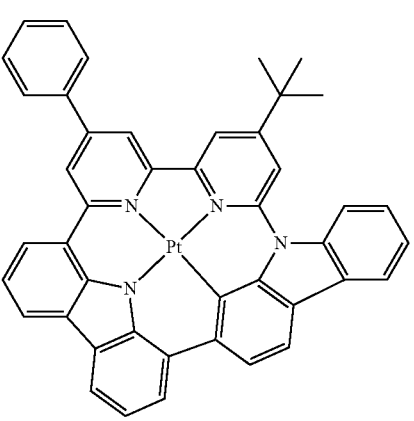
90
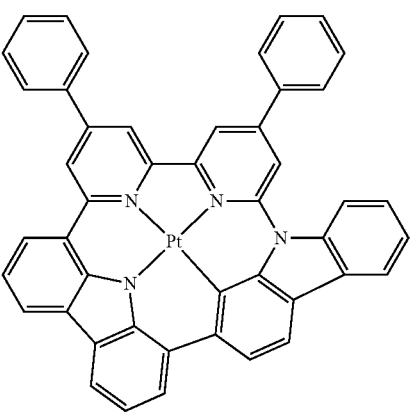

91
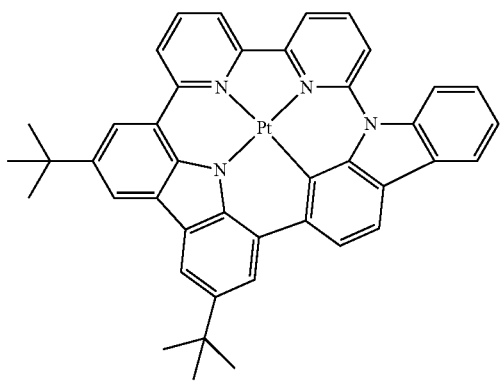
92
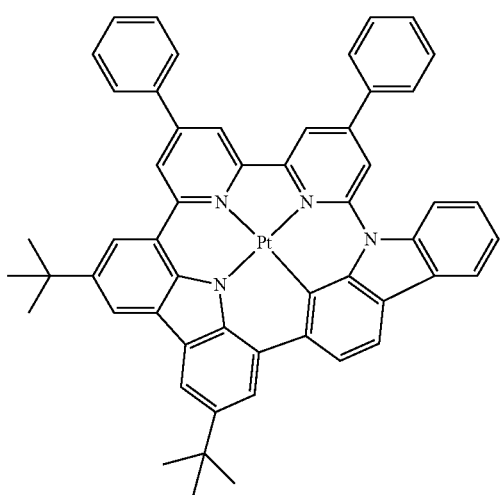
93
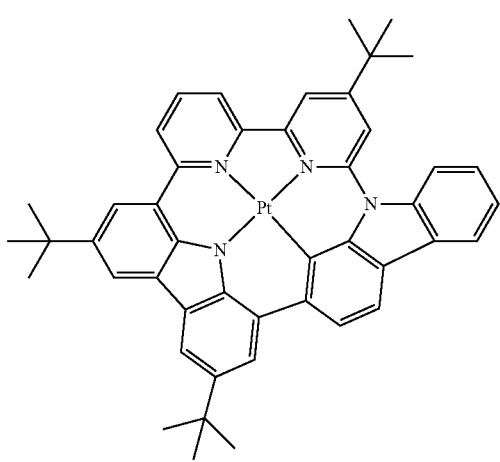
94
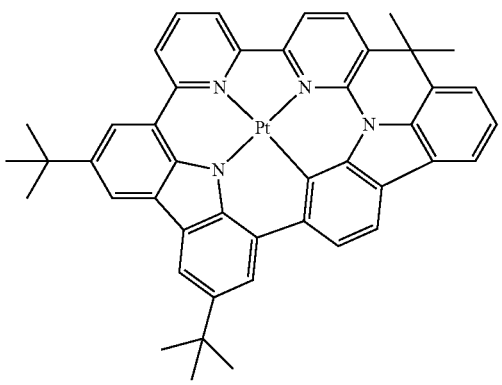
95
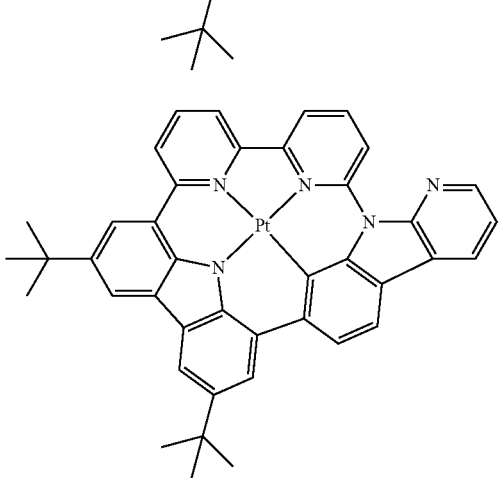
96
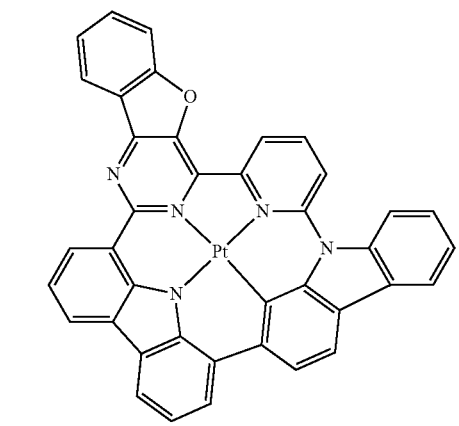
97
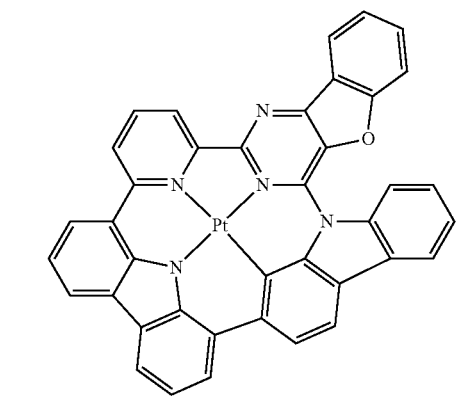

121
-continued
98
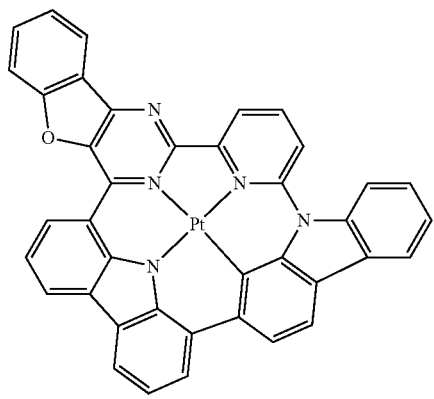
99
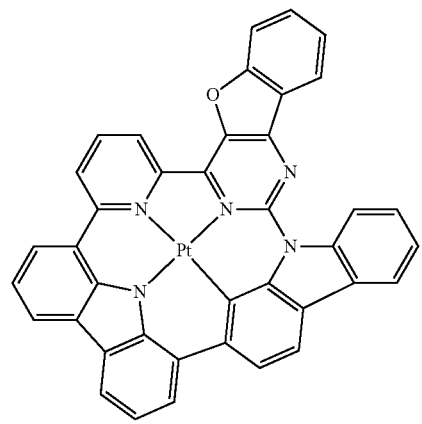
100
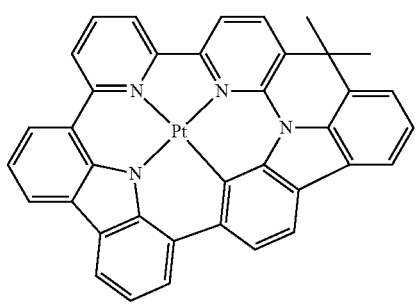
101
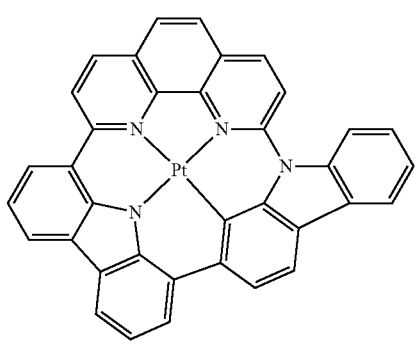
122
-continued
102
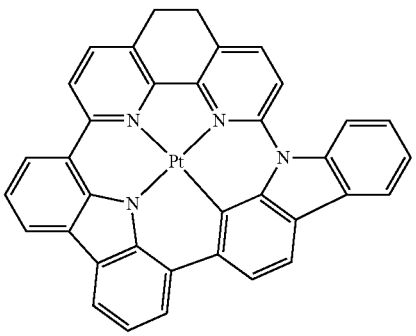
103
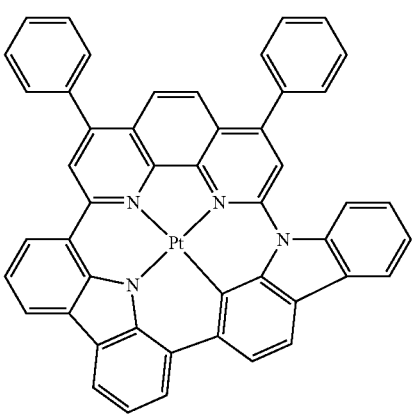
104
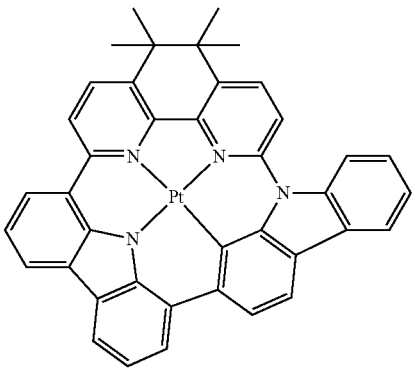
105
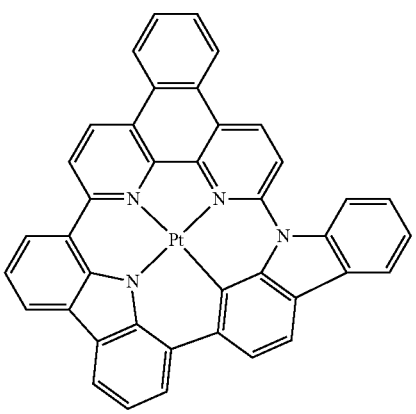

123
-continued
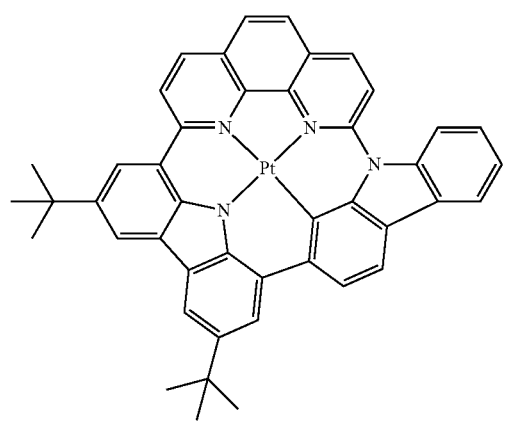
106
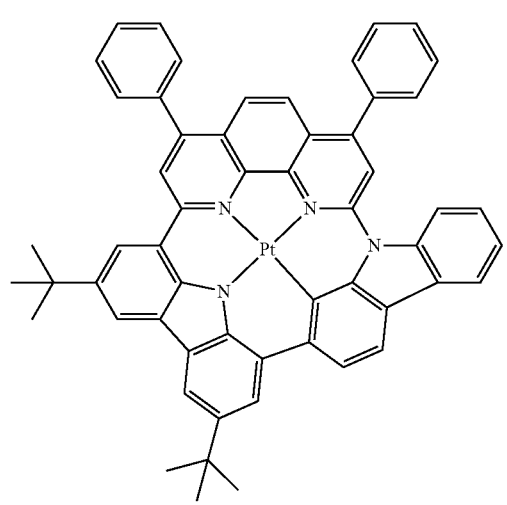
107
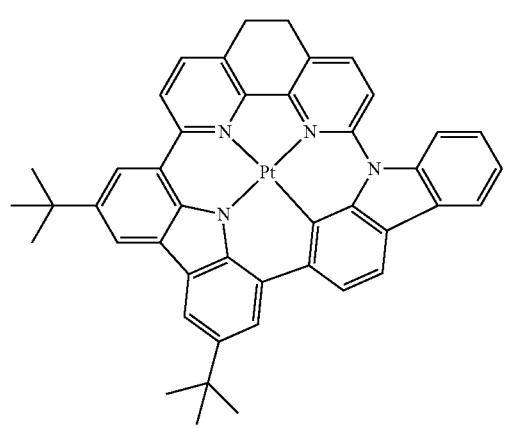
108
124
-continued
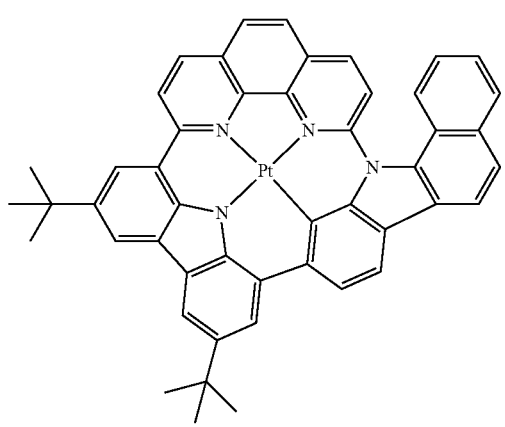
109
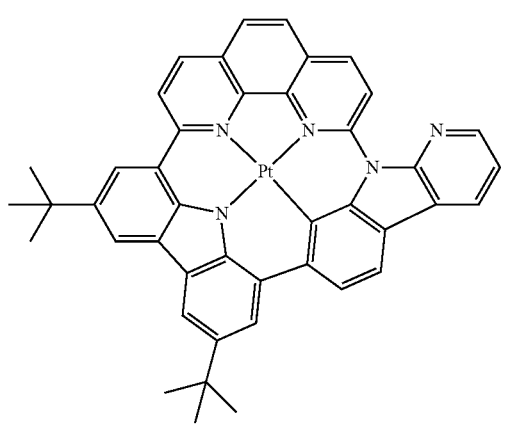
110
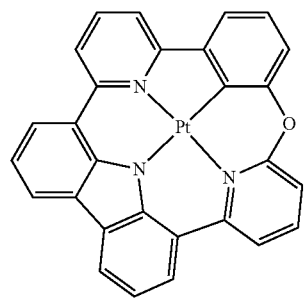
111
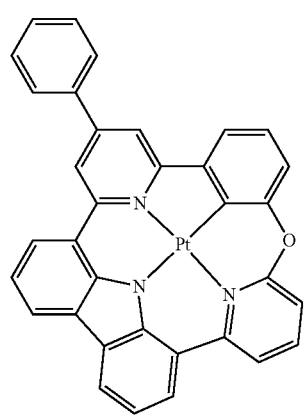
112

-continued
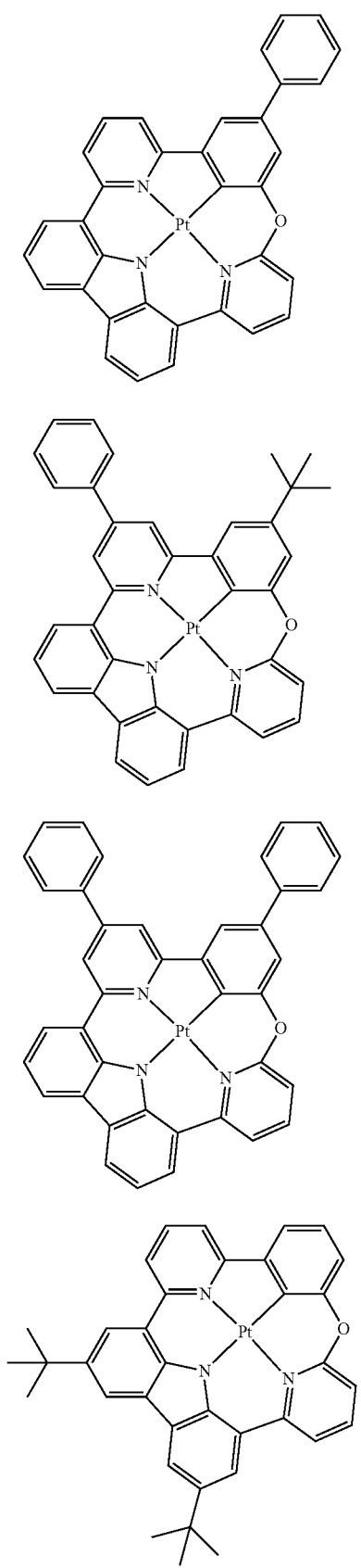
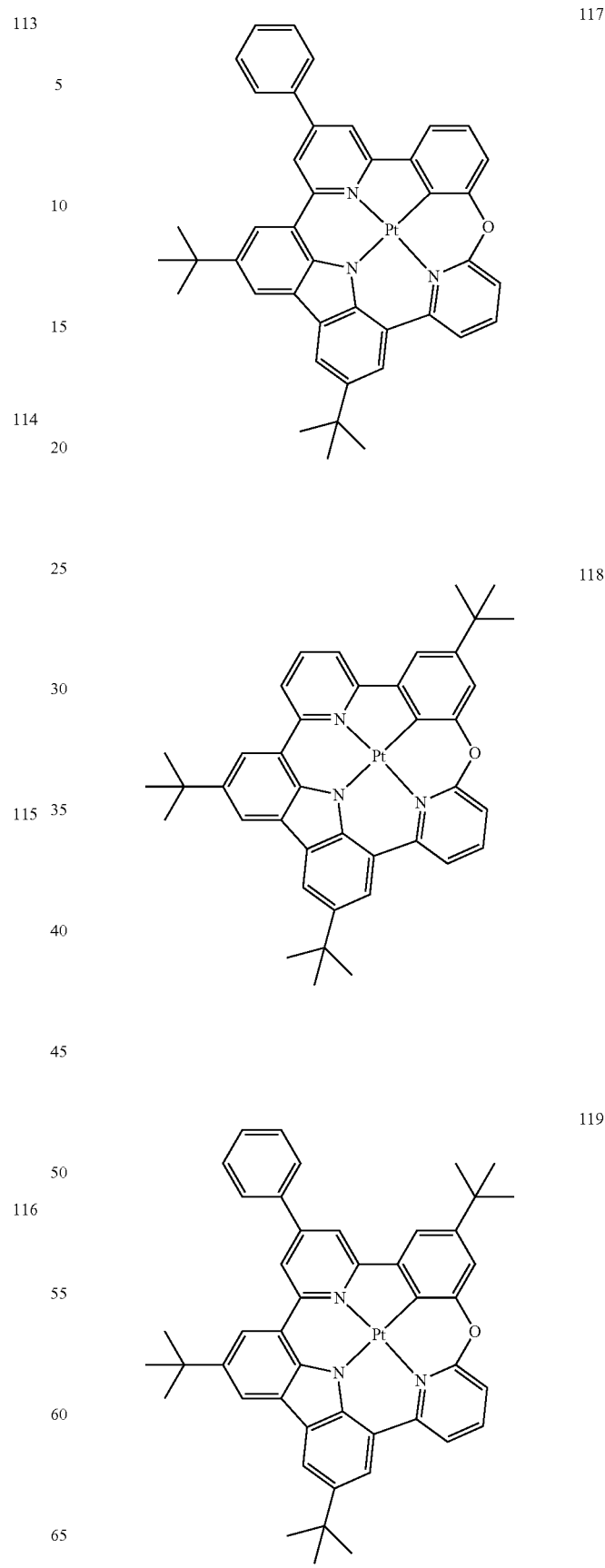

120
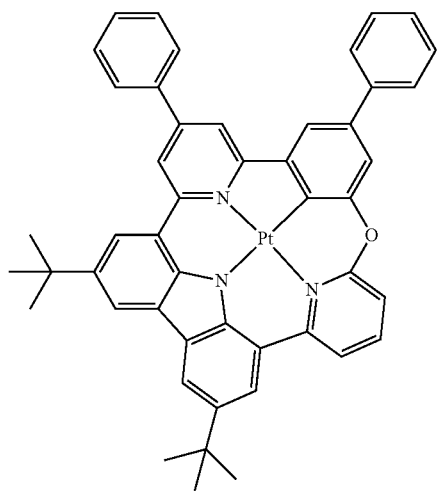
121
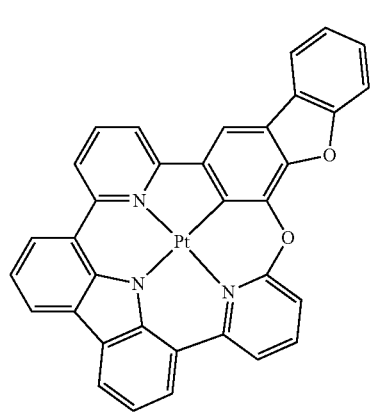
122
123
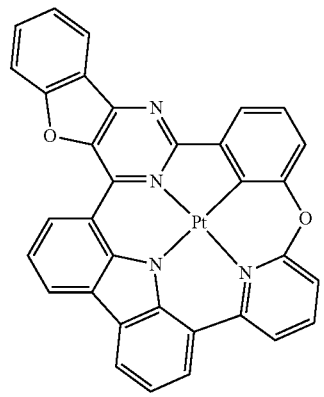
124
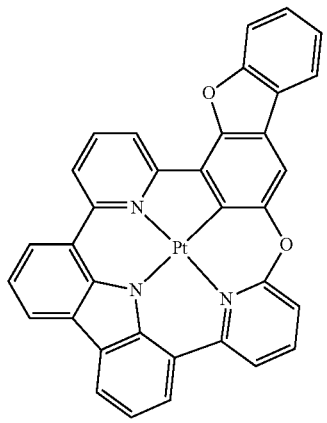
125
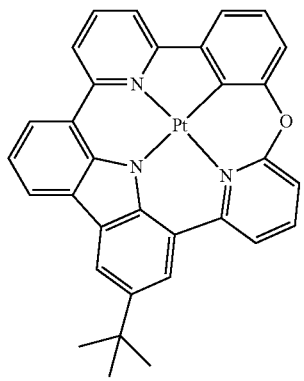
126

127
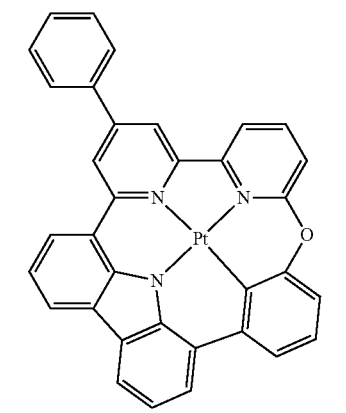
128
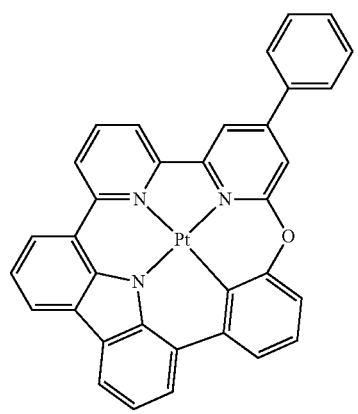
129
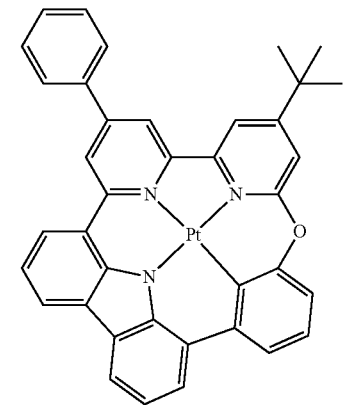
130
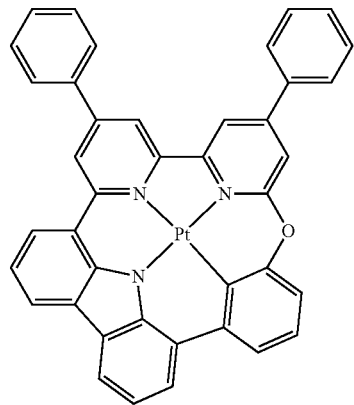
131
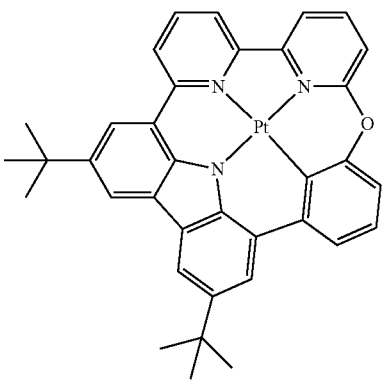
132
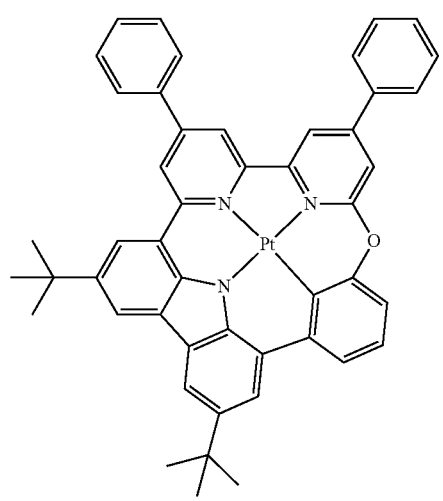
133
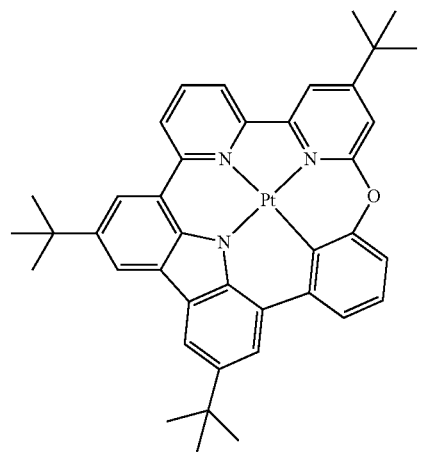

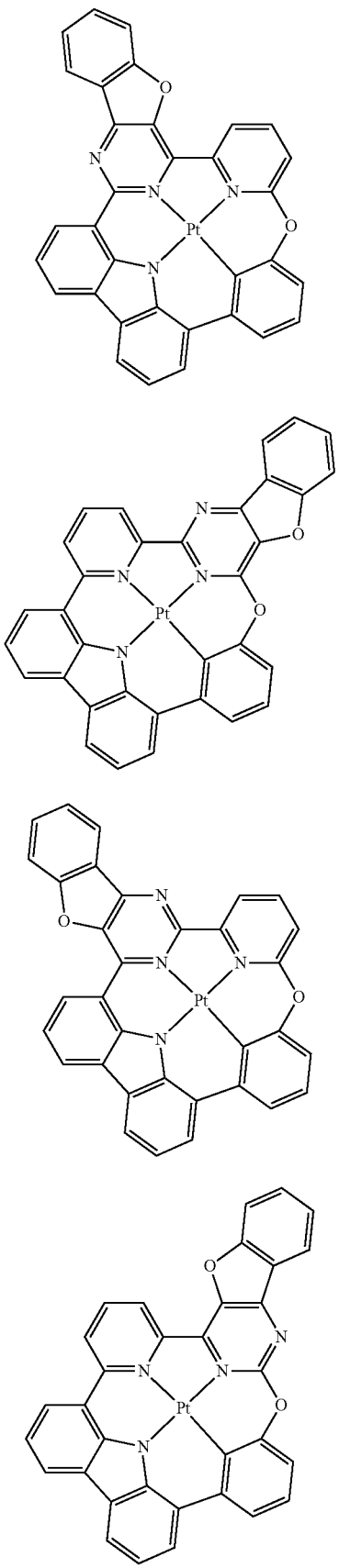
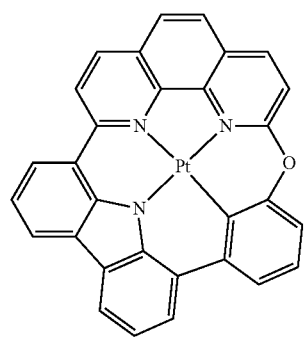
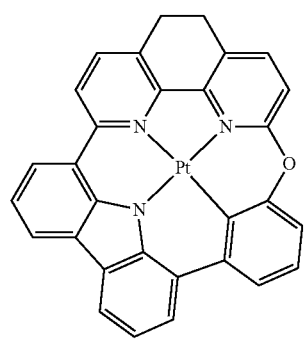
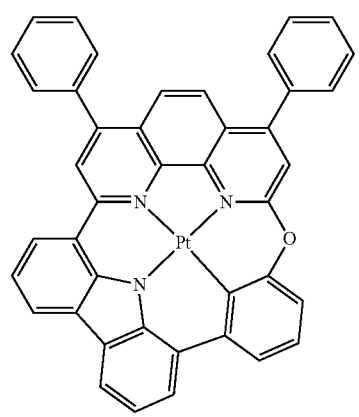
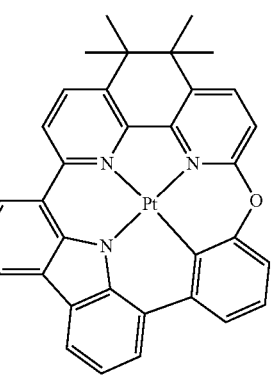

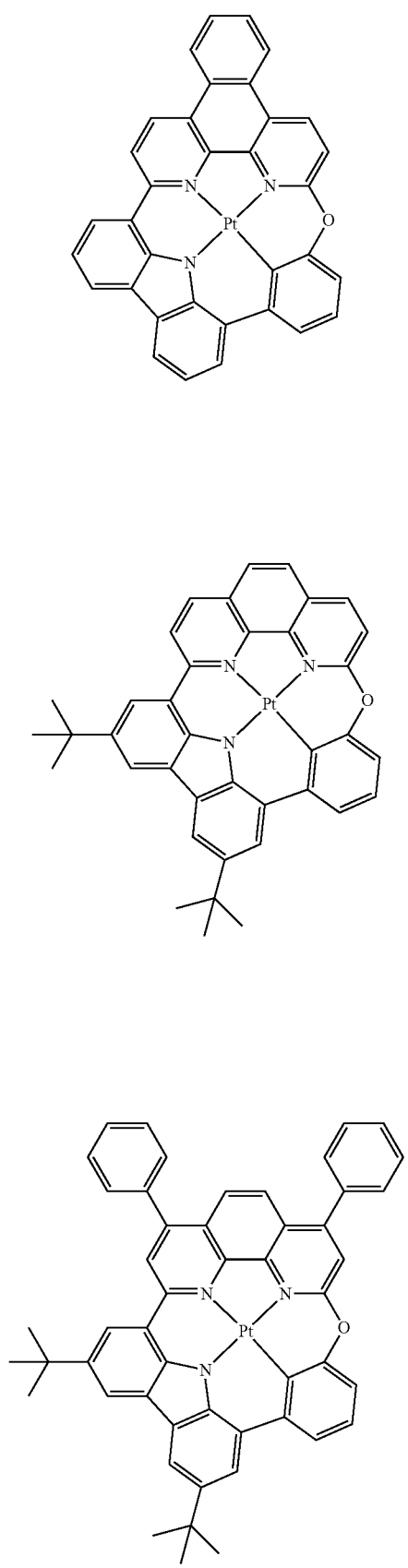
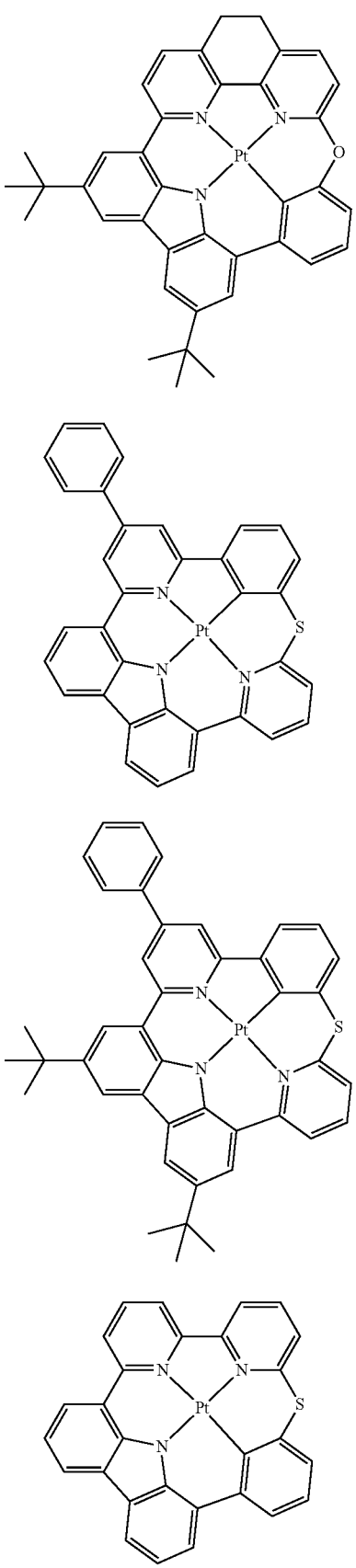

149
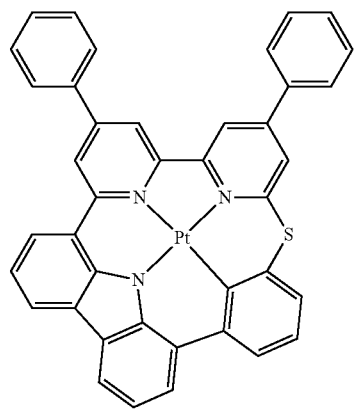
150
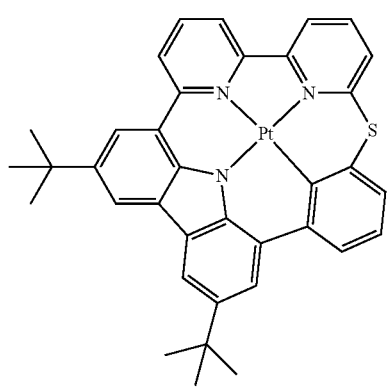
151
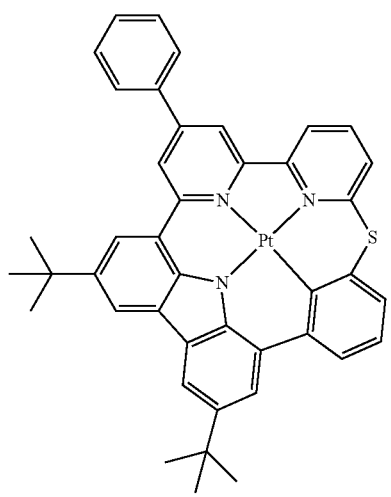
152
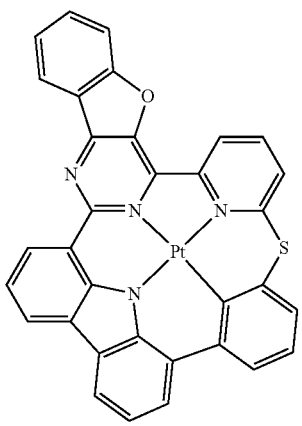
153
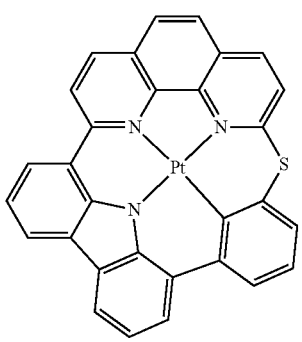
154
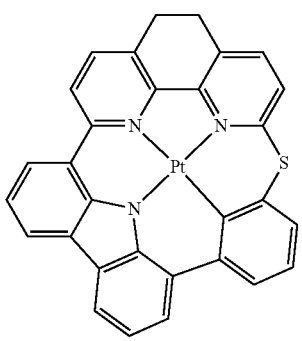
155
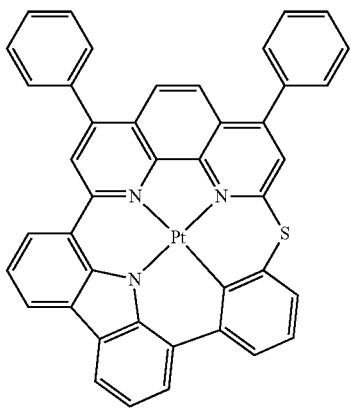

156 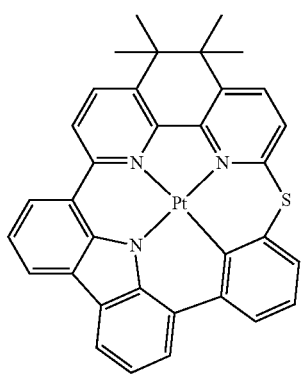

157 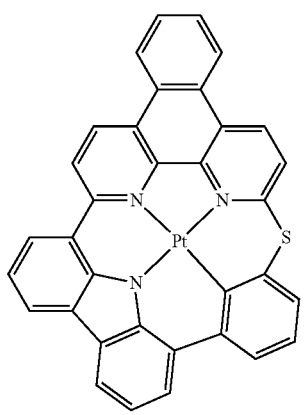

158 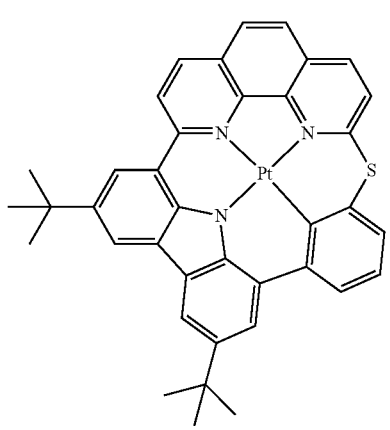

159 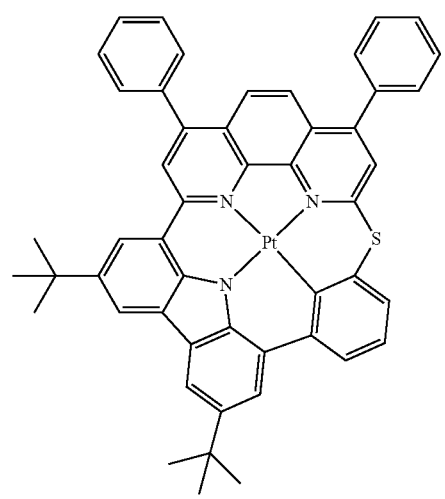

160 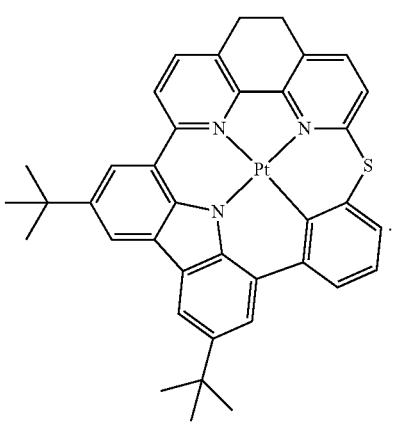

Formula 1 includes a moiety represented by

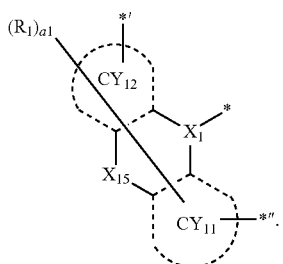

$X_1$ is N, a bond between $X_1$ and M in Formula 1 is a covalent bond, *' indicates a binding site to ring $CY_2$ in Formula 1, * indicates a binding site to M in Formula 1, and *" indicates a binding site to ring $CY_4$ in Formula 1. Therefore, since the full width at half maximum (FWHM) of the peak of the photoluminescence (PL) spectrum of the organometallic compound represented by Formula 1 and/or the electroluminescence (EL) spectrum of the organic light-emitting device including the organometallic compound may be improved (for example, reduced), the electronic device, for example, the organic light-emitting device, which includes the organometallic compound, may have excellent color purity, high luminescence efficiency, and/or a long lifespan. In an embodiment, the organometallic compound represented by Formula 1 may emit red light and/or near-infrared light having excellent color purity.

In addition, in Formula 1, ring $CY_{12}$ is connected to ring $CY_2$ via a single bond, ring $CY_2$ is connected to ring $CY_3$ via $T_1$, ring $CY_3$ is connected to ring $CY_4$ via $T_2$, and ring $CY_4$ is connected to ring $CY_{11}$ via a single bond. That is, the organometallic compound represented by Formula 1 may have four cyclometalated rings and have a stereoscopically stable molecular structure. Therefore, an electronic device, for example, an organic light-emitting device, which includes the organometallic compound, may have a long lifespan.

For example, highest occupied molecular orbital (HOMO), lowest unoccupied molecular orbital (LUMO), and triplet ($T_1$) energy levels of some of the above compounds were evaluated by a DFT method of Gaussian program (structurally optimized at a level of B3LYP, 6-31G (d,p)), and results thereof are shown in Table 1.

TABLE 1

| Compound No. | HOMO (eV) | LUMO (eV) | $T_1$ energy level (eV) |
|---|---|---|---|
| 77 | −4.589 | −1.775 | 1.961 |
| 85 | −4.419 | −1.876 | 1.845 |
| 86 | −4.604 | −2.287 | 1.622 |
| 101 | −4.640 | −2.168 | 1.743 |

From Table 1, it is confirmed that the organometallic compound represented by Formula 1 has such electric characteristics that are suitable for use in an electric device, for example, for use as a dopant for an organic light-emitting device.

Synthesis methods of the organometallic compound represented by Formula 1 may be understood by one of ordinary skill in the art by referring to Synthesis Examples provided below.

The organometallic compound represented by Formula 1 is suitable for use in an organic layer of an organic light-emitting device, for example, for use as a dopant in an emission layer of the organic layer. Thus, another aspect provides an organic light-emitting device that includes: a first electrode; a second electrode; and an organic layer that is disposed between the first electrode and the second electrode and includes an organic layer including an emission layer and at least one of the organometallic compound represented by Formula 1.

The organic light-emitting device may have, due to the inclusion of an organic layer including the organometallic compound represented by Formula 1, a low driving voltage, high efficiency, high power, high quantum efficiency, a long lifespan, a low roll-off ratio, and excellent color purity.

The organometallic compound represented by Formula 1 may be used between a pair of electrodes of the organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host).

The expression "(an organic layer) includes at least one of organometallic compounds" as used herein may include an embodiment in which "(an organic layer) includes identical organometallic compounds represented by Formula 1" and an embodiment in which "(an organic layer) includes two or more different organometallic compounds represented by Formula 1."

For example, the organic layer may include, as the organometallic compound, only Compound 1. In this embodiment, Compound 1 may be included in an emission layer of the organic light-emitting device. In one or more embodiments, the organic layer may include, as the organometallic compound, Compound 1 and Compound 2.

In this embodiment, Compound 1 and Compound 2 may be included in an identical layer (for example, Compound 1 and Compound 2 all may be included in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In an embodiment, in the organic light-emitting device, the first electrode is an anode, and the second electrode is a cathode, and the organic layer further includes a hole transport region disposed between the first electrode and the emission layer and an electron transport region disposed between the emission layer and the second electrode, wherein the hole transport region includes a hole injection layer, a hole transport layer, an electron blocking layer, or any combination thereof, and wherein the electron transport region includes a hole blocking layer, an electron transport layer, an electron injection layer, or any combination thereof.

The term "organic layer" as used herein refers to a single layer and/or a plurality of layers between the first electrode and the second electrode of the organic light-emitting device. The "organic layer" may include, in addition to an organic compound, an organometallic complex including metal.

The FIGURE is a schematic view of an organic light-emitting device 10 according to an embodiment. Hereinafter, the structure of an organic light-emitting device according to an embodiment and a method of manufacturing an organic light-emitting device according to an embodiment will be described in connection with the FIGURE.

The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

The first electrode 11 may be formed by depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode may be, for example, indium tin oxide (ITO), indium zinc oxide (IZO), tin oxide ($SnO_2$), and zinc oxide (ZnO). In one or more embodiments, magnesium (Mg), aluminum (Al), aluminum-lithium (Al—Li), calcium (Ca), magnesium-indium (Mg—In), or magnesium-silver (Mg—Ag) may be used as the material for forming the first electrode.

The first electrode 11 may have a single-layered structure or a multi-layered structure including two or more layers. For example, the first electrode 11 may have a three-layered structure of ITO/Ag/ITO, but the structure of the first electrode 110 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

A hole injection layer may be formed on the first electrode 11 by using one or more suitable methods selected from vacuum deposition, spin coating, casting, or Langmuir-Blodgett (LB) deposition.

When a hole injection layer is formed by vacuum deposition, the deposition conditions may vary according to a compound that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Angstroms per second (A/sec) to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one selected from m-MTDATA, TDATA, 2-TNATA, NPB, β-NPB, TPD, Spiro-TPD, Spiro-NPB, methylated-NPB, TAPC, HMTPD, 4,4',4''-tris(N-carbazolyl)triphenylamine (TCTA), polyaniline/dodecylbenzene sulfonic acid (PANI/DBSA), poly(3,4-ethylenedioxythiophene)/poly(4-styrene sulfonate) (PEDOT/PSS), polyaniline/camphor sulfonic acid (PANI/CSA), polyaniline/poly(4-styrene sulfonate) (PANI/PSS), a compound represented by Formula 201 below, and a compound represented by Formula 202 below:

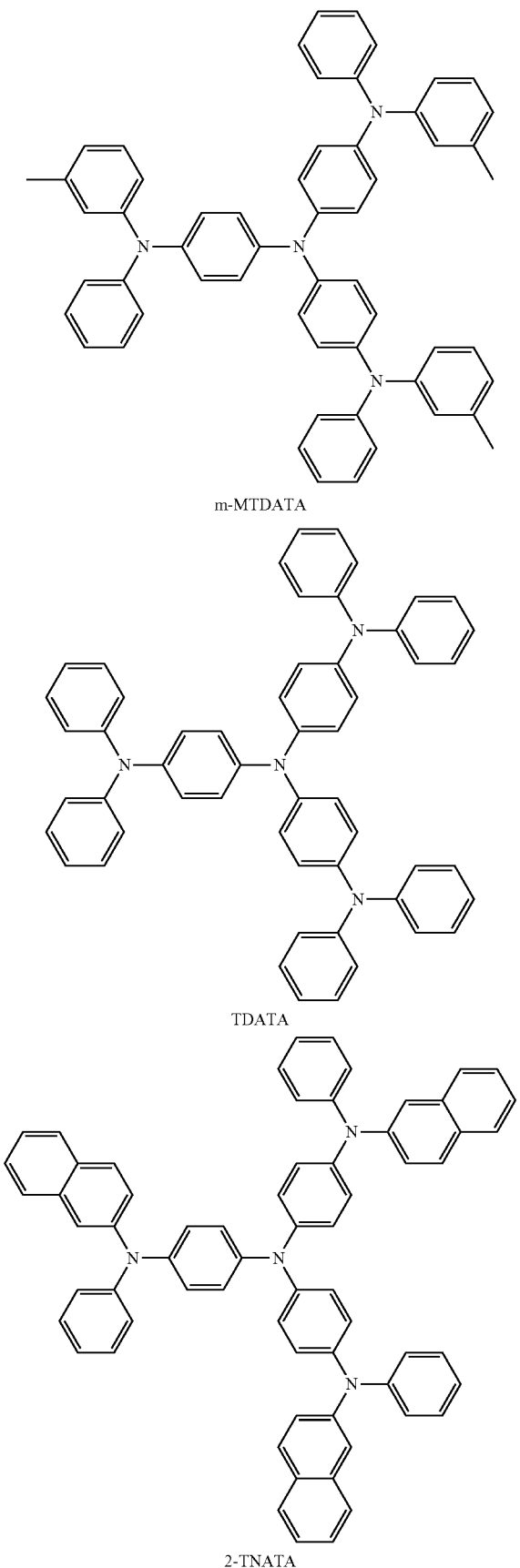

m-MTDATA

TDATA

2-TNATA

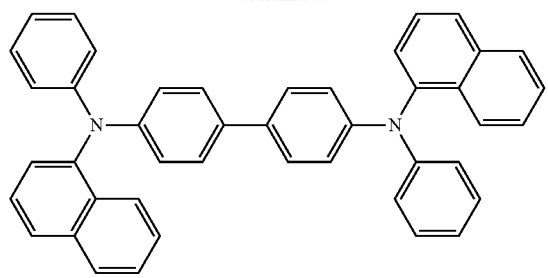
NPB
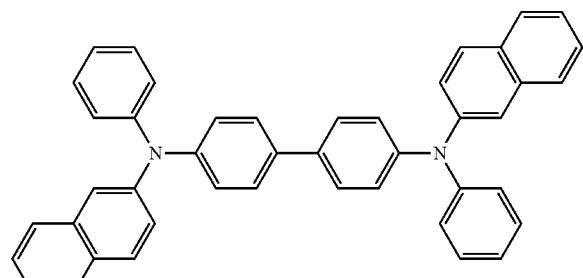
β-NPB
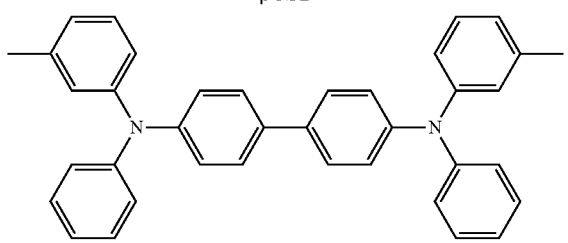
TPD
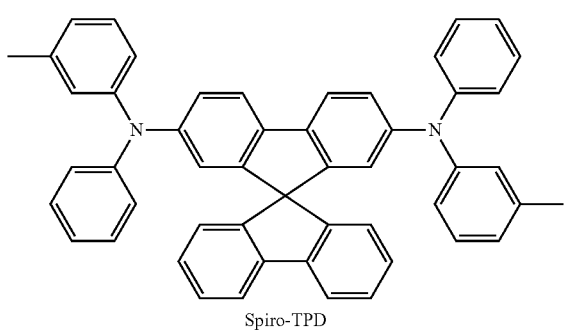
Spiro-TPD
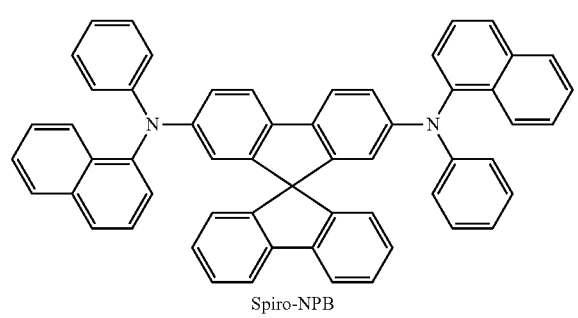
Spiro-NPB
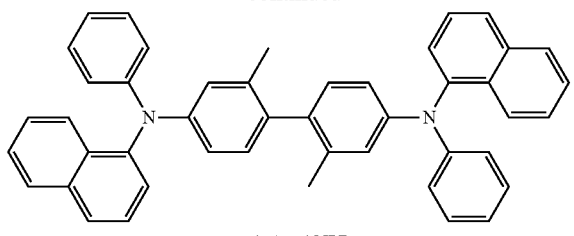
methylated NPB
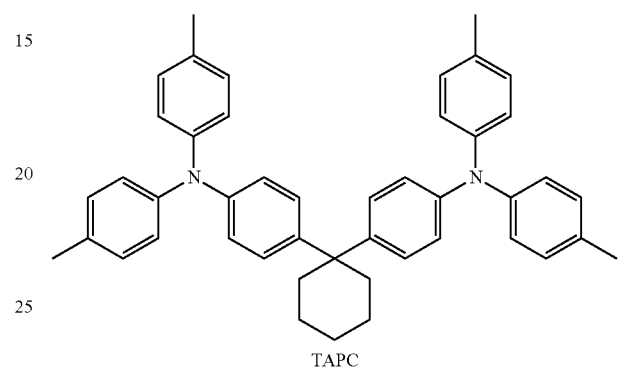
TAPC
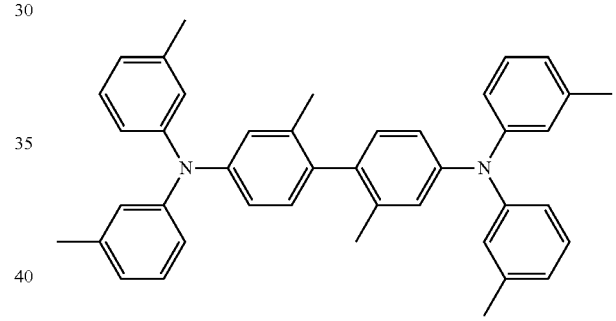
HMTPD
Formula 201
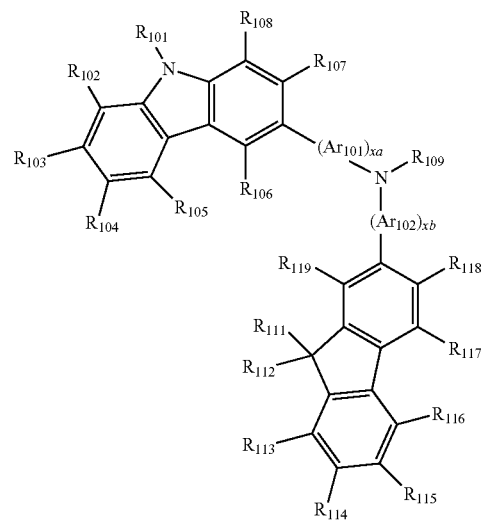

Formula 202

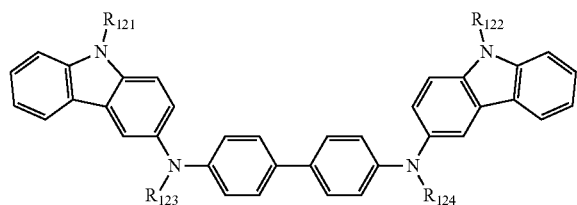

$Ar_{101}$ and $Ar_{102}$ in Formula 201 may each independently be selected from:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

In Formula 201, xa and xb may each independently be an integer from 0 to 5, or 0, 1, or 2. For example, xa is 1 and xb is 0, but xa and xb are not limited thereto.

$R_{101}$ to $R_{108}$, $R_{111}$ to $R_{119}$, and $R_{121}$ to $R_{124}$ in Formulae 201 and 202 may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, and so on), or a $C_1$-$C_{10}$ alkoxy group (for example, a methoxy group, an ethoxy group, a propoxy group, a butoxy group, a pentoxy group, and so on);

a $C_1$-$C_{10}$ alkyl group or a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_1$ alkoxy group, but embodiments of the present disclosure are not limited thereto, and $R_{109}$ in Formula 201 may be selected from:

a phenyl group, a naphthyl group, an anthracenyl group, and a pyridinyl group; and a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

According to an embodiment, the compound represented by Formula 201 may be represented by Formula 201A, but embodiments of the present disclosure are not limited thereto:

Formula 201A

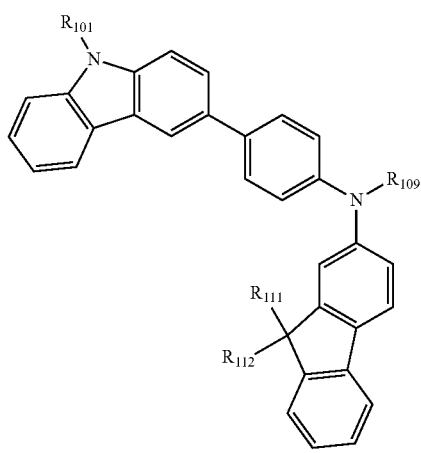

$R_{101}$, $R_{111}$, $R_{112}$, and $R_{109}$ in Formula 201A may be understood by referring to the description provided herein.

For example, the compound represented by Formula 201, and the compound represented by Formula 202 may include compounds HT1 to HT20 illustrated below, but are not limited thereto.

147 148
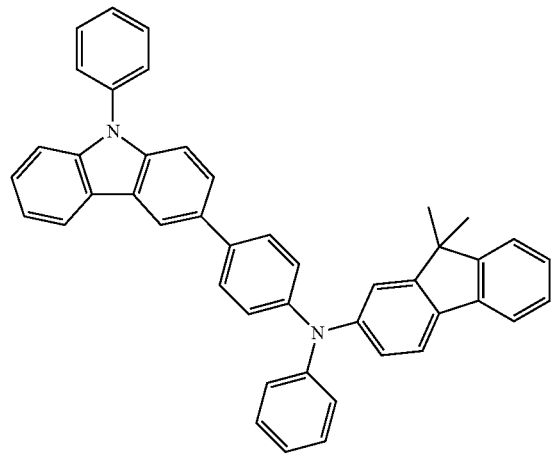 HT1
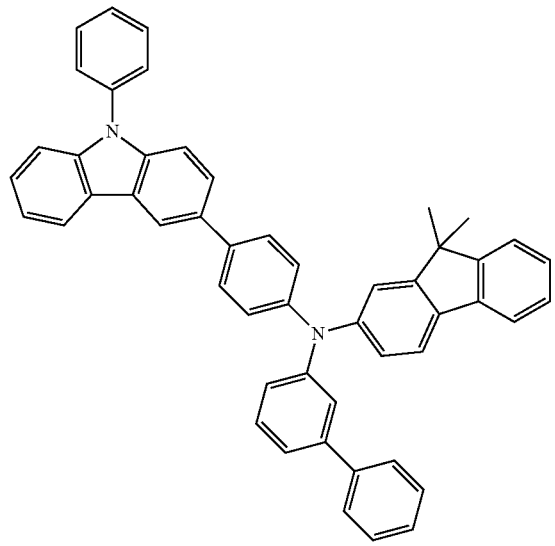 HT2
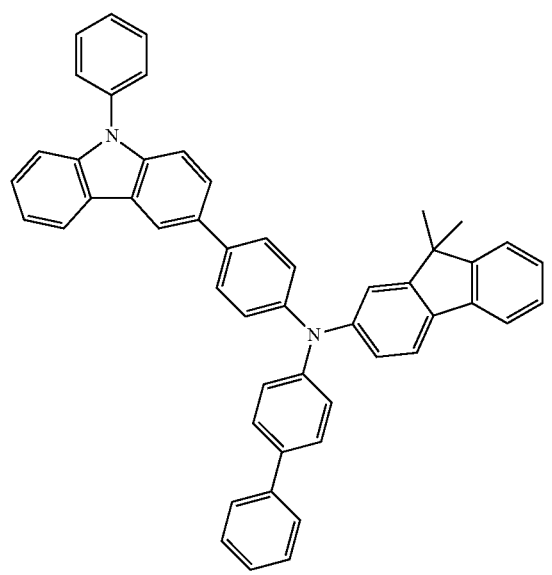 HT3
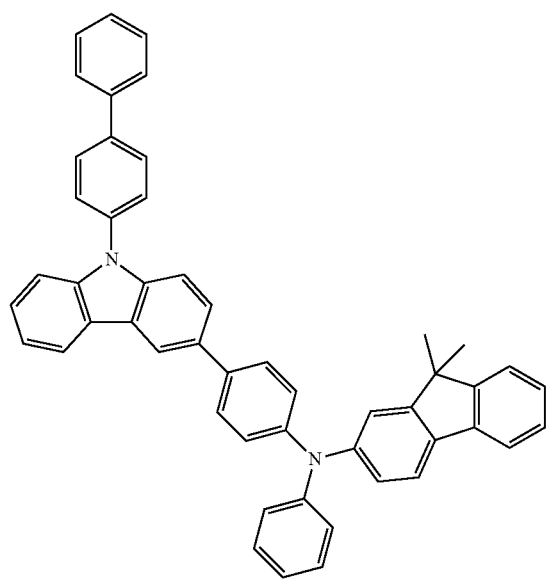 HT4

HT5
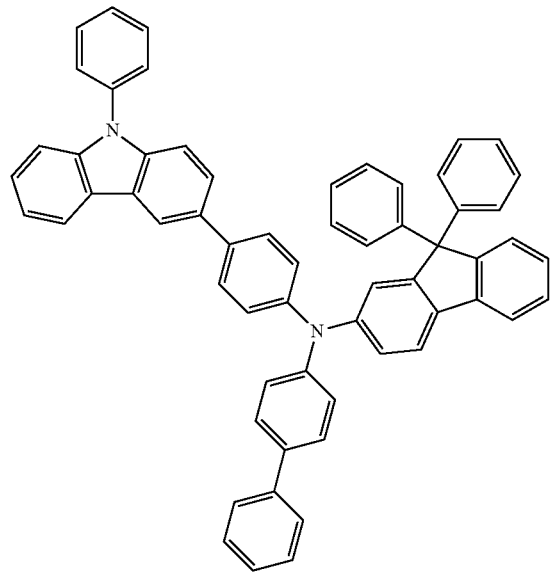
HT6
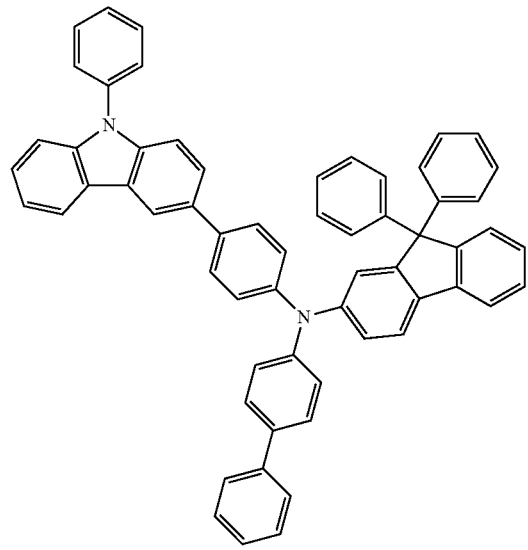
HT7
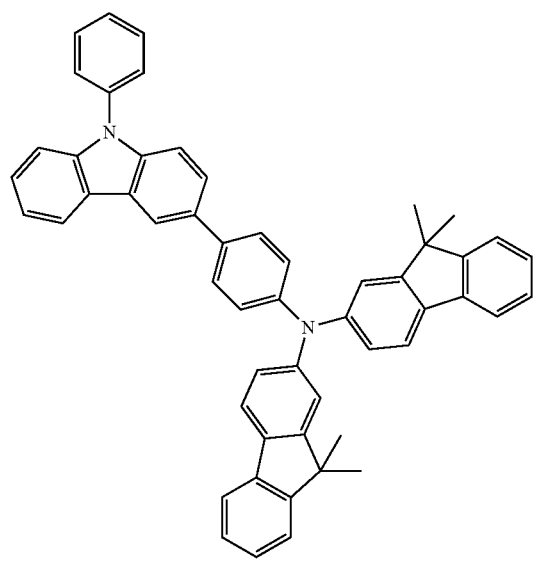
HT8
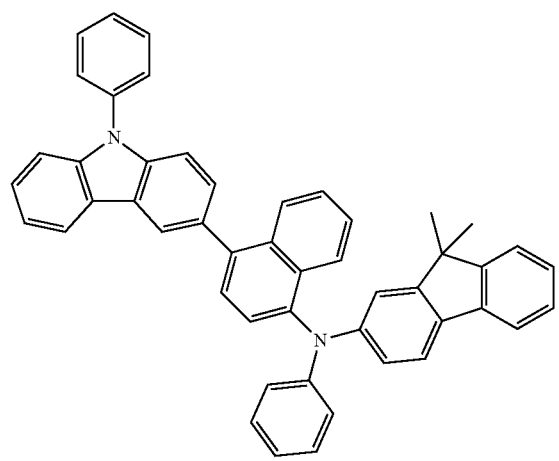

-continued
HT9
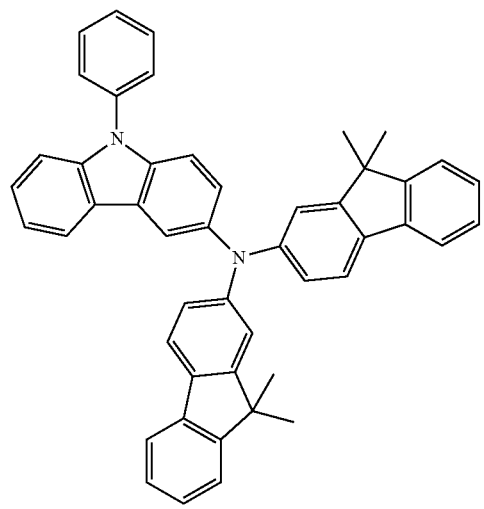
HT10
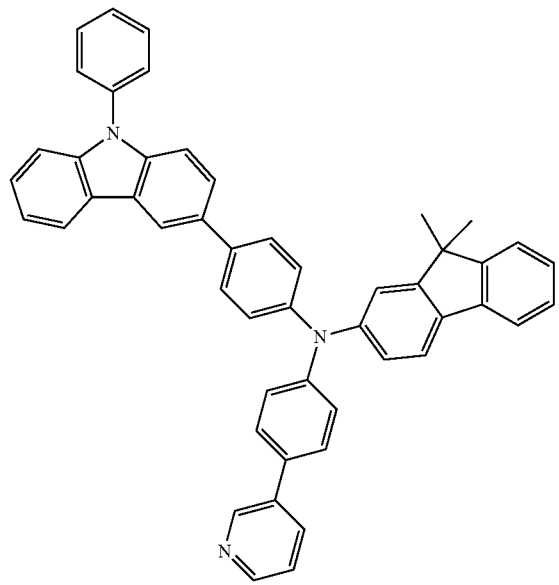
HT11
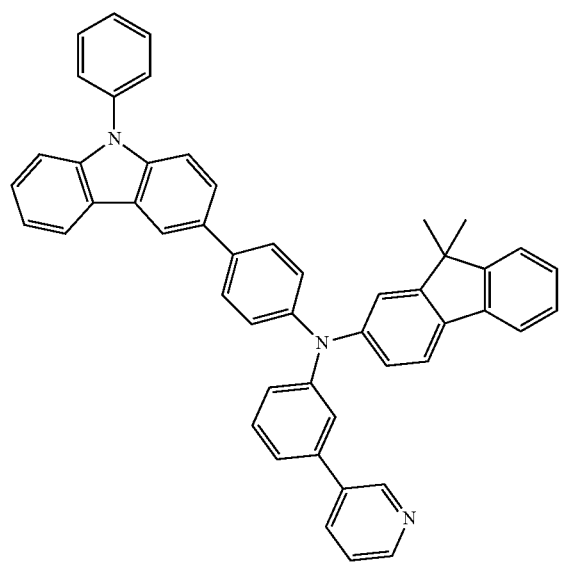
HT12
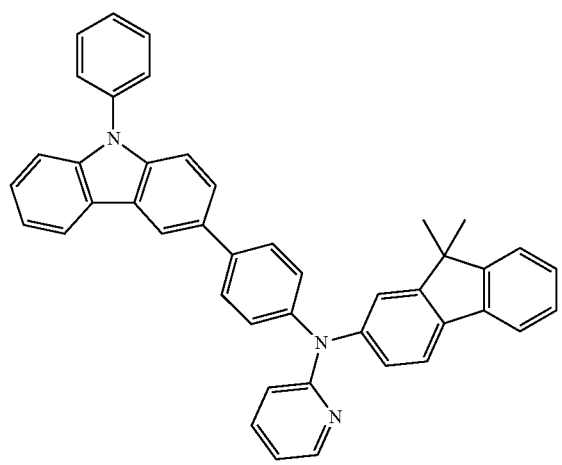
HT13
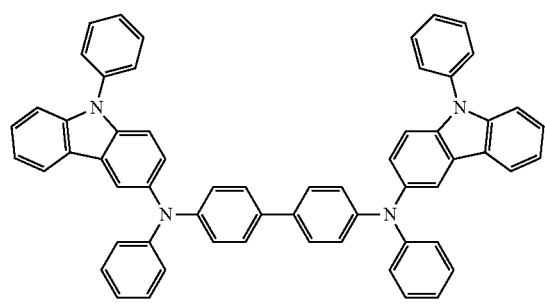
HT14
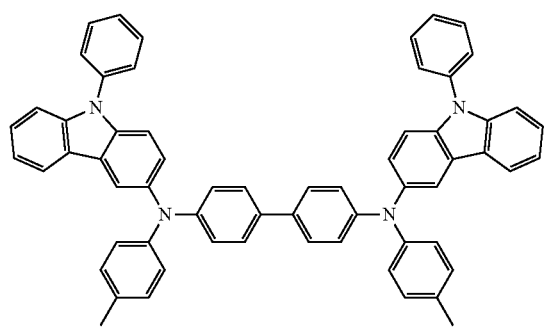

-continued

HT15 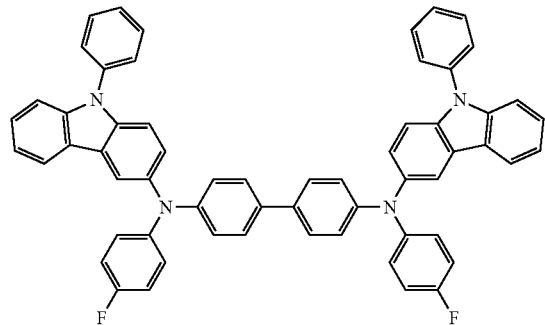 HT16 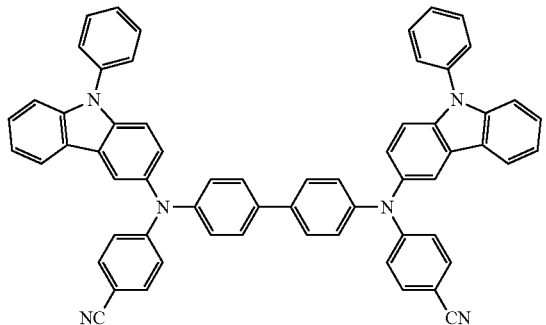

HT17 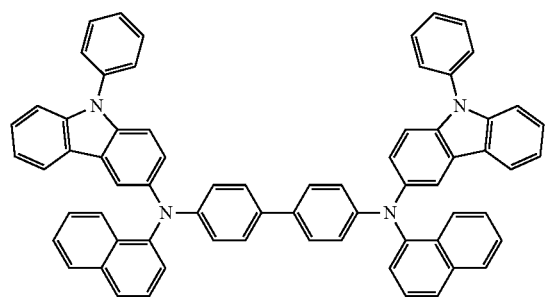 HT18 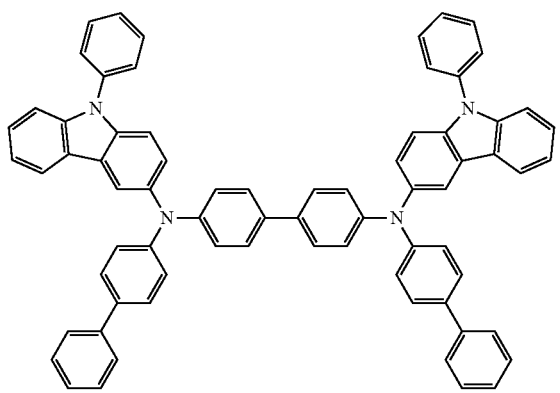

HT19 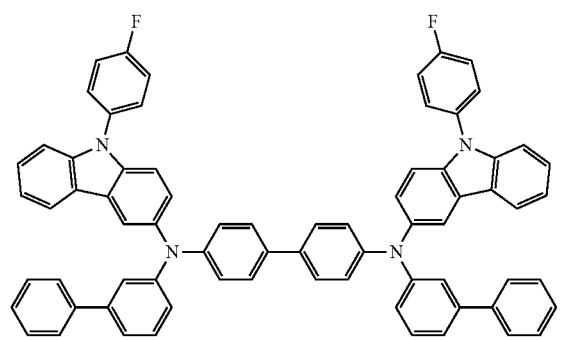 HT20 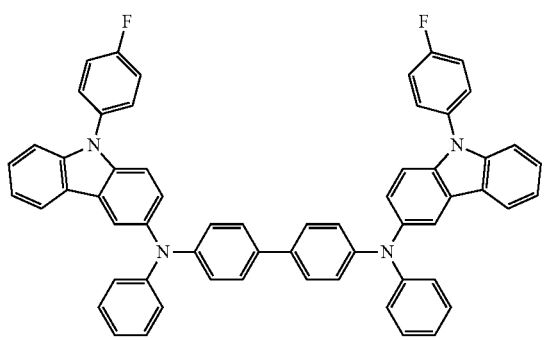

A thickness of the hole transport region may be in a range of about 100 Å to about 10,000 Å, for example, about 100 Å to about 1,000 Å. When the hole transport region includes at least one of a hole injection layer and a hole transport layer, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1,500 Å.

While not wishing to be bound by theory, it is understood that when the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments of the present disclosure are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenium oxide; and a cyano group-containing compound, such as Compound HT-D1 below, but are not limited thereto.

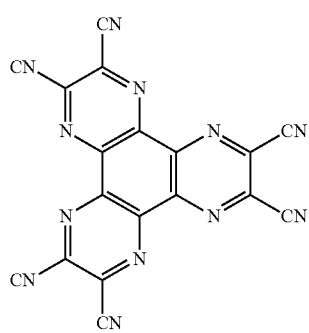

HT-D1

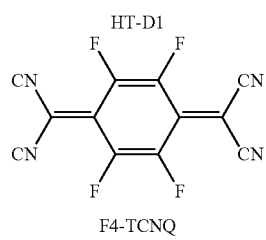

F4-TCNQ

The hole transport region may include a buffer layer.

Also, the buffer layer may compensate for an optical resonance distance according to a wavelength of light emitted from the emission layer, and thus, efficiency of a formed organic light-emitting device may be improved.

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a compound that is used to form the emission layer.

Meanwhile, when the hole transport region includes an electron blocking layer, a material for the electron blocking layer may be selected from materials for the hole transport region described above and materials for a host to be explained later. However, the material for the electron blocking layer is not limited thereto. For example, when the hole transport region includes an electron blocking layer, a material for the electron blocking layer may be mCP, which will be explained later.

The emission layer may include a host and a dopant, and the dopant may include the organometallic compound represented by Formula 1.

The host may include at least one selected from TPBi, TBADN, ADN (also referred to as "DNA"), CBP, CDBP, TCP, mCP, Compound H50, and Compound H51:

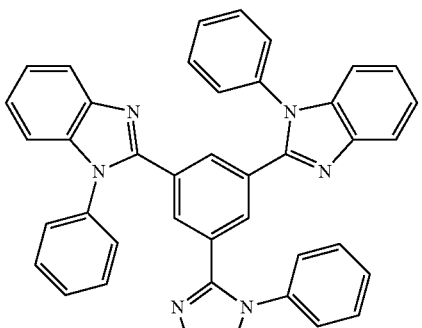

TPBi

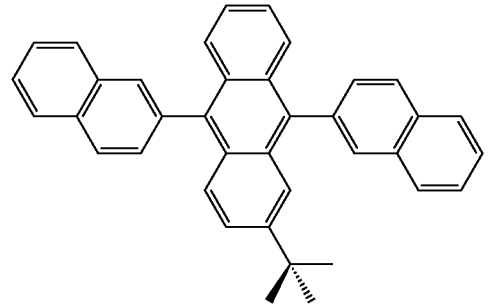

TBADN

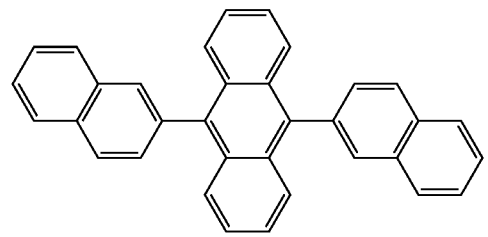

ADN

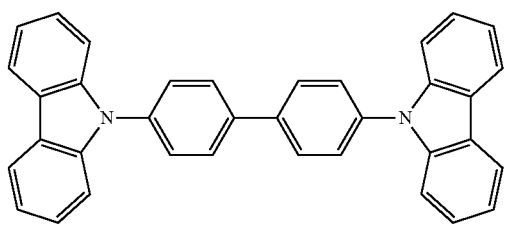

CBP

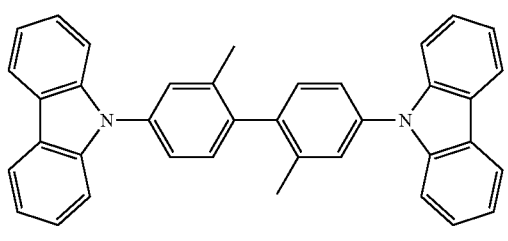

CDBP

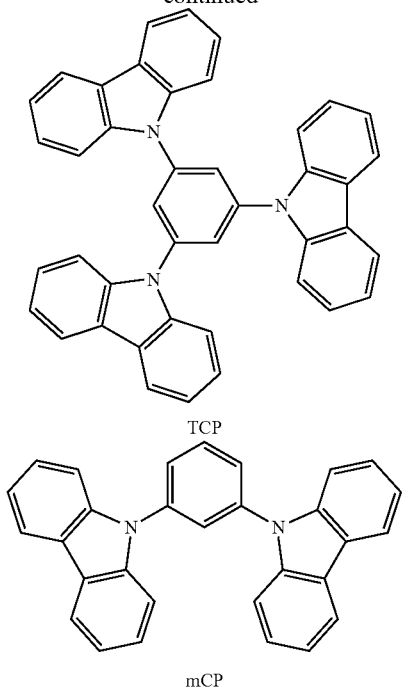

TCP

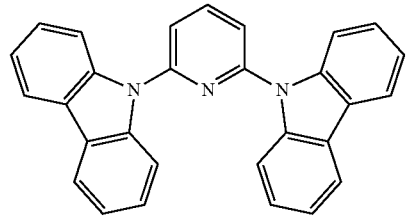

mCP

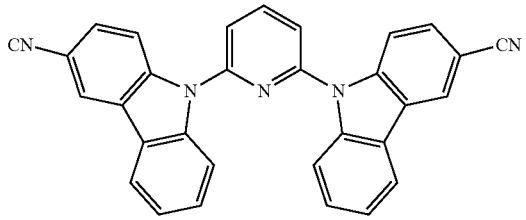

H50

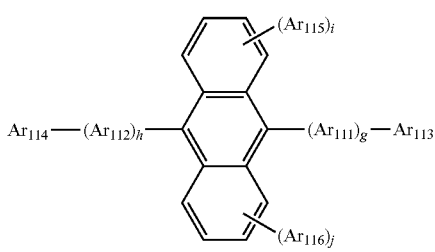

H51

In one or more embodiments, the host may further include a compound represented by Formula 301 below.

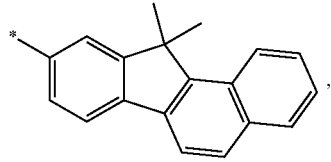 [SMILES: *c1ccc2c(c1)C(C)(C)c1c-2ccc2ccccc12]

Formula 301

$Ar_{111}$ and $Ar_{112}$ in Formula 301 may each independently be selected from:

a phenylene group, a naphthylene group, a phenanthrenylene group, and a pyrenylene group; and a phenylene group, a naphthylene group, a phenanthrenylene group, and a pyrenylene group, each substituted with at least one selected from a phenyl group, a naphthyl group, and an anthracenyl group.

$Ar_{113}$ to $Ar_{116}$ in Formula 301 may each independently be selected from:

a $C_1$-$C_{10}$ alkyl group, a phenyl group, a naphthyl group, a phenanthrenyl group, and a pyrenyl group; and a phenyl group, a naphthyl group, a phenanthrenyl group, and a pyrenyl group, each substituted with at least one selected from a phenyl group, a naphthyl group, and an anthracenyl group.

g, h, i, and j in Formula 301 may each independently be an integer from 0 to 4, and may be, for example, 0, 1, or 2.

$Ar_{113}$ to $Ar_{116}$ in Formula 301 may each independently be selected from:

a $C_1$-$C_{10}$ alkyl group, the substituted with at least one selected from a phenyl group, a naphthyl group, and an anthracenyl group;

a phenyl group, a naphthyl group, an anthracenyl group, a pyrenyl, a phenanthrenyl group, and a fluorenyl group;

a phenyl group, a naphthyl group, an anthracenyl group, a pyrenyl group, a phenanthrenyl group, and a fluorenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, and a fluorenyl group; and

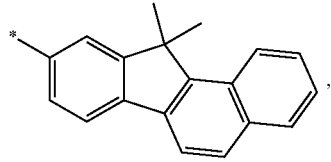 [SMILES: *c1ccc2c(c1)C(C)(C)c1c-2ccc2ccccc12]

but embodiments of the present disclosure are not limited thereto.

In one or more embodiments, the host may include a compound represented by Formula 302:

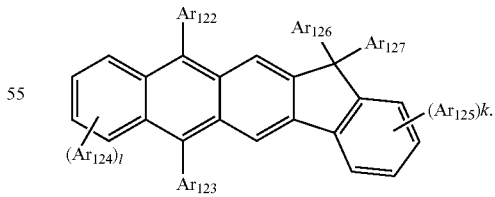

Formula 302

$Ar_{122}$ to $Ar_{125}$ in Formula 302 may each independently be defined as $Ar_{113}$ in Formula 301.

$Ar_{126}$ and $Ar_{127}$ in Formula 302 may each independently be a $C_1$-$C_{10}$ alkyl group (for example, a methyl group, an ethyl group, or a propyl group).

k and l in Formula 302 may each independently be an integer from 0 to 4. For example, k and l may be 0, 1, or 2.

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight, but embodiments of the present disclosure are not limited thereto.

A thickness of the emission layer may be in a range of about 100 Å to about 1,000 Å, for example, about 200 Å to about 600 Å. While not wishing to be bound by theory, it is understood that when the thickness of the emission layer is within the range described above, excellent emission characteristics may be exhibited without substantial increase of driving voltage.

Then, an electron transport region may be disposed on the emission layer electron transport region.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, and BAlq but embodiments of the present disclosure are not limited thereto.

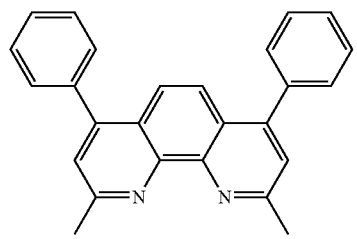

BCP

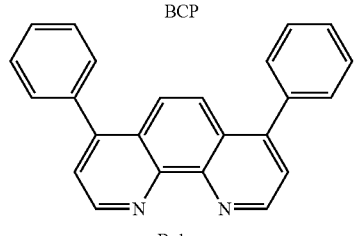

Bphen

A thickness of the hole blocking layer may be in a range of about 20 Å to about 1,000 Å, for example, about 30 Å to about 300 Å. While not wishing to be bound by theory, it is understood that when the thickness of the hole blocking layer is within these ranges, the hole blocking layer may have improved hole blocking ability without a substantial increase in driving voltage.

The electron transport layer may further include at least one selected from BCP, Bphen, Alq$_3$, BAlq, TAZ, and NTAZ.

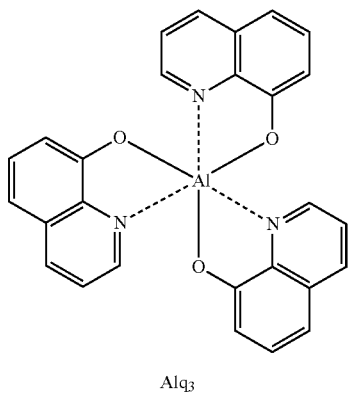

Alq$_3$

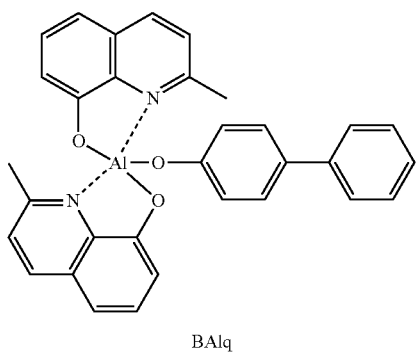

BAlq

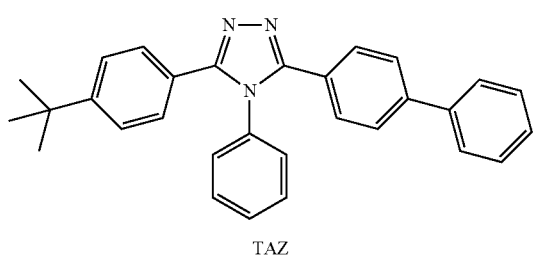

TAZ

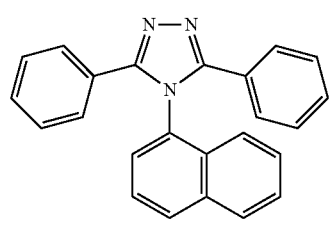

NTAZ

In one or more embodiments, the electron transport layer may include at least one of ET1 to ET25, but are not limited thereto:
ET1
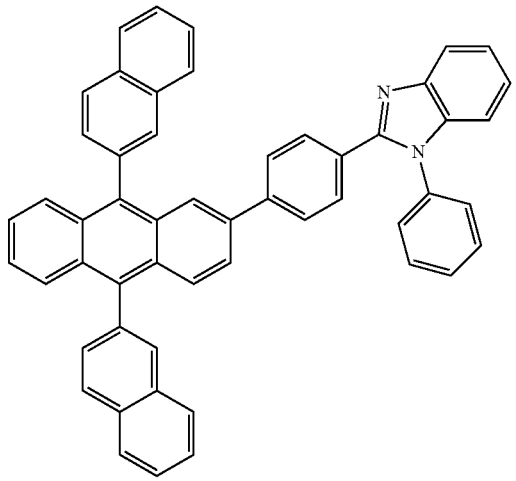
ET2
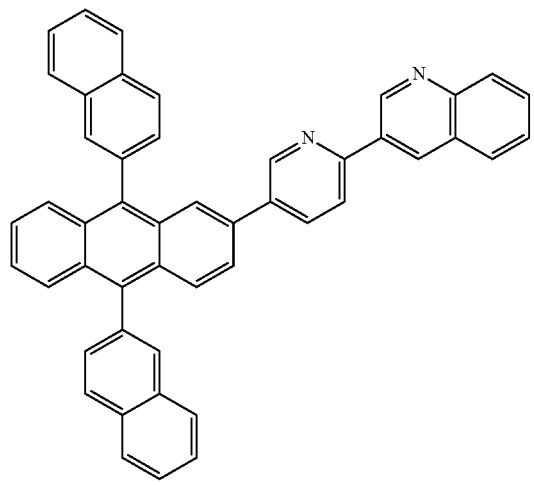
ET3
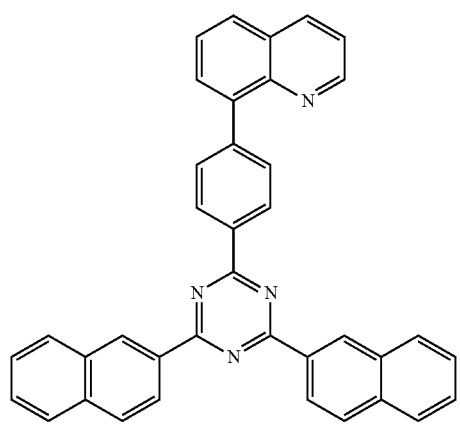
ET4
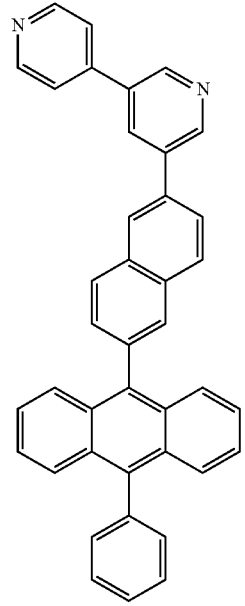
ET5
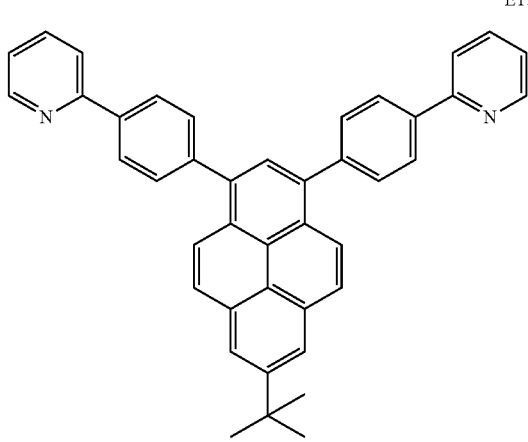
ET6
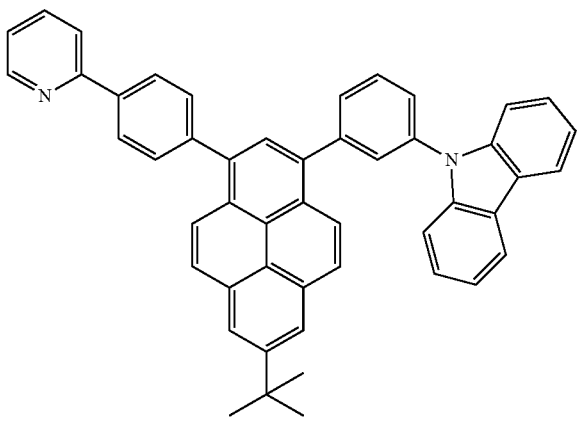

ET7
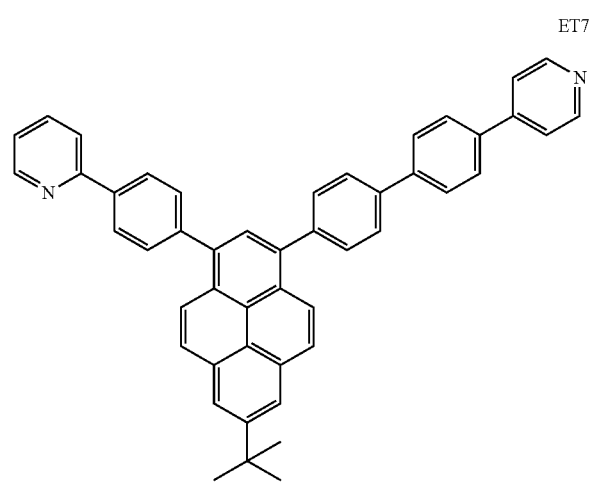
ET8
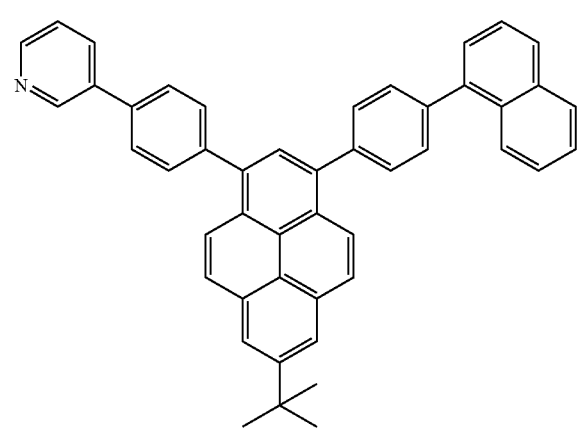
ET9
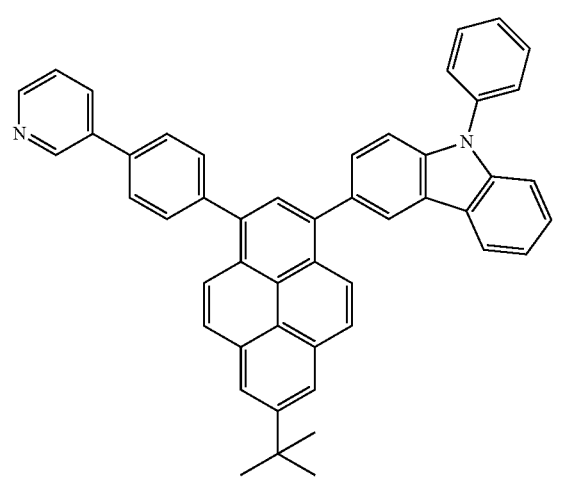
ET10
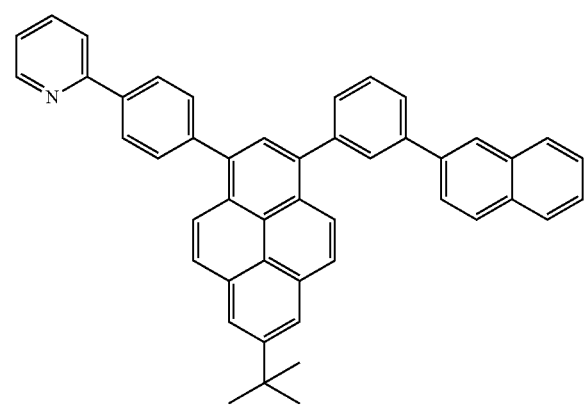
ET11
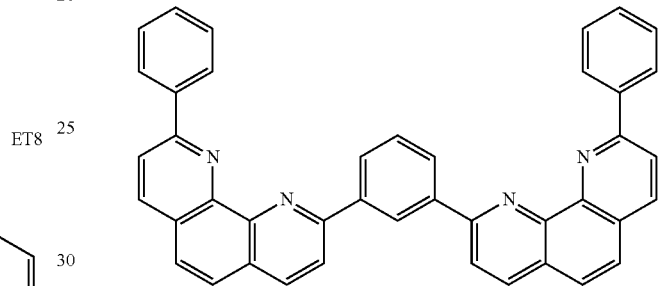
ET12
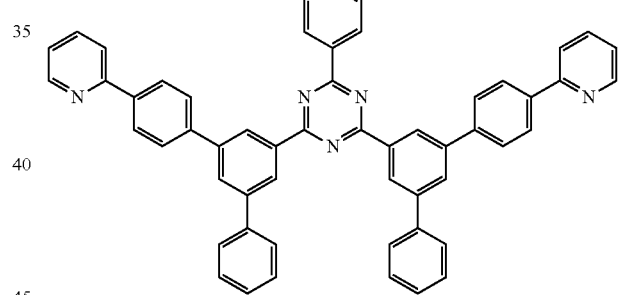
ET13
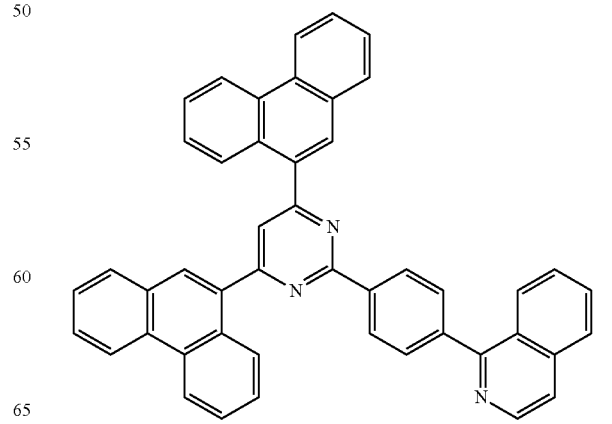

ET14
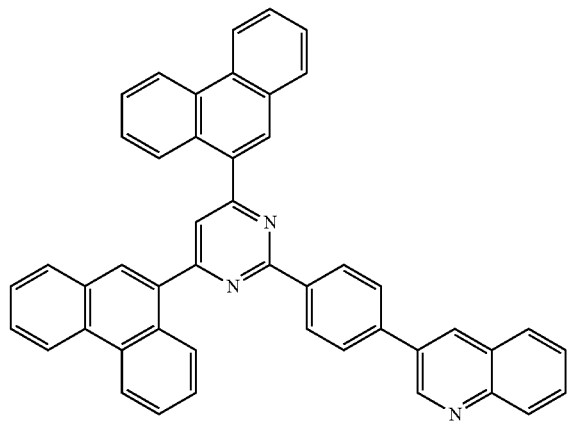
ET15
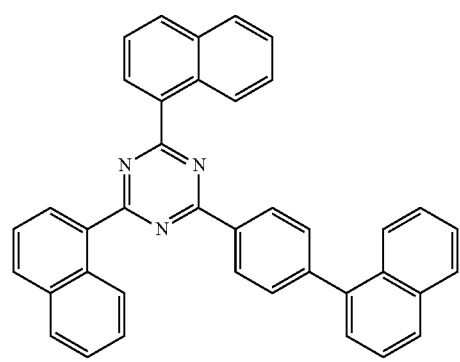
ET16
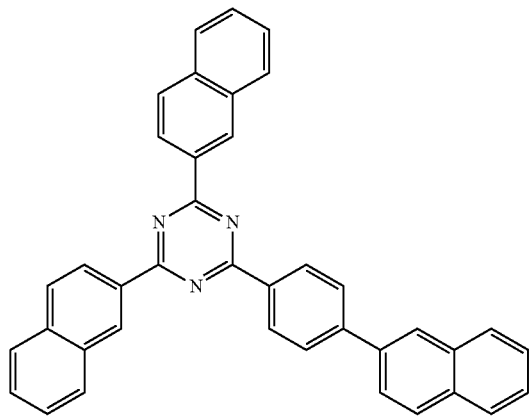
ET17
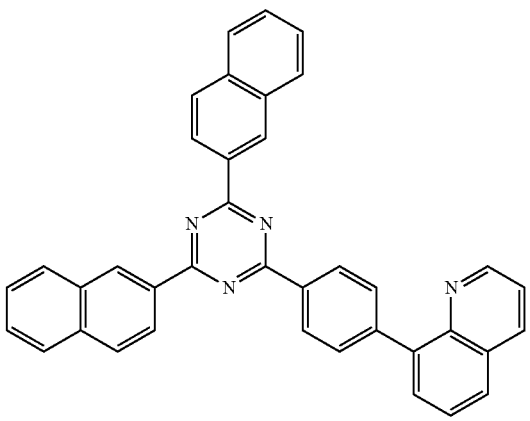
ET18
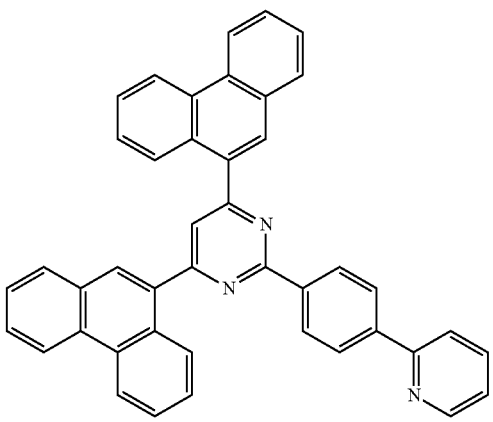
ET19
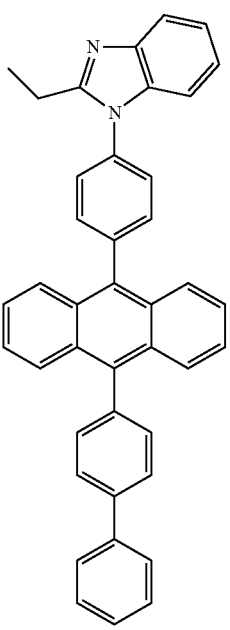

ET20
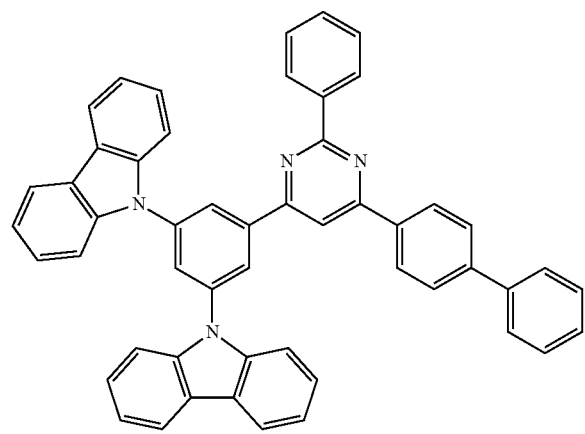
ET23
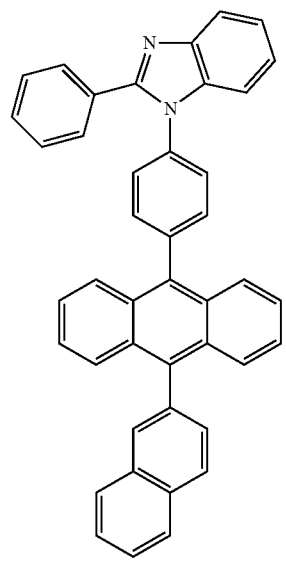
ET21
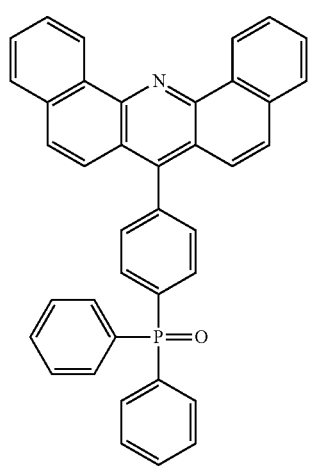
ET24
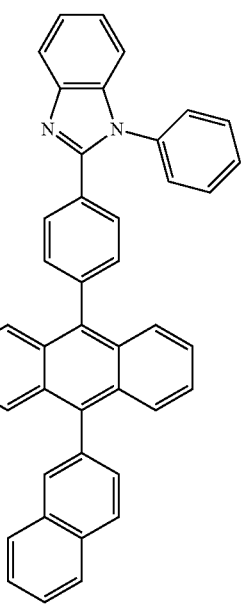
ET22
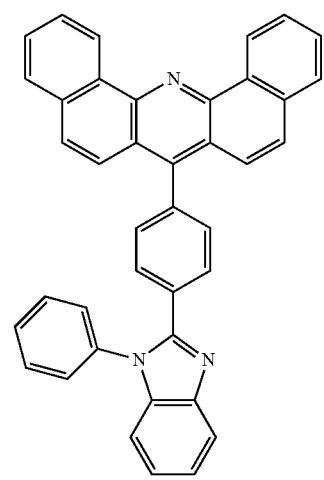
ET25
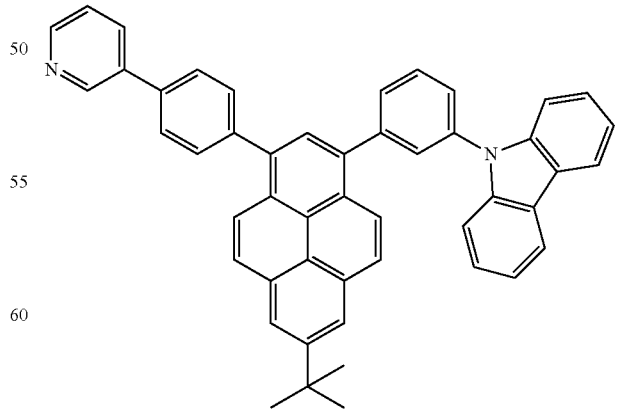
A thickness of the electron transport layer may be in a range of about 100 Å to about 1,000 Å, for example, about 150 Å to about 500 Å. While not wishing to be bound by theory, it is understood that when the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium 8-hydroxyquinolate, LiQ) or ET-D2.

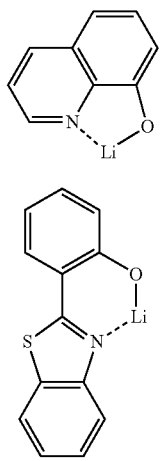

ET-D1

ET-D2

The electron transport region may include an electron injection layer that promotes flow of electrons from the second electrode 19 thereinto.

The electron injection layer may include at least one selected from LiF, NaCl, CsF, $Li_2O$, and BaO.

A thickness of the electron injection layer may be in a range of about 1 Å to about 100 Å, for example, about 3 Å to about 90 Å. While not wishing to be bound by theory, it is understood that when the thickness of the electron injection layer is within the range described above, the electron injection layer may have satisfactory electron injection characteristics without a substantial increase in driving voltage.

The second electrode 19 is disposed on the organic layer 15. The second electrode 19 may be a cathode. A material for forming the second electrode 19 may be selected from metal, an alloy, an electrically conductive compound, and a combination thereof, which have a relatively low work function. For example, lithium (Li), magnesium (Mg), aluminum (Al), aluminum-lithium (Al-Li), calcium (Ca), magnesium-indium (Mg—In), or magnesium-silver (Mg—Ag) may be used as a material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to the FIGURE, but embodiments of the present disclosure are not limited thereto.

Another aspect of the present disclosure provides a diagnostic composition including at least one organometallic compound represented by Formula 1.

The organometallic compound represented by Formula 1 provides high luminescence efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an iso-propyloxy group.

The term "$C_2$-$C_{60}$ alkenyl group" as used herein refers to a hydrocarbon group formed by including at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by including at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, P, Si and S as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one carbon-carbon double bond in its ring. Examples of the $C_1$-$C_{10}$ heterocycloalkenyl group are a 2,3-dihydrofuranyl group, and a 2,3-dihydrothiophenyl group. The term "$C_1$-

$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a carbocyclic aromatic system that has at least one heteroatom selected from N, O, P, Si, and S as a ring-forming atom, and 1 to 60 carbon atoms. The term "$C_1$-$C_{60}$ heteroarylene group" as used herein refers to a divalent group having a carbocyclic aromatic system that has at least one heteroatom selected from N, O, P, Si and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" as used herein indicates —$OA_{102}$ (wherein $A_{102}$ is the $C_6$-$C_{60}$ aryl group), and a $C_6$-$C_{60}$ arylthio group as used herein indicates —$SA_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, and S, other than carbon atoms, as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one heteroatom selected from N, O, Si, P, and S other than 1 to 30 carbon atoms. The $C_1$-$C_{30}$ heterocyclic group may be a monocyclic group or a polycyclic group.

At least one substituent of the substituted $C_5$-$C_{15}$ carbocyclic group, the substituted $C_2$-$C_{15}$ heterocyclic group, the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), and —P(=O)($Q_{28}$)($Q_{29}$); and —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), and $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group, and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1 (Compound 71)

Synthesis of Intermediate 71P-2

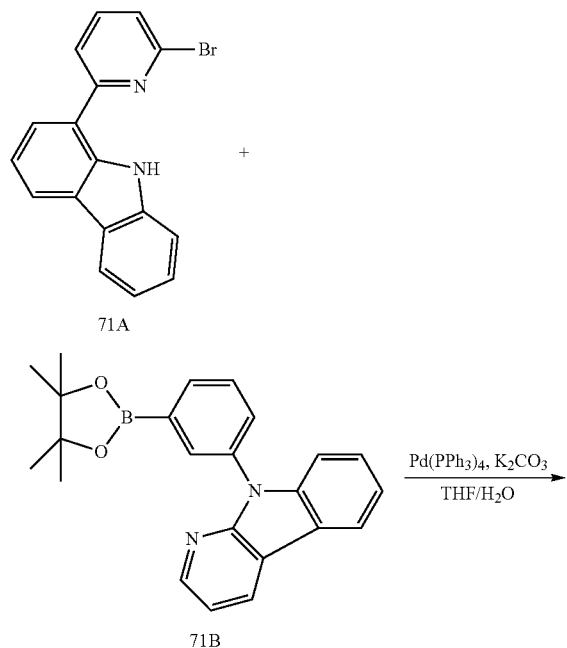

71A

71B

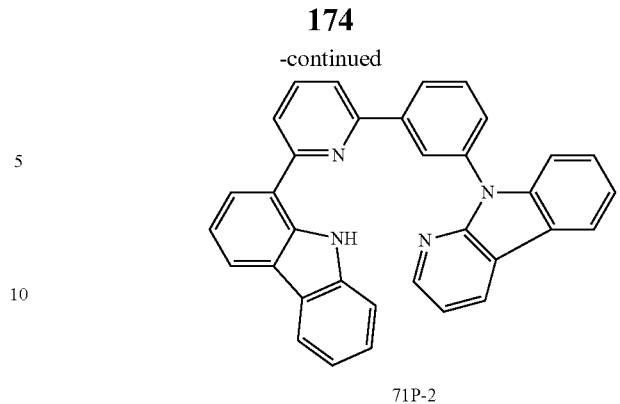

71P-2

Compounds 71A (3.3 grams (g), 10.3 millimoles (mmol)) and 71B (4.2 g, 11.3 mmol) as starting materials, Pd(PPh$_3$)$_4$ (0.8 g, 0.7 mmol), K$_2$CO$_3$ (4.3 g, 30.8 mmol), 120 milliliters (mL) of tetrahydrofuran (THF), and 40 mL of distilled water were mixed and stirred under reflux for 12 hours. After the temperature was lowered to room temperature, methylenechloride (MC) was added to extract the product. The organic layer extracted therefrom was dried over anhydrous magnesium sulfate (MgSO$_4$) to remove the solvent and filtered. The residue obtained by concentrating the filtrate under reduced pressure was purified by column chromatography with MC:Hexane to obtain 4.1 g (82%) of Intermediate 71P-2.

Synthesis of Intermediate 71P-1

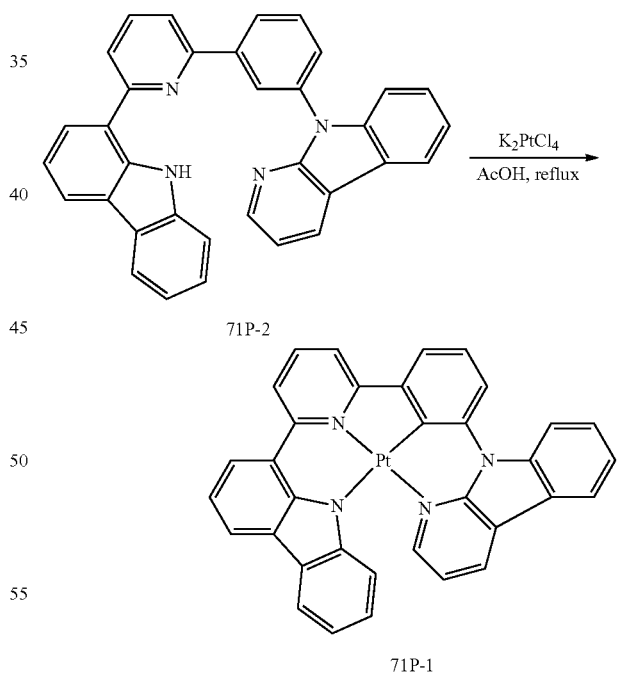

71P-2

71P-1

Intermediate 71P-2 (3.9 g, 8.1 mmol) and K$_2$PtCl$_4$ (3.7 g, 8.9 mmol) were mixed with 100 mL of acetic acid, and the mixed solution was stirred under reflux for 18 hours to allow the reaction to proceed. After the temperature was lowered, the resulting solid product was filtered and subjected to column chromatography with MC:hexane to obtain 3.0 g (55%) of Intermediate 71P-1.

Synthesis of Compound 71

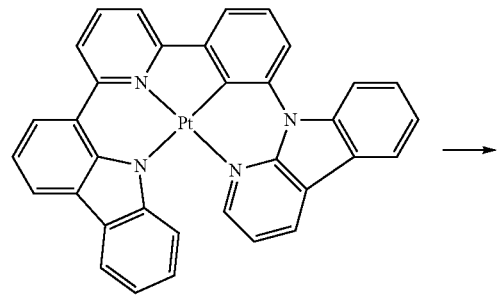

71P-1

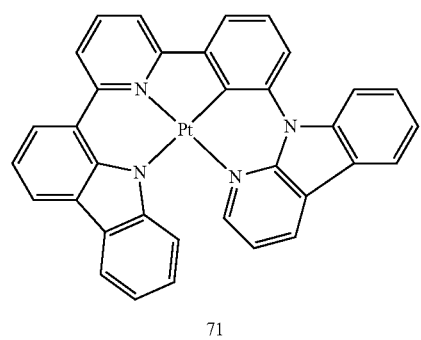

71

Intermediate 71P-1 (3.5 g, 5.2 mmol) was allowed to react at a temperature of 300° C. for 18 hours, and then, the temperature was lowered. The resulting product was dissolved in MC and subjected to column chromatography with MC:hexane to obtain 0.9 g (26%) of Compound 71. The obtained compound was identified by Mass and HPLC analysis.

HRMS (MALDI) calcd for $C_{34}H_{18}N_4Pt$: m/z 677.1179, Found: 677.1185.

Synthesis Example 2 (Compound 72)

Synthesis of Intermediate 72P-2

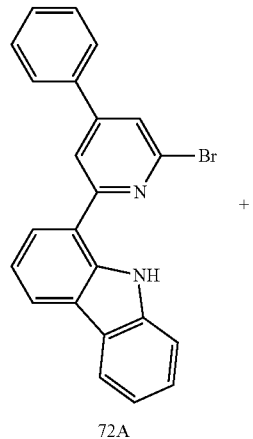

72A

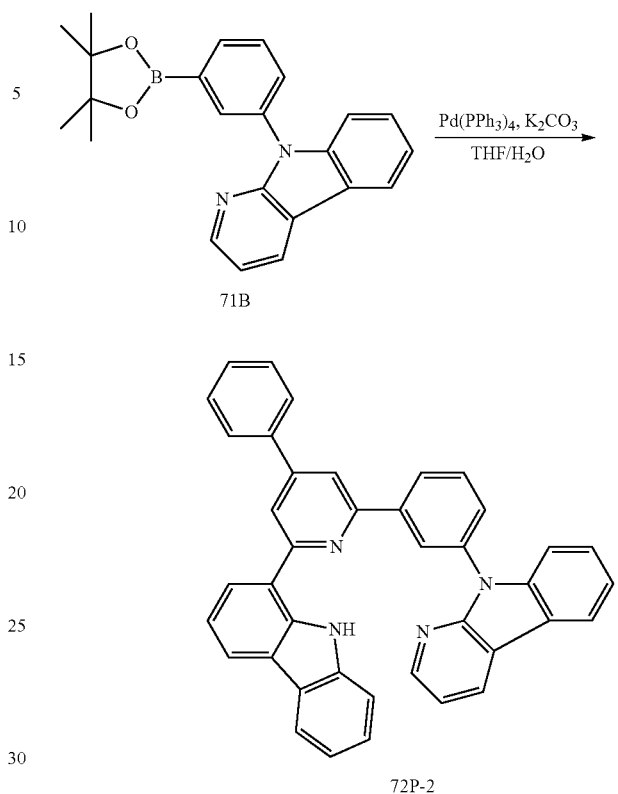

Compounds 72A (3.0 g, 7.6 mmol) and 71B (3.1 g, 8.3 mmol) as starting materials, $Pd(PPh_3)_4$ (0.6 g, 0.5 mmol), $K_2CO_3$ (3.1 g, 22.7 mmol), 90 mL of tetrahydrofuran (THF), and 30 mL of distilled water were mixed and stirred under reflux for 12 hours. After the temperature was lowered to room temperature, methylenechloride (MC) was added to extract the product. The organic layer extracted therefrom was dried over anhydrous magnesium sulfate ($MgSO_4$) to remove the solvent. The residue obtained by concentrating the filtrate under reduced pressure was purified by column chromatography with MC:Hexane to obtain 3.4 g (77%) of Intermediate 72P-2.

Synthesis of Intermediate 72P-1

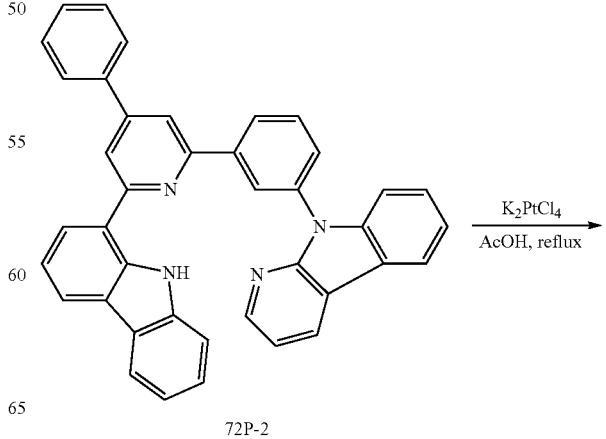

72P-2

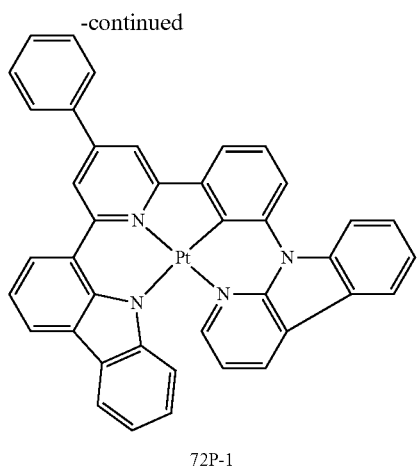

72P-1

Intermediate 72P-2 (3.0 g, 5.3 mmol) and K$_2$PtCl$_4$ (2.4 g, 5.8 mmol) were mixed with 70 mL of acetic acid, and the mixed solution was stirred under reflux for 18 hours to allow the reaction to proceed. After the temperature was lowered, the resulting solid product was filtered and subjected to column chromatography with MC:hexane to obtain 1.9 g (48%) of Intermediate 72P-1.

Synthesis of Compound 72

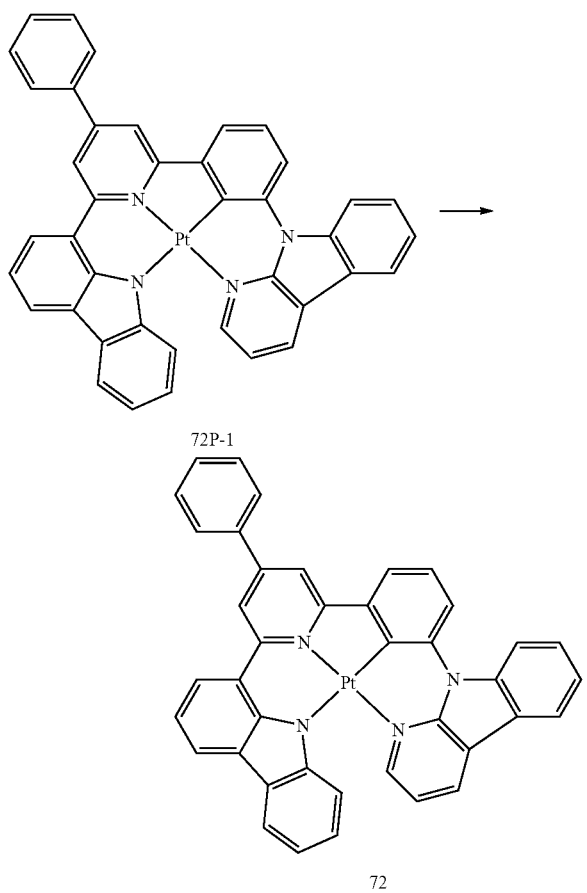

72P-1

72

Intermediate 72P-1 (1.9 g, 2.5 mmol) was allowed to react at a temperature of 300° C. for 18 hours, and then, the temperature was lowered. The resulting product was dissolved in MC and subjected to column chromatography with MC:hexane to obtain 0.3 g (16%) of Compound 72. The obtained compound was identified by Mass and HPLC analysis.

HRMS (MALDI) calcd for $C_{40}H_{22}N_4Pt$: m/z 753.1492, Found: 753.1486.

Example 1

An indium tin oxide (ITO) glass substrate was cut to a size of 50 mm×50 mm×0.5 mm (mm=millimeters), and then, sonicated in acetone iso-propyl alcohol and pure water, each for 15 minutes, and then, washed by exposure to UV ozone for 30 minutes.

Subsequently, on the ITO electrode (anode) on the glass substrate, m-MTDATA was deposited at a deposition speed of 1 Angstrom per second (Å/sec) to form a hole injection layer having a thickness of 600 Angstroms (Å), and α-NPD was deposited on the hole injection layer at a deposition speed of 1 Å/sec to form a hole transport layer having a thickness of 250 Å.

Compound 71 (dopant) and CBP (host) were co-deposited on the hole transport layer at a deposition speed of 0.1 Å/sec and a deposition speed of 1 Å/sec, respectively, to form an emission layer having a thickness of 400 Å.

BAlq was deposited on the emission layer at a deposition speed of 1 Å/sec to form a hole blocking layer having a thickness of 50 Å, and Alq$_3$ was deposited on the hole blocking layer to form an electron transport layer having a thickness of 300 Å, and then, LiF was deposited on the electron transport layer to form an electron injection layer having a thickness of 10 Å, and then, Al was vacuum deposited on the electron injection layer to form a second electrode (cathode) having a thickness of 1,200 Å, thereby completing the manufacture of an organic light-emitting device having a structure of ITO/m-MTDATA (600 Å)/α-NPD (250 Å)/CBP+10% (Compound 71) (400 Å)/Balq(50 Å)/Alq$_3$(300 Å)/LiF(10 Å)/Al(1,200 Å).

Example 2 and Comparative Examples A and B

Organic light-emitting devices were manufactured in the same manner as in Example 1, except that in forming an emission layer, for use as a dopant, corresponding compounds shown in Table 2 were used instead of Compound 71.

Evaluation Example 1: Evaluation of Characteristics of Organic Light-Emitting Devices The driving voltage, external quantum efficiency (EQE), a full width at half maximum (FWHM) and lifespan (T$_{97}$) of the organic light-emitting devices manufactured according to Examples 1 and 2 and Comparative Examples A and B were evaluated, and results thereof are shown in Table 2. A current-voltage meter (Keithley 2400) and a luminance meter (Minolta Cs-1000A) were used as the evaluation device, and the lifespan (T$_{97}$) indicates an amount of time that lapsed when luminance was 97% of initial luminance (100%). The lifespan (T$_{97}$) was indicated by relative values of the lifespan (T$_{97}$) of the organic light-emitting device of Comparative Example A.

TABLE 2

| Dopant | EQE (%) | FWHM (nm) | T$_{97}$ (%) (at 6000 nit) |
|---|---|---|---|
| Example 1 | Compound 71 | 21.9 | 38.2 | 374 |
| Example 2 | Compound 72 | 23.8 | 40.6 | 623 |
| Comparative Example A | Compound A | 12.1 | 56.2 | 100 |
| Comparative Example B | Compound B | 10.8 | 116.5 | 167 |

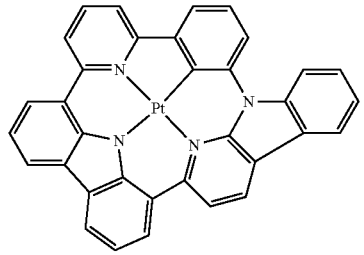

71

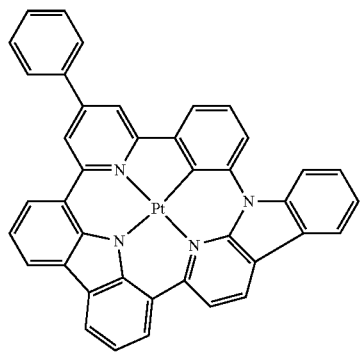

72

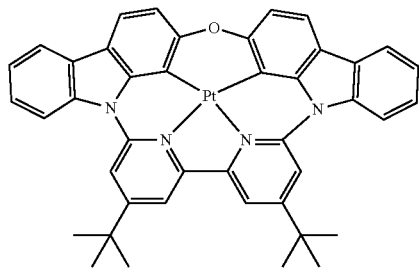

A

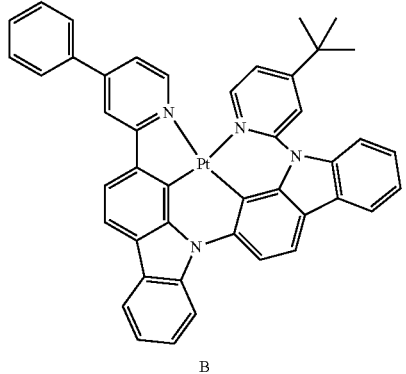

B

Referring to Table 2, it is confirmed that the organic light-emitting devices of Examples 1 and 2 have improved EQE, FWHM and lifespan characteristics, compared with Comparative Examples A and B.

Since the organometallic compound has excellent electrical characteristics and thermal stability, an organic light-emitting device including the organometallic compound may have excellent FWHM, EQE, and lifespan characteristics. In addition, since the organometallic compound has excellent phosphorescence characteristics, the organometallic compound may be used to provide a diagnostic composition having high diagnostic efficiency.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the FIGURES, it will be understood by those of ordinary skill in the art that various changes in form and details may be made therein without departing from the spirit and scope of the present description as defined by the following claims.

What is claimed is:

1. An organometallic compound represented by Formula 1:

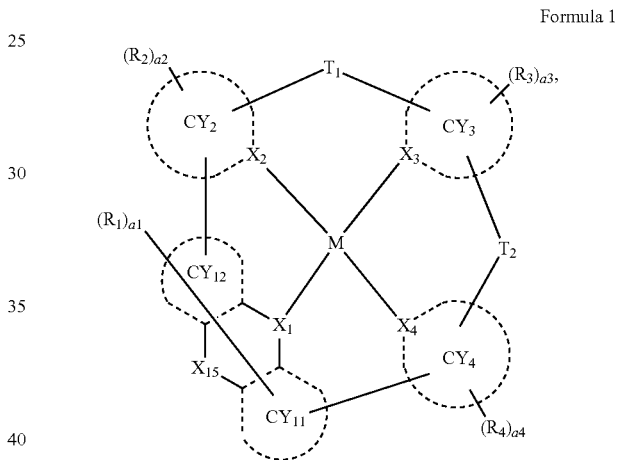

Formula 1 wherein, in Formula 1,

M is beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au), $X_1$ is N, $X_2$ to $X_4$ are each independently N or C, a bond between $X_1$ and M is a covalent bond, two bonds selected from a bond between $X_2$ and M, a bond between $X_3$ and M, and a bond between $X_4$ and M are each a coordinate bond and the remaining bond is a covalent bond, ring $CY_{11}$ and ring $CY_{12}$ are each independently a $C_5$-$C_{15}$ carbocyclic group or a $C_1$-$C_{15}$ heterocyclic group, ring $CY_2$ to ring $CY_4$ are each independently a $C_5$-$C_{30}$ carbocyclic group or a $C_1$-$C_{30}$ heterocyclic group, $T_1$ and $T_2$ are each independently selected from a single bond, a double bond, *—N($R_5$)—*', *—B($R_5$)—*', *—P($R_5$)—*', *—C($R_5$)($R_6$)—*', *—Si($R_5$)($R_6$)—*', *—Ge($R_5$)($R_6$)—*', *—S—*', *—Se—*', *—O—*', *—C(=O)—*', *—S(=O)—*', *—S(=O)$_2$—*', *—C($R_5$)=*', *=C($R_5$)—*', *—C($R_5$)=C($R_6$)—*', *—C($R_{5a}$)($R_{5b}$)—C($R_{6a}$)($R_{6b}$)—*', *—C(=S)—*', and *—C≡C—*', and * and *' each indicate a binding site to a neighboring atom, $X_{15}$ is a single bond, O, S, Se, $N(R_{15})$, $C(R_{15})(R_{16})$, or $Si(R_{15})(R_{16})$, $R_5$ and $R_6$, and $R_{15}$ and $R_{16}$ are optionally linked via a single bond, a double bond, or a first linking group to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group are each unsubstituted or substituted with at least one $R_{1a}$, $R_1$ to $R_6$, $R_{5a}$, $R_{5b}$, $R_{6a}$, $R_{6b}$, $R_{15}$, and $R_{16}$ are each independently selected from hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, and —$P(=O)(Q_8)(Q_9)$, a1 to a4 are each independently an integer from 0 to 20, two or more groups selected from a plurality of neighboring groups $R_1$ are optionally linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group are each unsubstituted or substituted with at least one $R_{1a}$, two or more groups selected from a plurality of neighboring groups $R_2$ are optionally linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group are each unsubstituted or substituted with at least one $R_{1a}$, two or more groups selected from a plurality of neighboring groups $R_3$ are optionally linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group are each unsubstituted or substituted with at least one $R_{1a}$, two or more groups selected from a plurality of neighboring groups $R_4$ are optionally linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group are each unsubstituted or substituted with at least one $R_{1a}$, two or more groups selected from $R_1$ to $R_6$, $R_{5a}$, $R_{5b}$, $R_{6a}$, $R_{6b}$, $R_{15}$, and $R_{16}$ are optionally linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group are each unsubstituted or substituted with at least one $R_{1a}$, $R_{1a}$ is defined the same as above $R_1$, at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), and —P(=O)($Q_{28}$)($Q_{29}$); and
—N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), and $Q_1$ to $Q_9$, $Q_{11}$ to $Q_{19}$, $Q_{21}$ to $Q_{29}$, and $Q_{31}$ to $Q_{39}$ are each independently selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$) alkyl group substituted with at least one selected from deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_1$-$C_{60}$) heteroaryl group, a monovalent non-aromatic condensed polycyclic group, and a monovalent non-aromatic condensed heteropolycyclic group.

2. The organometallic compound of claim 1, wherein
i) $X_2$ and $X_3$ are each N, and $X_4$ is C;
ii) $X_2$ and $X_4$ are each N, and $X_3$ is C;
iii) a bond between $X_2$ and M and a bond between $X_3$ and M are each a coordinate bond, and a bond between $X_4$ and M is a covalent bond, or
iv) a bond between $X_2$ and M and a bond between $X_4$ and M are each a coordinate bond, and a bond between $X_3$ and M is a covalent bond.

3. The organometallic compound of claim 1, wherein
ring $CY_{11}$, ring $CY_{12}$, and ring $CY_2$ to ring $CY_4$ are each independently selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzooxadiazole group, a benzothiadiazole group, a 5,6,7,8-tetrahydroisoquinoline group, a 5,6,7,8-tetrahydroquinoline group, an indazole group, a benzofluorene group, a benzocarbazole group, a naphthobenzofuran group, a naphthobenzothiophene group, and a naphtobenzosilole group.

4. The organometallic compound of claim 1, wherein, $T_1$, and $X_{15}$ are each a single bond.

5. The organometallic compound of claim 1, wherein $R_1$ to $R_6$, $R_{5a}$, $R_{5b}$, $R_{6a}$, $R_{6b}$, $R_{15}$, and $R_{16}$ are each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, a phenoxy group, and a naphthoxy group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, a phenoxy group, and a naphthoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{20}$ alkyl group, a C$_1$-C$_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, and —Si(Q$_{33}$)(Q$_{34}$)(Q$_{35}$); and —N(Q$_1$)(Q$_2$), —Si(Q$_3$)(Q$_4$)(Q$_5$), —B(Q$_6$)(Q$_7$), and —P(=O)(Q$_8$)(Q$_9$), and Q$_1$ to Q$_9$ and Q$_{33}$ to Q$_{35}$ are each independently selected from:

—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a C$_1$-C$_{10}$ alkyl group, and a phenyl group.

6. The organometallic compound of claim 1, wherein, in Formula 1, ring CY$_2$ is a group represented by Formula A2-1' or A2-2', ring CY$_3$ is a group represented by Formula A3-1', A3-2', or A3-3', ring CY$_4$ is a group represented by Formula A4-1' or A4-3', and at least one of Condition 1 to Condition 3 is satisfied:

Condition 1 ring CY$_2$ is a group represented by Formula A2-2';

Condition 2 ring CY$_3$ is a group represented by Formula A3-2' or A3-3'; and

Condition 3 ring CY$_4$ is a group represented by Formula A4-3':

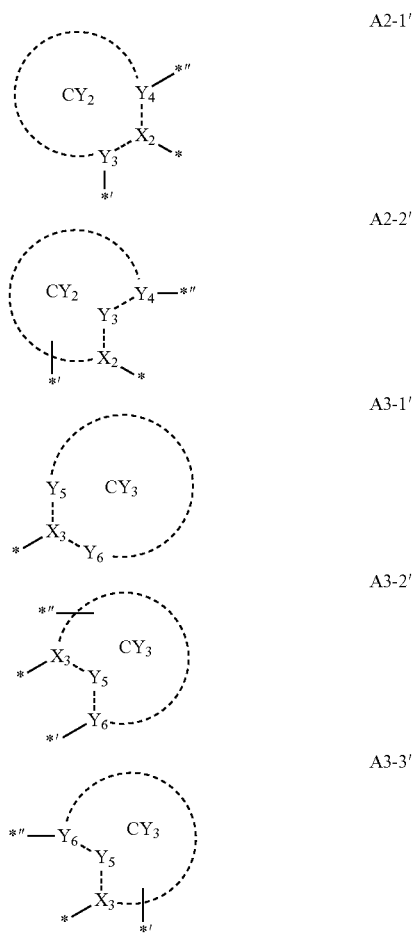

-continued

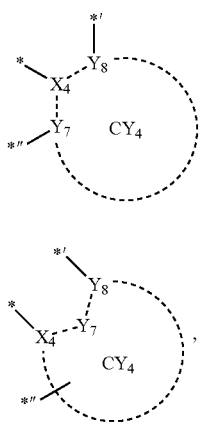

wherein, in Formulae A2-1', A2-2', A3-1', A3-2', A3-3', A4-1', and A4-3', $X_2$ to $X_4$ and ring $CY_2$ to ring $CY_4$ are each independently the same as described in claim 1, $Y_3$, to $Y_8$ are each independently N, B, P, C, or Si, in Formulae A2-1' and A2-2', i) a bond between $X_2$ and $Y_3$, a bond between $X_2$ and $Y_4$ and a bond between $Y_3$ and $Y_4$ are each independently a single bond or a double bond; or ii) $Y_3$, $X_2$, and $Y_4$ form a carbene group, *' indicates a binding site to ring $CY_{12}$ in Formula 1, * indicates a binding site to M in Formula 1, and *''' indicates a binding site to $T_1$ in Formula 1, in Formulae A3-1', A3-2', and A3-3', i) a bond between $X_3$ and $Y_5$, a bond between $X_3$ and $Y_6$ and a bond between $Y_5$ and $Y_6$ are each independently a single bond or a double bond;

or ii) $Y_5$, $X_3$, and $Y_6$ form a carbene group, *''' indicates a binding site to $T_1$ in Formula 1, * indicates a binding site to M in Formula 1, and *' indicates a binding site to $T_2$ in Formula 1, and in Formulae A4-1' and A4-3', i) a bond between $X_4$ and $Y_7$, a bond between $X_4$ and $Y_8$ and a bond between $Y_7$ and $Y_8$ are each independently a single bond or a double bond; or ii) $Y_7$, $X_4$, and $Y_8$ form a carbene group, *' indicates a binding site to $T_2$ in Formula 1, * indicates a binding site to M in Formula 1, and *''' indicates a binding site to ring $CY_{11}$ in Formula 1.

7. The organometallic compound of claim 6, wherein i) ring $CY_2$ is a group represented by Formula A2-1', $T_1$ is a single bond, ring $CY_3$ is a group represented by Formula A3-1', $T_2$ is not a single bond, and ring $CY_4$ is a group represented by Formula A4-1'; or ii) ring $CY_2$ is a group represented by Formula A2-1', Ti is a single bond, ring $CY_3$ is a group represented by Formula A3-1', $T_2$ is a single bond, and ring $CY_4$ is a group represented by Formula A4-3'.

8. The organometallic compound of claim 6, wherein the group represented by Formula A2-2' is a group represented by Formula A2-2, the group represented by Formula A3-2' is a group represented by Formula A3-2, the group represented by Formula A3-3' is a group represented by Formula A3-3, and the group represented by Formula A4-3' is a group represented by Formula A4-3:

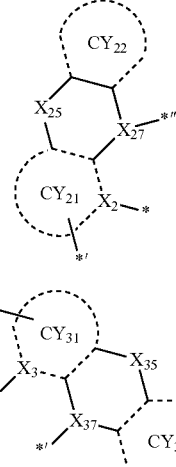

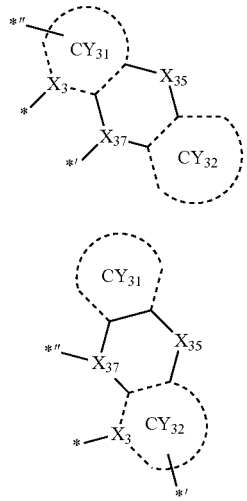

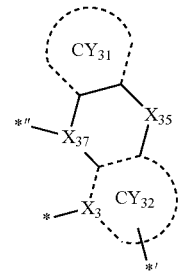

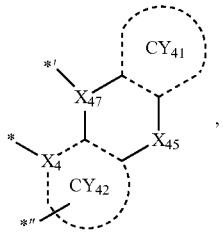

wherein, in Formula A2-2, ring $CY_{21}$ and ring $CY_{22}$ are each independently defined the same as ring $CY_{11}$ in claim 1, $X_{25}$ is a single bond, O, S, Se, N($R_{25}$), C($R_{25}$)($R_{26}$), or Si($R_{25}$)($R_{26}$), $X_{27}$ is N, B, P, C($R_{27}$), or Si($R_{27}$), $X_2$, *', *, and *''' are each independently defined the same as $X_2$, *', *, and *''' in Formula A2-2', respectively, and $R_{25}$ to $R_{27}$ are each independently defined the same as $R_2$ in claim 1, in Formulae A3-2 and A3-3, ring $CY_{31}$ and ring $CY_{32}$ are each independently defined the same as ring $CY_{11}$ in claim 1, $X_{35}$ is a single bond, O, S, Se, N($R_{35}$), C($R_{35}$)($R_{36}$), or Si($R_{35}$)($R_{36}$), $X_{37}$ is N, B, P, C($R_{37}$), or Si($R_{37}$), $X_3$, *''', *, and *' are each independently defined the same as $X_3$, *''', *, and *' in Formula A3-2', respectively, and $R_{35}$ to $R_{37}$ are each independently defined the same as $R_3$ in claim 1, and in Formula A4-3, ring $CY_{41}$ and ring $CY_{42}$ are each independently defined the same as ring $CY_{11}$ in claim 1, $X_{45}$ is a single bond, O, S, Se, N($R_{45}$), C($R_{45}$)($R_{46}$), or Si($R_{45}$)($R_{46}$), $X_{47}$ is N, B, P, C($R_{47}$), or Si($R_{47}$), $X_4$, *', *, and *''' are each independently defined the same as $X_4$, *', *, and *" in Formula A4-3', respectively, and $R_{45}$ to $R_{47}$ are each independently defined the same as $R_4$ in claim 1.
9. The organometallic compound of claim 1, wherein a moiety represented by
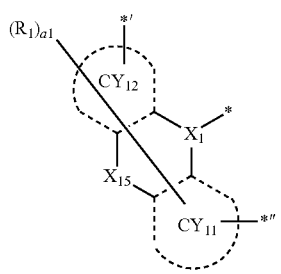
in Formula 1 is selected from groups represented by Formulae A1-1(1) to A1-1(11):
A1-1(1)
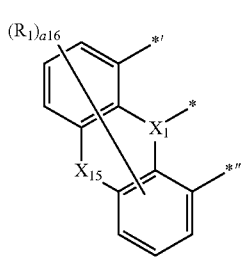
A1-1(2)
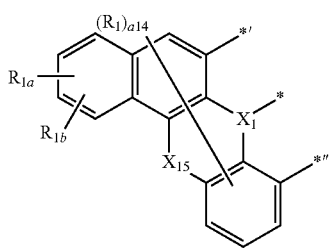
A1-1(3)
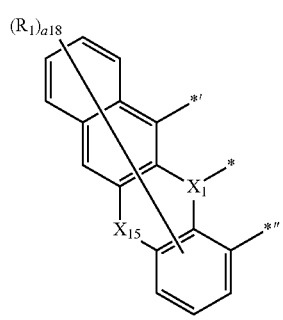
A1-1(4)
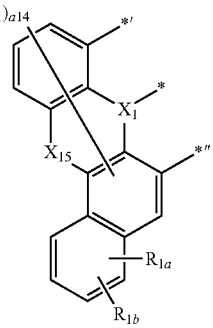
A1-1(5)
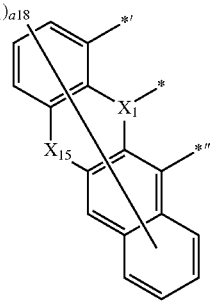
A1-1(6)
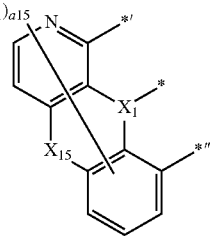
A1-1(7)
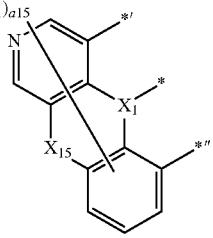
A1-1(8)
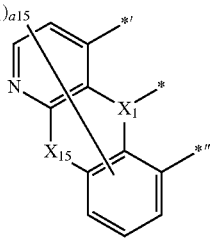
A1-1(9)
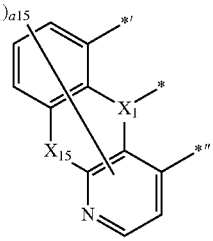

-continued

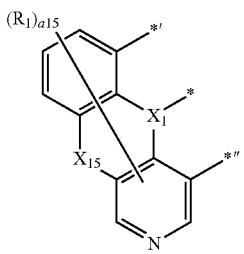
A1-1(10)

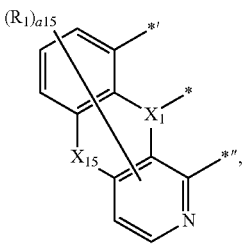
A1-1(11)

wherein, in Formulae A1-1(1) to A1-1(11),
$X_1$, $X_{15}$, and $R_1$ are each independently the same as described in claim 1,
$R_{1a}$ and $R_{1b}$ are each independently defined the same as $R_1$ in claim 1,
a18 is an integer from 0 to 8,
a16 is an integer from 0 to 6,
a15 is an integer from 0 to 5,
a14 is an integer from 0 to 4,
*″ indicates a binding site to ring $CY_4$ in Formula 1,
* indicates a binding site to M in Formula 1, and
*′ indicates a binding site to ring $CY_2$ in Formula 1.

10. The organometallic compound of claim 1, wherein a moiety represented by

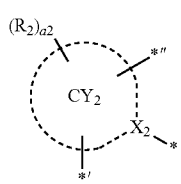

in Formula 1 is selected from groups represented by Formulae A2-1(1) to A2-1(21) and A2-2(1) to A2-2(58):

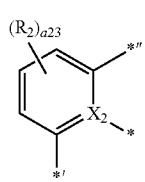
A2-1(1)

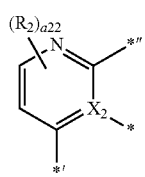
A2-1(2)

-continued

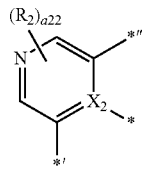
A2-1(3)

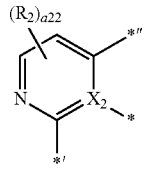
A2-1(4)

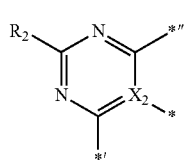
A2-1(5)

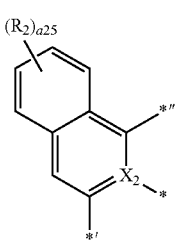
A2-1(6)

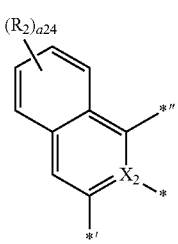
A2-1(7)

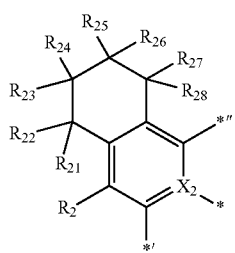
A2-1(8)

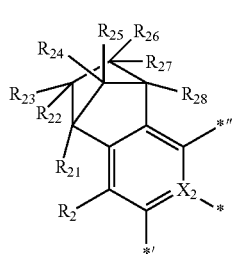
A2-1(9)

-continued
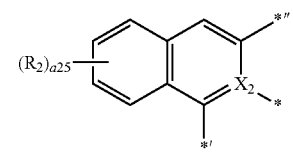
A2-1(10)
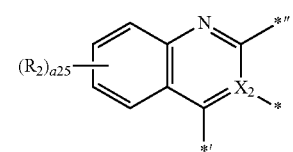
A2-1(11)
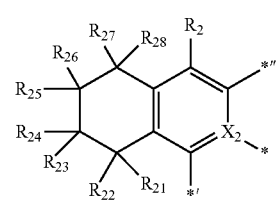
A2-1(12)
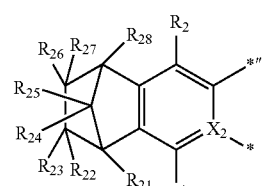
A2-1(13)
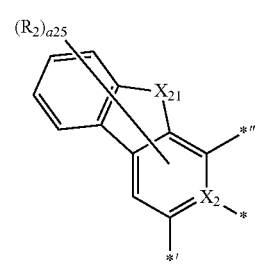
A2-1(14)
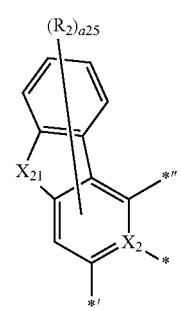
A2-1(15)
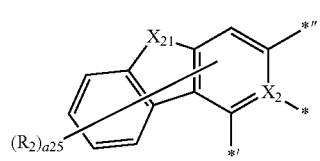
A2-1(16)
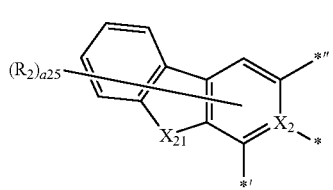
A2-1(17)
-continued
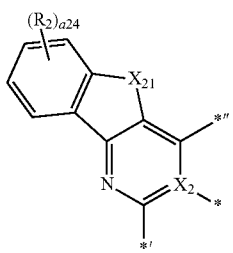
A2-1(18)
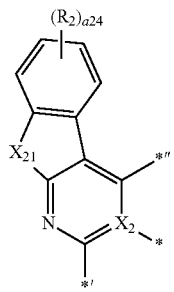
A2-1(19)
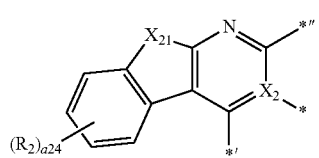
A2-1(20)
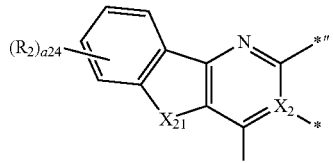
A2-1(21)
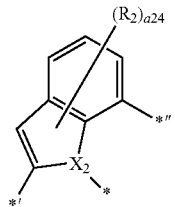
A2-2(1)
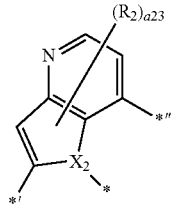
A2-2(2)
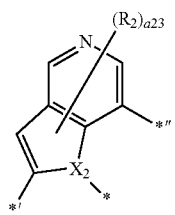
A2-2(3)

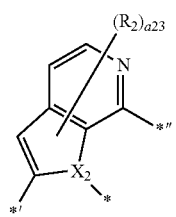 A2-2(4)
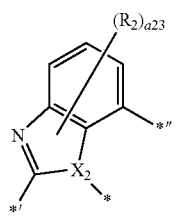 A2-2(5)
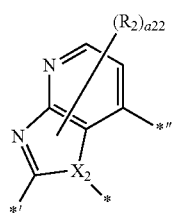 A2-2(6)
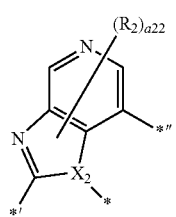 A2-2(7)
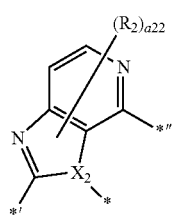 A2-2(8)
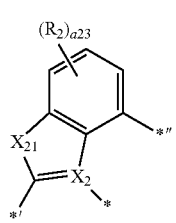 A2-2(9)
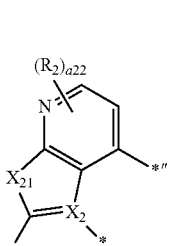 A2-2(10)
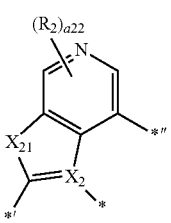 A2-2(11)
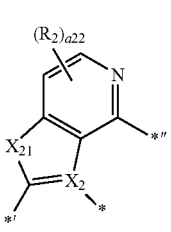 A2-2(12)
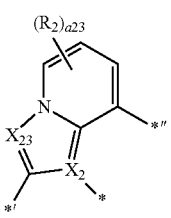 A2-2(13)
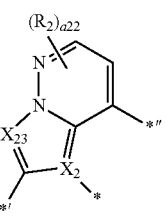 A2-2(14)
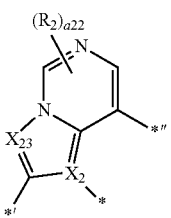 A2-2(15)
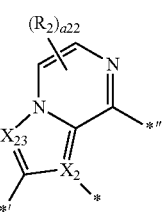 A2-2(16)
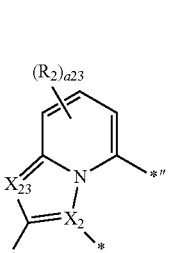 A2-2(17)

-continued
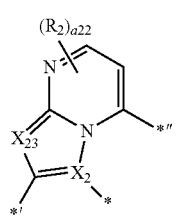 A2-2(18)
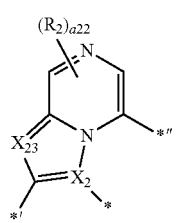 A2-2(19)
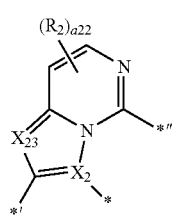 A2-2(20)
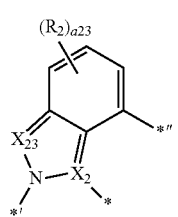 A2-2(21)
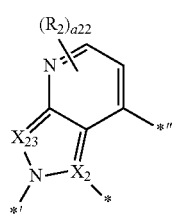 A2-2(22)
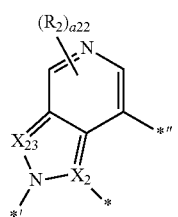 A2-2(23)
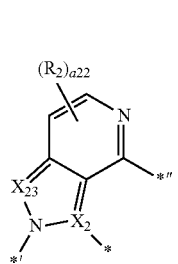 A2-2(24)
-continued
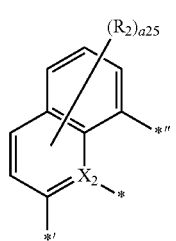 A2-2(25)
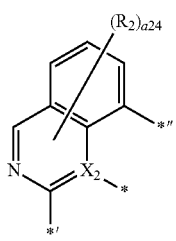 A2-2(26)
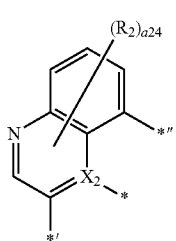 A2-2(27)
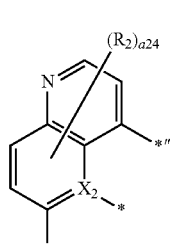 A2-2(28)
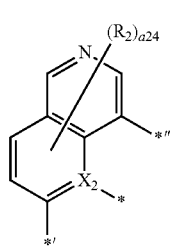 A2-2(29)
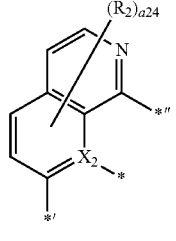 A2-2(30)
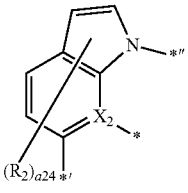 A2-2(31)

| | | |
|---|---|---|
| 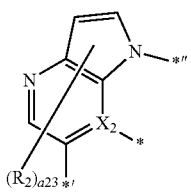 | A2-2(32) | |
| 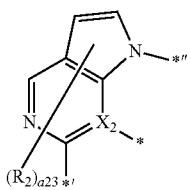 | A2-2(33) | |
| 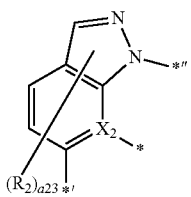 | A2-2(34) | |
| 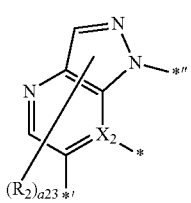 | A2-2(35) | |
| 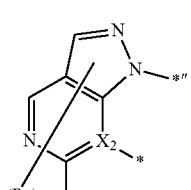 | A2-2(36) | |
| 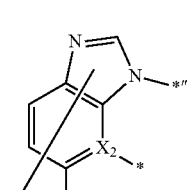 | A2-2(37) | |
| 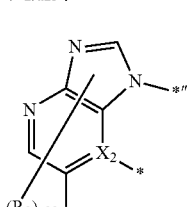 | A2-2(38) | |
| 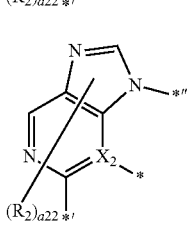 | A2-2(39) | |
| 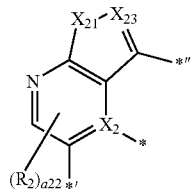 | A2-2(40) | |
| 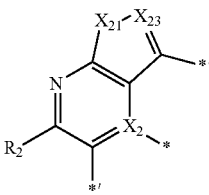 | A2-2(41) | |
| 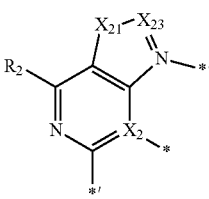 | A2-2(42) | |
| 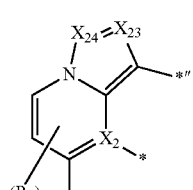 | A2-2(43) | |
| 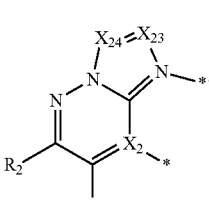 | A2-2(44) | |
| 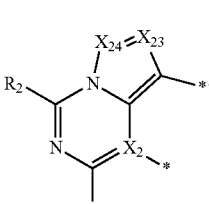 | A2-2(45) | |
| 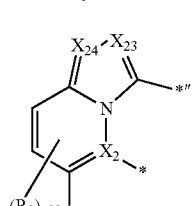 | A2-2(46) | |
| 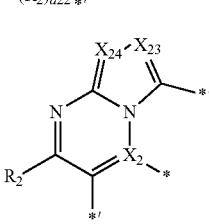 | A2-2(47) | |

A2-2(48) 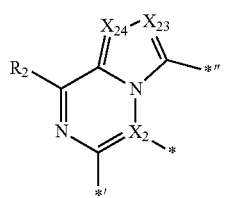
A2-2(49) 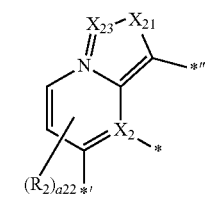
A2-2(50) 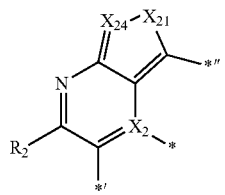
A2-2(51) 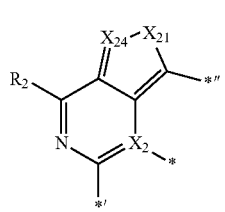
A2-2(52) 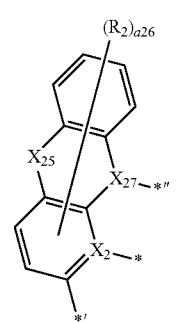
A2-2(53) 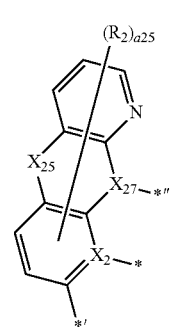
A2-2(54) 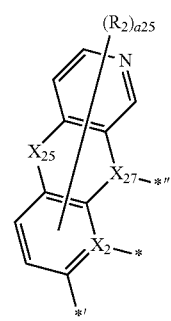
A2-2(55) 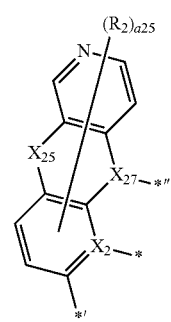
A2-2(56) 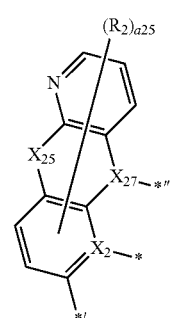
A2-2(57) 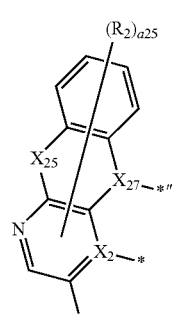
A2-2(58) 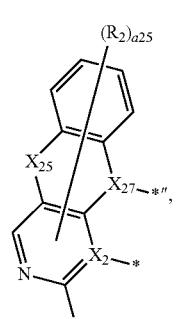

wherein, in Formulae A2-1(1) to A2-1(21) and A2-2(1) to A2-2(58), $X_2$ and $R_2$ are each independently the same as described in claim 1, $X_{21}$ is O, S, Se, $N(R_{21})$, $C(R_{21})(R_{22})$, or $Si(R_{21})(R_{22})$, $X_{23}$ is N or $C(R_{23})$, $X_{24}$ is N or $C(R_{24})$, $X_{25}$ is a single bond, O, S, Se, $N(R_{25})$, $C(R_{25})(R_{26})$, or $Si(R_{25})(R_{26})$, $X_{27}$ is N, B, P, $C(R_{27})$, or $Si(R_{27})$, $R_{21}$ to $R_{28}$ are each independently define the same $R_2$ in claim 1, a26 is an integer from 0 to 6, a25 is an integer from 0 to 5, a24 is an integer from 0 to 4, a23 is an integer from 0 to 3, a22 is an integer from 0 to 2, \*' indicates a binding site to ring $CY_{12}$ in Formula 1, \* indicates a binding site to M in Formula 1, and \*'' indicates a binding site to $T_1$ in Formula 1.

11. The organometallic compound of claim 1, wherein a moiety represented by

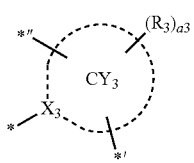

in Formula 1 is selected from groups represented by Formulae A3-1(1) to A3-1(21), A3-2(1) to A3-2(58), and A3-3(1) to A3-3(58):

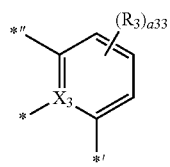
A3-1(1)

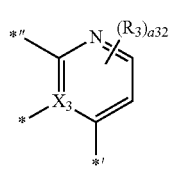
A3-1(2)

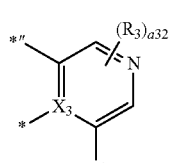
A3-1(3)

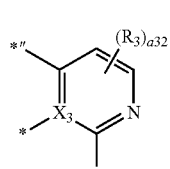
A3-1(4)

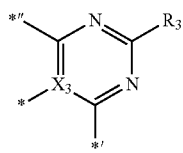
A3-1(5)

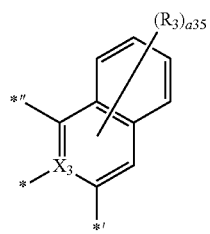
A3-1(6)

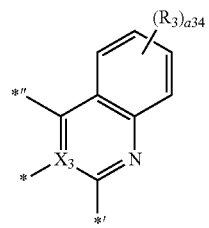
A3-1(7)

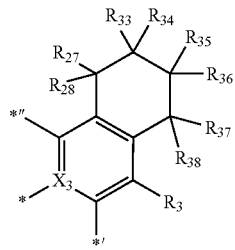
A3-1(8)

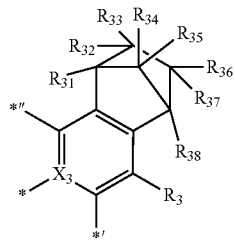
A3-1(9)

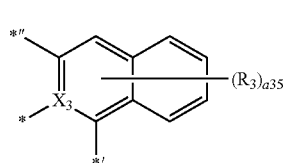
A3-1(10)

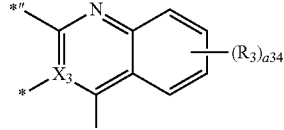
A3-1(11)

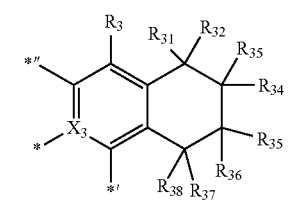 A3-1(12)
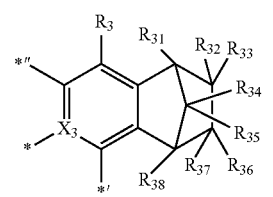 A3-1(13)
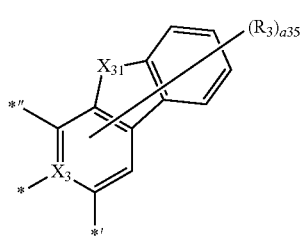 A3-1(14)
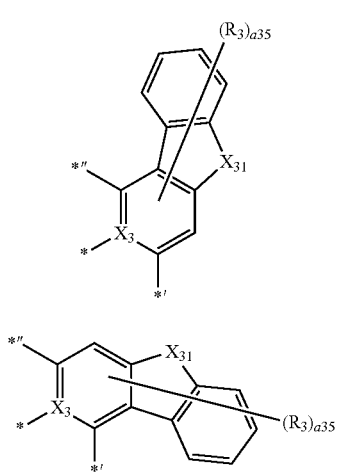 A3-1(15)
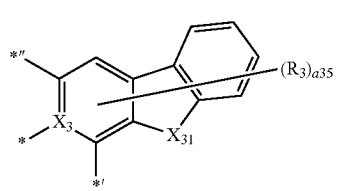 A3-1(16)
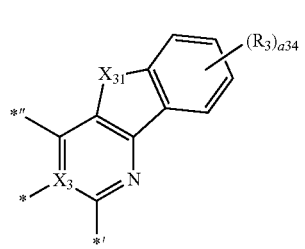 A3-1(17)
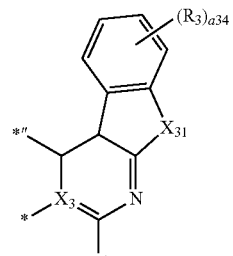 A3-1(18)
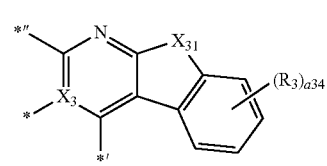 A3-1(19)
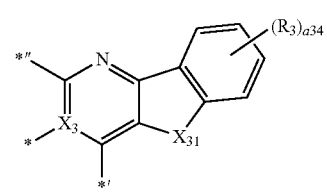 A3-1(20)
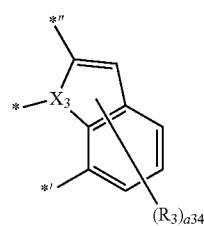 A3-1(21)
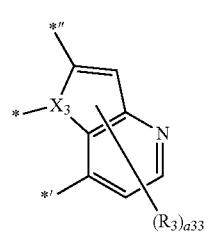 A3-2(1)
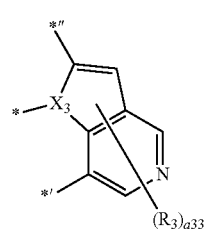 A3-2(2)
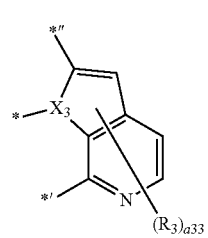 A3-2(3)
 A3-2(4)

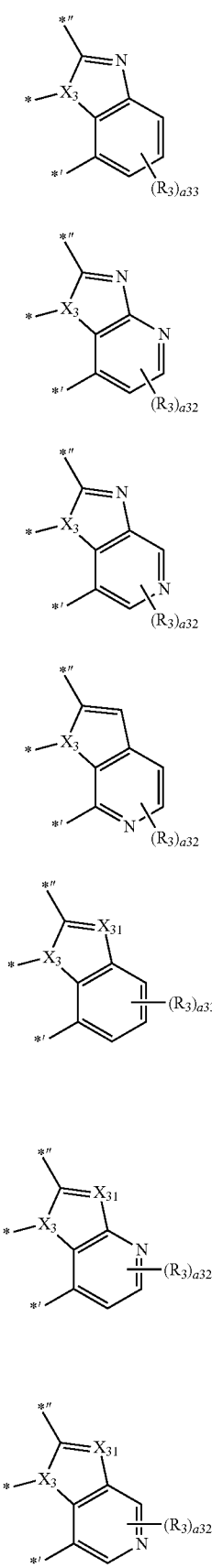
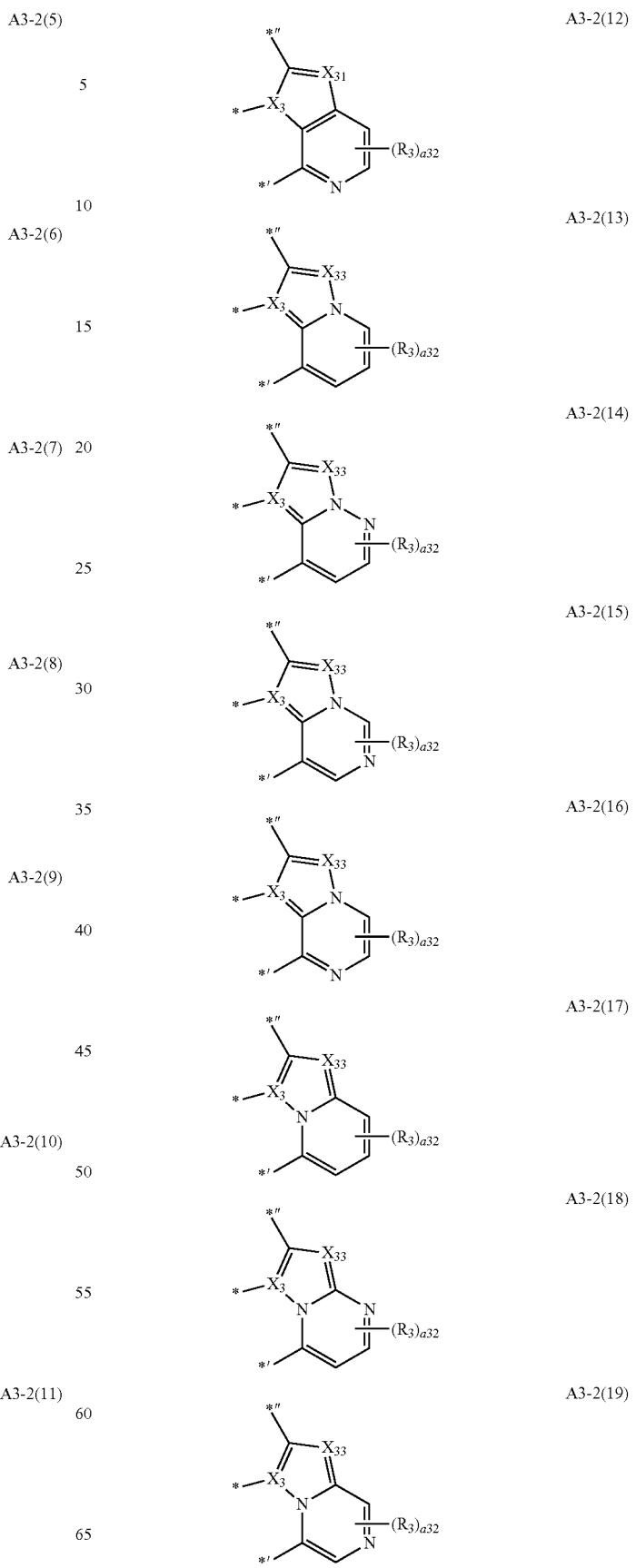

209
-continued
A3-2(20)
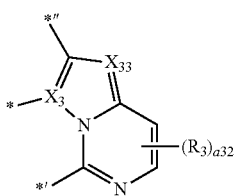
A3-2(21)
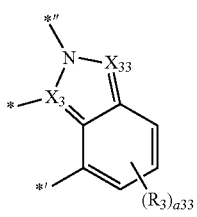
A3-2(22)
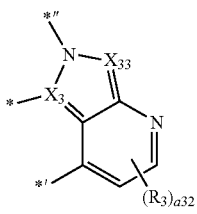
A3-2(23)
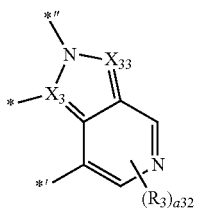
A3-2(24)
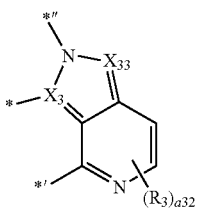
A3-2(25)
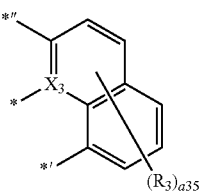
A3-2(26)
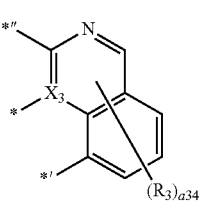
210
-continued
A3-2(27)
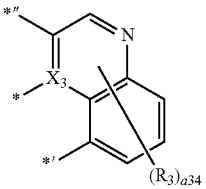
A3-2(28)
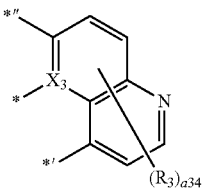
A3-2(29)
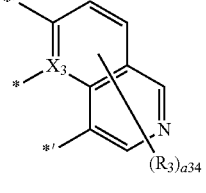
A3-2(30)
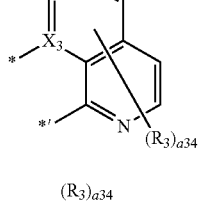
A3-2(31)
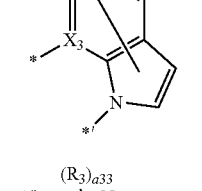
A3-2(32)
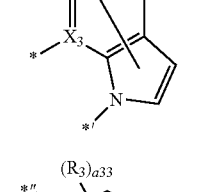
A3-2(33)
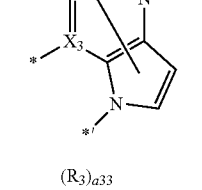
A3-2(34)
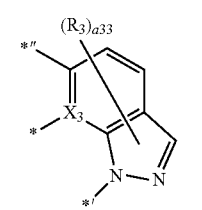

| | | |
|---|---|---|
| 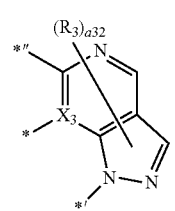 A3-2(35) | 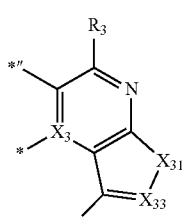 | A3-2(42) |
| 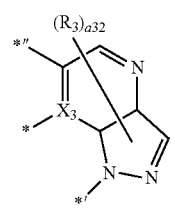 A3-2(36) | 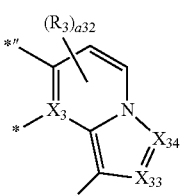 | A3-2(43) |
| 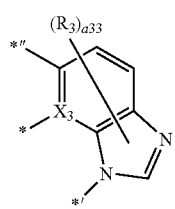 A3-2(37) | 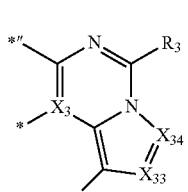 | A3-2(44) |
| 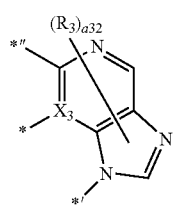 A3-2(38) | 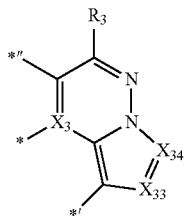 | A3-2(45) |
| 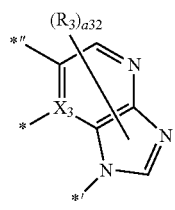 A3-2(39) | 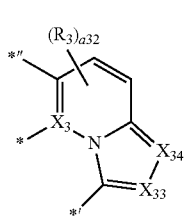 | A3-2(46) |
| 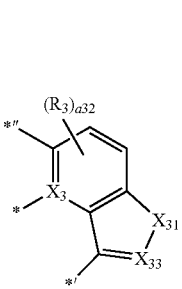 A3-2(40) | 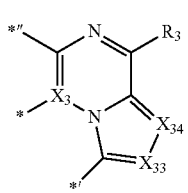 | A3-2(47) |
| 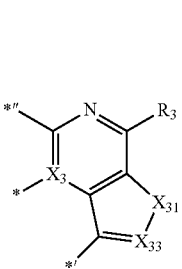 A3-2(41) | 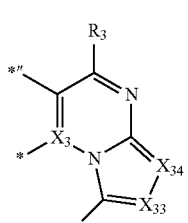 | A3-2(48) |

A3-2(49) 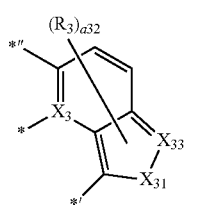
A3-2(50) 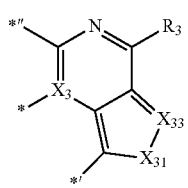
A3-2(51) 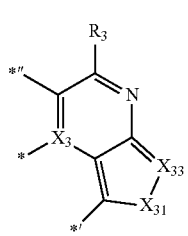
A3-2(52) 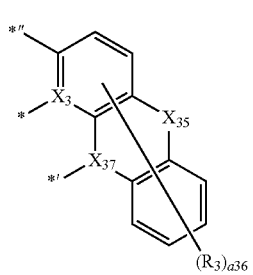
A3-2(53) 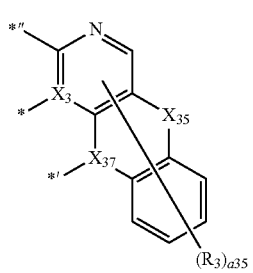
A3-2(54) 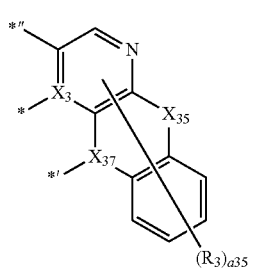
A3-2(55) 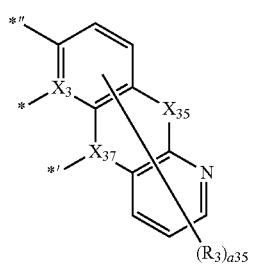
A3-2(56) 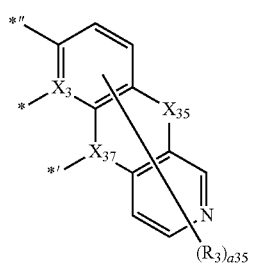
A3-2(57) 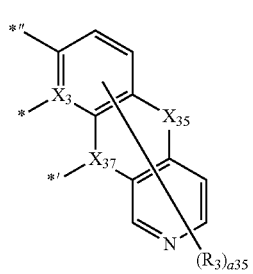
A3-2(58) 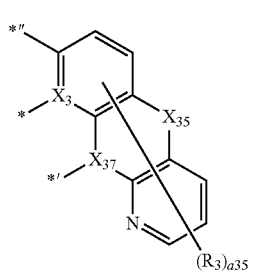
A3-3(1) 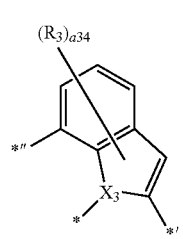
A3-3(2) 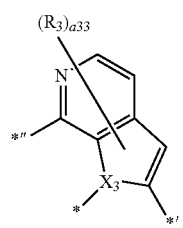

A3-3(3) 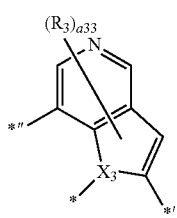
A3-3(4) 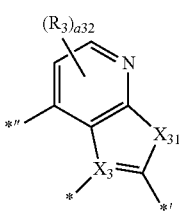
A3-3(5)
A3-3(6)
A3-3(7)
A3-3(8)
A3-3(9)
A3-3(10) 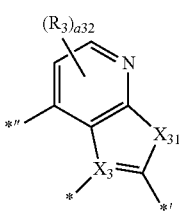
A3-3(11) 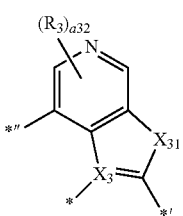
A3-3(12) 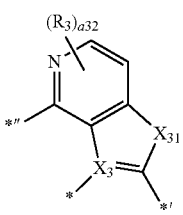
A3-3(13) 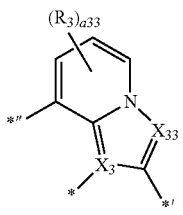
A3-3(14) 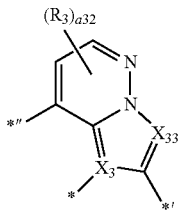
A3-3(15) 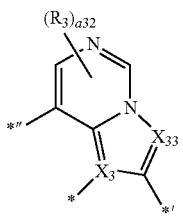
A3-3(16) 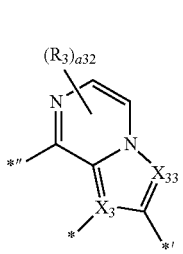

217
-continued
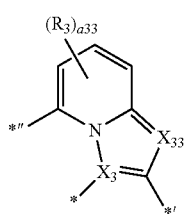
A3-3(17)
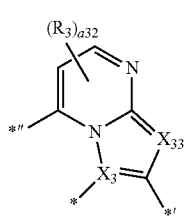
A3-3(18)
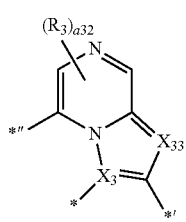
A3-3(19)
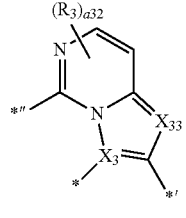
A3-3(20)
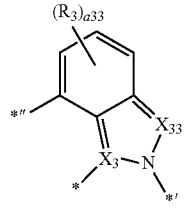
A3-3(21)
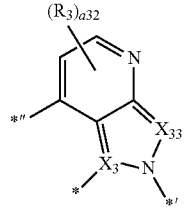
A3-3(22)
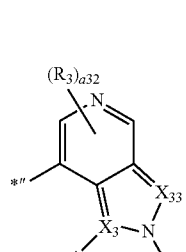
A3-3(23)
218
-continued
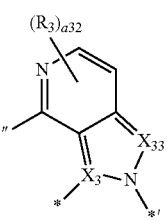
A3-3(24)
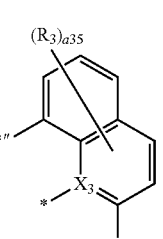
A3-3(25)
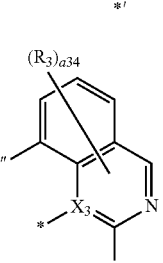
A3-3(26)
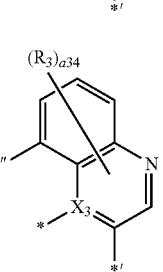
A3-3(27)
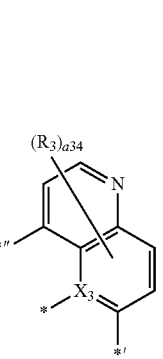
A3-3(28)
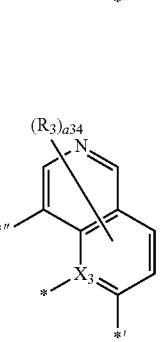
A3-3(29)

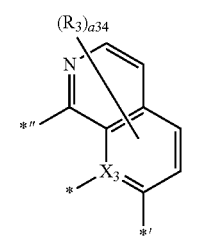 A3-3(30)
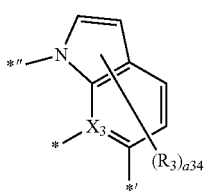 A3-3(31)
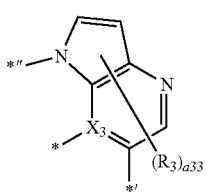 A3-3(32)
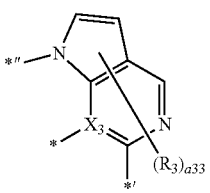 A3-3(33)
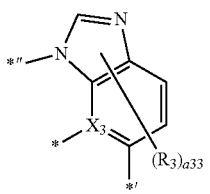 A3-3(34)
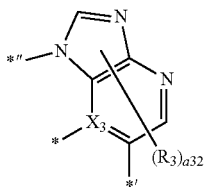 A3-3(35)
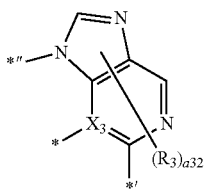 A3-3(36)
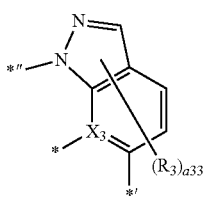 A3-3(37)
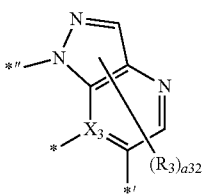 A3-3(38)
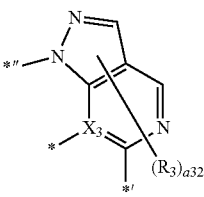 A3-3(39)
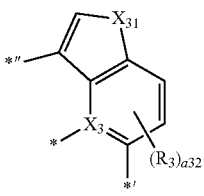 A3-3(40)
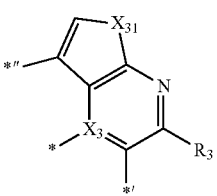 A3-3(41)
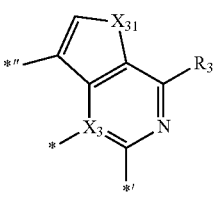 A3-3(42)
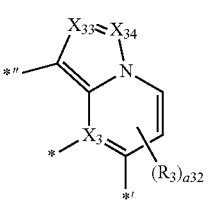 A3-3(43)
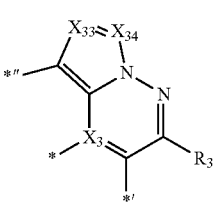 A3-3(44)
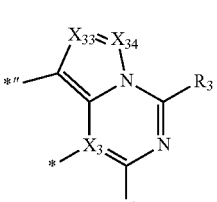 A3-3(45)

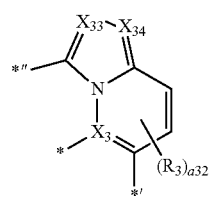 A3-3(46)
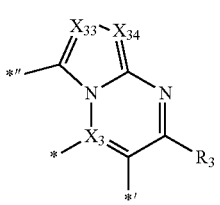 A3-3(47)
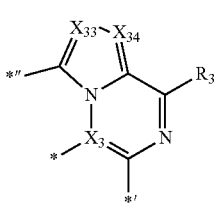 A3-3(48)
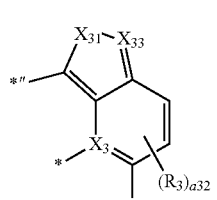 A3-3(49)
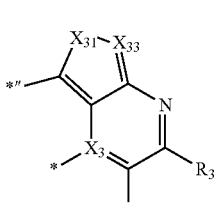 A3-3(50)
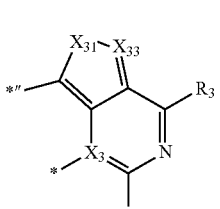 A3-3(51)
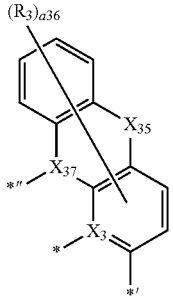 A3-3(52)
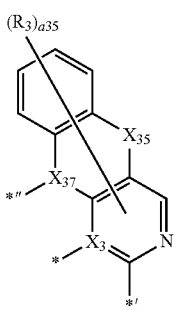 A3-3(53)
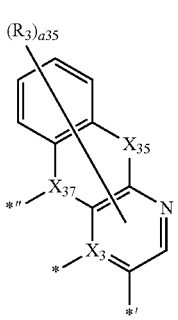 A3-3(54)
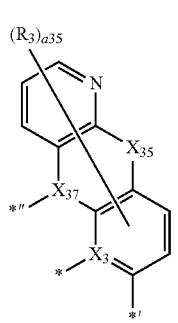 A3-3(55)
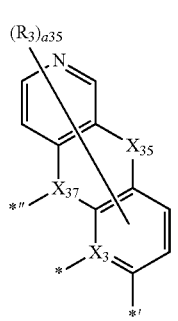 A3-3(56)
A3-3(57)

-continued

A3-3(58)

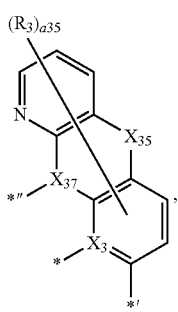

wherein, in Formulae A3-1(1) to A3-1(21), A3-2(1) to A3-2(58), and A3-3(1) to A3-3(58),
$X_3$ and $R_3$ are each independently the same as described in claim 1,
$X_{31}$ is O, S, Se, $N(R_{31})$, $C(R_{31})(R_{32})$, or $Si(R_{31})(R_{32})$,
$X_{33}$ is N or $C(R_{33})$,
$X_{34}$ is N or $C(R_{34})$,
$X_{35}$ is a single bond, O, S, Se, $N(R_{35})$, $C(R_{35})(R_{36})$, or $Si(R_{35})(R_{36})$,
$X_{37}$ is N, B, P, $C(R_{37})$, or $Si(R_{37})$,
$R_{31}$ to $R_{38}$ are each independently defined the same as $R_3$ in claim 1,
a36 is an integer from 0 to 6,
a35 is an integer from 0 to 5,
a34 is an integer from 0 to 4,
a33 is an integer from 0 to 3,
a32 is an integer from 0 to 2,
*''' indicates a binding site to $T_1$ in Formula 1,
* indicates a binding site to M in Formula 1, and
*' indicates a binding site to $T_2$ in Formula 1.

12. The organometallic compound of claim 1, wherein a moiety represented by

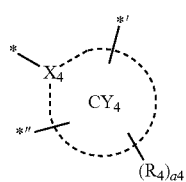

in Formula 1 is selected from groups represented by Formulae A4-1(1) to A4-1(21) and A4-3(1) to A4-3(61):

A4-1(1)

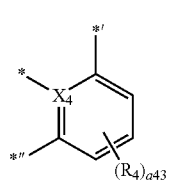

A4-1(2)

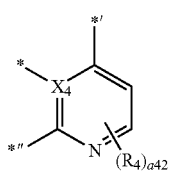

A4-1(3)

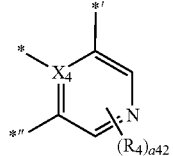

A4-1(4)

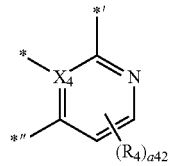

A4-1(5)

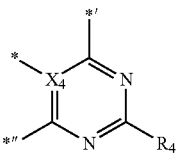

A4-1(6)

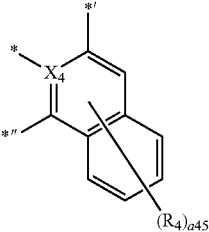

A4-1(7)

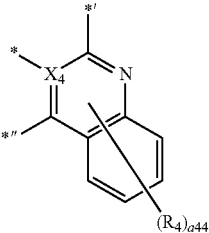

A4-1(8)

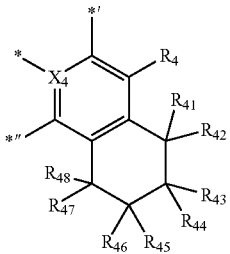

A4-1(9)

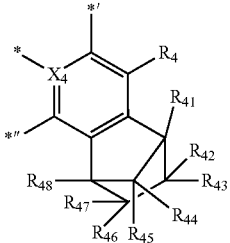

225
-continued
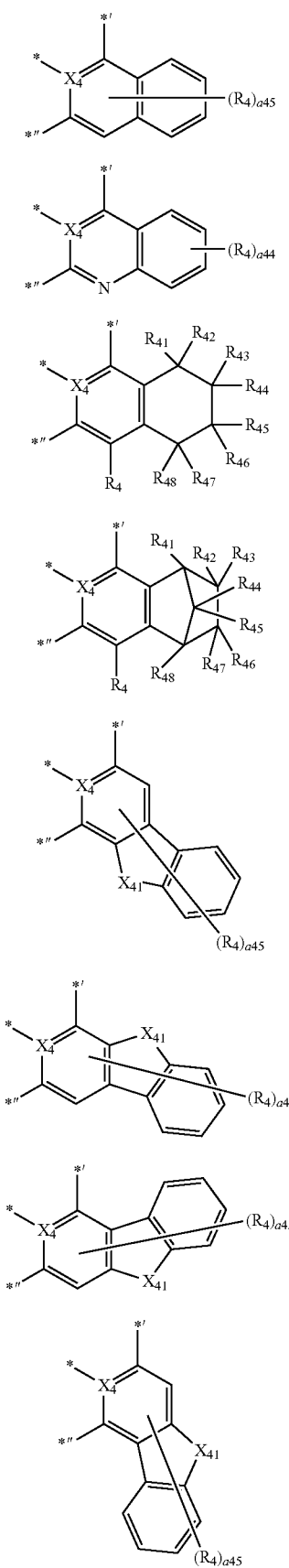
226
-continued
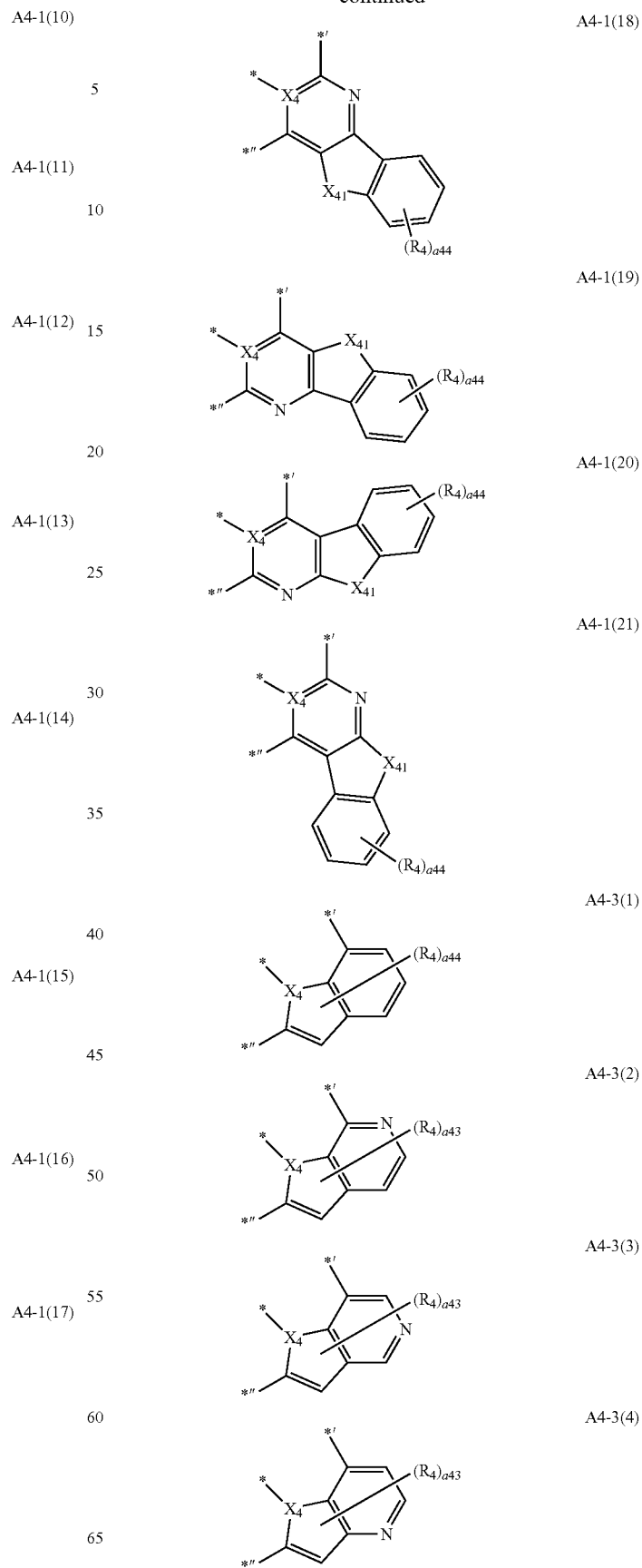

227
-continued
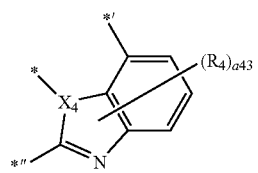 A4-3(5)
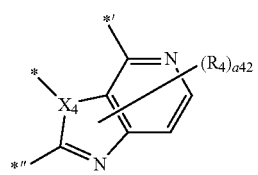 A4-3(6)
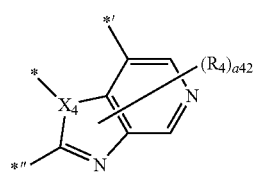 A4-3(7)
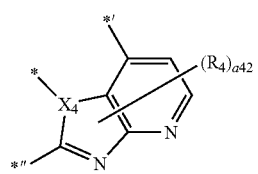 A4-3(8)
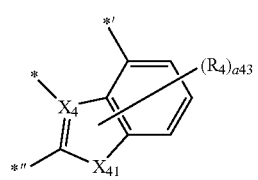 A4-3(9)
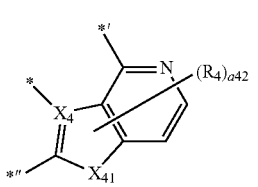 A4-3(10)
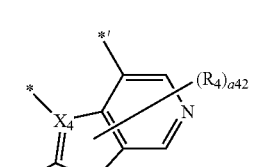 A4-3(11)
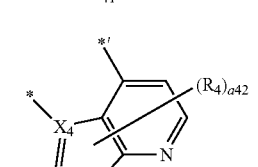 A4-3(12)
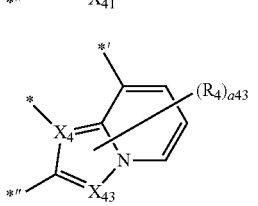 A4-3(13)
228
-continued
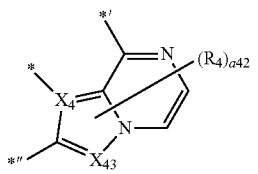 A4-3(14)
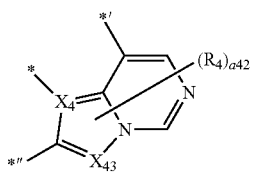 A4-3(15)
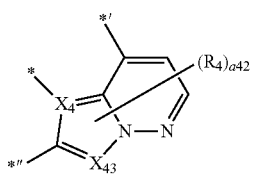 A4-3(16)
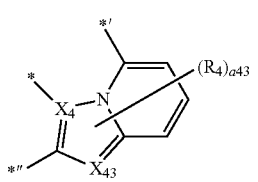 A4-3(17)
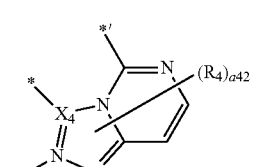 A4-3(18)
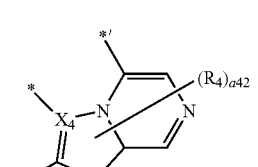 A4-3(19)
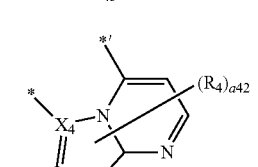 A4-3(20)
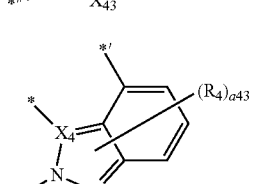 A4-3(21)
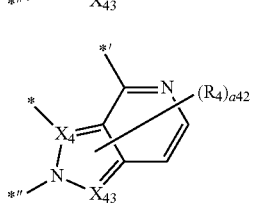 A4-3(22)

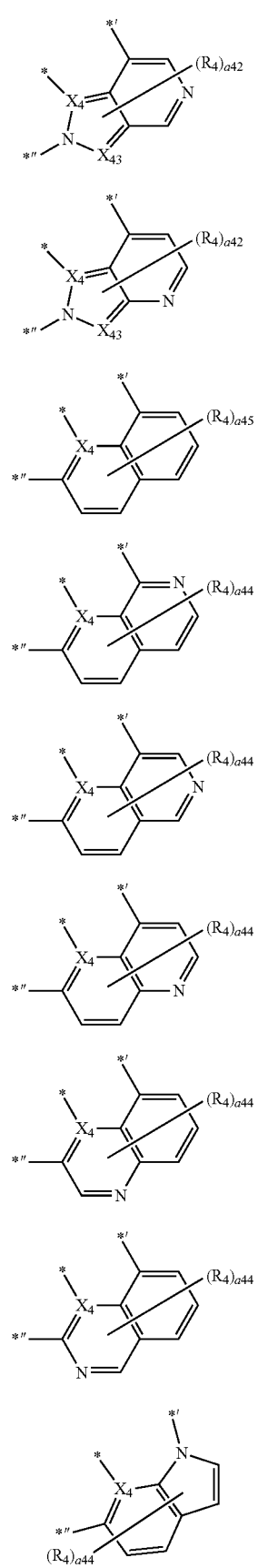
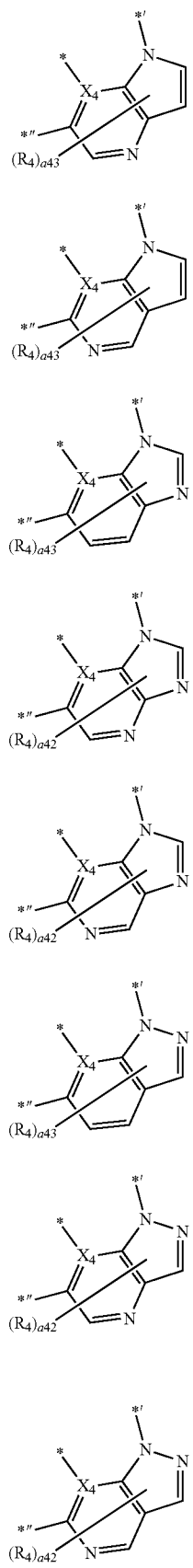

A4-3(40) 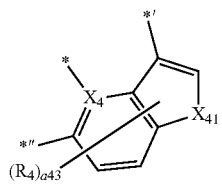
A4-3(41) 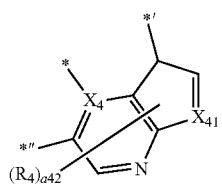
A4-3(42) 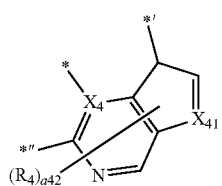
A4-3(43) 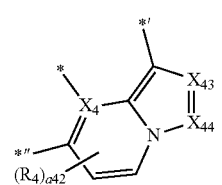
A4-3(44) 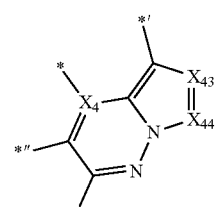
A4-3(45) 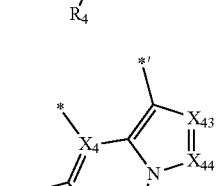
A4-3(46) 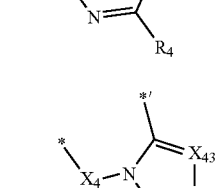
A4-3(47) 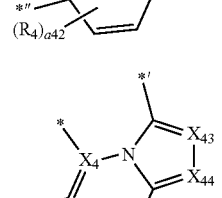
A4-3(48) 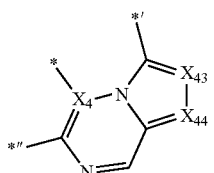
A4-3(49) 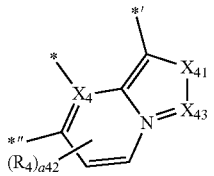
A4-3(50) 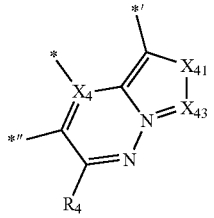
A4-3(51) 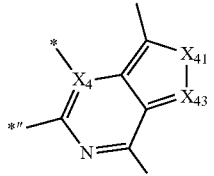
A4-3(52) 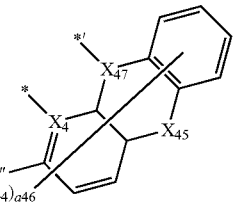
A4-3(53) 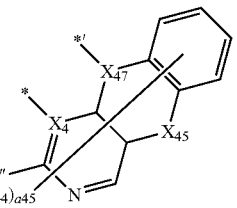
A4-3(54) 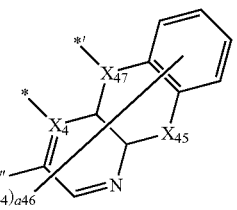

-continued

A4-3(55)
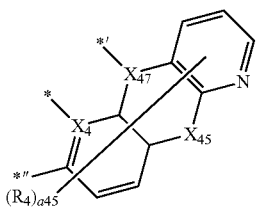

A4-3(56)
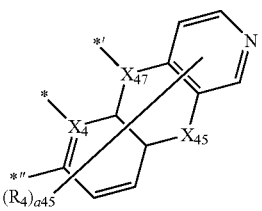

A4-3(57)
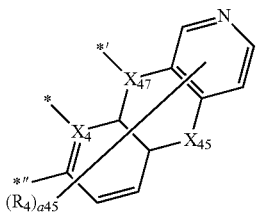

A4-3(58)
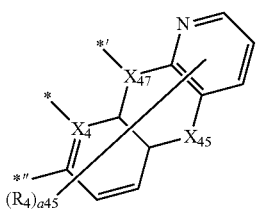

A4-3(59)
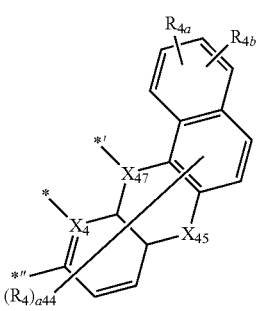

A4-3(60)
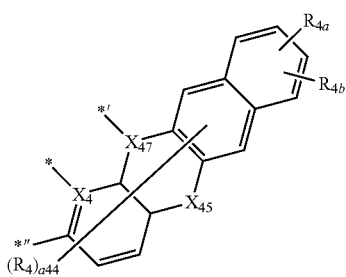

-continued

A4-3(61)
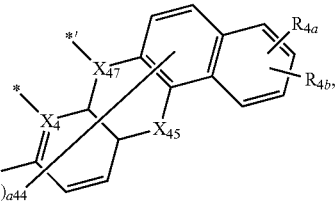

wherein, in Formula A4-1(1) to A4-1(21) and A4-3(1) to A4-3(61), $X_4$ and $R_4$ are each independently the same as described in claim 1, $X_{41}$ is O, S, Se, $N(R_{41})$, $C(R_{41})(R_{42})$, or $Si(R_{41})(R_{42})$, $X_{43}$ is N or $C(R_{43})$, $X_{44}$ is N or $C(R_{44})$, $X_{45}$ is a single bond, O, S, Se, $N(R_{45})$, $C(R_{45})(R_{46})$, or $Si(R_{45})(R_{46})$, $X_{47}$ is N, B, P, $C(R_{47})$, or $Si(R_{47})$, $R_{41}$ to $R_{48}$, $R_{4a}$ and $R_{4b}$ are each independently defined the same as $R_4$ in claim 1, a46 is an integer from 0 to 6, a45 is an integer from 0 to 5, a44 is an integer from 0 to 4, a43 is an integer from 0 to 3, a42 is an integer from 0 to 2,

*' indicates a binding site to $T_2$ in Formula 1,

* indicates a binding site to M in Formula 1, and

*" indicates a binding site to ring $CY_{11}$ in Formula 1.

13. The organometallic compound of claim 1, wherein i) $T_1$ is a single bond and $R_2$ and $R_3$ are linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group are each unsubstituted or substituted with at least one $R_{1a}$;

ii) $T_2$ is *—$N(R_5)$—*', *—$B(R_5)$—*' or *—$P(R_5)$—*' and $R_4$ and $R_5$ are linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group are each unsubstituted or substituted with at least one $R_{1a}$;

iii) $T_2$ is *—$N(R_5)$—*', *—$B(R_5)$—*' or *—$P(R_5)$—*' and $R_3$ and $R_5$ are linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group are each unsubstituted or substituted with at least one $R_{1a}$; or iv) $T_2$ is *—$N(R_5)$—*', *—$B(R_5)$—*' or *—$P(R_5)$—*', $R_4$ and $R_5$ are linked to form a $C_5$-$C_{30}$ carbocyclic group or a $C_1$-$C_{30}$ heterocyclic group, $R_3$ and $R_5$ are linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group are each unsubstituted or substituted with at least one $R_{1a}$.

14. The organometallic compound of claim 1, wherein the organometallic compound is represented by one of Formulae 1-1 to 1-4:

Formula 1-1

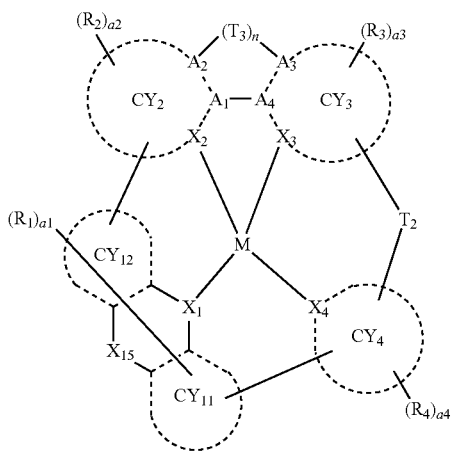

Formula 1-2

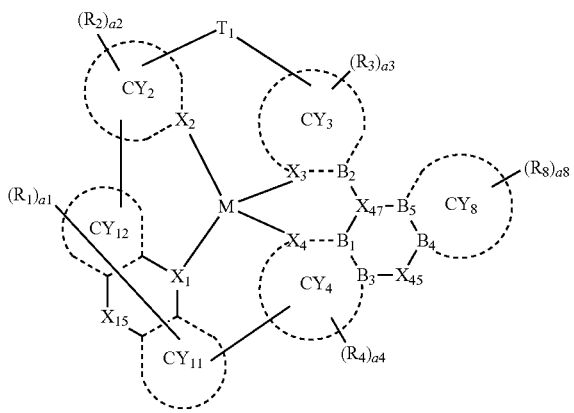

Formula 1-3

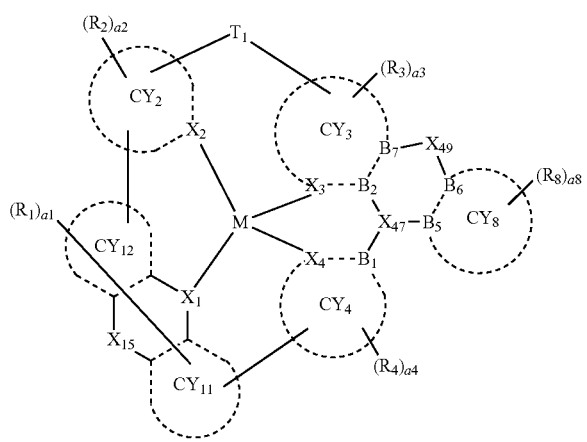

Formula 1-4

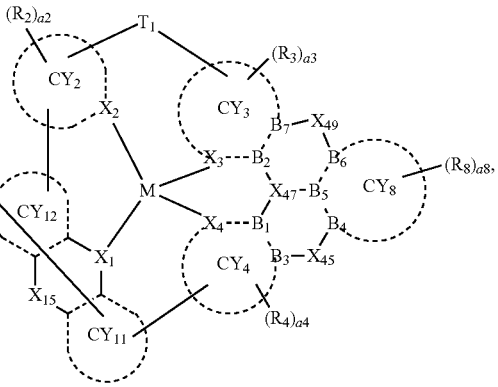

wherein, in Formulae 1-1 to 1-4,

M, $X_1$ to $X_4$, ring $CY_{11}$, ring $CY_{12}$, ring $CY_2$ to ring $CY_4$, $T_1$, $T_2$, $X_{15}$, $R_1$ to $R_4$ and a1 to a4 are each independently the same as described in claim 1, ring $CY_8$ is defined the same as ring $CY_4$ in claim 1, $A_1$ to $A_4$ and $B_1$ to $B_7$ are each independently C or N, $X_{45}$ is a single bond, O, S, Se, $N(R_{45})$, $C(R_{45})(R_{46})$, or $Si(R_{45})(R_{46})$, $X_{47}$ is N, B, P, $C(R_{47})$, or $Si(R_{47})$, $X_{49}$ is a single bond, O, S, Se, $N(R_{48})$, $C(R_{48})(R_{49})$, or $Si(R_{48})(R_{49})$, $T_3$ is selected from a single bond, a double bond, *—N($R_7$)—*', *—B($R_7$)—*', *—P($R_7$)—*', *—C($R_7$)($R_8$)—*', *—Si($R_7$)($R_8$)—*', *—Ge($R_7$)($R_8$)—*', *—S—*', *—Se—*', *—O—*', *—C(=O)—*', *—S(=O)—*', *—S(=O)$_2$—*', *—C($R_7$)=*', *=C($R_8$)—*', *—C($R_7$)=C($R_8$)—*', *—C(=S)—*', and *—C≡C—*', and * and *' each indicate a binding site to a neighboring atom, n is an integer from 1 to 5, wherein, when n is two or more, two or more groups $T_3$ are identical to or different from each other, $R_{45}$ to $R_{49}$ are each independently defined the same as $R_4$ in claim 1, and $R_7$ and $R_8$ are each independently defined the same as $R_5$ in claim 1.

15. The organometallic compound of claim 1, wherein the organometallic compound is one of Compounds 1 to 160:

1

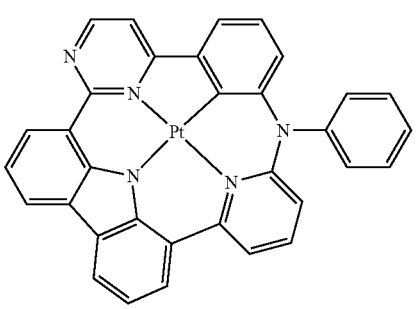

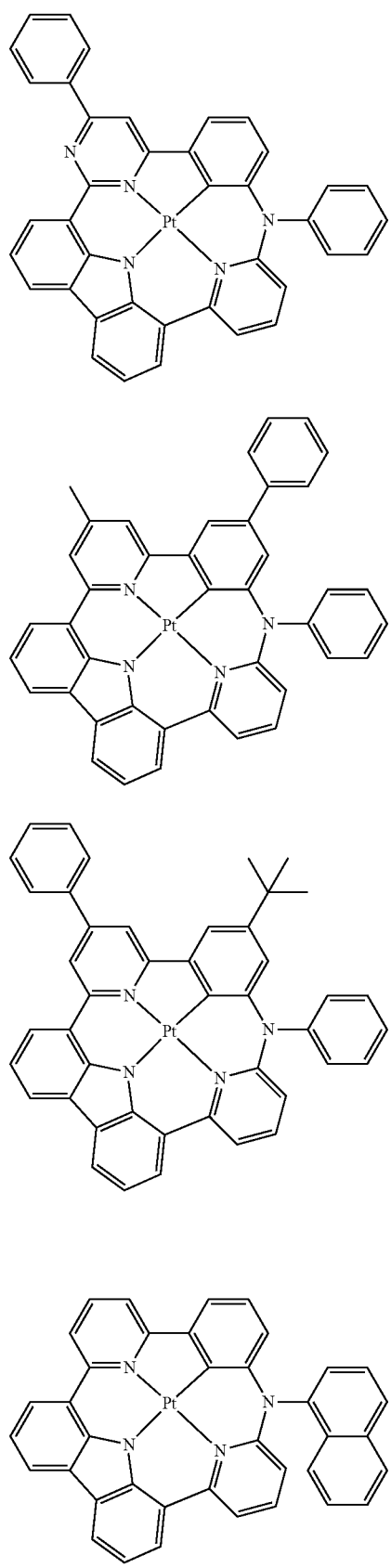
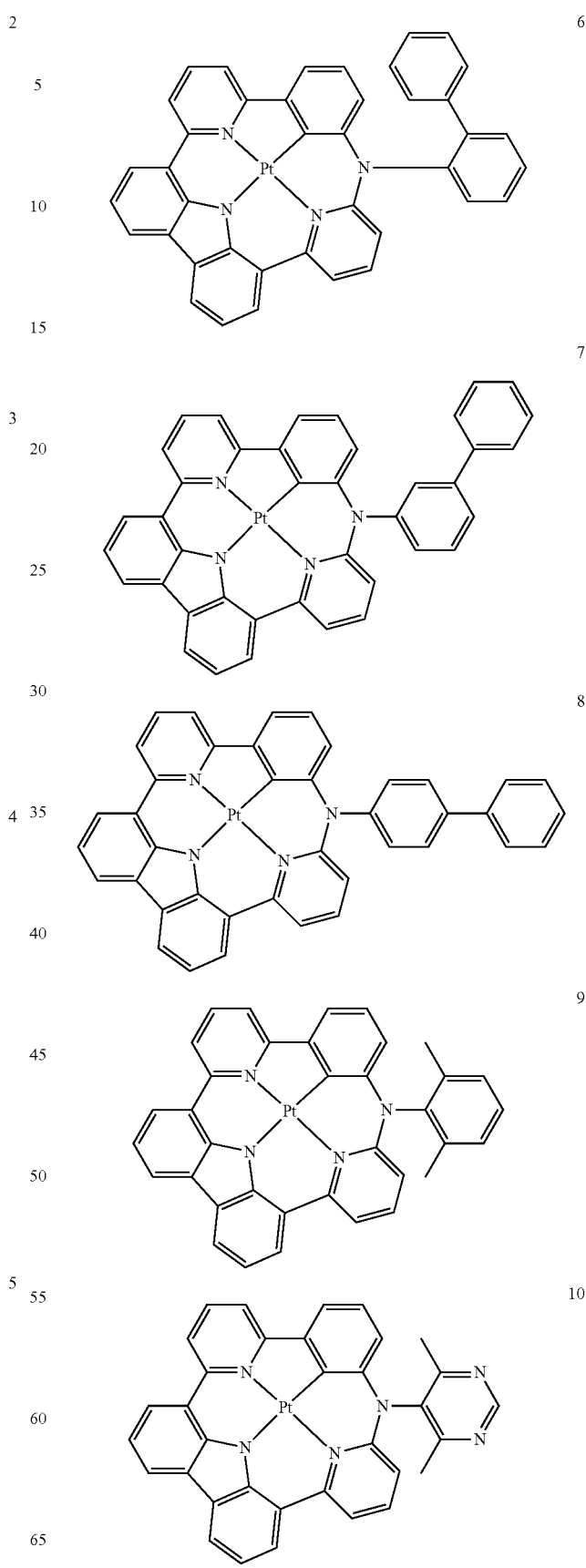

-continued
11
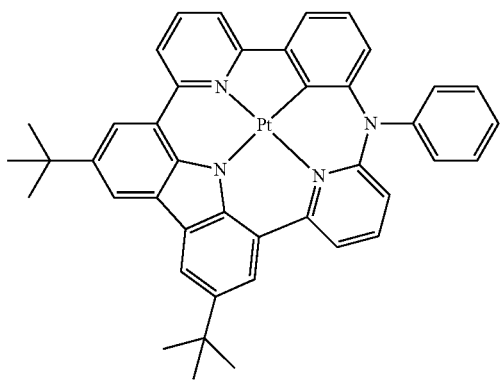
12
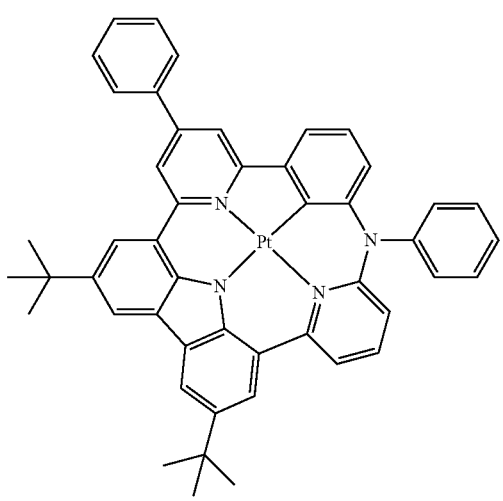
13
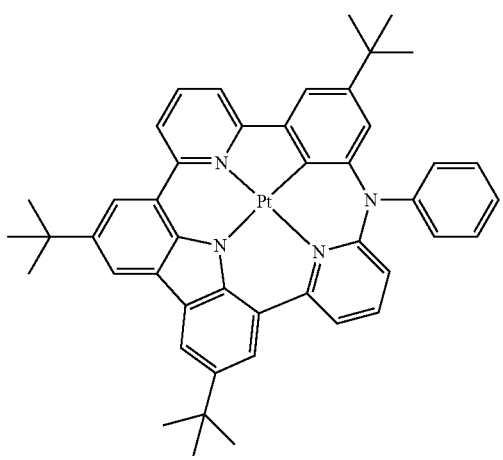
-continued
14
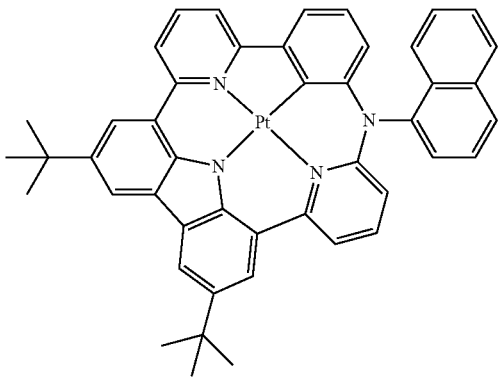
15
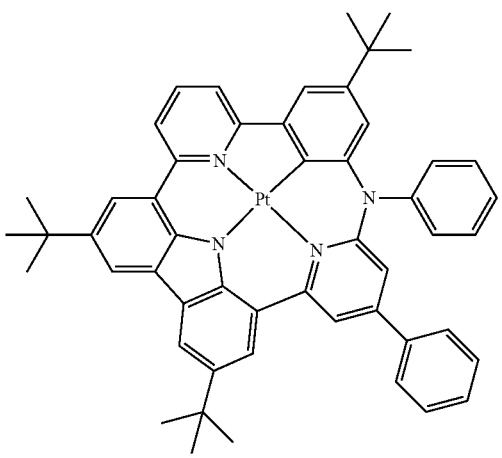
16
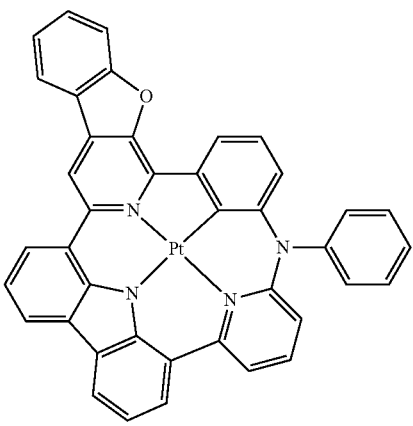
17
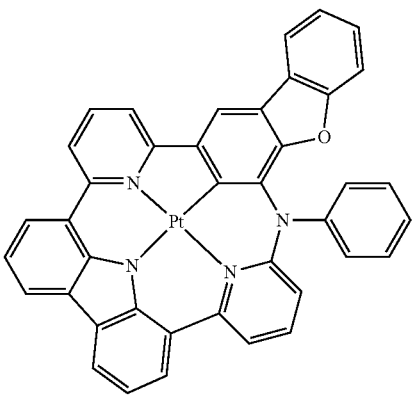

18
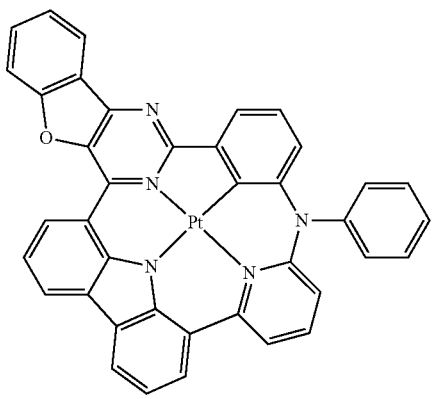
19
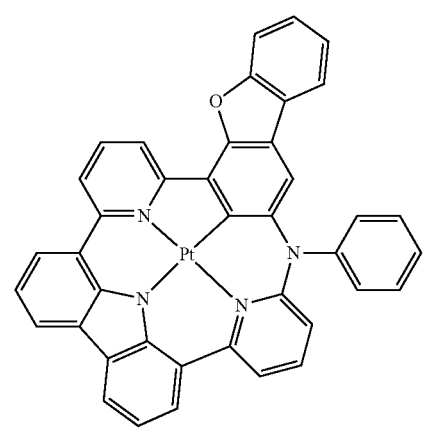
20
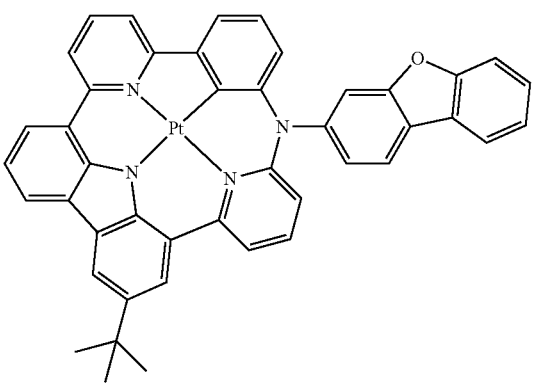
21
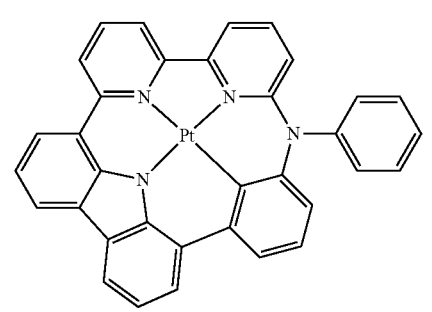
22
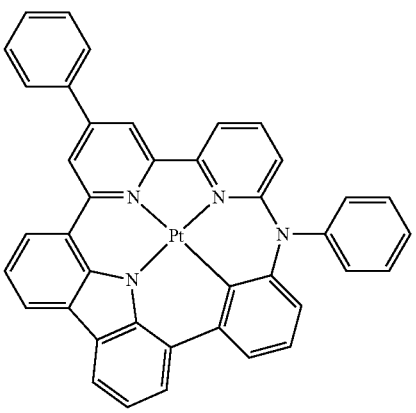
23
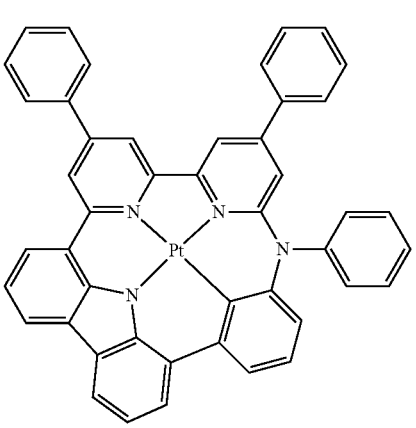
24
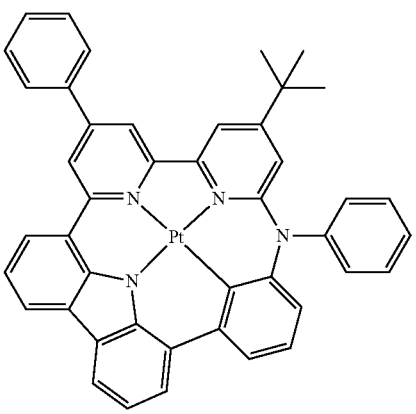
25
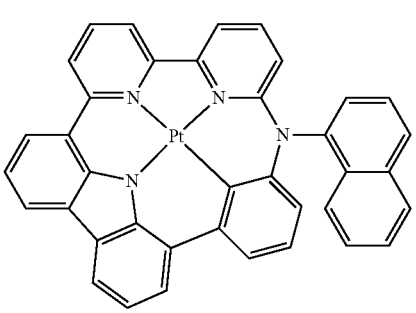

26
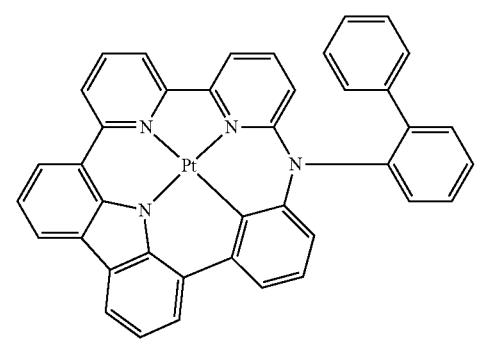
27
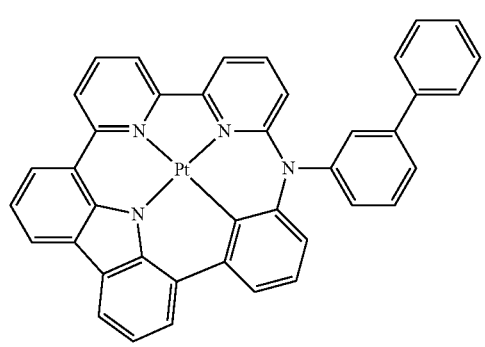
28
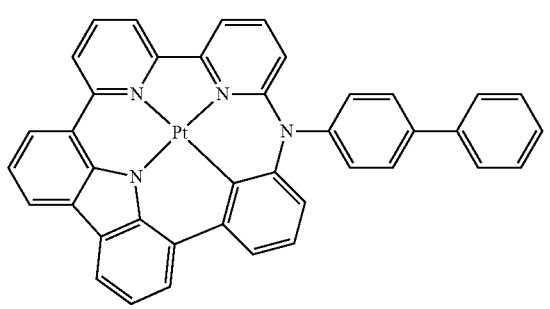
29
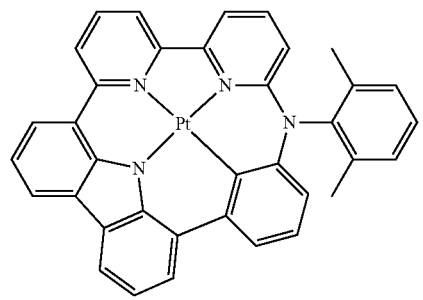
30
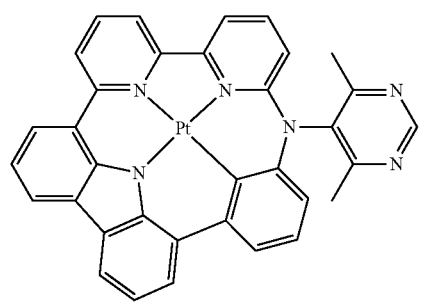
31
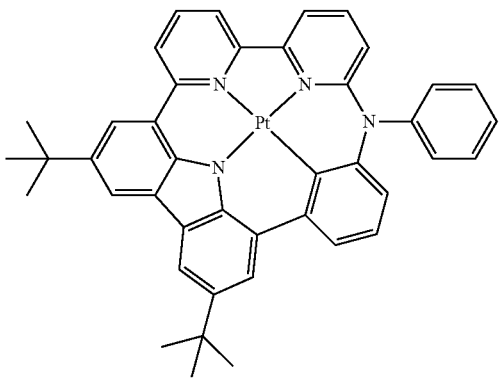
32
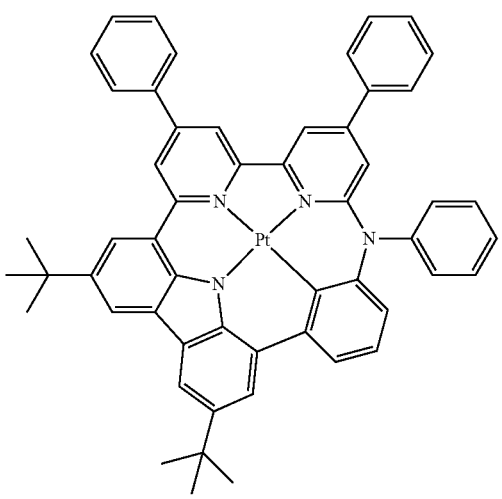
33
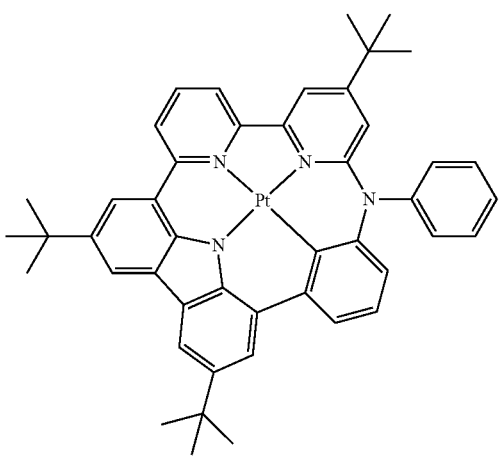
34
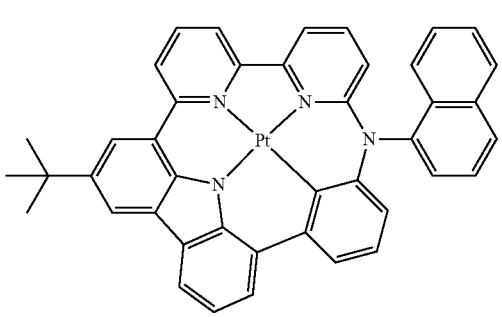

-continued
35
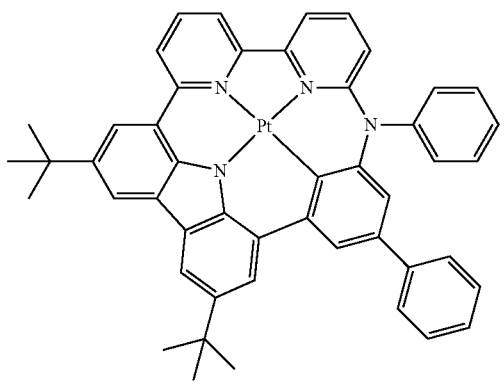
36
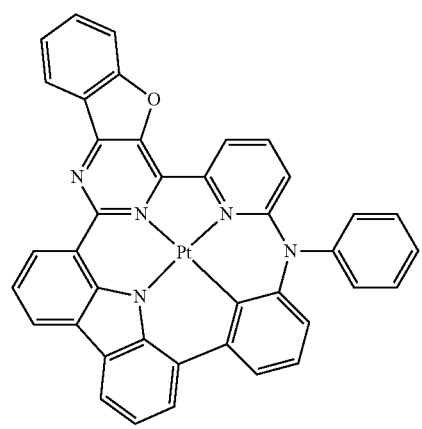
37
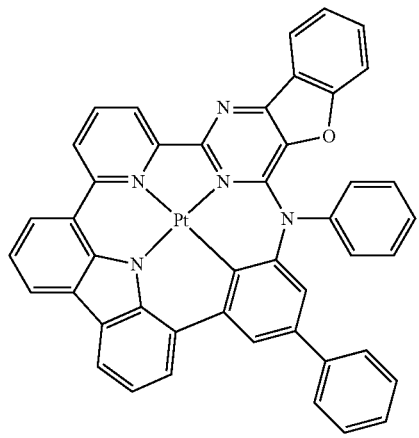
38
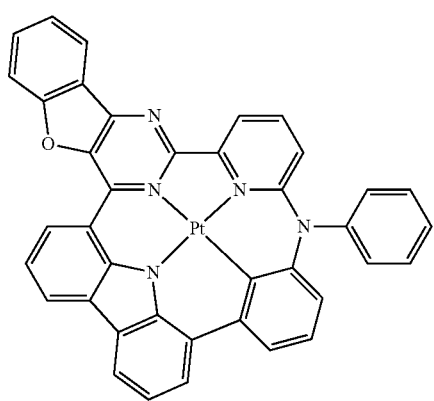
-continued
39
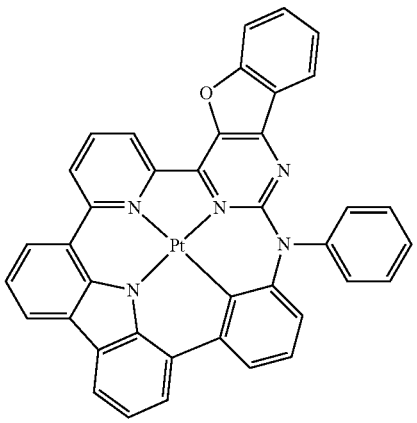
40
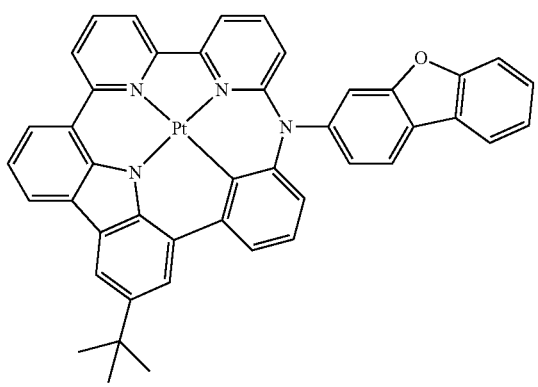
41
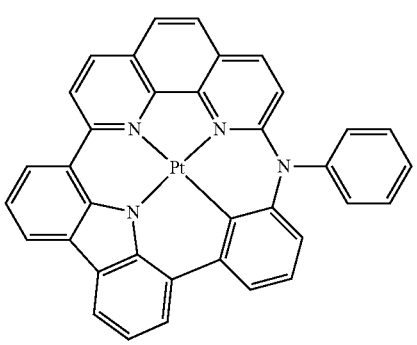
42
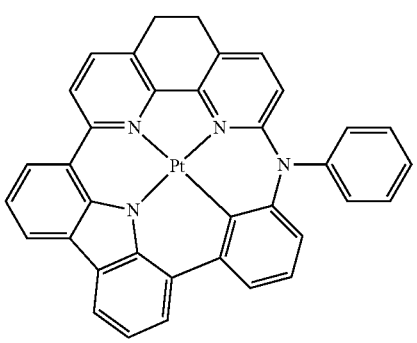

-continued
43
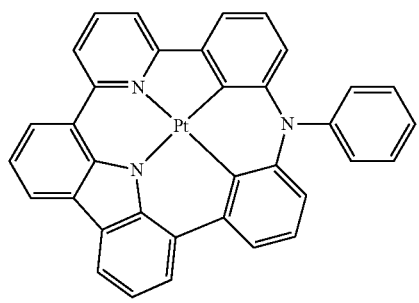
44
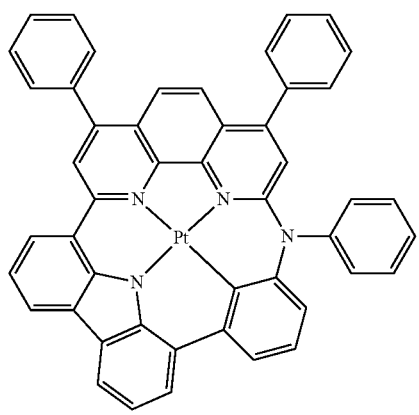
45
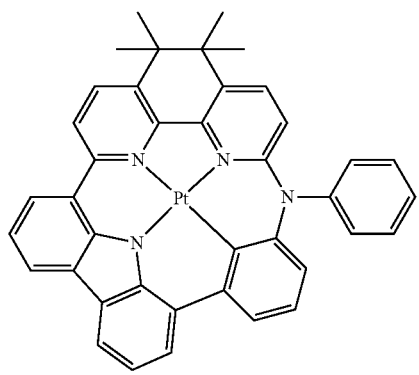
46
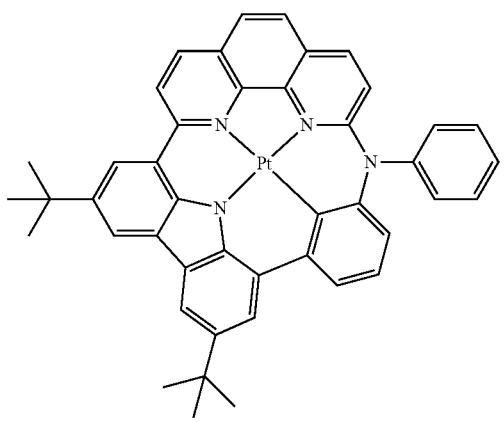
-continued
47
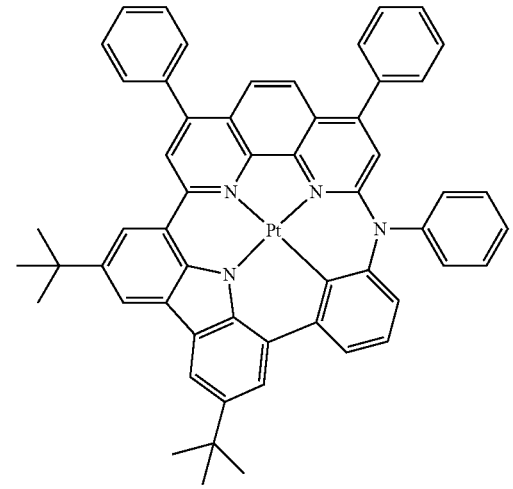
48
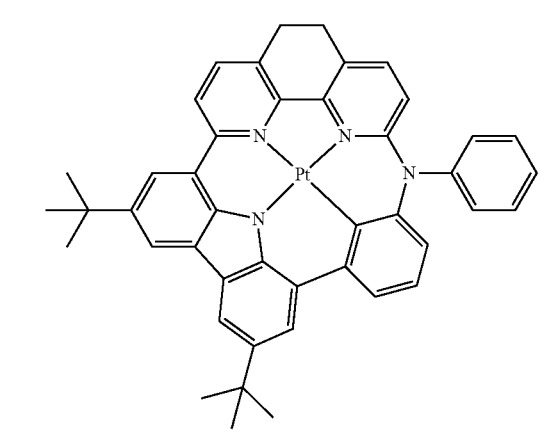
49
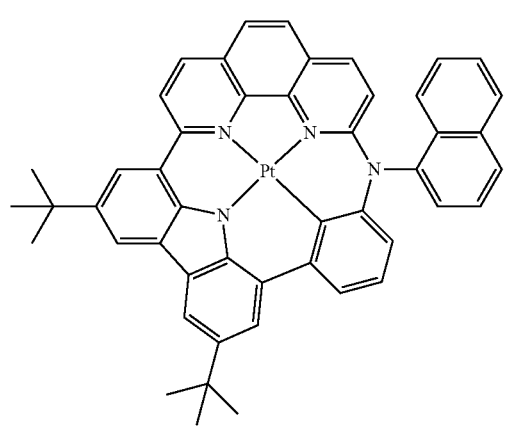

249
-continued
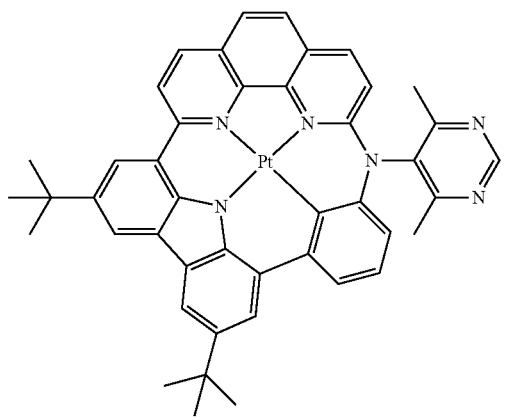
50
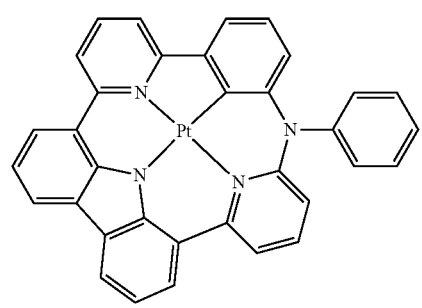
51
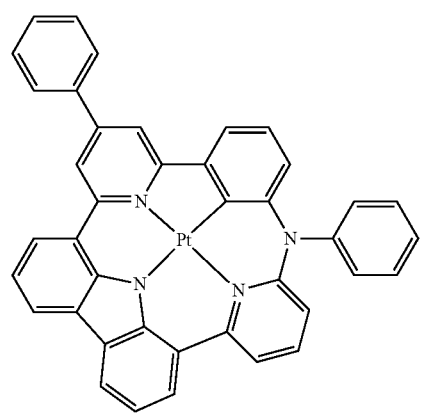
52
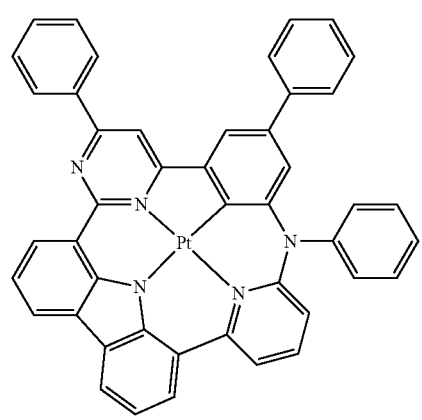
53
250
-continued
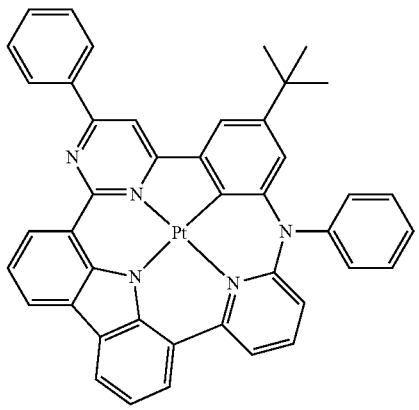
54
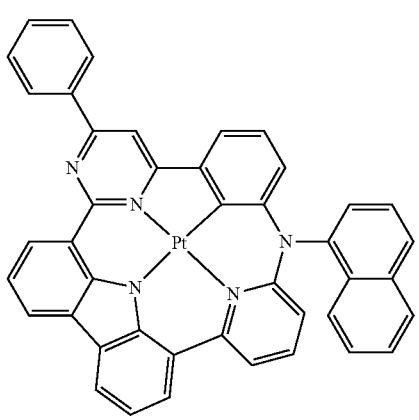
55
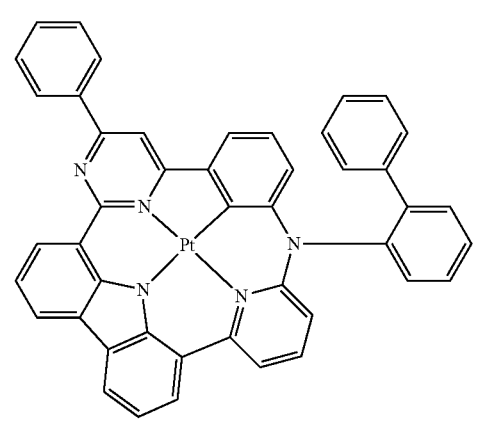
56
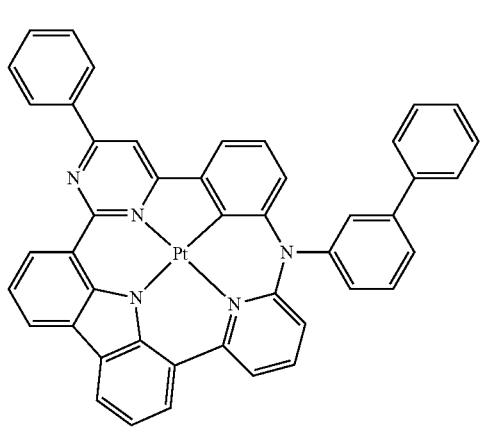
57

251
-continued
58
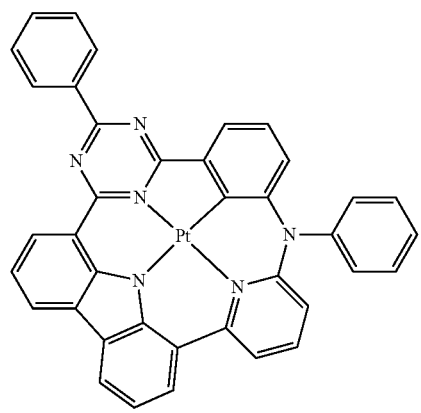
59
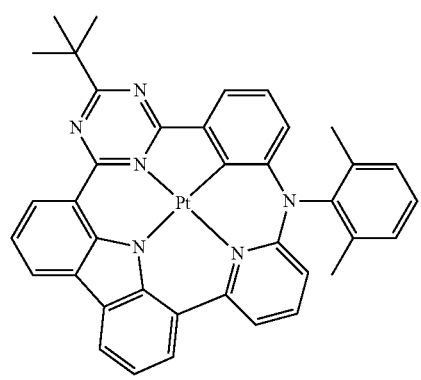
60
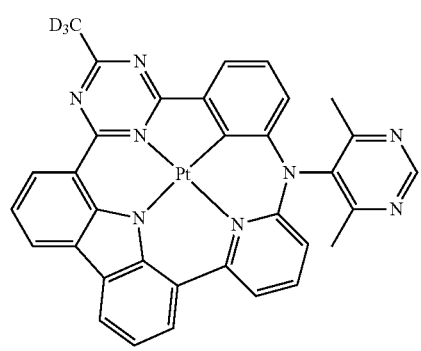
61
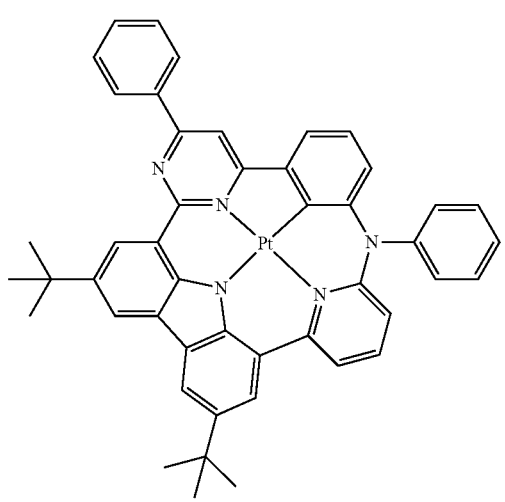
252
-continued
62
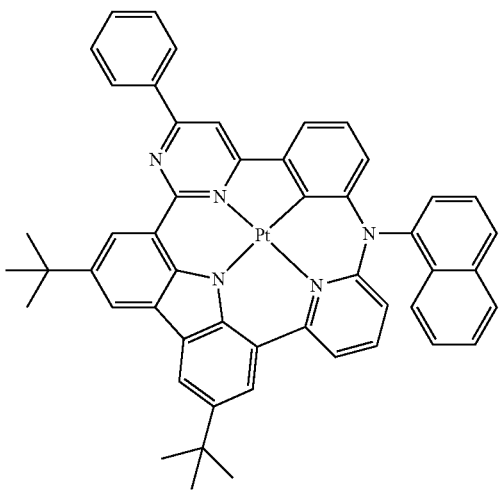
63
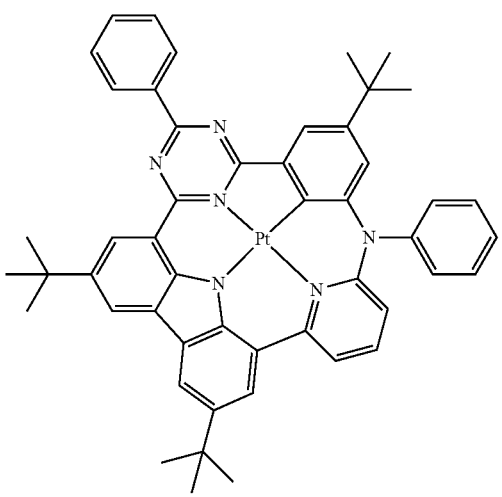
64
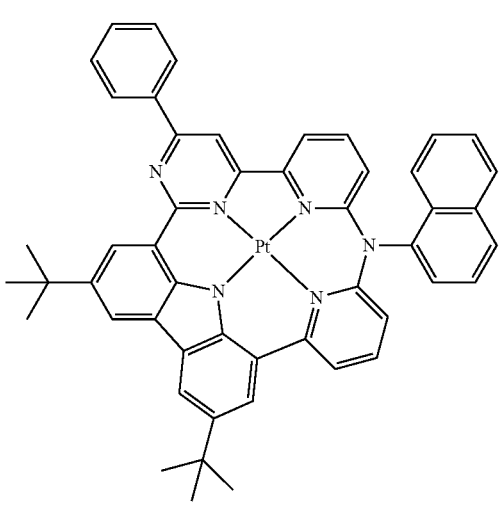

253
-continued
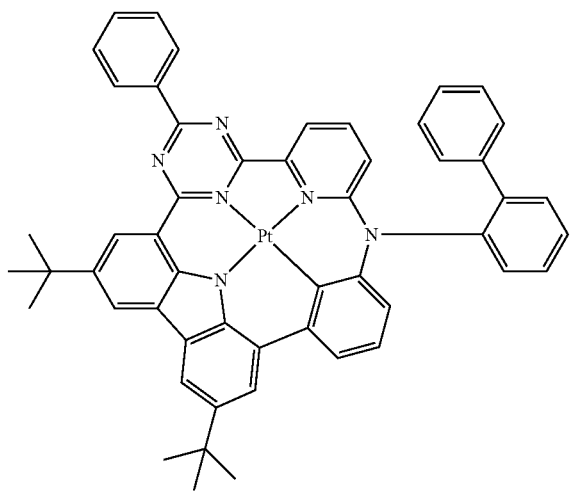
65
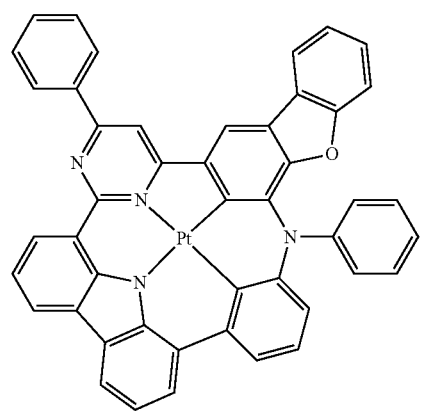
66
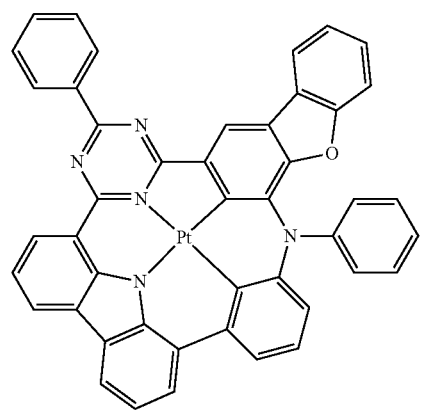
67
254
-continued
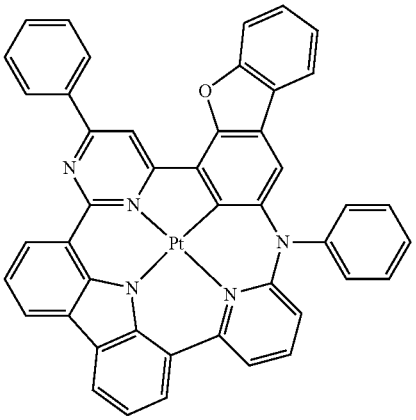
68
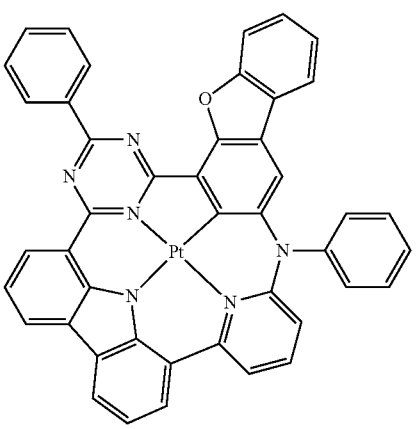
69
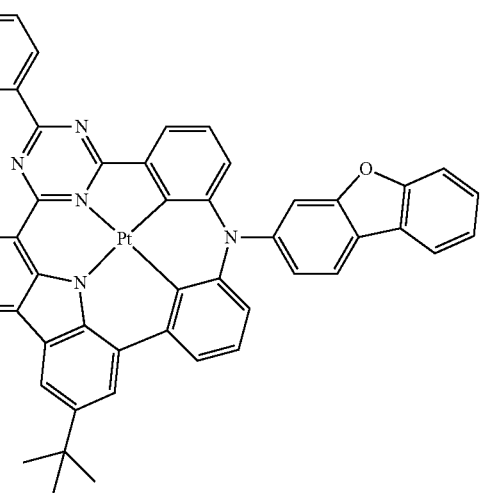
70
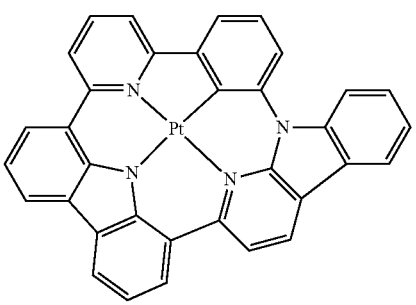
71

72
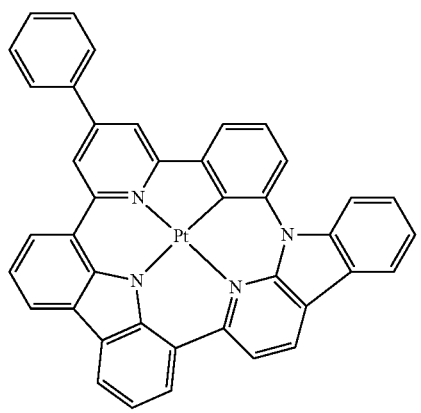
73
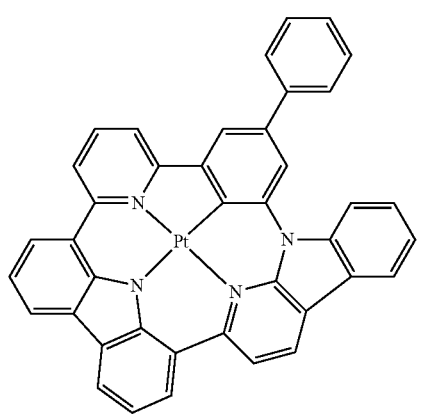
74
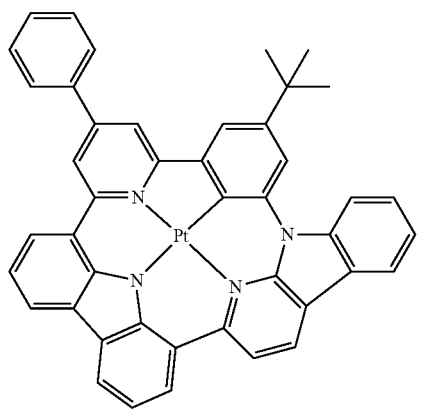
75
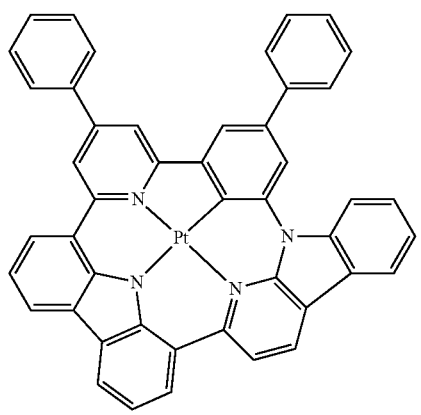
76
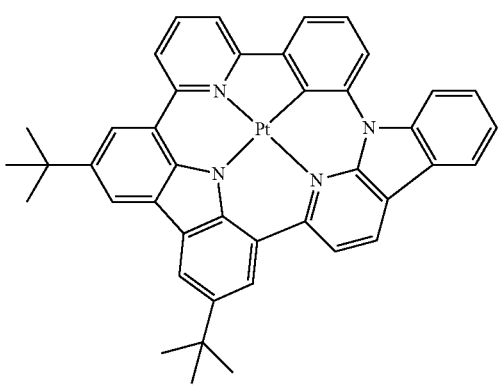
77
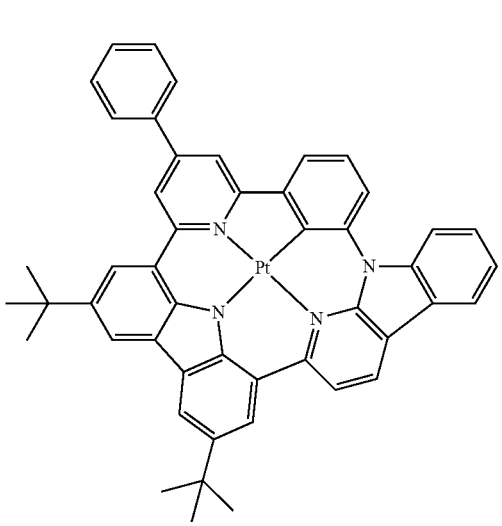
78
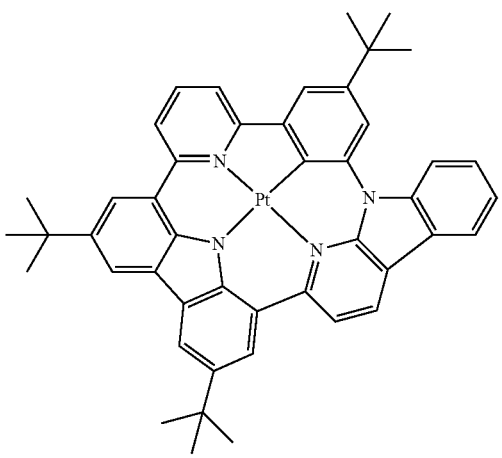

257
-continued
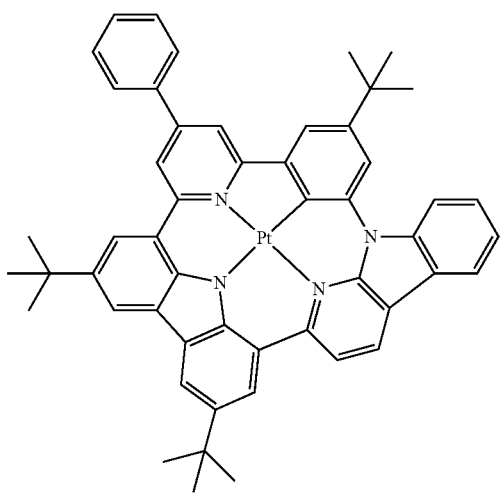
79
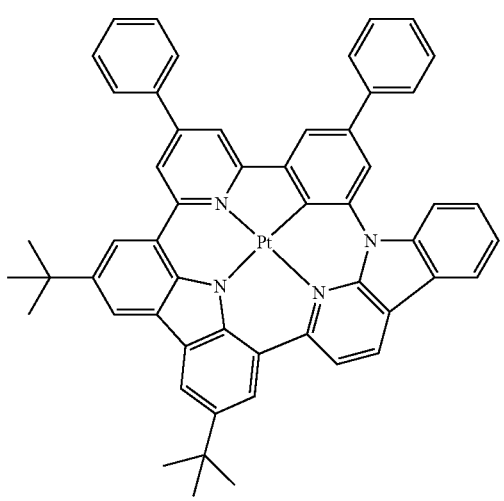
80
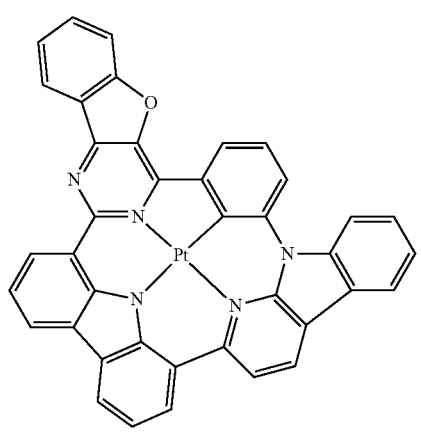
81
258
-continued
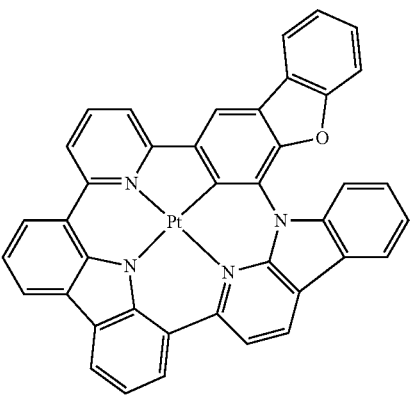
82
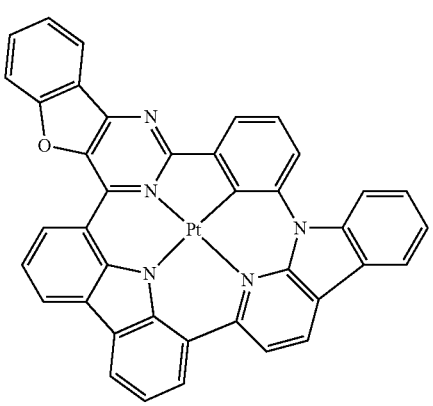
83
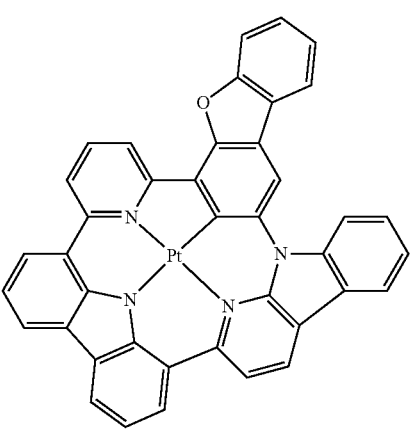
84

259
-continued
85
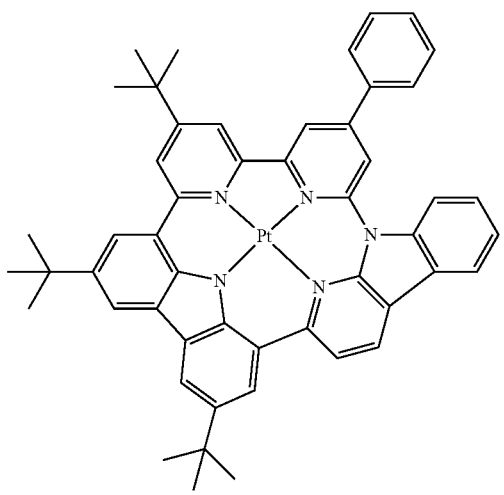
86
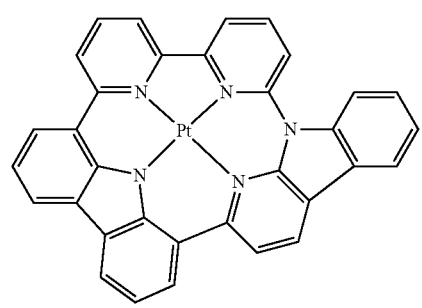
87
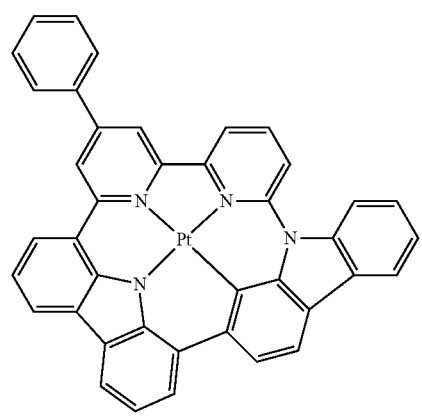
88
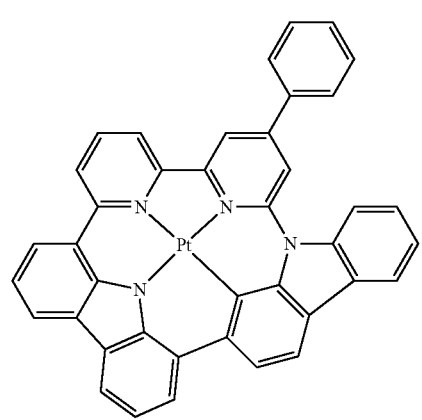
260
-continued
89
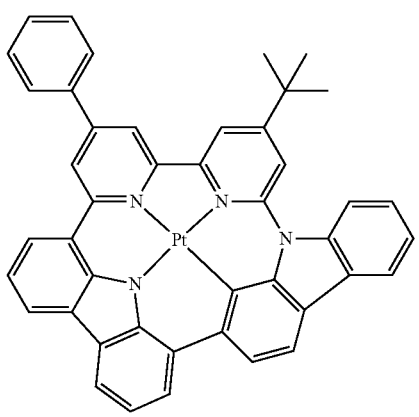
90
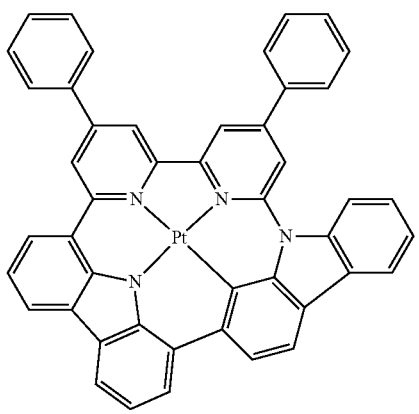
91
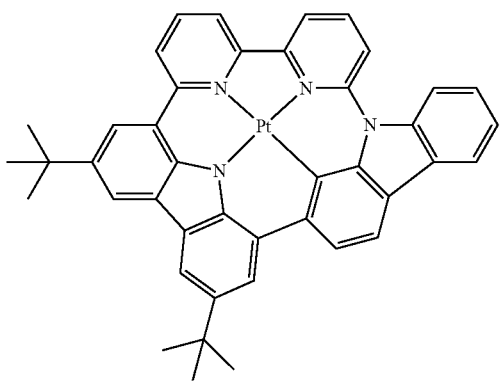

92
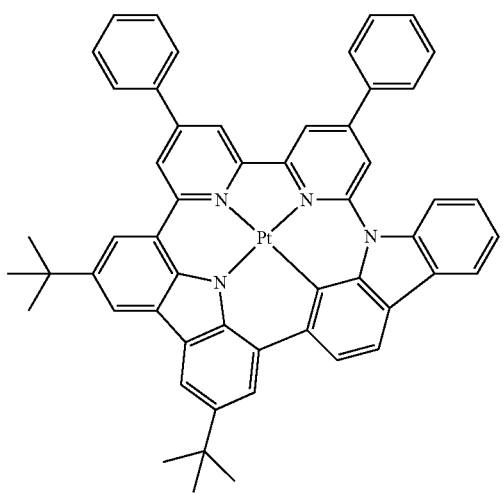
93
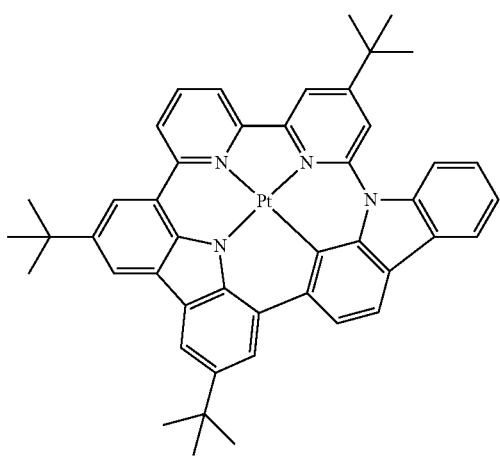
94
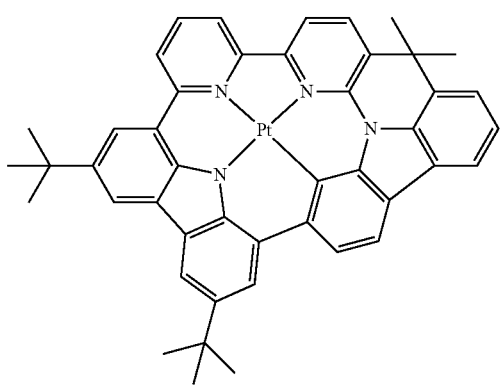
95
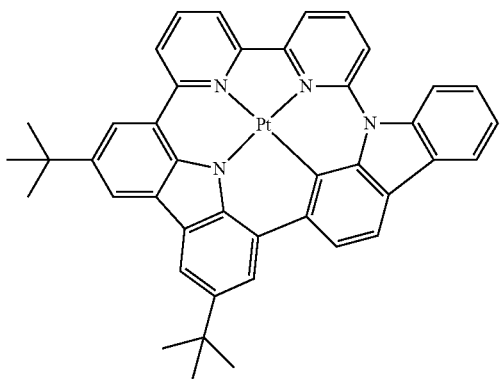
96
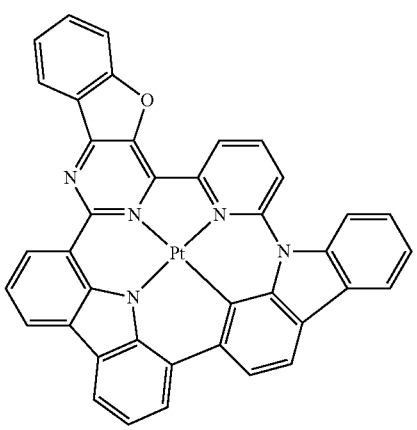
97
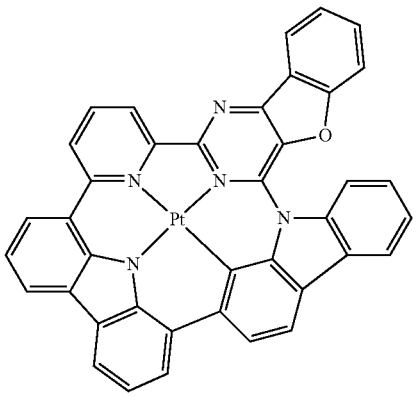
98
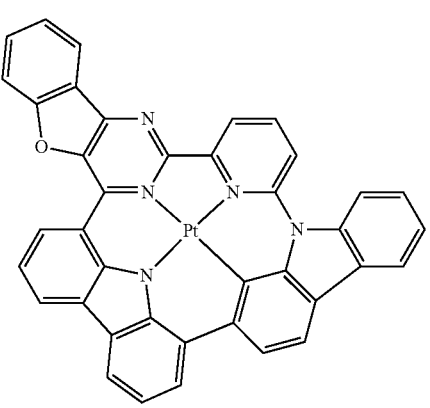

99
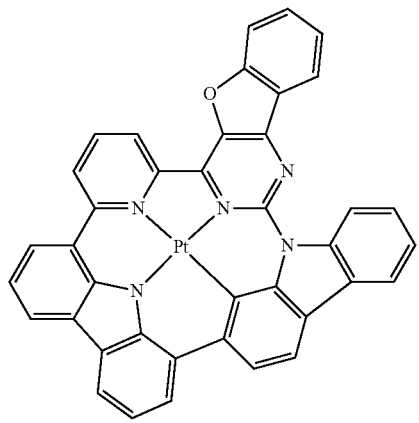
100
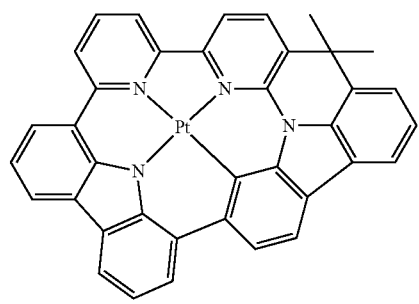
101
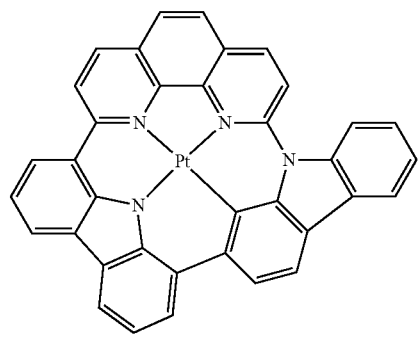
102
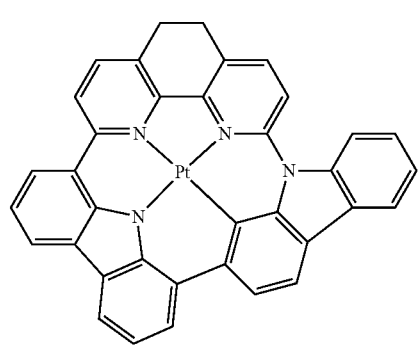
103
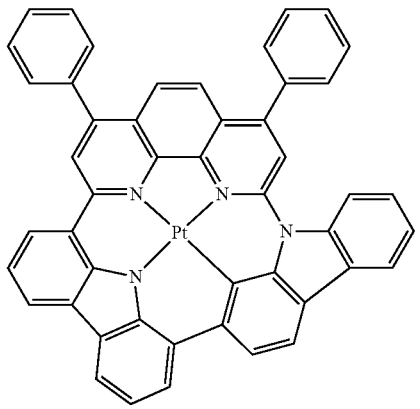
104
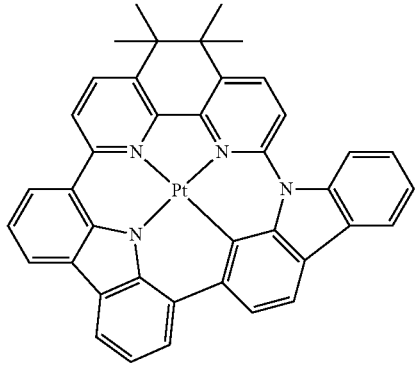
105
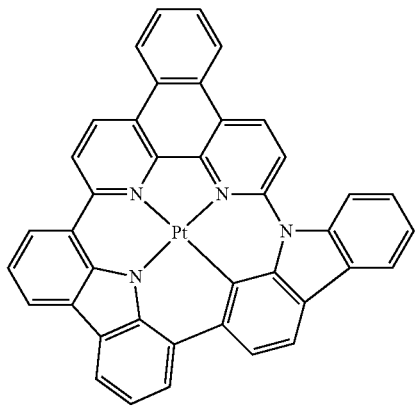
106
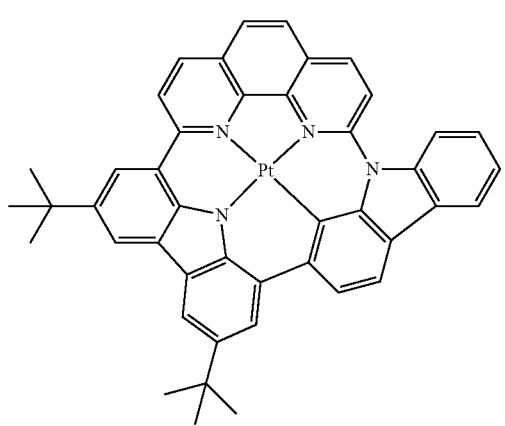

107
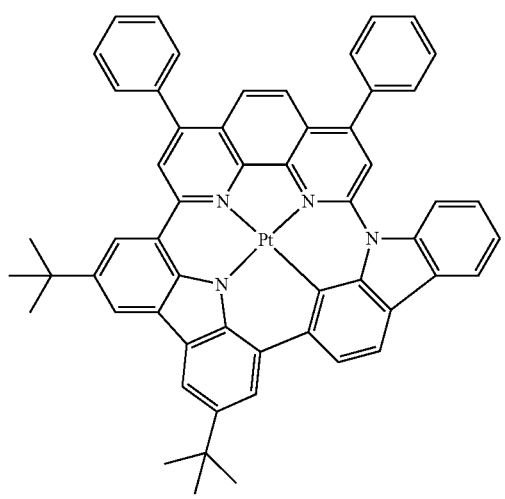
108
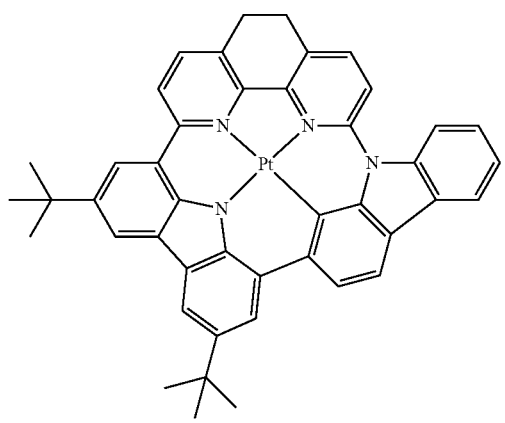
109
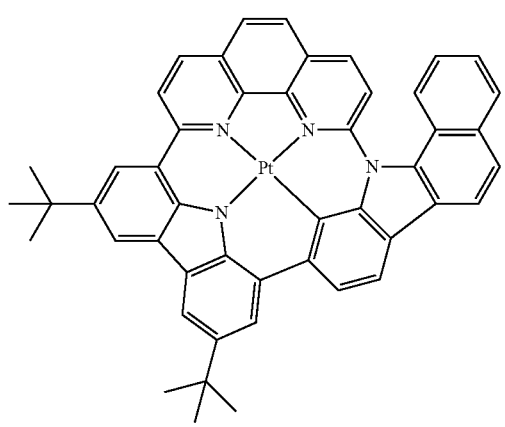
110
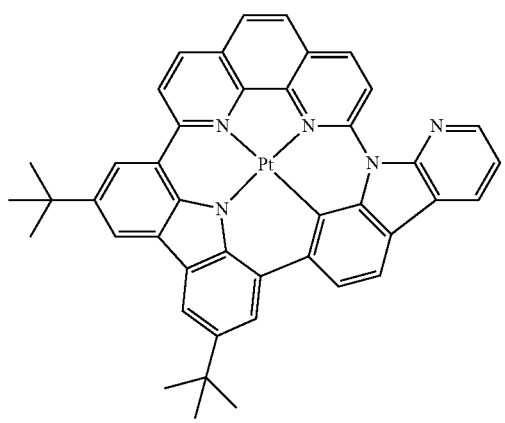
111
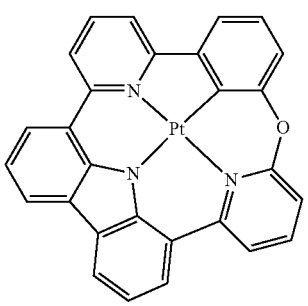
112
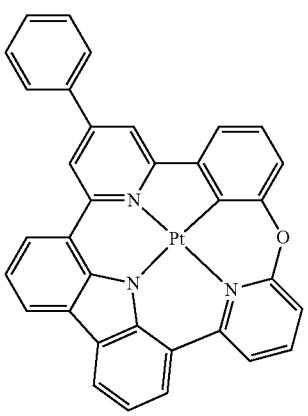
113
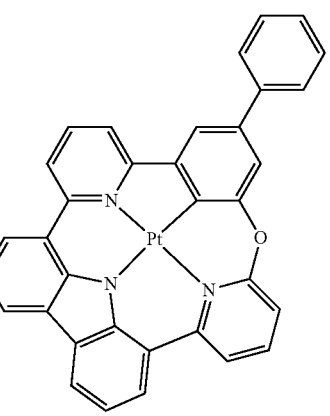

267
-continued
114
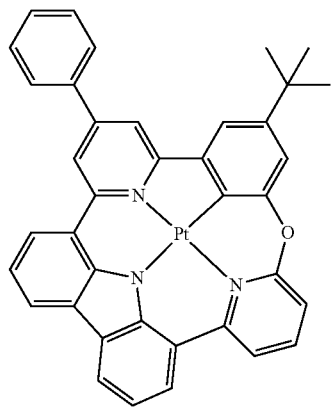
115
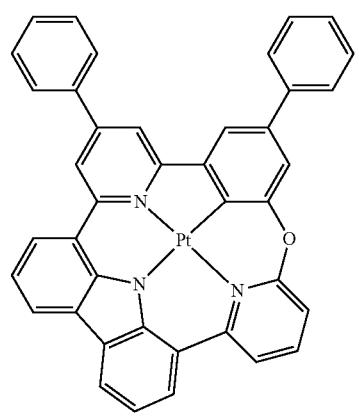
116
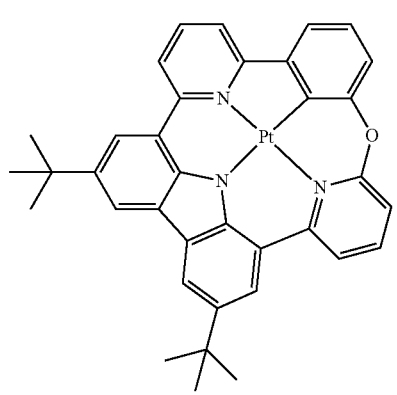
268
-continued
117
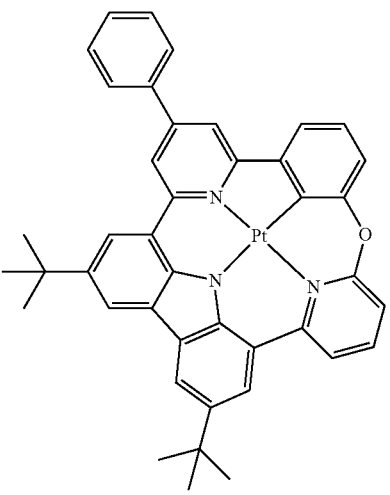
118
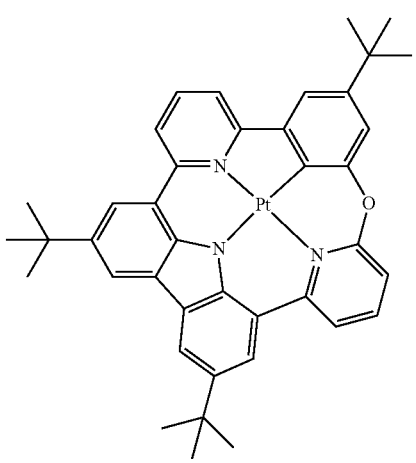
119
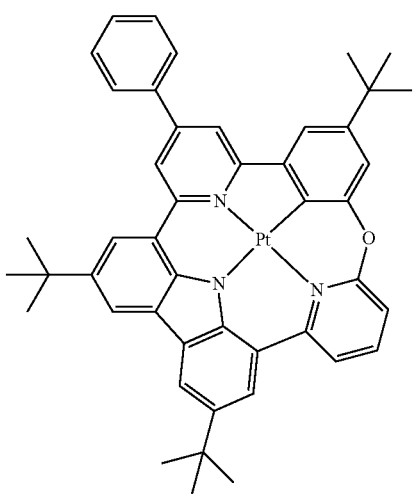

269
-continued
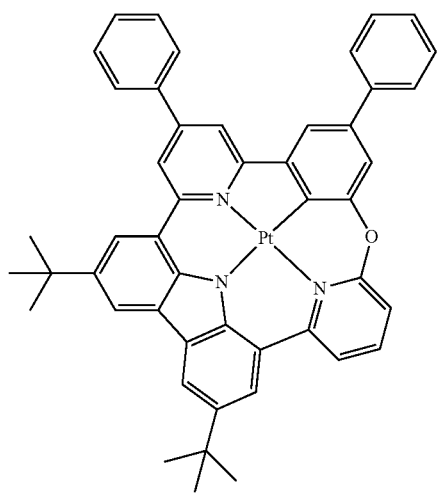
120
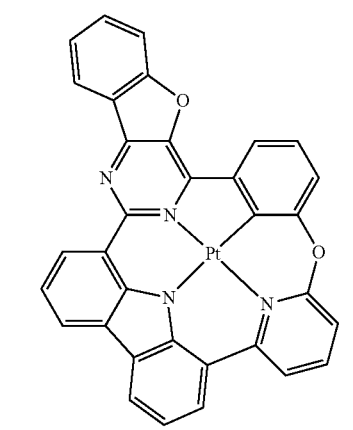
121
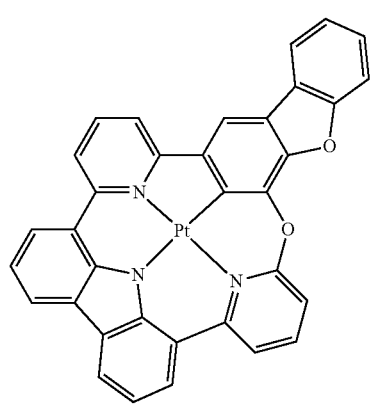
122
270
-continued
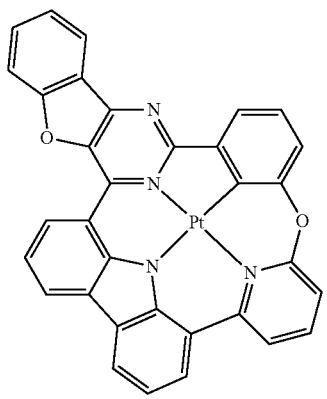
123
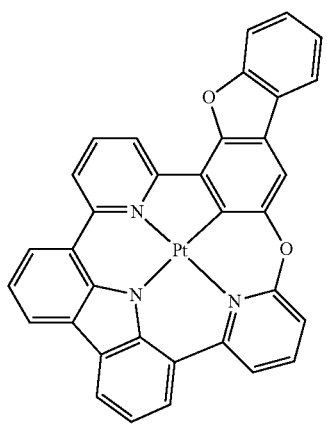
124
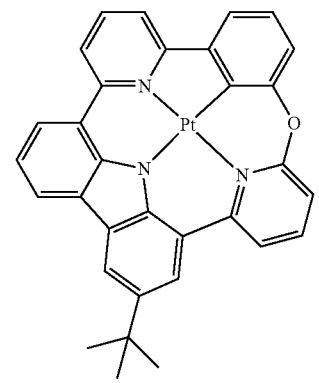
125
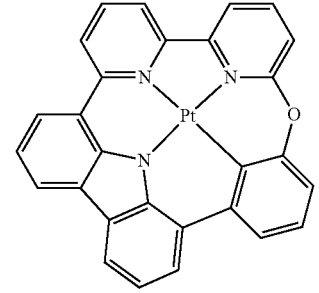
126

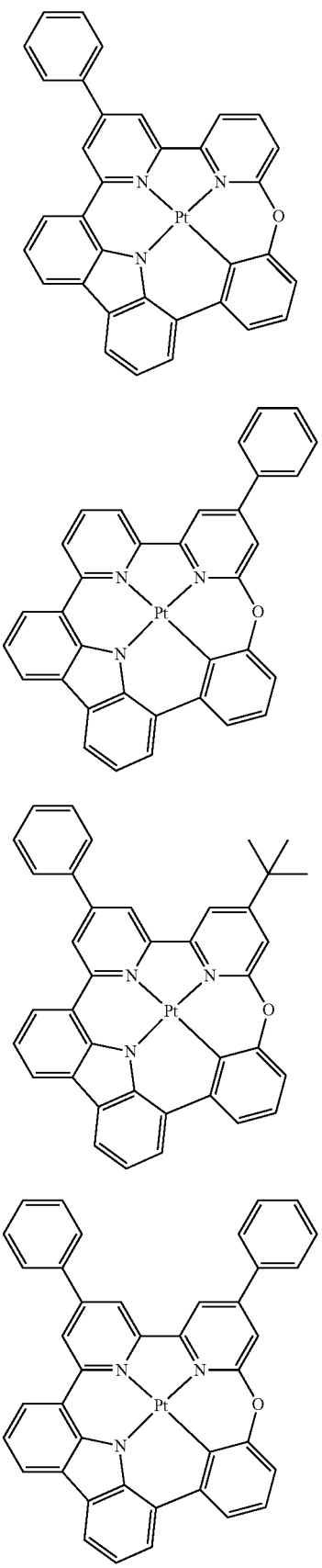
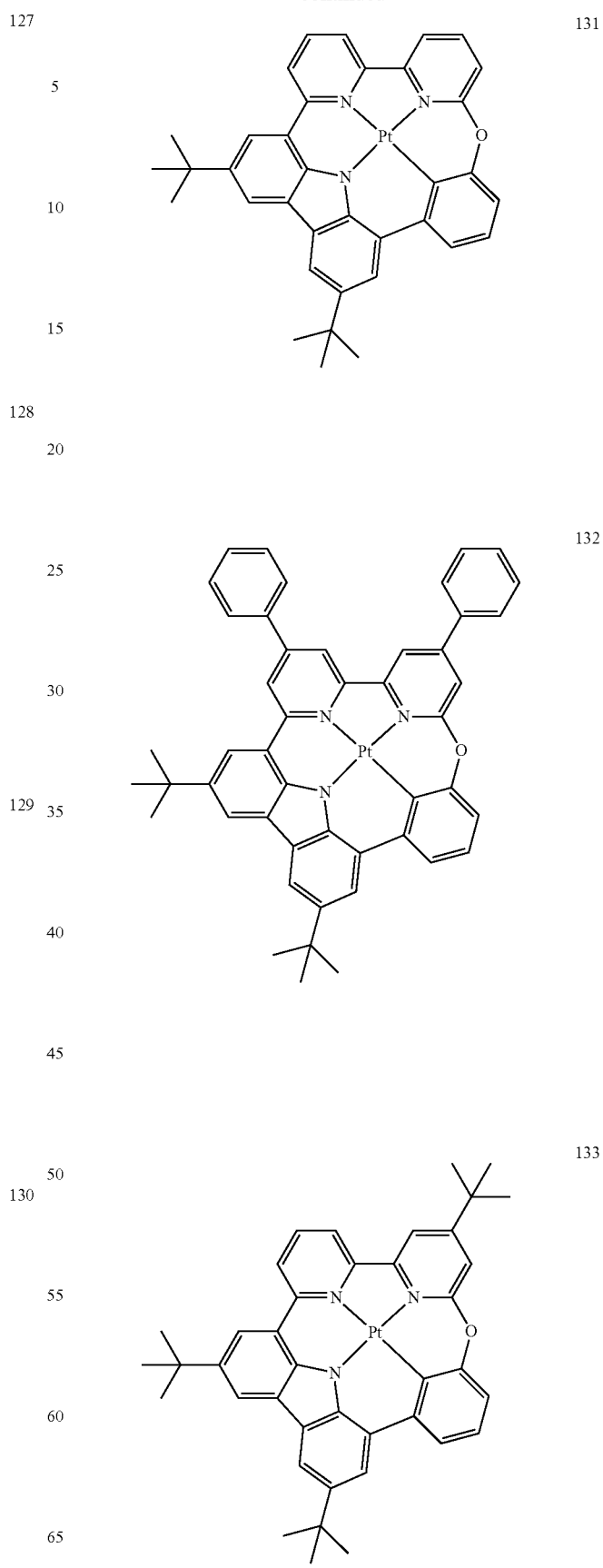

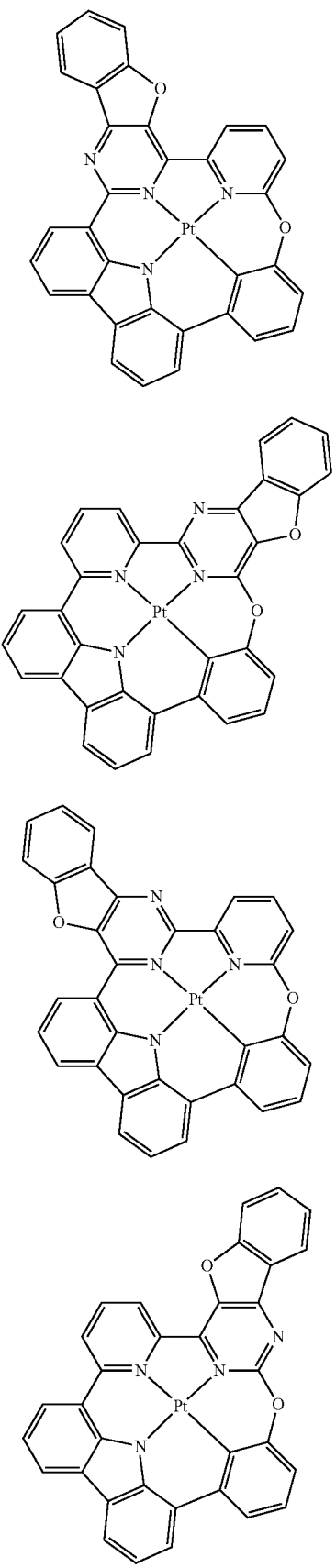
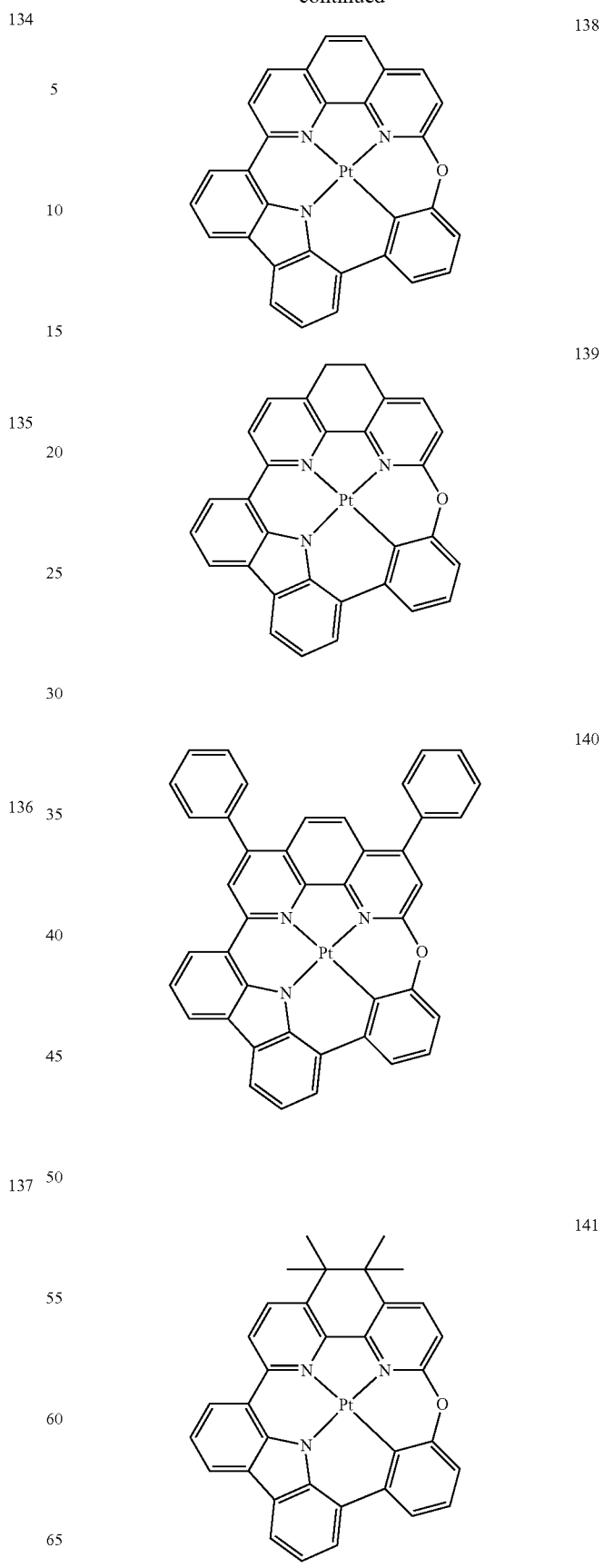

142 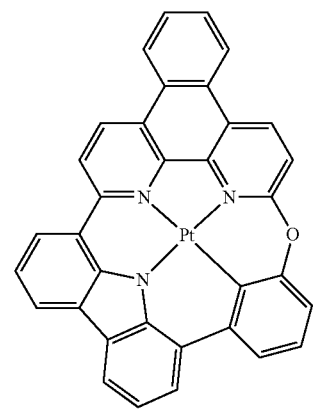
143 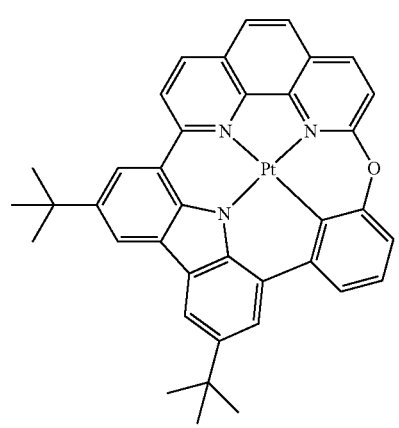
144 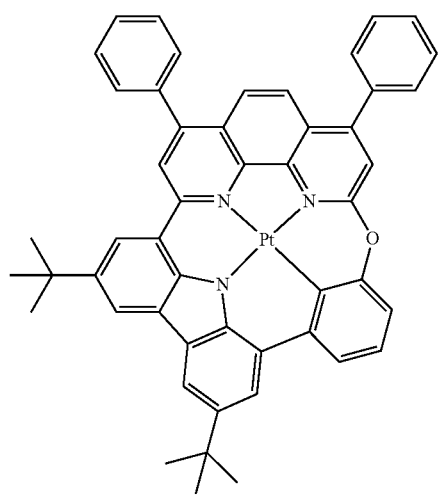
145 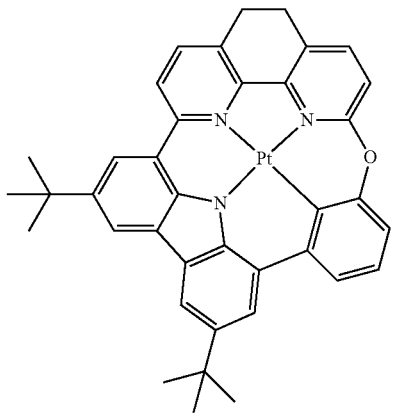
146 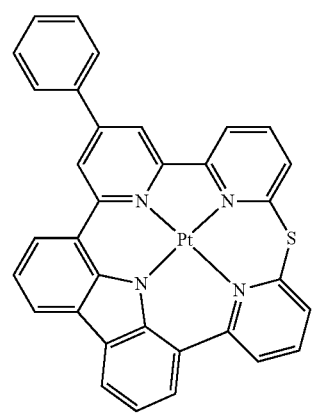
147 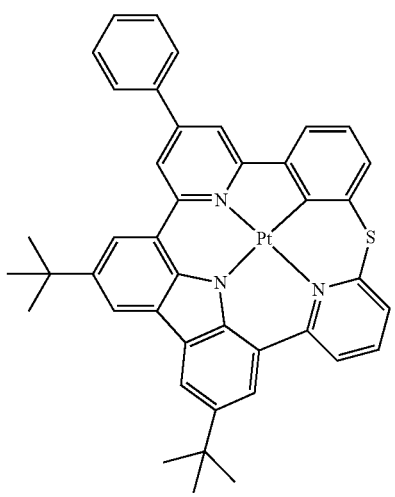
148 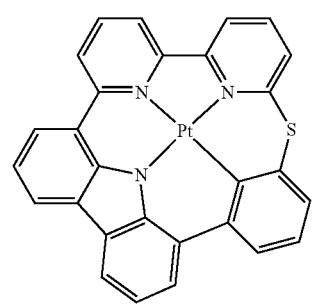

149
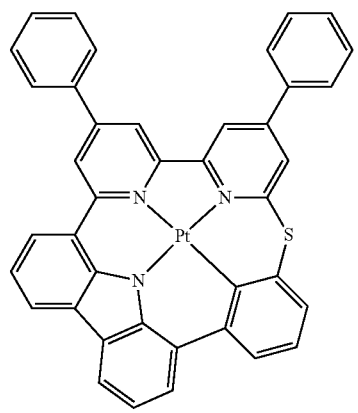
150
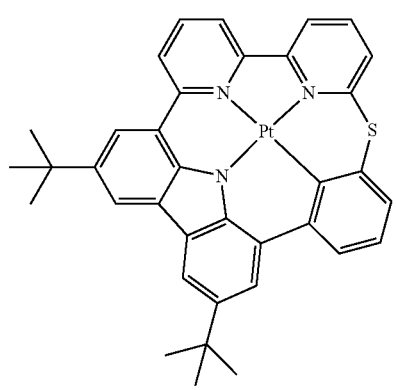
151
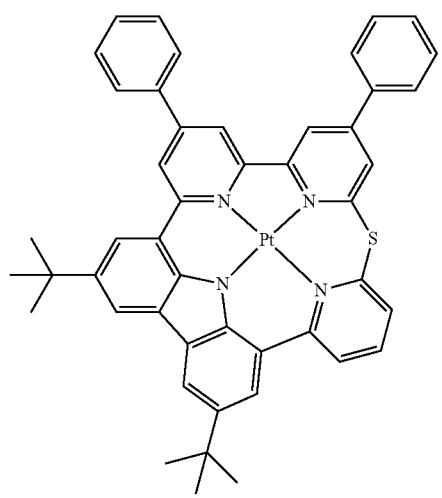
152
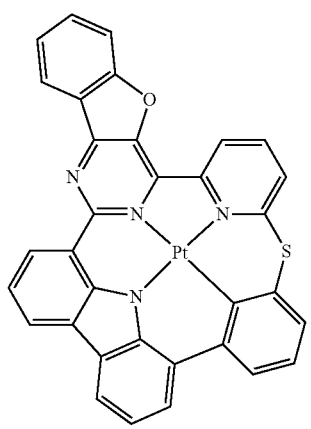
153
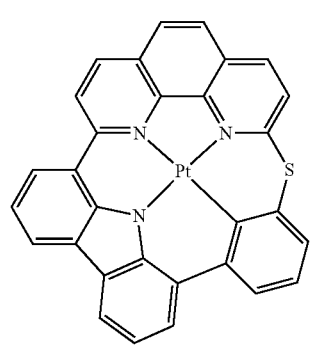
154
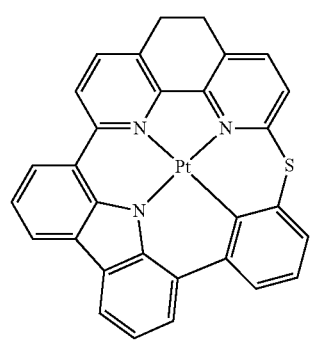
155
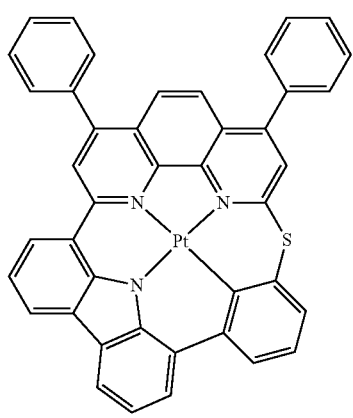

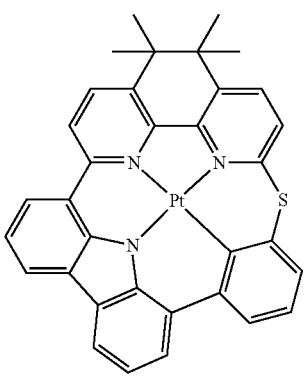
156

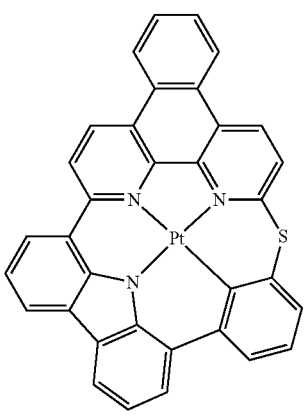
157

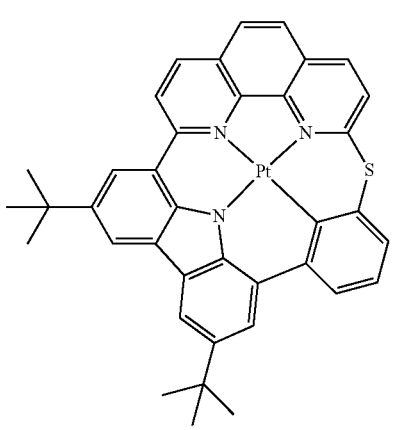
158

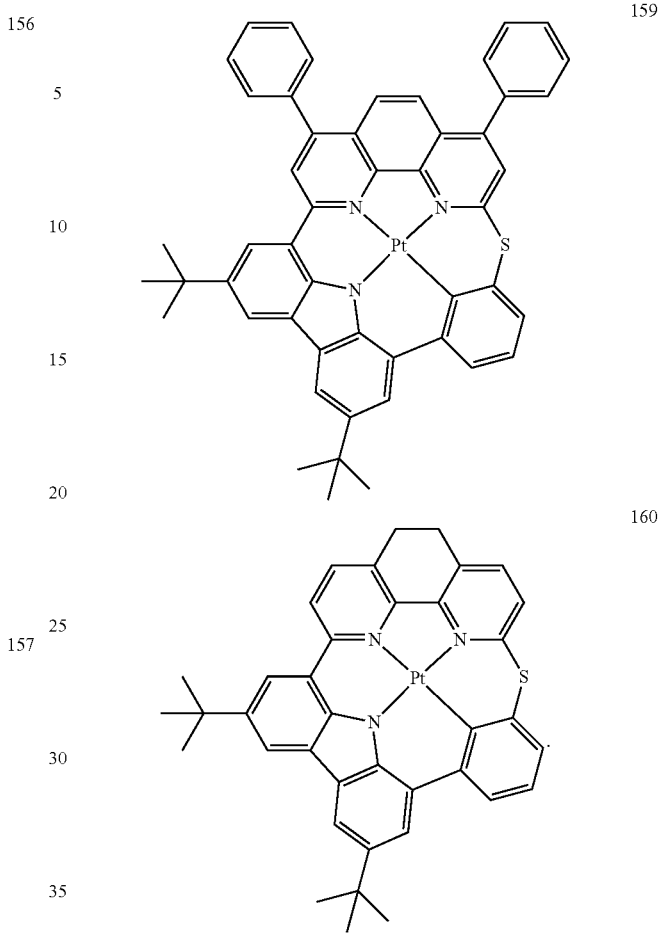
159

160

16. An organic light-emitting device comprising:
   a first electrode;
   a second electrode; and
   an organic layer disposed between the first electrode and the second electrode and comprising an emission layer,
   wherein the organic layer comprises at least one organometallic compound of claim 1.

17. The organic light-emitting device of claim 16, wherein
   the first electrode is an anode,
   the second electrode is a cathode,
   the organic layer further comprises a hole transport region between the first electrode and the emission layer and an electronic transport region between the emission layer and the second electrode,
   the hole transport region comprises a hole injection layer, a hole transport layer, an electron blocking layer, a buffer layer or any combination thereof, and
   the electron transport region comprises a hole blocking layer, an electron transport layer, an electron injection layer, or any combination thereof.

18. The organic light-emitting device of claim 16, wherein the emission layer comprises the organometallic compound.

19. The organic light-emitting device of claim 18, wherein the emission layer further comprises a host, and an amount of the host is larger than an amount of the organometallic compound.

20. A diagnostic composition comprising at least one of the organometallic compound of claim 1.

* * * * *